(12) United States Patent
Yoshida et al.

(10) Patent No.: US 8,878,757 B2
(45) Date of Patent: Nov. 4, 2014

(54) DISPLAY DEVICE AND METHOD OF DRIVING THE SAME

(75) Inventors: Yasunori Yoshida, Kanagawa (JP); Hajime Kimura, Kanagawa (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 1156 days.

(21) Appl. No.: 11/851,158

(22) Filed: Sep. 6, 2007

(65) Prior Publication Data

US 2008/0068359 A1    Mar. 20, 2008

(30) Foreign Application Priority Data

Sep. 15, 2006  (JP) ................................. 2006-251911

(51) Int. Cl.
| | | |
|---|---|---|
| G09G 3/34 | (2006.01) | |
| G09G 3/36 | (2006.01) | |
| G09G 3/32 | (2006.01) | |
| H01L 27/12 | (2006.01) | |
| H01L 29/423 | (2006.01) | |
| G09G 3/20 | (2006.01) | |

(52) U.S. Cl.
CPC ........ *G09G 3/3406* (2013.01); *G09G 2310/061* (2013.01); *G09G 2300/0842* (2013.01);

(Continued)

(58) Field of Classification Search
CPC . G09G 3/3406; G09G 3/3648; G09G 3/2025; G09G 3/325; G09G 3/3258; G09G 2300/0819; G09G 2300/0842; G09G 2300/0852; G09G 2300/0861; G09G 2310/024; G09G 2310/061; G09G 2310/08; G09G 2320/0252; G09G 2320/0261; G09G 2320/0271; G09G 2320/0276; G09G 2320/0626; G09G 2320/0673; G09G 2320/10; G09G 2320/106; G09G 2340/0435; G09G 2360/144; G09G 2360/18; G09G 3/3233; H01L 29/42384; H01L 27/1214
USPC ................................ 345/84–104; 375/240.15
See application file for complete search history.

(56) References Cited

U.S. PATENT DOCUMENTS

| 6,614,415 B2 | 9/2003 | Mizutani et al. |
| 7,002,540 B2 | 2/2006 | Aoki |

(Continued)

FOREIGN PATENT DOCUMENTS

| CN | 1661429 | 8/2005 |
| EP | 1 494 196 A2 | 1/2005 |

(Continued)

OTHER PUBLICATIONS

B.-w. Lee et al.; "51.2: Mastering the Moving Image: Refreshing TFT-LCDs at 120 Hz"; *SID 05 Digest*, vol. 36; pp. 1583-1585; May 2005.

(Continued)

*Primary Examiner* — Michael Pervan
(74) *Attorney, Agent, or Firm* — Fish & Richardson P.C.

(57) ABSTRACT

The present invention solves the motion blur of moving images in hold-type display devices. An amount of a moving image is detected from image data included in frames and an image at the intermediate state between an image of the current frame and an image of the next frame is made as an interpolation image. Thus, the movement of the image can follow the movement of human eyes and the luminance of the interpolation image is changed, and thus, display can be made close to pseudo impulse type display. In this manner, hold-type display devices without motion blur and methods of driving the hold-type display devices can be provided.

9 Claims, 68 Drawing Sheets

(52) U.S. Cl.
CPC .. *G09G 2320/0626* (2013.01); *G09G 2320/106* (2013.01); *G09G 2360/144* (2013.01); *G09G 3/325* (2013.01); *G09G 2310/08* (2013.01); *G09G 2320/0673* (2013.01); *G09G 2300/0861* (2013.01); *G09G 2300/0819* (2013.01); *G09G 2340/0435* (2013.01); *G09G 3/3233* (2013.01); *G09G 2320/0271* (2013.01); *G09G 2300/0852* (2013.01); *H01L 27/1214* (2013.01); *G09G 2320/10* (2013.01); *H01L 29/42384* (2013.01); *G09G 2320/0252* (2013.01); *G09G 3/2025* (2013.01); *G09G 3/3648* (2013.01); *G09G 2320/0276* (2013.01); *G09G 3/3258* (2013.01); *G09G 2360/18* (2013.01); *G09G 2310/024* (2013.01); *G09G 2320/0261* (2013.01)
USPC .......................................................... 345/84

(56) References Cited

U.S. PATENT DOCUMENTS

| | | | |
|---|---|---|---|
| 7,310,118 | B2 | 12/2007 | Kamimura |
| 7,839,453 | B2 | 11/2010 | Takeuchi |
| 2004/0155847 | A1 | 8/2004 | Taoka et al. |
| 2005/0078069 | A1 | 4/2005 | Aiba et al. |
| 2005/0140626 | A1* | 6/2005 | Doyen et al. ............... 345/89 |
| 2005/0184949 | A1 | 8/2005 | Kamimura |
| 2005/0270254 | A1 | 12/2005 | Ozaki |
| 2006/0044472 | A1* | 3/2006 | Lee et al. .................. 348/607 |
| 2006/0072664 | A1 | 4/2006 | Kwon et al. |
| 2006/0267904 | A1 | 11/2006 | Aiba |
| 2007/0018934 | A1 | 1/2007 | Kim et al. |
| 2007/0103424 | A1* | 5/2007 | Huang ....................... 345/102 |
| 2007/0103585 | A1* | 5/2007 | Takeuchi et al. ........... 348/441 |

FOREIGN PATENT DOCUMENTS

| | | |
|---|---|---|
| EP | 1 607 935 A1 | 12/2005 |
| JP | 04-302289 A | 10/1992 |
| JP | 09-325715 | 12/1997 |
| JP | 2000-200063 | 7/2000 |
| JP | 2002-023707 | 1/2002 |
| JP | 2002-091400 | 3/2002 |
| JP | 3295437 | 6/2002 |
| JP | 2004-177575 | 6/2004 |
| JP | 2004-240317 | 8/2004 |
| JP | 2005-043875 A | 2/2005 |
| JP | 2005-241787 A | 9/2005 |
| JP | 2005-268912 | 9/2005 |
| JP | 2006-133384 A | 5/2006 |
| JP | 2006-145799 A | 6/2006 |
| KR | 2005-0004045 A | 1/2005 |
| KR | 2005-0086357 A | 8/2005 |
| KR | 2006-0019776 A | 3/2006 |
| TW | 200601220 A | 1/2006 |

OTHER PUBLICATIONS

N. Kimura et al.; "60.2: *Invited Paper*: New Technologies for Large-Sized High-Quality LCD TV"; *SID 05 Digest*, vol. 36; pp. 1734-1737; May 2005.

Y. Yoshida et al.; "66.3 *Invited Paper*: Image Quality Improvements in Large-Screen LC-TV"; *SID 05 Digest*, vol. 36; pp. 1852-1855; May 2005.

Sang Soo Kim; "66.1: *Invited Paper*: The World's Largest (82-in.) TFT LCD"; *SID 05 Digest*, vol. 36; pp. 1842-1847; May 2005.

Taesung Kim et al.; "54.3: Impulsive Driving Technique in S-PVA Architecture"; *SID 06 Digest*, vol. 37; pp. 1708-1711; Jun. 2006.

Sunkwang Hong et al.; "66.2: Motion-Interpolated FRC Algorithm for 120Hz LCD"; *SID 06 Digest*, vol. 37; pp. 1892-1895; Jun. 2006.

Jun-Woo Lee et al.; "69.4: Amorphous Silicon Based 40" LCD TV Using Ultra Fast OCB Mode"; *SID 06 Digest*, vol. 37; pp. 1950-1953; Jun. 2006.

Goh Itoh et al.; "8.2: Picture Adaptive Display System using TFT-LCD and LED Backlight for High Quality Motion Picture"; *Conference Record of the 26th International Display Research Conference*; pp. 96-99; Sep. 2006.

R. Otake et al.; "Moving picture response improvement technology for LCD televisions: "Clear Focus Drive""; *Proceedings of the 12th International Display Workshops in conjunction with Asia Display*; pp. 797-799; Dec. 2005.

J. Maruyama et al.; "Timing Control System for Flexible Black Data Insertion on IPS-Pro Panels"; *Proceedings of the 13th International Display Workshops*; pp. 1613-1616; Dec. 2006.

Kikuo Ono et al.; "Invited Paper: High Performance IPS-Pro Technology for LCD-TVs"; *Digest of Technical Papers AM-FPD 06, The 13th International Workshop on Active-Matrix Flatpanel Displays and Devices*; pp. 89-92; Jul. 2006.

Ono, K, et al., "69.5: Invited Paper: Progress of IPS-Pro Technology for LCD-TVs," SID Digest '06 : SID International Symposium Digest of Technical Papers, Jun. 6, 2006, vol. 37, pp. 1954-1957.

Chinese Office Action (Application No. 200710154257.2) dated Apr. 26, 2011, with English translation, 17 pages.

Office Action, Taiwanese Application No. 96134119, dated Jul. 12, 2013, 22 pages with full English translation.

* cited by examiner

DISPLAY DEVICE AND METHOD OF DRIVING THE SAME

BACKGROUND OF THE INVENTION

1. Field of the Invention

The present invention relates to display devices and methods of driving the display devices. Specifically, a method of improving the quality of moving images in the hold-type display devices.

2. Description of the Related Art

In recent years, there has been growing interests in thin display devices. As substitutes for CRT displays, liquid crystal displays, plasma displays, projection displays, and the like have been developed and becoming popular. Furthermore, field emission displays, inorganic electroluminescence displays, organic electroluminescence displays, electronic paper, and the like have been developed as next-generation display devices.

In a display portion which is provided in the above-described display device, pixels which are minimum units for constituting an image are disposed. Each of the pixels emits light with certain luminance in accordance with the image data to display an image in the display portion.

When a moving image is displayed in such a display device, different images are displayed quickly, several tens of times per second. The period in which an image is displayed is referred to as one frame period.

Here, driving methods of display devices can be classified according to temporal distribution of the luminance of a pixel in one frame period. As for the hold-type driving, the luminance of a pixel is almost constant in one frame period. On the other hand, as for impulsive-type driving which is typified by CRT, after intense light is emitted once in one frame period, the luminance of a pixel immediately decreases and light is not emitted any more. In impulsive driving, a non-lighting state dominates the most part of one frame period.

Unfortunately, hold-type display devices have motion blur in which in displaying moving images, a part of the moving image appears to have traces or the whole image is blurred. This is because an image displayed on a hold-type display device is kept still during one frame period, while a man turn his eyes in the direction in which the image move, while predicting the movement of the image. This leads to mismatching between the movement of human eyes and the movement of moving image. On the other hand, in an impulse type display device, an image appears in an eye's blink and immediately disappears, there is no problem of such mismatching between human eyes and an moving image, which does not lead to motion blur.

Typically, two methods for solving the problem of the hold-type display device are proposed (Patent Document 1: Japanese Patent No. 3295437). The first method is a method in which a period for displaying an image and a period for display a black image are provided in one frame period. By this method, the display can become pseudo impulse type display, afterimages can be made less easily perceived and moving image characteristics can be increased. (Patent Document 2: Japanese Published Patent Application No. H9-325715 and Patent Document 3: Japanese Published Patent Application No. 2000-200063). The second method is a method in which one frame period is shortened (in other words, the frame frequency is made large), thereby the movement of an image follows the movement of human eyes to smooth the movement of the image, which leads to improvement of moving image characteristics (Patent Document 4: Japanese Published Patent Application No. 2005-268912).

Further, as the improvement of the first method, a method in which in stead of the black image, an image which is darker than an original image is displayed to improve the moving image characteristics is known (Patent Document 5: Japanese Published Patent Application No. 2002-23707. Patent Document 6: Japanese Published Patent Application No. 2004-240317, Non-patent document 1: Society For Information Display '05 DIGEST, 60.2, pp. 1734-1737 (2005), Non-patent document 2: Society For Information Display '06 DIGEST, 69.4, pp. 1950-1953 (2006), Non-patent document 3: Society For Information Display '06 DIGEST, 69.5, pp. 1954-1957 (2006)). Further, a method in which a driving method is changed depending on the movement amount of an image, or a temperature is known (Patent Document 7: Japanese Published Patent Application No. 2002-91400, Patent Document 8: Japanese Published Patent Application No. 2004-177575).

SUMMARY OF THE INVENTION

As described above, various methods have been studied to solve the motion blur of moving images in hold-type display devices. However, such methods does not give sufficient effects and reach the same moving image characteristics as that of impulse type display devices. In addition, in the method in which a black image is inserted to make pseudo impulse type display, more flickers are viewed. Undesirably, the black image insertion causes decrease of an average luminance of an image, and the power consumption is increased to provide the same level of luminance as that in the case of not inserting a black image. In the method of increasing a frame frequency, data processing becomes complicated, and a driver circuit for high speed processing is needed, which causes problems of manufacturing cost, heat generation due to the data processing, and high power consumption.

The present invention has been made in view of the above-described problems. It is an object of the present invention to provide hold-type display devices without motion blur and methods of driving the hold-type display devices. Further, it is other objects of the present invention to provide display devices with low power consumption and methods of driving the display device; to provide display devices with improved image qualities for still images and moving images and methods of driving the display device, to provide display devices with wider viewing angels and methods of driving the display devices; and to provide display devices with improved response speed and methods of driving the display devices.

An aspect of the present invention is a method of driving a liquid crystal display device having a display screen, comprising the step of:

displaying first to third images sequentially on the display screen;

wherein:

the first image and the third image are each formed by an external video signal;

the second image is formed based on the external video signal for the first image and the external video signal for the third image; and the luminance of the second image is lower than the luminance of the first image.

Another aspect of the present invention is a method of driving a liquid crystal display device having a display screen, comprising the step of:

displaying first to third images sequentially on the display screen;

wherein:

the first image and the third image are each formed by an external video signal;

the second image is an image at an intermediate state between the first image and the third image; and the luminance of the second image is lower than the luminance of the first image.

Another aspect of the present invention is a method of driving a liquid crystal display device having a display screen, comprising the step of:

displaying first to third images sequentially on the display screen;

wherein:

the first image and the third image are each formed by an external video signal;

the second image is an interpolation image formed from the first image and the third image; and the luminance of the second image is lower than the luminance of the first image.

Another aspect of the present invention is a method of driving a liquid crystal display device having a display screen, comprising the step of:

displaying first to third images sequentially on the display screen;

wherein:

the first image and the third image are each formed by an external video signal;

the second image is an image formed by motion interpolation from the first image and the third image; and the luminance of the second image is lower than the luminance of the first image.

Another aspect of the present invention is a liquid crystal display device comprising:

a display screen, the display screen sequentially displaying first to third images; and a control circuit, the control circuit comprising:

means for forming the first image and the third image by external video signals;

means for forming the second image based on the external video signal for the first image and the external video signal for the third image; and means for lowering the luminance of the second image than the luminance of the first image.

Another aspect of the present invention is a liquid crystal display device comprising:

a display screen, the display screen sequentially displaying first to third images; and a control circuit, the control circuit comprising:

means for forming the first image and the third image by external video signals;

means for forming the second image to be at an intermediate state between the first image and the third image; and means for lowering the luminance of the second image than the luminance of the first image.

Another aspect of the present invention is a liquid crystal display device comprising:

a display screen, the display screen sequentially displaying first to third images; and a control circuit, the control circuit comprising:

means for forming the first image and the third image by external video signals;

means for forming the second image as an interpolation image formed from the first image and the third image; and means for lowering the luminance of the second image than the luminance of the first image.

Another aspect of the present invention is a liquid crystal display device comprising:

a display screen, the display screen sequentially displaying first to third images; and a control circuit, the control circuit comprising:

means for forming the first image and the third image by external video signals;

means for forming the second image by motion interpolation from the first image and the third image; and means for lowering the luminance of the second image than the luminance of the first image.

Another aspect of the present invention is a method of driving a liquid crystal display device having a display screen, comprising the step of:

displaying first to third images sequentially on the display screen;

wherein:

objects are displayed in the first to the third images;

a position of displaying the object in the first image is different from a position of displaying the object in the third image;

a position of displaying the object in the second image is determined based on the position of displaying the object in the first image and the position of displaying the object in the third image; and the luminance of the object displayed in the second image is lower than the luminance of the object displayed in the first image.

Another aspect of the present invention is a method of driving a liquid crystal display device having a display screen, comprising the step of:

displaying first to third images sequentially on the display screen;

wherein:

objects are displayed in the first to the third images;

a position of displaying the object in the first image is different from a position of displaying the object in the third image;

the object in the second image is displayed at an intermediate position between the position of displaying the object in the first image and the position of displaying the object in the third image; and the luminance of the object displayed in the second image is lower than the luminance of the object displayed in the first image.

Another aspect of the present invention is a method of driving a liquid crystal display device having a display screen, comprising the step of:

displaying first to third images sequentially on the display screen;

wherein:

objects are displayed in the first to the third images;

a position of displaying the object in the first image is different from a position of displaying the object in the third image;

the second image is an image formed by motion interpolation from the first image and the third image; and the luminance of the object displayed in the second image is lower than the luminance of the object displayed in the first image.

Another aspect of the present invention is a method of driving a liquid crystal display device having a display screen, comprising the step of:

displaying first to third images sequentially on the display screen;

wherein:

first and second objects are displayed in the first to the third images;

a position of displaying the first object in the first image is different from a position of displaying the first object in the third image;

a position of displaying the second object in the first image is almost the same a position of displaying the second object in the third image;

a position of displaying the first object in the second image is determined based on the position of displaying the first object in the first image and the position of displaying the first object in the third image;

the luminance of the first object displayed in the second image is lower than the luminance of the first object displayed in the first image; and the luminance of the second object displayed in the second image is lower than the luminance of the second object displayed in the first image.

Another aspect of the present invention is a method of driving a liquid crystal display device having a display screen, comprising the step of:

displaying first to third images sequentially on the display screen;

wherein:

first and second objects are displayed in the first to the third images;

a position of displaying the first object in the first image is different from a position of displaying the first object in the third image;

a position of displaying the second object in the first image is almost the same a position of displaying the second object in the third image;

the second object in the second image is displayed to be at an intermediate position between the position of displaying the second object in the first image and the position of displaying the second object in the third image;

the luminance of the first object displayed in the second image is lower than the luminance of the first object displayed in the first image; and the luminance of the second object displayed in the second image is lower than the luminance of the second object displayed in the first image.

Another aspect of the present invention is a method of driving a liquid crystal display device having a display screen, comprising the step of:

displaying first to third images sequentially on the display screen;

wherein:

first and second objects are displayed in the first to the third images;

a position of displaying the first object in the first image is different from a position of displaying the first object in the third image;

a position of displaying the second object in the first image is almost the same a position of displaying the second object in the third image;

the second image is formed from motion interpolation from the first image and the third image;

the luminance of the first object displayed in the second image is lower than the luminance of the first object displayed in the first image; and the luminance of the second object displayed in the second image is lower than the luminance of the second object displayed in the first image.

Another aspect of the present invention is a liquid crystal display device comprising:

a display screen and a control circuit, wherein:

the display screen sequentially displays first to third images;

objects are displayed in the first to third images;

a position of displaying the object in the first image is different from a position of displaying the object in the third image;

the control circuit includes:

means for determining a position of displaying the object in the second image based on a position of displaying the object in the first image and a position of displaying the object in the third image; and means for lowering the luminance of the object displayed in the second image than the luminance of the object displayed in the first image.

Another aspect of the present invention is a liquid crystal display device comprising:

a display screen and a control circuit, wherein:

the display screen sequentially displays first to third images;

objects are displayed in the first to third images;

a position of displaying the object in the first image is different from a position of displaying the object in the third image;

the control circuit includes:

means for displaying the object in the second image at an intermediate position between a position of displaying the object in the first image and a position of displaying the object in the third image; and means for lowering the luminance of the object displayed in the second image than the luminance of the object displayed in the first image.

A liquid crystal display device comprising:

a display screen and a control circuit, wherein:

the display screen sequentially displays first to third images;

objects are displayed in the first to third images;

a position of displaying the object in the first image is different from a position of displaying the object in the third image;

the control circuit includes:

means for forming the second image by motion interpolation from the first image and the third image; and means for lowering the luminance of the object displayed in the second image than the luminance of the object displayed in the first image.

Another aspect of the present invention is an electronic device including the liquid crystal display device in any of the above-described structures.

In this specification, a method of smoothing moving images by motion interpolation, and a method of suppressing afterimages by provision of a difference in typical luminance between displayed images may be adopted at the same time, or one of the methods may be adopted. Thus, motion blur can be reduced.

It is to be noted that in this specification, the phrase "the luminance is zero" includes a case in which no light is emitted and further a case in which black is substantially displayed. In other words, even if a slight amount of light is emitted, a case in which the lowest grayscale of all grayscales to be displayed is displayed can be regarded as a case in which the luminance is zero.

Note that various types of switches can be used as a switch. An electrical switch, a mechanical switch, and the like are given as examples. That is, any element can be used as long as it can control a current flow, without limiting to a particular element. For example, a transistor (e.g., a bipolar transistor or a MOS transistor) a diode (e.g., a PN diode, a PIN diode, a Schottky diode, a MIM (Metal Insulator Metal) diode, a MIS (Metal Insulator Semiconductor) diode, or a diode-connected transistor), a thyristor, or the like can be used as a switch. Alternatively, a logic circuit combining such elements can be used as a switch.

As examples of mechanical switches, there is a switch formed by a micro electro mechanical system (MEMS) technology, like a digital micro mirror device (DMD). Such a switch includes an electrode which can be moved mechanically, and control connection or non-connection based on the movement of the electrode.

In the case of using a transistor as a switch, polarity (a conductivity type) of the transistor is not particularly limited because it operates just as a switch. However, a transistor of polarity with smaller off-current is preferably used when off-current should be small. A transistor provided with an LDD region, a transistor with a multi-gate structure, and the like are given as examples of a transistor with smaller off-current. In addition, it is preferable that an N-channel transistor be used when a potential of a source terminal of the transistor which is operated as a switch is closer to a potential of a low-potential-side power supply (e.g., Vss, GND, or 0V), while a p-channel transistor be used when the potential of the source terminal is closer to a potential of a high-potential-side power supply (e.g., Vdd). This is because the absolute value of gate-source voltage can be increased when the potential of the source terminal of an N-channel transistor is closer to a potential of a low-potential-side power supply and when the potential of the source terminal of a p-channel transistor is closer to a potential of a high-potential-side power supply so that the transistors can more accurately operate as a switch. This is also because the transistors hardly conduct a source follower operation, so that reduction in output voltage hardly occurs.

Note that a CMOS switch may be employed as a switch by using both N-channel and p-channel transistors. By employing a CMOS switch, the transistor can more precisely operate as a switch because current can flow when either the p-channel transistor or the N-channel transistor is turned on. For example, voltage can be appropriately output regardless of whether voltage of an input signal of the switch is high or low. In addition, since a voltage amplitude value of a signal for turning on or off the switch can be made small, power consumption can be reduced.

Note that also that when a transistor is employed as a switch, the switch includes an input terminal (one of a source terminal and a drain terminal), an output terminal (the other of the source terminal and the drain terminal), and a terminal for controlling electrical conduction (a gate terminal). On the other hand, when a diode is employed as a switch, the switch does not have a terminal for controlling electrical conduction in some cases. Therefore, the number of wirings for controlling terminals can be more reduced than the case of using a transistor when a diode is used as a switch.

Note that when it is explicitly described that "A and B are connected", the case where A and B are electrically connected, the case where A and B are functionally connected, and the case where A and B are directly connected are included therein. Here, each of A and B is an object (e.g., a device, an element, a circuit, a wiring, an electrode, a terminal, a conductive film, or a layer). Accordingly, connections other than the connection described in this specification and illustrated in the drawings are also included, without limitations to predetermined connections, and such connections described in this specification and illustrated in the drawings.

For example, in the case where A and B are electrically connected, one or more elements which enable electrical connection of A and B (e.g., a switch, a transistor, a capacitor, an inductor, a resistor, and/or a diode) may be provided between A and B. In addition, in the case where A and B are functionally connected, one or more circuits which enable functional connection of A and B (e.g., a logic circuit such as an inverter, a NAND circuit, or a NOR circuit, a signal converter circuit such as a DA converter circuit, an AD converter circuit, or a gamma correction circuit, a potential level converter circuit such as a power supply circuit (e.g., a boosting circuit or a voltage lower control circuit) or a level shifter circuit for changing a potential level of a signal, a voltage source, a current source, a switching circuit, or an amplifier circuit such as a circuit which can increase signal amplitude, the amount of current, or the like (e.g., an operational amplifier, a differential amplifier circuit, a source follower circuit, or a buffer circuit), a signal generating circuit, a memory circuit, and/or a control circuit) may be provided between A and B. Alternatively, in the case where A and B are directly connected, A and B may be directly connected without another element or another circuit interposed therebetween.

Note that when it is explicitly described that "A and B are directly connected", the case where A and B are directly connected (i.e., the case where A and B are connected without another element or another circuit interposed therebetween) and the case where A and B are electrically connected (i.e., the case where A and B are connected with another element or another circuit interposed therebetween) are included therein.

Note that when it is explicitly described that "A and B are electrically connected", the case where A and B are electrically connected (i.e., the case where A and B are connected with another element or another circuit interposed therebetween), the case where A and B are functionally connected (i.e., the case where A and B are functionally connected with another circuit interposed therebetween), and the case where A and B are directly connected (i.e., the case where A and B are connected without another element or another circuit interposed therebetween) are included therein. That is, when it is explicitly described that "A and B are electrically connected", the description is the same as the case where it is explicitly only described that "A and B are connected".

Note that a display element, a display device which is a device having a display element, a light-emitting element, and a light-emitting device which is a device having a light-emitting element can employ various types and can include various elements. For example, as a display element, a display device, a light-emitting element, or a light-emitting device, a display medium whose contrast, luminance, reflectivity, transmittivity, or the like changes by an electromagnetic action, such as an EL element (e.g., an organic EL element, an inorganic EL element, or an EL element including both organic and inorganic materials), an electron-emissive element, a liquid crystal element, electronic ink, an electrophoresis element, a grating light valve (GLV), a plasma display panel (PDP), a digital micromirror device (DMD), a piezoelectric ceramic display, or a carbon nanotube can be employed. Note that display devices using an EL element include an EL display; display devices using an electron-emissive element include a field emission display (FED), an SED-type flat panel display (SED: Surface-conduction Electron-emitter Display), and the like; display devices using a liquid crystal element include a liquid crystal display (e.g., a transmissive liquid crystal display, a semi-transmissive liquid crystal display, a reflective liquid crystal display, a direct-view liquid crystal display, or a projection liquid crystal display; and display devices using electronic ink or an electrophoresis element include electronic paper.

Note that an EL element is an EL element including an anode, a cathode and an EL layer interposed between the anode and the cathode. The EL layer may be various types of EL layers, but not limited to, for example, a layer utilizing emission from a singlet exciton (fluorescence), a layer utilizing emission from a triplet exciton (phosphorescence), a layer utilizing emission from a singlet exciton (fluorescence) and emission from a triplet exciton (phosphorescence), a layer including an organic material, a layer including an inorganic material, a layer including an organic material and an inorganic material, a layer including a high molecular material, a layer including a low molecular material, and a layer including a low molecular material and a high molecular material.

Note that an electron-emissive element is an element in which electrons are extracted by high electric field concentration on a sharp cathode. For example, the electron-emissive element may be any one of a spinto-type, a carbon nanotube (CNT) type, a metal-insulator-metal (MIM) type including a stack of a metal, an insulator and a metal, a metal-insulator-semiconductor (MIS) type including a stack of a metal, an insulator and a semiconductor, a MOS type, a silicon type, a thin film diode type, a diamond type, a surface conductive emitter SCD type, a thin film type including a stack of a metal, an insulator, a semiconductor and a metal, a HEED type, an EL type, a porous silicon type, a surface-conduction electron-emitter (SED) type and the like. However, without particular limitations, various elements can be used as an electron-emissive element.

A liquid crystal element is an element which controls transmission or non-transmission of light by an optical modulation action of liquid crystals and includes a pair of electrodes and liquid crystals. The optical modulation action of liquid crystals is controlled by an electric filed applied to the liquid crystal (including a lateral electric field, a vertical electric field and a diagonal electric field). In addition, not-limiting examples of such a liquid crystal element are a nematic liquid crystal, a cholesteric liquid crystal, a smectic liquid crystal, a discotic liquid crystal, a thermotropic liquid crystal, a lyotropic liquid Crystal, a low molecular liquid crystal, a polymer liquid crystal, a ferroelectric liquid crystal, an anti-ferroelectric liquid crystal, a main chain type liquid crystal, a side chain type polymer liquid crystal, a plasma address liquid crystal (a PALC), a banana-shaped liquid crystal, a TN (Twisted Nematic) mode, an STN (Super Twisted Nematic) mode, an IPS (In-Plane-Switching) mode, an FFS (Fringe Field Switching) mode, an MVA (Multi-domain Vertical Alignment) mode, a PVA (Patterned Vertical Alignment), an ASV (Advanced Super View) mode, an ASM (Axially Symmetric aligned Micro-cell) mode, an OCB (Optical Compensated Birefringence) mode, an ECB (Electrically Controlled Birefringence) mode, an FLC (Ferroelectric Liquid Crystal) mode, an AFLC (Anti Ferroelectric Liquid Crystal) mode, a PDLC (Polymer Dispersed Liquid Crystal) mode, and a guest host mode.

Note that an electric paper is a device such as a device using molecules (utilizing optical anisotropy or dye molecular orientation), a device using particles (utilizing electrophoresis, particle movement, particle rotation, or phase change), a display in which one end of a film moves, a display using emission/phase change of molecules, a display using optical absorption by molecules, a display in which electrons and holes are combined to emit light, or the like. For example, not-limiting examples of an electric paper include a microcapsule type electrophoresis device, a horizontal movement type electrophoresis device, a vertical movement type electrophoresis device, a device using a sphere twist ball, a device using a magnetism twist ball, a device using a column twist ball, a device using a charged toner, a device using an electronic powder and granular material, a magnetism electrophoresis type device a magnetism heat-sensitive type device, an electrowetting type device, a light-scattering (transparency/opacity change) type device, a device using a cholesteric liquid crystal/photoconductive layer, a cholesteric liquid crystal type device, a bitable nematic liquid crystal type device, a ferroelectric liquid crystal type device, a dichroism pigment/liquid crystal dispersed type device, a device using a movable film, a leuco dye rewritable (coloring/decoloring) type device, a photochromic device, an electrochromic device, an electrodeposition type device, a device using flexible organic electroluminescence and the like. Various types of electronic papers can be used. By using microcapsule electrophoresis, problems of electrophoresis, i.e., aggregation or precipitation of phoresis particles can be solved. An electronic powder and granular material has advantages such as high speed response, high reflectivity, wide viewing angle, low power consumption, and favorable memory characteristics.

A plasma display includes a substrate having a surface provided with an electrode, and a substrate having a surface provided with an electrode and a minute groove, and a phosphor layer formed in the groove. In the plasma display, the substrates are opposite to each other with a narrow interval and a rare gas is encapsulated therein. In the plasma display, a voltage is applied to the electrodes to generate an ultraviolet ray to excite the phosphor, so that display can be conducted. The plasma display panel may be a DC type PDP or an AC type PDP. Not-limiting examples of driving method of the plasma display are ASW (Address While Sustain) driving, ADS (Address Display Separated) driving in which a sub-frame is divided into a reset period, an address period and a sustain period, CLEAR (Low Energy Address and Reduction of False Contour Sequence) driving, ALIS (Alternate Lighting of Surface) method, TERES (Techbology of Reciprocal Susfainer) driving. Various types of plasma displays can be adopted.

As an example of a display device including a light source, a liquid crystal display device (including a transmissive type liquid crystal display, a semi-transmissive liquid crystal display, a reflective type liquid crystal display, a direct-view type liquid crystal display, a projection type liquid crystal display), and a display device using a grating light valve (GLV), and a display device using a digitally micromirror device (DMD) are given. As not-limiting examples of such a light source used in the above devices, electroluminescence, a cold-cathode tube, a hot cathode tube, LED, a laser light source, a mercury lamp or the like are given. Various light sources can be used.

Note that various types of transistors can be employed without limitations to a particular type. For example, thin film transistors (TFT) including a non-single crystalline semiconductor film typified by amorphous silicon, polycrystalline silicon, microcrystal (also referred to as semi-amorphous) silicon, or the like can be employed. In the case of using such TFTs, there are various advantages. For example, since TFITs can be formed at temperature lower than those using single crystalline silicon, the manufacturing cost can be reduced and a manufacturing device can be made larger. Since the manufacturing device can be made larger, the TFTs can be formed using a large substrate. Therefore, since a large number of display devices can be formed at the same time, they can be formed at low cost. In addition, because the manufacturing temperature is low, a substrate having low heat resistance can be used. Thus, transistors can be formed using a transparent substrate. Further, transmission of light in a display element can be controlled by using the transistors formed using the transparent substrate. Furthermore, a part of a film which forms a transistor can transmit light because film thickness of the transistor is thin. Accordingly, an aperture ratio can be improved.

By using a catalyst (e.g., nickel) in the case of forming polycrystalline silicon, crystallinity can be more improved and a transistor having excellent electric characteristics can be formed. Accordingly, a gate driver circuit (e.g., a scan line driver circuit), a source driver circuit (e.g., a signal line driver circuit), and a signal processing circuit (e.g., a signal generation circuit, a gamma correction circuit, or a DA converter circuit) can be formed over the same substrate.

In addition, by using a catalyst (e.g., nickel) in the case of forming microcrystal silicon, crystallinity can be more improved and a transistor having excellent electric characteristics can be formed. At this time, crystallinity can be improved by performing heat treatment without conducting laser irradiation. Accordingly, a gate driver circuit (e.g., a scan line driver circuit) and a part of a source driver circuit (e.g., an analog switch) can be formed on the same substrate. In addition, in the case of not using a laser for crystallization, crystallinity unevenness (mura) of silicon can be suppressed. Therefore, an image having high image quality can be displayed.

Note that polycrystalline silicon and microcrystal silicon can be formed without using a catalyst (such as nickel).

The crystallinity of silicon is preferably enhanced to poly crystallinity or micro crystallinity in the whole panel, but not limited thereto. In only a part of the panel, the crystallinity of silicon can be increased. The selective enhancement in crystallinity can be done by selective laser irradiation or the like. For example, only a peripheral driver circuit portion excluding pixels may be irradiated with laser light, or only a region of a gate driver circuit and/or a source driver circuit may be irradiated with laser light. Alternatively, only a part of a source driver circuit (for example, analog switch) may be irradiated with laser light. As a result, the crystallinity of silicon in only a region necessary for a high speed operation circuit can be increased. A pixel region is not especially needed to operate at high speed, and thus if the crystallinity is not increased, a pixel circuit can operate without problems. Thus, since the region whose crystallinity is increased is small, the manufacturing process can be shortened, the throughput can be increased, and the manufacturing cost can be reduced. Since the number of necessary manufacturing devices is small, the manufacturing cost can be reduced.

In addition, a transistor can be formed by using a semiconductor substrate, an SOI substrate, or the like. Therefore, a transistor with almost no variations in characteristics, sizes, shapes, or the like, with high current supply capacity, and with a small size can be formed. By using such a transistor, power consumption of a circuit can be reduced or a circuit can be highly integrated.

In addition, a transistor including a compound semiconductor or an oxide semiconductor such as ZnO, a-InGaZnO, SiGe, GaAs, IZO, ITO, or SnO, and a thin film transistor or the like obtained by thinning such a compound semiconductor or a oxide semiconductor can be used. Therefore, manufacturing temperature can be lowered and for example, such a transistor can be formed at room temperature. Accordingly, the transistor can be formed directly on a substrate having low heat resistance such as a plastic substrate or a film substrate. Note that such a compound semiconductor or an oxide semiconductor can be used for not only a channel portion of a transistor but also in other applications. For example, such a compound semiconductor or an oxide semiconductor can be used for a resistor, a pixel electrode, or a transparent electrode. Further, since such an element can be formed at the same time as the transistor, the cost can be reduced.

Transistors or the like formed by using an inkjet method or a printing method can also be used. Accordingly, transistors can be formed at room temperature, can be formed at a low vacuum, or can be formed using a large substrate. In addition, since transistors can be formed without using a mask (a reticle), layout of the transistors can be easily changed. Further, since it is not necessary to use a resist, the material cost is reduced and the number of steps can be reduced. Furthermore, since a film is formed only in a necessary portion, a material is not wasted compared with a manufacturing method in which etching is performed after a film is formed over the entire surface, so that the cost can be reduced.

Further, transistors or the like including an organic semiconductor or a carbon nanotube can be used. Accordingly, such transistors can be formed using a bendable or flexible substrate. Therefore, such transistors can resist a shock.

In addition, various types of transistors can be used. For example, a MOS transistor, a junction transistor, a bipolar transistor, or the like can be employed. Since a MOS transistor has a small size, a large number of transistors can be mounted. The use of a bipolar transistor can allow large current to flow, thereby operating a circuit at high speed.

Further, a MOS transistor, a bipolar transistor and/or the like may be mixed on a one substrate. Thus, low power consumption, reduction in size and high speed operation can be achieved.

Furthermore, various transistors other than the above-described types of transistors can be used.

Moreover, transistors can be formed using various types of substrates. The type of a substrate is not limited to a certain type. For example, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used as a substrate. Alternatively, a skin (e.g., cuticle or corium) or hypodermal tissue of an animal such as a human being can be used as a substrate. In addition, transistors may be formed using a substrate, and then, the transistors may be transferred to another substrate. As a substrate to which the transistors are transferred, a single crystalline substrate, an SOI substrate, a glass substrate, a quartz substrate, a plastic substrate, a paper substrate, a cellophane substrate, a stone substrate, a wood substrate, a cloth substrate (including a natural fiber (e.g., silk, cotton, or hemp), a synthetic fiber (e.g., nylon, polyurethane, or polyester), a regenerated fiber (e.g., acetate, cupra, rayon, or regenerated polyester), or the like), a leather substrate, a rubber substrate, a stainless steel substrate, a substrate including a stainless steel foil, or the like can be used. Alternatively, a skin (e.g., cuticle or corium) or hypodermal tissue of an animal such as a human being can be used. By using such a substrate, transistors with excellent properties or transistors with low power consumption can be formed, a device with high durability or high heat resistance can be formed, or reduction in weight or thinning can be achieved.

A structure of a transistor can be various modes without limiting to a certain structure. For example, a multi-gate structure having two or more gate electrodes may be used. When the multi-gate structure is used, a structure where a plurality of transistors are connected in series is provided because channel regions are connected in series. By using the multi-gate structure, off-current can be reduced or the withstand voltage of transistors can be increased to improve reliability. Alternatively, by using the multi-gate structure, drain-source current does not fluctuate very much even if drain-source voltage fluctuates when the transistor operates in a saturation region, so that a slope of voltage-current characteristics can be flat. By utilizing the characteristics that the slope of the voltage-current characteristics is flat, an ideal current source circuit or an active load having a extremely high resistance value can be provided. Accordingly, a differential circuit or a current mirror circuit having excellent properties can be provided.

As another example, a structure where gate electrodes are formed above and below a channel may be used. By using the structure where gate electrodes are formed above and below the channel, a channel region is enlarged, so that the amount of current flowing therethrough can be increased or a depletion layer can be easily formed to decrease a subthreshold swing (S value). When the gate electrodes are formed above and below the channel, a structure where a plurality of transistors are connected in parallel is provided.

Further, a structure where a gate electrode is formed above a channel, a structure where a gate electrode is formed below a channel, a staggered structure, an inversely staggered structure, a structure where a channel region is divided into a plurality of regions, a structure where channel regions are connected in parallel or a structure where channel regions are connected in series can be employed. In addition, a source electrode or a drain electrode may overlap with a channel region (or part of it). By using the structure where the source electrode or the drain electrode may overlap with the channel region (or part of it), an unstable operation due to electric charges accumulated in part of the channel region can be prevented. Further, an LDD region may be provided. By providing the LDD region, off-current can be reduced or the withstand voltage of transistors can be increased to improve reliability. Alternatively, by providing the LDD region, drain-source current does not fluctuate so much even if drain-source voltage fluctuates when a transistor operates in the saturation region, so that a slope of voltage-current characteristics can be flat.

Various types of transistors can be used and transistors can be formed using various types of substrates. Accordingly, all of the circuits which are necessary to realize a desired function can be formed using the same substrate. For example, all of the circuits which are necessary to realize a desired function can be formed using a glass substrate, a plastic substrate, a single crystalline substrate, an SOI substrate, or any other substrate. When all of the circuits which are necessary to realize a desired function are formed using the same substrate, the number of component parts can be reduced to cut the cost or the number of connections between circuit components can be reduced to improve reliability. Alternatively, part of the circuits which are necessary to realize a desired function may be formed using one substrate and another part of the circuits which are necessary to realize a desired function may be formed using another substrate. That is, not all of the circuits which are necessary to realize a desired function are required to be formed using the same substrate. For example, part of the circuits which are necessary to realize a desired function may be formed with transistors using a glass substrate and another part of the circuits which are necessary to realize the desired function may be formed using a single crystalline substrate, so that an IC chip formed from transistors formed using the single crystalline substrate may be connected to the glass substrate by COG (Chip On Glass) and the IC chip may be provided on the glass substrate. Alternatively, the IC chip may be connected to the glass substrate by TAB (Tape Automated Bonding) or a printed wiring board. When part of the circuits are formed using the same substrate in this manner, the number of the component parts can be reduced to cut the cost or the number of connections between the circuit components can be reduced to improve reliability. Alternatively, since circuits in a portion with high driving voltage or a portion with high driving frequency consume large power, the circuits in such portions are not formed on the same substrate, and instead, the circuits are formed using e.g., a single crystalline substrate and an IC chip formed from the circuits is used, which leads to prevention of increase in power consumption.

Note that one pixel corresponds to one element whose brightness can be controlled. Therefore, as an example, one pixel corresponds to one color element and brightness is expressed with the one color element. Accordingly, in the case of a color display device having color elements of R (Red), G (Green), and B (Blue), a minimum unit of an image is formed of three pixels of an R pixel, a G pixel, and a B pixel. Note that the color elements are not limited to three colors, and color elements of more than three colors may be used or a color other than RGB may be added. For example, RGBW (W corresponds to white) may be used by adding white. In addition, RGB plus one or more colors of yellow, cyan, magenta, emerald green, vermilion, and the like may be used. Further, a color similar to at least one of R, G and B may be added to RGB. For example, R, G, B1, and B2 may be used. Although both B1 and B2 are blue, they have slightly different frequency. Similarly, R1, R2, G, and B may be used. By using such color elements, display which is closer to the real object can be performed or power consumption can be reduced. Alternatively, as another example, in the case of controlling brightness of one color element by using a plurality of regions, one region may correspond to one pixel. Therefore, as an example, in the case of performing area ratio grayscale display or the case of including subpixels, a plurality of regions which control brightness are provided in each color element and grayscales are expressed with the all regions. In this case, one region which controls brightness may correspond to one pixel. Thus, in this case, one color element includes a plurality of pixels. Alternatively, even when a plurality of regions which control brightness are provided in one color element, one color element including the plurality of regions may correspond to one pixel. Thus, in this case, one color element includes one pixel. Further, when brightness is controlled by a plurality of regions in each color element, regions which contribute to display have different area dimensions depending on pixels in some cases. In addition, in a plurality of regions which control brightness in each color element, signals supplied to each of the plurality of regions may be slightly varied to widen a viewing angle. That is, potentials of pixel electrodes included in a plurality of regions provided in each color element may be different from each other. Accordingly, voltage applied to liquid crystal molecules are varied depending on the pixel electrodes. Therefore, the viewing angles can be widened.

Note that when "one pixel (for three colors)" is explicitly described, it corresponds to the case where three pixels of R, G, and B are considered as one pixel. Meanwhile, when "one pixel (for one color)" is explicitly described, it corresponds to the case where a plurality of regions are provided in each color element and collectively considered as one pixel.

Note that pixels are provided (arranged) in matrix in some cases. Here, description that pixels are provided (arranged) in matrix includes the case where the pixels are arranged in a straight line and the case where the pixels are arranged in a jagged line, in a longitudinal direction or a lateral direction. Therefore, in the case of performing full color display with three color elements (e.g., RGB), a case where pixels are arranged in stripes and a case where dots of the three color elements are arranged in a delta pattern are included. Additionally, a case which dots of the three color elements are provided in Bayer arrangement are also included. Note that the color elements are not limited to three colors, and more than three color elements may be employed. RGBW (W corresponds to white), RGB plus one or more of yellow, cyan, magenta, and the like, or the like is given as an example. Further, the sizes of display regions may be different between respective dots of color elements. Thus, power consumption can be reduced and the life of a display element can be prolonged.

Furthermore, an active matrix method in which an active element is included in a pixel or a passive matrix method in which an active element is not included in a pixel can be used.

In the active matrix method, as an active element (a non-linear element), not only a transistor but also various active elements (non-linear elements) can be used. For example, a MIM (Metal Insulator Metal), a TFD (Thin Film Diode), or the like can also be used. Since such an element needs fewer number of manufacturing steps, the manufacturing cost can be reduced or a yield can be improved. Further, since the size of such an element is small, an aperture ratio can be improved, so that power consumption can be reduced and higher luminance can be achieved.

As a method other than the active matrix method, the passive matrix method in which an active element (a non-linear element) is not used can also be used. Since an active element (a non-linear element) is not used, the manufacturing steps are fewer, so that the manufacturing cost can be reduced or the yield can be improved. Further, since an active element (a non-linear element) is not used, the aperture ratio can be improved, so that power consumption can be reduced and high luminance can be achieved.

Note that a transistor is an element having at least three terminals of a gate, a drain, and a source. The transistor has a channel region between a drain region and a source region, and current can flow through the drain region, the channel region, and the source region. Here, since the source and the drain of the transistor may change depending on the structure, the operating condition, etc., of the transistor, it is difficult to define which is a source or a drain. Therefore, in this specification (including description, scope of claims, drawings and the like), a region functioning as a source and a drain is not called the source or the drain in some cases. In such a case, for example, one of the source and the drain may be described as a first terminal and the other thereof may be described as a second terminal. Alternatively, one of the source and the drain may be described as a first electrode and the other thereof may be described as a second electrode. Further alternatively, one of the source and the drain may be described as a source region and the other thereof may be called a drain region.

Note also that a transistor may be an element having at least three terminals of a base, an emitter, and a collector. In this case also, one of the emitter and the collector may be similarly called a first terminal and the other terminal may be called a second terminal.

A gate corresponds to the whole or part of a gate electrode and a gate wiring (also called a gate line, a gate signal line, a scan line, a scan signal line, or the like). A gate electrode corresponds to part of a conductive film which overlaps with a semiconductor which forms a channel region with a gate insulating film interposed therebetween. Note that part of the gate electrode overlaps with an LDD (Lightly Doped Drain) region, the source region (or the drain region) with the gate insulating film interposed therebetween in some cases. A gate wiring corresponds to a wiring for connecting a gate electrode of each transistor to each other, a wiring for connecting a gate electrode of each pixel to each other, or a wiring for connecting a gate electrode to another wiring.

However, there is a portion (a region, a conductive film, a wiring, or the like) which functions as both a gate electrode and a gate wiring. Such a portion (a region, a conductive film, a wiring, or the like) may be called either a gate electrode or a gate wiring. That is, there is a region where a gate electrode and a gate wiring cannot be clearly distinguished from each other. For example, in the case where a channel region overlaps with part of an extended gate wiring, the overlapped portion (region, conductive film, wiring, or the like) functions as both a gate wiring and a gate electrode. Accordingly, such a portion (a region, a conductive film, a wiring, or the like) may be called either a gate electrode or a gate wiring.

In addition, a portion (a region, a conductive film, a wiring, or the like) which is formed of the same material as a gate electrode, forms the same island as the gate electrode to be connected to the gate electrode may also be called a gate electrode. Similarly, a portion (a region, a conductive film, a wiring, or the like) which is formed of the same material as a gate wiring, forms the same island as the gate wiring to be connected to the gate wiring may also be called a gate wiring. In a strict sense, such a portion (a region, a conductive film, a wiring, or the like) does not overlap with a channel region or does not have a function of connecting a gate electrode to another gate electrode in some cases. However, there is a portion (a region, a conductive film, a wiring, or the like) which is formed of the same material as a gate electrode or a gate wiring, forms the same island as the gate electrode or the gate wiring to be connected to the gate electrode or the gate wiring because of conditions in the manufacturing process. Thus, such a portion (a region, a conductive film, a wiring, or the like) may also be called either a gate electrode or a gate wiring.

In a multi-gate transistor, for example, a gate electrode is often connected to another gate electrode by using a conductive film which is formed of the same material as the gate electrodes. Since such a portion (a region, a conductive film, a wiring, or the like) is a portion (a region, a conductive film, a wiring, or the like) for connecting the gate electrode to the another gate electrode, it may be called a gate wiring, but it may also be called a gate electrode because a multi-gate transistor can be considered as one transistor. That is, a portion (a region, a conductive film, a wiring, or the like) which is formed of the same material as a gate electrode or a gate wiring, forms the same island as the gate electrode or the gate wiring to be connected to the gate electrode or the gate wiring may be called either a gate electrode or a gate wiring. In addition, for example, part of a conductive film which connects a gate electrode and a gate wiring and is formed from a different material from the gate electrode and the gate wiring may also be called either a gate electrode or a gate wiring.

Note that a gate terminal corresponds to part of a portion (a region, a conductive film, a wiring, or the like) of a gate electrode or a portion (a region, a conductive film, a wiring, or the like) which is electrically connected to the gate electrode.

Note that when a wiring is called a gate wiring, a gate line, a gate signal line, a scan line, or a scan signal line, there is a case in which a gate of a transistor is not connected to a wiring. In this case, the gate wiring, the gate line, the gate signal line, the scan line, or the scan signal line corresponds to a wiring formed in the same layer as the gate of the transistor, a wiring formed of the same material of the gate of the transistor, or a wiring formed at the same time as the gate of the transistor in some cases. As examples, a wiring for storage capacitor, a power supply line, a reference potential supply line, and the like can be given.

Note also that a source corresponds to the whole or part of a source region, a source electrode, and a source wiring (also called a source line, a source signal line, a data line, a data signal line, or the like). A source region corresponds to a semiconductor region containing a large amount of p-type impurities (e.g., boron or gallium) or n-type impurities (e.g., phosphorus or arsenic). Accordingly, a region containing a small amount of p-type impurities or n-type impurities, namely, an LDD (Lightly Doped Drain) region is not included in the source region. A source electrode is part of a conductive layer formed of a material different from that of a source region, and electrically connected to the source region. However, there is a case where a source electrode and a source region are collectively called a source electrode. A source wiring is a wiring for connecting source electrodes of transistors to each other, a wiring for connecting source electrodes of pixels to each other, or a wiring for connecting a source electrode to another wiring.

However, there is a portion (a region, a conductive film, a wiring, or the like) functioning as both a source electrode and a source wiring. Such a portion (a region, a conductive film, a wiring, or the like) may be called either a source electrode or a source wiring. That is, there is a region where a source electrode and a source wiring cannot be clearly distinguished from each other. For example, in a case where a source region overlaps with part of an extended source wiring, the overlapped portion (region, conductive film, wiring, or the like) functions as both a source wiring and a source electrode. Accordingly, such a portion (a region, a conductive film, a wiring, or the like) may be called either a source electrode or a source wiring.

In addition, a portion (a region, a conductive film, a wiring, or the like) which is formed of the same material as a source electrode, forms the same island as the source electrode to be connected to the source electrode, or a portion (a region, a conductive film, a wiring, or the like) which connects a source electrode and another source electrode may also be called a source electrode. Further, a portion which overlaps with a source region may be called a source electrode. Similarly, a portion (a region, a conductive film, a wiring, or the like) which is formed of the same material as a source wiring, forms the same island as the source wiring to be connected to the source wiring may also be called a source wiring. In a strict sense, such a portion (a region, a conductive film, a wiring, or the like) does not have a function of connecting a source electrode to another source electrode in some cases. However, there is a portion (a region, a conductive film, a wiring, or the like) which is formed of the same material as a source electrode or a source wiring, and is connected to the source electrode or the source wiring because of conditions in the manufacturing process. Thus, such a portion (a region, a conductive film, a wiring, or the like) may also be called either a source electrode or a source wiring.

In addition, for example, part of a conductive film which connects a source electrode and a source wiring and is formed of a material different from that of the source electrode or the source wiring may be called either a source electrode or a source wiring.

Note that a source terminal corresponds to part of a source region, a source electrode, or a portion (a region, a conductive film, a wiring, or the like) which is electrically connected to the source electrode.

Note that when a wiring is called a source wiring, a source line, a source signal line, a data line, or a data signal line, there is a case in which a source (a drain) of a transistor is not connected to a wiring. In this case, the source wiring, the source line, the source signal line, the data line, or the data signal line corresponds to a wiring formed in the same layer as the source (the drain) of the transistor, a wiring formed of the same material of the source (the drain) of the transistor, or a wiring formed at the same time as the source (the drain) of the transistor in some cases. As examples, a wiring for storage capacitor, a power supply line, a reference potential supply line, and the like can be given.

Note also that the same can be applied to a drain.

Note also that a semiconductor device corresponds to a device having a circuit including a semiconductor element (e.g., a transistor, a diode, or thyristor). The semiconductor device may be general devices that can function by utilizing semiconductor characteristics. Furthermore, devices including a semiconductor material are also referred to as semiconductor devices.

Note also that a display element corresponds to an optical modulation element, a liquid crystal element, a light-emitting element, an EL element (an organic EL element, an inorganic EL element, or an EL element including organic and inorganic materials), an electron-emissive element, an electrophoresis element, a discharging element, a light-reflecting element, a light diffraction element, a digital micromirror device (DMD), or the like. Note that the present invention is not limited to these examples.

In addition, a display device corresponds to a device having a display element. Note that a display device may include a plurality of pixels including a display element. In addition, a display device may include a peripheral driver circuit for driving the plurality of pixels. The peripheral driver circuit for driving the plurality of pixels may be formed on the same substrate as the plurality of pixels. In addition, a display device may also include a peripheral driver circuit provided over a substrate by wire bonding or bump bonding, namely, an IC chip connected by chip on glass (COG) or an IC chip connected by TAB or the like. Further, a display device may include a flexible printed circuit (FPC) to which an IC chip, a resistor, a capacitor, an inductor, a transistor, or the like is attached. Note that a display device includes a printed wiring board (PWB) which is connected through a flexible printed circuit (FPC) and to which an IC chip, a resistor, a capacitor, an inductor, a transistor, or the like is attached. A display device may also include an optical sheet such as a polarizing plate or a retardation plate. A display device may also include a lighting device, a housing, an audio input and output device, a light sensor, and the like. Here, a lighting device such as a backlight unit may include a light guide plate, a prism sheet, a diffusion sheet, a reflective sheet, a light source (e.g., an LED or a cold cathode tube), a cooling device (e.g., a water cooling device or an air cooling device), or the like.

Moreover, a lighting device corresponds to a device having a backlight unit, a light guide plate, a prism sheet, a diffusion sheet, a reflective sheet, or a light source (e.g., an LED, a cold cathode tube, or a hot cathode tube), a cooling device, or the like.

In addition, a light-emitting device corresponds to a device having e.g., a light-emitting element. When a light-emitting element is used as a display element, a light-emitting device is a typical example of a display device.

Note that a reflective device corresponds to a device having a light-reflecting element, a light-diffraction element, a light-reflecting electrode, or the like.

A liquid crystal display device corresponds to a display device including a liquid crystal element. Liquid crystal display devices include a direct-view liquid crystal display, a projection liquid crystal display, a transmissive liquid crystal display, a semi-transmissive liquid crystal display, a reflective liquid crystal display, and the like.

Note also that a driving device corresponds to a device having a semiconductor element, an electric circuit, an electronic circuit and/or the like. For example, a transistor which controls input of a signal from a source signal line to a pixel (also called a selection transistor, a switching transistor, or the like), a transistor which supplies voltage or current to a pixel electrode, a transistor which supplies voltage or current to a light-emitting element, and the like are examples of the driving device. A circuit which supplies a signal to a gate signal line (also called a gate driver, a gate line driver circuit, or the like), a circuit which supplies a signal to a source signal line (also called a source driver, a source line driver circuit, or the like) are also examples of the driving device.

Note that a display device, a semiconductor device, a light-ing device, a cooling device, a light-emitting device, a reflective device, a driving device, and the like are provided together in some cases. For example, a display device includes a semiconductor device and a light-emitting device in some cases. Alternatively, a semiconductor device includes a display device and a driving device in some cases.

When "B is formed on A" or "B is formed over A" is explicitly described, it does not necessarily mean that B is formed in direct contact with A. The description includes a case where A and B are not in direct contact with each other, i.e., a case where another object is interposed between A and B. Here, each of A and B corresponds to an object (e.g., a device, an element, a circuit, a wiring, an electrode, a terminal, a conductive film, or a layer).

Accordingly, for example, when "a layer B is formed on (or over) a layer A" is explicitly described, it includes both a case where the layer B is formed in direct contact with the layer A, and a case where another layer (e.g., a layer C or a layer D) is formed in direct contact with the layer A, and the layer B is formed in direct contact with the layer C or D. Note that another layer (e.g., a layer C or a layer D) may be a single layer or a plurality of layers.

Similarly, when "B is formed above (or over) A" is explicitly described, it does not necessarily mean that B is formed in direct contact with A, and another object may be interposed between A and B. Accordingly, for example, when "a layer B is formed above a layer A" is explicitly described, it includes both a case where the layer B is formed in direct contact with the layer A, and a case where another layer (e.g., a layer C or a layer D) is formed in direct contact with the layer A, and the layer B is formed in direct contact with the layer C or D. Note that another layer (e.g., a layer C or a layer D) may be a single layer or a plurality of layers.

Note that when it is explicitly described that B is formed in direct contact with A, it includes not the case where another object is interposed between A and B but the case where B is formed in direct contact with A.

Note that the same can be applied to a case where "B is formed below or under A" is explicitly described.

Explicit singular forms preferably mean singular forms. However, without being limited to this, such singular forms can include plural forms. Similarly, explicit plural forms preferably mean plural forms. However, without being limited to this, such plural forms can include singular forms.

In accordance with the present invention, an amount of a moving image is detected from image data included in frames to make an image at the intermediate state between the image of the current frame and the next image of the next frame as an interpolation image. Thus, the movement of the image can follow the movement of human eyes, and thus the movement of images can be smoothed. Further, the luminance of the interpolation image is changed, and thus, display can be made close to pseudo impulse type display and afterimages are not perceived by human eyes. In this manner, hold-type display device without motion blur and methods of driving the hold-type display devices can be provided.

DETAILED DESCRIPTION OF THE INVENTION

Embodiment Modes

Figure 1A:
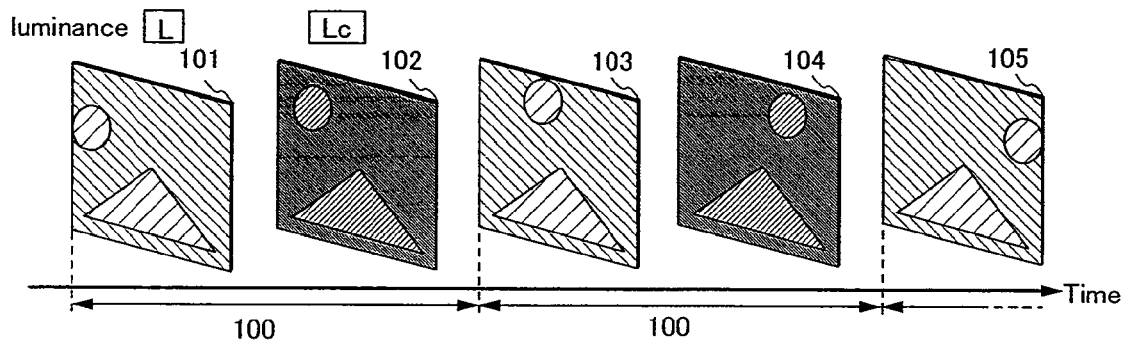
FIGS. 1A to 1C illustrate modes of the present invention.

Embodiment Modes of the present invention will now be described. However, the present invention can be carried out in many different modes. Note that it is easily understood by those skilled in the art that the present invention is not limited to the following description and various changes may be made in modes and details without departing from the spirit and the scope of the present invention. Therefore, the present invention should not be limited to the descriptions of the embodiment modes below in this specification.

Embodiment Mode 1

Embodiment Mode 1 will describe a method of driving a display device or a semiconductor device of this specification to reduce motion blur, as an example.

In this embodiment mode, a case is mainly described, in which, when a frame rate of an image data to be input (which is the number of frames per second and also referred to as a input frame rate) and a frame rate of display (also referred to as a display frame rate) are compared, the display frame rate is higher than the input frame rate. Specifically, while the input frame rate is 60 Hz, the display frame rate may be 90 Hz, 120 Hz, or 180 Hz. In addition, while the input frame rate is 50 Hz, the display frame rate is 75 Hz, 100 Hz, or 150 Hz. However, without limitations, various values may be adopted for the input frame rates and display frame rates.

When the input frame rate is higher than the display frame rate, a part of the image data to be input is abandoned so that the display frame rate can be satisfied. However, as in this embodiment mode, the display frame rate is higher than the input frame rate, the display frame rate cannot be satisfied by only the input image data. At this time, the input image data is interpolated in some way to satisfy the display frame rate.

In this specification, an image which is displayed in accordance with the input frame rate is referred to as a basic image and an image which is made to interpolate the basic image is referred to as an interpolation image. As a method of making an interpolation image, there are methods, such as a method in which the movement amount of an image, i.e., how much the image is moved, is detected from image data in frames, and an intermediate image between the image data is made as an interpolation image; a method in which a basic image is used as an interpolation image; a method in which an image obtained by multiplying luminance of a basic image by a coefficient.

The intermediate image used here is an image which is anticipated within the range of movement when the difference between plural image data is regarded as the movement of the image. In other words, the image having an image data obtained by interpolation from the difference between plural image data is referred to as an intermediate image.

Here, the difference between the interpolation image and the intermediate image is clarified. The interpolation image is an image which is inserted between basic images to interpolate the difference between the input frame and the display frame rate and there are no particular limitations on the image data included in the interpolation image. On the other hand, the intermediate image is an image having an image data obtained by interpolation. In other words, when the difference between the input frame rate and the display frame rate is interpolated, an intermediate image can be used as an interpolation image or another image can be used.

An intermediate image is obtained by interpolation from the difference between plural image data, which is referred to as motion interpolation.

In this embodiment mode, a movement amount of an image, i.e., how much the image is moved, is detected from the image data in frames, and an image at the intermediate state of the frame and the next frame is an interpolation image and the luminance of the interpolation image is changed.

Figure 1B:
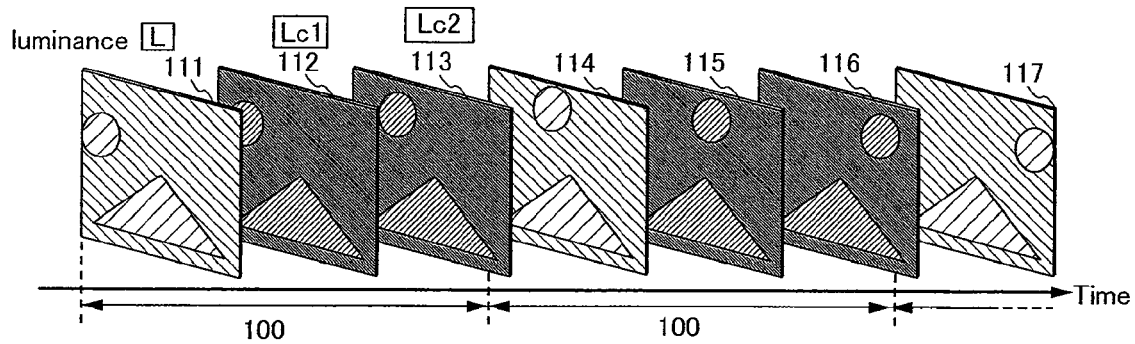
Figure 1C:
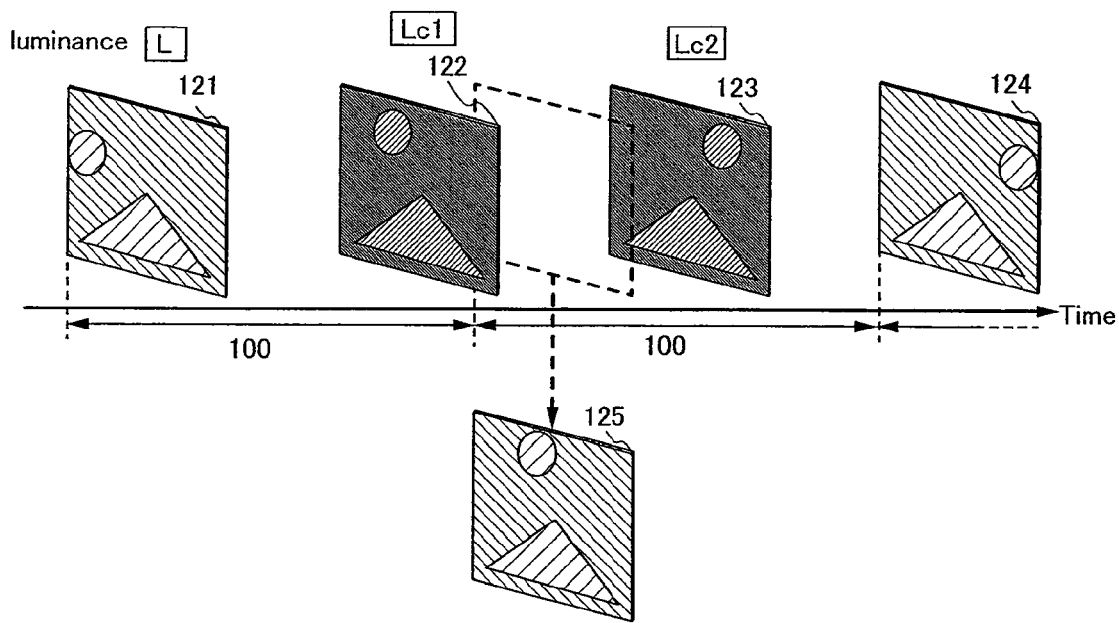

With reference to FIGS. 1A to 1C, a method of reducing motion blur is described as an example. In the methods illustrated in FIGS. 1A to 1C, circular regions in the images are moved in frames, while triangle regions in the images are not moved in the frames. Note that the image is only one example for explanation, and the image to be displayed is not limited to this example. The methods illustrated in FIGS. 1A to 1C can be applied to various images.

FIG. 1A illustrates a mode in which the display frame rate is twice as high as the input frame rate. FIG. 1A schematically illustrates the change with time of images to be displayed with time indicated by the horizontal axis. The period 100 denotes one frame period. A first image 101 denotes a basic image of the previous frame, a second image 102 is an interpolation image of the previous frame, a third image 103 is a basic image of the current frame, a fourth image 104 is an interpolation image of the current frame, and a fifth image 105 is a basic image of the next frame.

The second image 102 is an image which is made by detection of the movement amount of the image from the first image 101 to the third image 103 (i.e., the movement amount of the image), and the second image 102 is an image at the intermediate state of the first image 101 and the third image 103. FIG. 1A illustrates the image at the intermediate state of the region which is changed from frame to frame (the circular region) and the region which is not changed from frame to frame (the triangle region). In other words, the position of the circular region in the second image 102 is an intermediate position between the positions of the circular regions in the first image 101 and the third image 103. Thus, the second image 102 interpolates the image data by motion interpolation. In this manner, the moving image is interpolated to interpolate the image data, thereby providing smooth display.

Further, the second image 102 is image at the intermediate state between the first image 101 and the third image 103, and further, may have luminance which is controlled by a certain rule. The certain rule is, for example, as shown in FIG. 1A, the typical luminance of the first image 101 is L and the typical luminance of the second image 102 is Lc, which preferably satisfies $L>Lc$. Preferably, they satisfy $0.1 L<Lc<0.8 L$, more preferably $0.2 L<Lc<0.5 L$. By control of the luminance to satisfy the expression, display can be made pseudo impulse type display, and thus afterimages are not perceived by human eyes.

The typical luminance of the image will be described later with reference to FIGS. 3A to 3E.

Two different causes of motion blur (non-smoothness in movement of images and afterimages to human eyes) are removed at one time, so that motion blur can be drastically reduced.

Moreover, the fourth image 104 which is an interpolation image may be formed in the same way, from the third image 103 and the fifth image 105. In other words, the fourth image 104 is an image to be at the intermediate state between the third image 103 and the fifth image 105 by detection of the movement amount of the image from the third image 103 to the fifth image 105, and further, may be an image whose luminance is controlled by a certain rule.

FIG. 1B illustrates a mode in which the display frame rate is three times as high as the input frame rate. FIG. 1B schematically illustrates the change with time of images to be displayed with time indicated by the horizontal axis. The period 100 denotes one frame period. A first image 111 denotes a basic image of the previous frame, a second image 112 is a first interpolation image of the previous frame, a third image 113 is a second interpolation image of the previous frame, a fourth image 114 is a basic image of the current frame, a fifth image 115 is a first interpolation image of the current frame, and a sixth image 116 is a second interpolation image of the current frame, and a seventh image 117 is a basic image of the next frame.

The second image 112 and the third image 113 may be images which are made by detection of the movement amount of the image from the first image 111 to the fourth image 114, and the second image 112 and the third image 113 may be images at the intermediate state of the first image 111 and the fourth image 114. FIG. 1B illustrates the image at the intermediate state of the region which is changed from frame to frame (the circular region) and the region which is not changed from frame to frame (the triangle region). In other words, the positions of the circular regions in the second image 112 and the third image 113 are intermediate positions between the positions of the circular regions in the first image 111 and the fourth image 114. Specifically, the movement amount of the circular region detected from the first image 111 and the fourth image 114 (i.e., how much the image is changed) is X. At this time, the circular region in the second image 112 may be displaced by about $\frac{1}{3}X$ from the position of the circular region in the first image 111. Further, the circular region in the third image 113 may be displaced by about $\frac{2}{3}X$ from that of the first image 111. Thus, the second image 112 and the third image 113 interpolate the image data by motion interpolation. In this manner, the moving image is interpolated to interpolate the image data, thereby providing smooth display.

Moreover, the second image 112 and the third image 113 are images at the intermediate state between the first image 111 and the fourth image 114, and further, may have luminance controlled by a certain rule. The certain rule is, for example, as shown in FIG. 1B, the typical luminance of the first image 111 is L, the typical luminance of the second image 112 is Lc1, and the typical luminance of the third image 113 is Lc2, which preferably satisfies $L>Lc1$, $L>Lc2$ or $Lc1=Lc2$. Preferably, they satisfy $0.1 L<Lc1=Lc2<0.8 L$, more preferably $0.2 L<Lc1=Lc2<0.5 L$. By control of the luminance to satisfy the expression, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced.

The fifth image 115 and the sixth image 116 which are interpolation images may be formed in a similar way to the forth image 114 and the seventh image 117 which are basic images. In other words, the fifth image 115 and the sixth image 116 are images to be at the intermediate state between the fourth image 114 and the seventh image 117 by detection the movement amount of the image from the fourth image 114 to the seventh image 117, and further may have luminance controlled by a certain rule.

By the method of FIG. 1B, the display frame rate is so high that the movement of the image can follow the movement of human eyes, thereby providing smooth movement in displaying and drastically reducing the motion blur.

FIG. 1C illustrates a mode in which the display frame rate is 1.5 times as high as the input frame rate. FIG. 1C schematically illustrates the change with time of images to be displayed with time indicated by the horizontal axis. The period 100 denotes one frame period. A first image 121 denotes a basic image of the previous frame, a second image 122 is a first interpolation image, a third image 123 is a second interpolation image, and a fourth image 124 is a basic image of the next frame. Note that a fifth image 125 as input image data is a basic image of the current frame, although it may not be actually displayed, and may be used to make the second image 122 and the third image 123.

The second image 122 and the third image 123 are images which are made by detection of the movement amount of the image from the first image 121 to the fourth image 124 via the fifth image 125, and the second image 122 and the third image 123 are images at the intermediate state of the first image 121 and the fourth image 124. FIG. IC illustrates the image at the intermediate state of the region which is changed from frame to frame (the circular region) and the region which is not changed from frame to frame (the triangle region). In other words, the position of the circular regions in the second image 122 and the third image 123 are intermediate positions between the positions of the circular regions in the first image 121 and the fourth image 124. Thus, the second image 122 and the third image 123 interpolate the image data by motion interpolation. In this manner, the moving image is subjected to motion interpolation to interpolate the image data, thereby providing smooth display.

Moreover, the second image 122 and the third image 123 are images at the intermediate state between the first image 121 and the fourth image 124, and further, may have luminance controlled by a certain rule. The certain rule is, for example, as shown in FIG. 1C, the typical luminance of the first image 121 is L, the typical luminance of the second image 122 is Lc1, and the typical luminance of the third image 123 is Lc2, which preferably satisfies L>Lc1, L>Lc2 or Lc1=Lc2. Preferably, they satisfy 0.1 L<Lc1=Lc2<0.8 L, more preferably 0.2 L<Lc1=Lc2<0.5 L. By control of the luminance to satisfy the expression, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced.

Note that in the method of FIG. 1C, the display frame rate is so low that the time for writing a signal to a display device can be elongated. Thus, the clock frequency of the display device can be made low to reduce power consumption. In addition, the processing rate of motion interpolation can be low to reduce power consumption.

Figure 2A:
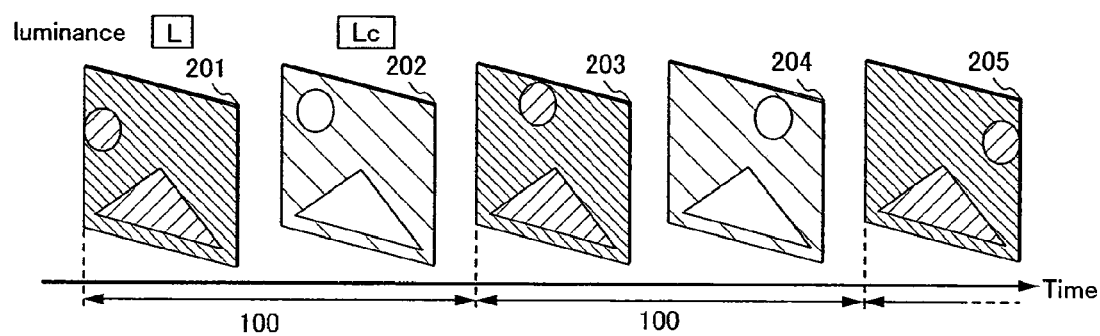
FIGS. 2A to 2C illustrate modes of the present invention.
Figure 2B:
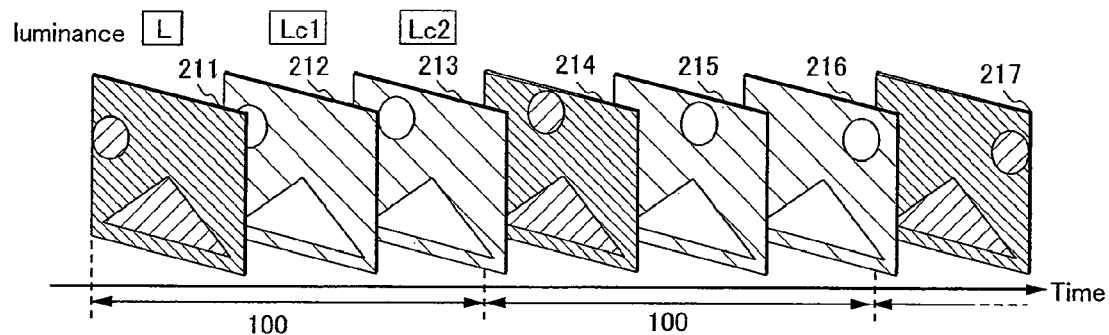
Figure 2C:
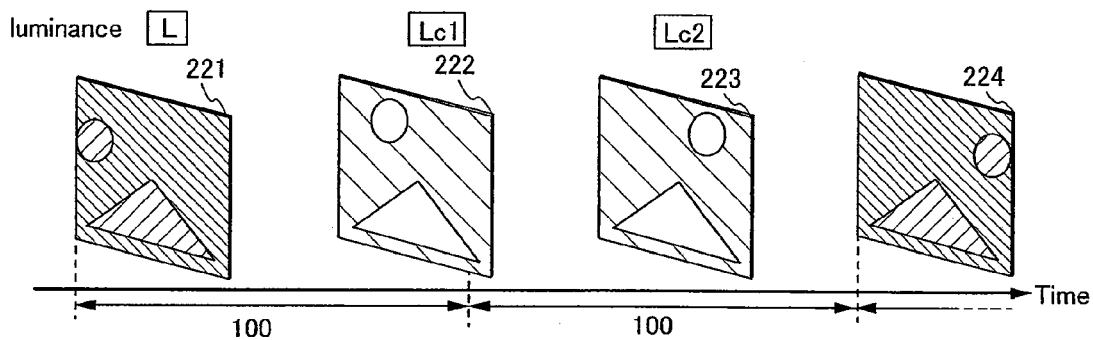

Next, with reference to FIGS. 2A to 2C, examples in which motion blur are reduced are described. FIGS. 2A to 2C are different in control methods of luminance of images from FIGS. 1A to 1C.

The method illustrated in FIG. 2A, the period 100 denotes one frame period. A first image 201 denotes a basic image of the previous frame, a second image 202 is an interpolation image of the previous frame, a third image 203 is a basic image of the current frame, a fourth image 204 is an interpolation image of the current frame, and a fifth image 205 is a basic image of the next frame. Note that the first image 201, the second image 202, the third image 203, the fourth image 204 and the fifth image 205 correspond to the first image 101, the second image 102, the third image 103, the fourth image 104, and the fifth image 105 in FIG. 1A respectively, and the images may be displayed in the same way as the images in FIG. 1A.

However, the method of controlling luminance of an image in the method of FIG. 2A is different from that of FIG. 1A. In other words, the second image 202 is made to be at the intermediate state between the first image 201 and the third image 203 and may have luminance controlled by a certain rule. The certain rule is, for example, as shown in FIG. 2A, the typical luminance of the first image 201 is L and the typical luminance of the second image 202 is Lc, which preferably satisfies L<Lc. Preferably, they satisfy 1.1 L<Lc<1.8 L, more preferably 1.2 L<Lc<1.5 L. FIG. 1A has illustrated the mode in which the luminance of the interpolation image is lower than that of the basic image; however, the magnitude relationship in luminance of the both images may be inverted as shown in FIG. 2A. In other words, as shown in FIG. 2A, even when the luminance of the interpolation image is higher than that of the basic image, display can be pseudo impulse type display. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

The typical luminance of the first image 201, the third image 203 and the fifth image 205 may be reduced, while the typical luminance of the second image 202 and the fourth image 204 may not be changed. Specifically, L and Lc may satisfy the relationship of L<Lc. Preferably, they satisfy the relationship of 0.1 Lc<L<0.8 Lc, more preferably, 0.2 Lc<L<0.5 Lc. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

The method illustrated in FIG. 2B, the period 100 denotes one frame period. A first image 211 denotes a basic image of the previous frame, a second image 212 is a first interpolation image of the previous frame, a third image 213 is a second interpolation image of the previous frame, a fourth image 214 is a basic image of the current frame, a fifth image 215 is a first interpolation image of the current frame, a sixth image 216 is a second interpolation image of the current frame, and a seventh image 217 is a basic image of the next frame. Note that the first image 211, the second image 212, the third image 213, the fourth image 214, the fifth image 215, the sixth image 216, and the seventh image 217 correspond to the first image 111, the second image 112, the third image 113, the fourth image 114, the fifth image 115, the sixth image 116, and the seventh image 117 in FIG. 1B respectively, and the images may be displayed in the same way as the images in FIG. 1B.

However, the method of controlling luminance of an image in the method of FIG. 2B is different from that of FIG. 1B. In other words, the second image 212 and the third image 213 are made to be at the intermediate state between the first image 211 and the fourth image 214 and may have luminance controlled by a certain rule. The certain rule is, for example, as shown in FIG. 2B, the typical luminance of the first image 211 is L the typical luminance of the second image 212 is Lc1, and the typical luminance of the third image 213 is Lc2, which preferably satisfies L<Lc1, L<Lc2 or Lc1=Lc2. Preferably, they satisfy 1.1 L<Lc1=Lc2<1.8 L, more preferably 1.2 L<Lc1=Lc2<1.5 L. FIG. 1B has illustrated the mode in which the luminance of the interpolation image is lower than that of the basic image; however, the magnitude relationship in luminance of the both images may be traverse as shown in FIG. 2B. In other words, as shown in FIG. 2B, even when the luminance of the interpolation image is higher than that of the basic image, display can be pseudo impulse type display. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

The typical luminance of the first image 211, the fourth image 214, and the seventh image 217 may be reduced, while the typical luminance of the second image 212, the third image 213, the fifth image 215 and the sixth image 216 may not be changed. Specifically, L, Lc1 and Lc2 may satisfy L<Lc1, L<Lc2 or Lc1=Lc2. Preferably, they satisfy 0.1 Lc1=0.1 Lc2<L<0.8 Lc1=0.8 Lc2, more preferably 0.2 Lc1=0.2 Lc2<L<0.5 Lc1=0.5 Lc2. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

In the method illustrated in FIG. 2C, the period 100 denotes one frame period. A first image 221 denotes a basic image of the previous frame, a second image 222 is a first interpolation image, a third image 223 is a second interpolation image, and a fourth image 224 is a basic image of the next frame. Note that the first image 221, the second image 222, the third image 223, and the fourth image 224 correspond to the first image 121, the second image 122, the third image 123, and the fourth image 124, in FIG. 1C respectively, and the images may be displayed in the same way as the images in FIG. 1C.

However, the method of controlling luminance of an image in the method of FIG. 2C is different from that of FIG. 1C. In other words, the second image 222 and the third image 223 are made to be at the intermediate state between the first image 221 and the fourth image 224 and may have luminance controlled by a certain rule. The certain rule is, for example, as shown in FIG. 2C, the typical luminance of the first image 221 is L, the typical luminance of the second image 222 is Lc1, and the typical luminance of the third image 223 is Lc2, which preferably satisfies L<Lc1, L<Lc2 or Lc1=Lc2. Preferably, they satisfy 1.1 L<Lc1=Lc2<1.8 L, more preferably 1.2 L<Lc1=Lc2<1.5 L. FIG. 1C has illustrated the mode in which the luminance of the interpolation image is lower than that of the basic image; however, the magnitude relationship in luminance of the both images may be traverse as shown in FIG. 2C. In other words, as shown in FIG. 2C, even when the luminance of the interpolation image is higher than that of the basic image, display can be pseudo impulse type display. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

The typical luminance of the first image 221 and the fourth image 224 may be reduced, while the typical luminance of the second image 222 and the third image 223 may not be changed. Specifically, L, Lc1 and Lc2 may satisfy the relationship of L<Lc1, L<Lc2 or Lc1=Lc2. Preferably, they satisfy the relationship of 0.1 Lc1=0.1 Lc2<L<0.8 Lc1=0.8 Lc2, more preferably, 0.2 Lc1=0.2 Lc2<L<0.5 Lc1=0.5 Lc2. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

Figure 3A:
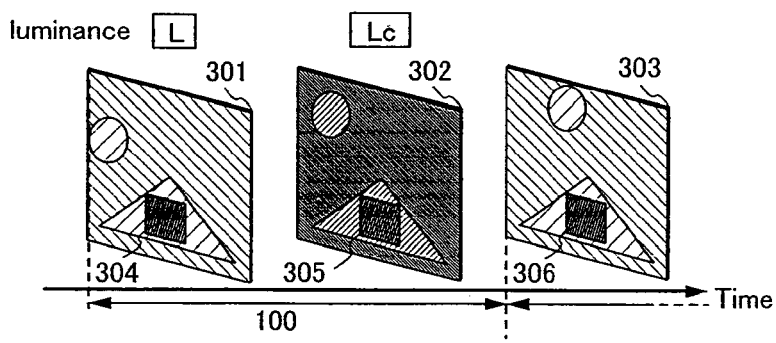
FIGS. 3A to 3E are views for describing methods of measuring a semiconductor device according to the present invention.
Figure 3B:
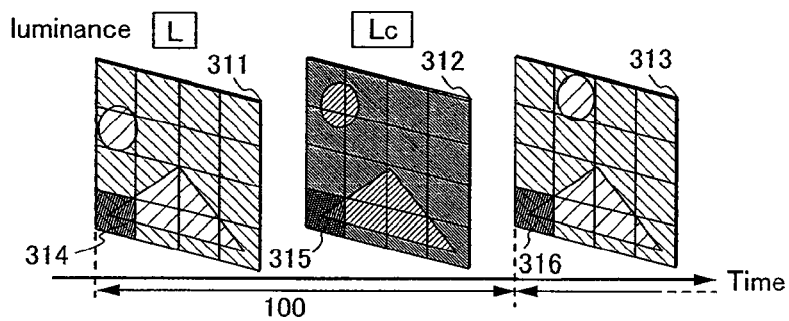
Figure 3C:
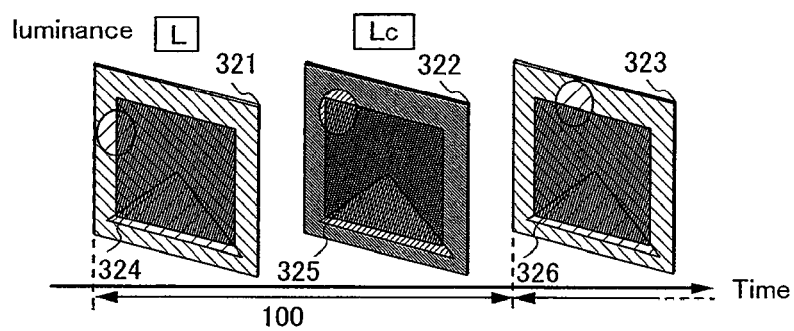
Figure 3D:
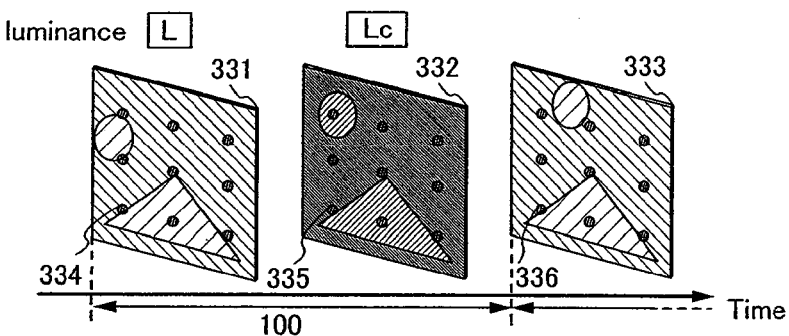
Figure 3E:
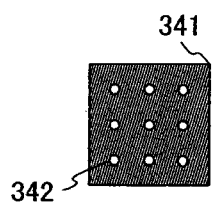

Next, with reference to FIGS. 3A to 3E, typical luminance of images is described. FIGS. 3A to 3D schematically illustrate change with time of images to be displayed with time indicated by the horizontal axis. FIG. 3E illustrates an example of a method of measuring luminance of an image in a region.

FIG. 3A illustrates an example in which the luminance of a region whose position is not changed from frame to frame is regarded as a typical luminance of the image. The period 100 denotes one frame period. A first image 301 is a basic image of the previous frame, a second image 302 is an interpolation image of the previous frame, a third image 303 is a basic image of the current frame, a first region 304 is a luminance measurement region in the first image 301, a second region 305 is a luminance measurement region in the second image 302, and a third region 306 is a luminance measurement region in the third image 303.

The use of such typical luminance enables to judge whether display is close to pseudo impulse type display or not. The luminance measured in the first region 304 is L and the luminance measured in the second region 305 is Lc. At this time, if Lc is lower than L (Lc<L), it can be said that display can be pseudo impulse type display. Thus, it is known that motion blur is reduced.

The luminance in the second region 305 to the luminance in the first region 304 and the third region 306 is preferably within the following range. In order to reduce motion blur, the luminance of the second region 305 is preferably 80 % or lower of the luminance of either the first region 304 or the third region 306, more preferably 50% or lower. Further, in order to reduce power consumption or flickers, the luminance of the second region 305 is preferably 10% or higher of the luminance of either the first region 304 or the third region 306, more preferably 20% or higher. In sum, the luminance of the second region 305 to the luminance of either the first region 304 or the third region 306 is preferably within the range of 10% to 80% inclusive, more preferably 20% to 50% inclusive.

FIG. 3B illustrates an example in which an image is divided into plural rectangular regions in a grid pattern, luminance of the plural regions is measured, and the average value of the luminance is regarded as a typical luminance. The period 100 denotes one frame period. A first image 311 is a basic image of the previous frame, a second image 312 is an interpolation image of the previous frame, a third image 313 is a basic image of the current frame, a first region 314 is one of luminance measurement regions in the first image 311, a second region 315 is one of luminance measurement regions in the second image 312, and a third region 316 is one of luminance measurement regions in the third image 313.

The use of such typical luminance enables to judge whether display is close to pseudo impulse type display or not. The average luminance of luminance measured in all regions of the first image 311 is L and the average luminance of luminance measured in all regions of the second image 312 is Lc. At this time, if Lc is lower than L (Lc<L), it can be said that display can be close to pseudo impulse type display. Thus, it is known that motion blur is reduced.

The average luminance in the second image 312 to the average luminance in the first image 311 and the third image 313 is preferably within the following range. In order to reduce motion blur, the average luminance of the second image 312 is preferably 80% or lower of the average luminance of either the first image 311 or the third image 313, more preferably 50% or lower. Further, in order to reduce power consumption or flickers, the average luminance of the second image 312 is preferably 10% or higher of the average luminance of either the first image 311 or the third image 313, more preferably 20% or higher. In sum, the average luminance of the second image 312 to the average luminance of either the first image 311 or the third image 313 is preferably within the range of 10% to 80% inclusive, more preferably 20% to 50% inclusive.

FIG. 3C illustrates an example in which luminance of the center region of an image are measured, and the average value of the luminance is regarded as a typical luminance. The period 100 denotes one frame period. A first image 321 is a basic image of the previous frame, a second image 322 is an interpolation image of the previous frame, a third image 323 is a basic image of the current frame, a first region 324 is a luminance measurement region in the first image 321, a second region 325 is a luminance measurement region in the second image 322, and a third region 326 is a luminance measurement region in the third image 323.

The use of such typical luminance enables to judge whether display is close to pseudo impulse type display or not. The luminance of the first region 324 is L and the luminance of the second region 325 is Lc. At this time, if Lc is lower than L (Lc<L), it can be said that display can be close to pseudo impulse type display. Thus, it is known that motion blur is reduced.

The luminance in the second region 325 to the luminance in the first region 324 and the third region 326 is preferably within the following range. In order to reduce motion blur, the luminance of the second region 325 is preferably 80% or lower of the luminance of either the first region 324 or the third region 326, more preferably 50% or lower. Further, in order to reduce power consumption or flickers, the luminance of the second region 325 is preferably 10% or higher of the luminance of either the first region 324 or the third region 326, more preferably 20% or higher. In sum, the luminance of the second region 325 to the luminance of either the first region 324 or the third region 326 is preferably within the range of 10% to 80% inclusive, more preferably 20% to 50% inclusive.

FIG. 3D illustrates an example in which luminance of plural sampled points in the whole image are measured and the average value of the luminance is regarded as a typical luminance. The period 100 denotes one frame period. A first image 331 is a basic image of the previous frame, a second image 332 is an interpolation image of the previous frame, a third image 333 is a basic image of the current frame, a first region 334 is a luminance measurement region in the first image 331, a second region 335 is a luminance measurement region in the second image 332, and a third region 336 is a luminance measurement region in the third image 333.

The use of such typical luminance enables to judge whether display is close to pseudo impulse type display or not. The average of luminance measured in all first regions 334 is L and the average of luminance measured in all second regions 335 is Lc. At this time, if Lc is lower than L (Lc<L), it can be said that display can be close to pseudo impulse type display. Thus, it is known that motion blur is reduced.

The luminance in the second region 335 to the luminance in the first region 334 and the third region 336 is preferably within the following range. In order to reduce motion blur, the luminance of the second region 335 is preferably 80% or lower of the luminance of either the first region 334 or the third region 336, more preferably 50% or lower. Further, in order to reduce power consumption or flickers, the luminance of the second region 335 is preferably 10% or higher of the luminance of either the first region 334 or the third region 336, more preferably 20% or higher. In sum, the luminance of the second region 335 to the luminance of either the first region 334 or the third region 336 is preferably within the range of 10% to 80% inclusive, more preferably 20% to 50% inclusive.

FIG. 3E illustrates the method of measuring luminance in the luminance measurement regions shown in FIGS. 3A to 3D. A region 341 is a luminance measurement region, and a dot 342 is a dot for measuring luminance in the region 341 which is a luminance measurement region. A luminance meter (an apparatus for measuring luminance) having a high time resolution covers small measuring range, and thus when the region 341 is large, the whole region is not measured. As shown in FIG. 3E, luminance of plural dots in the region 341 are measured uniformly, and the average value of luminance is regarded as the luminance of the region 341.

Note that when the image has a combination of R, G, and B, the measured luminance may be luminance which is added values of R, G and B, luminance which is added values of R and G, luminance which is added values of B and G, luminance which is added values of R and B, or each luminance of R, G, and B.

The content of this embodiment mode can be freely combined with the other embodiment modes.

Moreover, the elements or components of the drawings in this embodiment mode can each be combined with elements or components of drawings in other embodiment modes.

Embodiment Mode 2

Embodiment Mode 2 will now describe a method of detecting movement of images in frames and making an intermediate image, and a method of controlling a driving method based on the movement of the images in frames or the like, by a driving method of a display device and a semiconductor device in this specification.

Figure 4A:
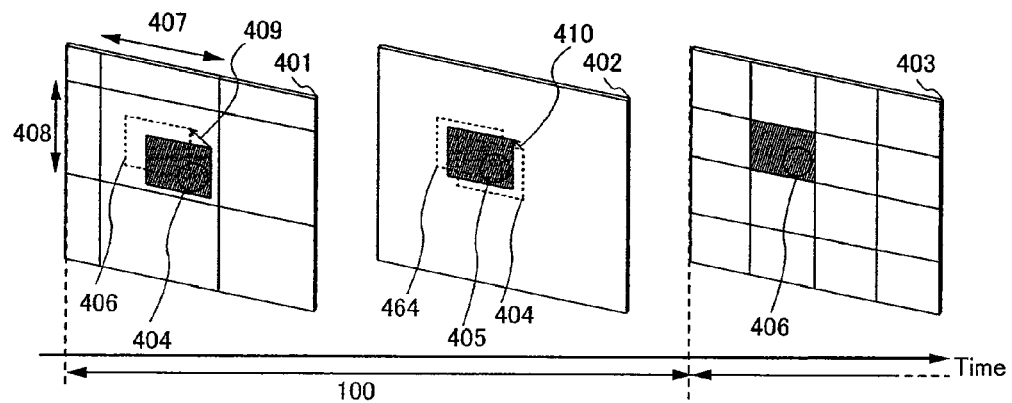
FIGS. 4A and 4B are views for describing methods of producing images of a semiconductor device according to the present invention.
Figure 4B:
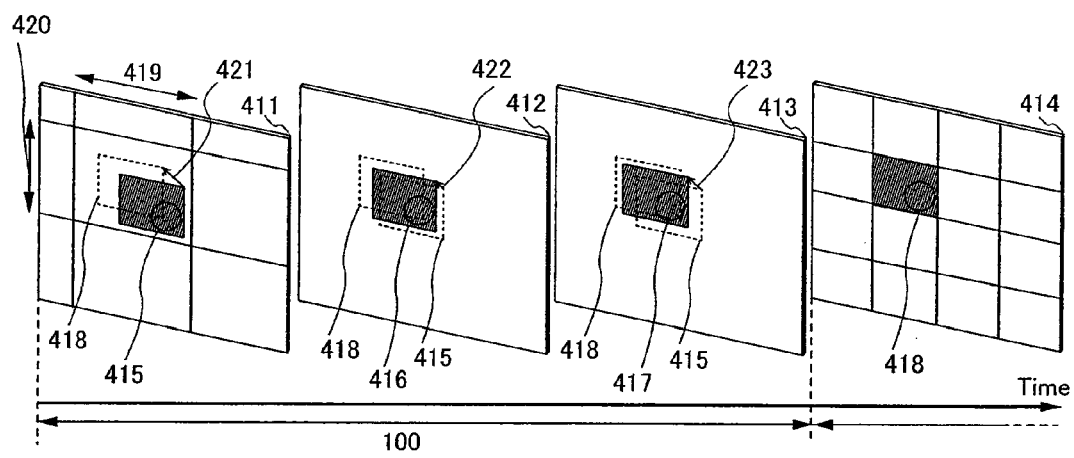

With reference to FIGS. 4A and 4B, a method in which the movement of images in frames is detected and an intermediate image is made is described. FIG. 4A illustrates a mode in which a display frame rate is twice as high as an input frame rate. FIG. 4A schematically illustrate the method in which the movement of an image is detected with time as a horizontal axis. The period 100 denotes one frame period. A first image 401 is a basic image of the previous frame, a second image 402 is an interpolation image, and a third image 403 is a basic image of the current frame. In the images, a first region 404, a second region 405 and a third region 406 are provided as regions which do not have time dependency.

In the third image 403, the image is divided into plural tile-shaped (rectangular) regions, and image data of one region of the plural regions, i.e., a third region 406 is focused on.

Next, in the first image 401, a region larger than the third region 406 with the third region 406 as a center is focused on. The region larger than the third region 406 with the third region 406 as a center is a data searching area. In the data searching area, the range in the horizontal direction (X direction) is denoted by reference number 407 and the range in the perpendicular direction (Y direction) is denoted by reference number 408. The range in the horizontal direction 407 and the range in the perpendicular direction 408 of the data searching area may be ranges in which the range in the horizontal direction and the range in the perpendicular direction of the third region 406 are enlarged by about 15 pixels.

In the data searching area, a region which has image data most similar to image data of the third region 406 is searched. The search method may be a least-square method or the like. By the search, the first region 404 is assumed to be obtained as the region which has image data most similar to image data.

Next, a vector 409 is used as an amount of the positional difference between the obtained first region 404 and the third region 406. Note that the vector 409 is referred to as a movement vector.

In the second image 402, by using a vector 410 obtained from the movement vector 409, the image data in the third region 406 of the third image 403, and the image data in the first region 404 of the first image 401, a second region 405 is formed.

Note that the vector 410 obtained from the movement vector 409 is referred to as a displacement vector. The displacement vector 410 determines a position for forming the second region 405. The second region 405 is formed apart from the first region 404 by the displacement vector 410. The displacement vector 410 may be a vector which is half of the movement vector 409.

The image data in the second region 405 of the second image 402 may be determined by the image data in the third region 406 of the third image 403 and the image data in the first region 404 of the first image 401. For example, the image data in the second region 405 of the second image 402 may be an average of the image data in the third region 406 of the third image 403 and the image data in the first region 404 of the first image 401.

In this manner, the second region 405 in the second image 402 corresponding to the third region 406 in the third image 403 can be formed. The above processing is conducted on another region in the third image 403 to form the second region 402 which is at the intermediate state between the third image 403 and the first image 401.

FIG. 4B illustrates a mode in which the display frame rate is three time as high as the input frame rate. FIG. 4B schematically illustrates a method of detecting movement of an image with time as a horizontal axis. The period 100 denotes one frame period. A first image 411 is a basic image of the previous frame, a second image 412 is a first interpolation image, a third image 413 is a second interpolation image, and a fourth image 414 is a basic image of the current frame. In addition, in the images, a first region 415, a second region 416, a third region 417 and a fourth region 418 are provided as regions which do not have time dependency.

In the fourth image 414, an image is divided into plural tile-shaped (rectangular) regions and the image data of the fourth region 418 which is one of the regions is focused on.

In the first image 411, an area which is larger than the fourth region 418 with the fourth region 418 as a center is focused on. The area larger than the fourth region 418 with the fourth region 418 as a center is a data searching area. In the data searching area, the area in the horizontal direction (X direction) is denoted by reference number 419 and the range in the perpendicular direction (Y direction) is denoted by reference number 420. The range in the horizontal direction 419 and the range in the perpendicular direction 420 of the data searching area may be ranges in which the range in the horizontal direction and the range in the perpendicular direction of the fourth region 418 are enlarged by about 15 pixels.

In the data searching area, a region which has image data most similar to image data of the fourth region 418 is searched. The search method may be a least-square method or the like. By the search, the first region 415 is assumed to be obtained as the region which has image data most similar to image data.

Next, a vector 421 is used as an amount of the positional difference between the obtained first region 415 and the fourth region 418. Note that the vector 421 is also referred to as a movement vector.

In the second image 412 and the third image 413, by vectors 422 and 423 obtained from the movement vector 421, the image data in the fourth region 418 of the fourth image 414, and the image data in the first region 415 of the first image 411, a second region 416 and a third region 417 are formed.

Note that the vector 422 obtained from the movement vector 421 is referred to as a first displacement vector, and the vector 423 is referred to as a second displacement vector. The first displacement vector 422 determines a position for forming the second region 416. The second region 416 is formed apart from the first region 415 by the first displacement vector 422. The amount of the displacement vector 422 may be a vector which is ⅓ times that of the movement vector 421. The second displacement vector 423 determines a position for forming the third region 417. The third region 417 is formed apart from the first region 415 by the second displacement vector 423. The amount of the displacement vector 423 may be a vector which is ⅔ times that of the movement vector 421.

The image data in the second region 416 of the second image 412 may be determined by the image data in the fourth region 418 of the fourth image 414 and the image data in the first region 415 of the first image 411. For example, the image data in the second region 416 of the second image 412 may be an average of the image data in the fourth region 418 of the fourth image 414 and the image data in the first region 415 of the first image 411.

The image data in the third region 417 of the third image 413 may be determined by the image data in the fourth region 418 of the fourth image 414 and the image data in the first region 415 of the first image 411. For example, the image data in the third region 417 of the third image 413 may be an average of the image data in the fourth region 418 of the fourth image 414 and the image data in the first region 415 of the first image 411.

In this manner, the second region 416 in the second image 412 and the third region 417 and the third image 413 corresponding to the fourth region 418 of the fourth image 414 can be formed. The above processing is conducted on another region of the fourth image 414 to form the second region 412 and the third region 413 which are at the intermediate state between the fourth image 414 and the first image 411.

Figure 5A:
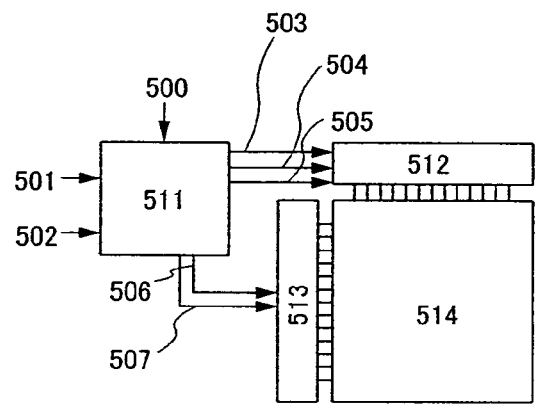
FIGS. 5A to 5D are block circuit diagrams of a semiconductor device according to the present invention.
Figure 5B:
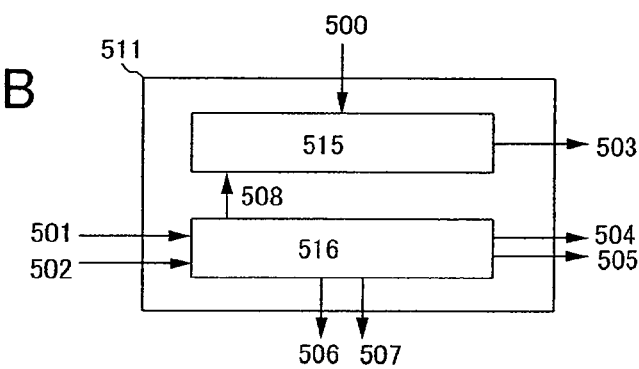
Figure 5C:
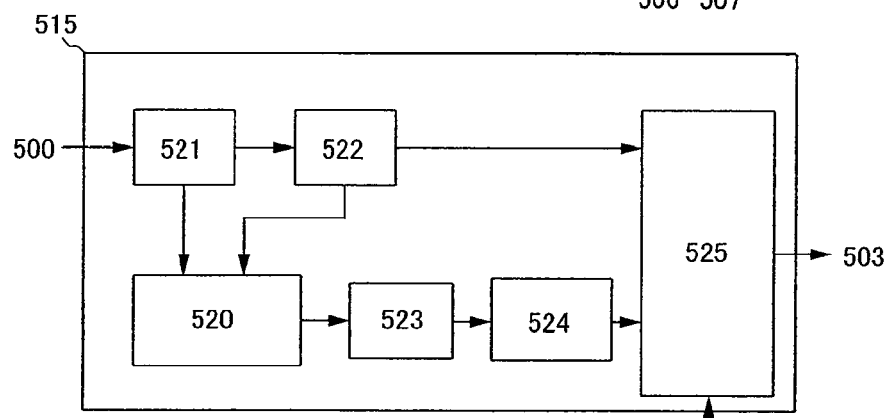
Figure 5D:
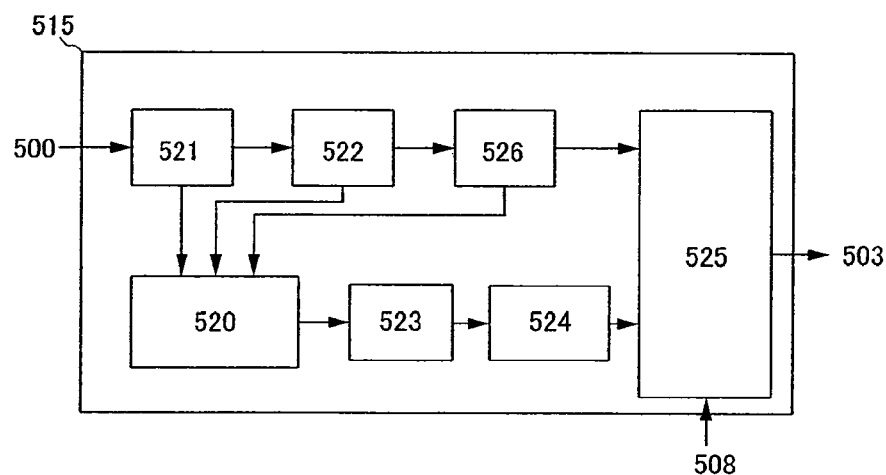

Next, with reference to FIGS. 5A to 5D, examples of circuits in which the movement of an image from frame to frame, in order to form an intermediate image are described. FIG. 5A illustrates a connection between a peripheral driver circuit including a source driver and a gate driver for displaying an image in a display region and a control circuit for controlling the periphery circuit. FIG. 5B illustrates one example of a detailed circuit configuration of the control circuit. FIG. 5C illustrates one example of a detailed circuit configuration of an image processing circuit included in the control circuit. FIG. 5D illustrates another example of a detailed circuit configuration of an image processing circuit included in the control circuit.

As shown in FIG. 5A, a display device and a semiconductor device in this specification may include a control circuit 511, a source drive 512, a gate driver 513 and a display region 514.

Note that the control circuit 511, the source driver 512 and the gate driver 513 may be formed on the same substrate as the display region 514.

Alternatively, part of the control circuit 511, the source driver 512 and the gate driver 513 may be formed on the same substrate as the display region 514, and the other circuits may be formed on a different substrate from the display region 514. For example, the source driver 512 and the gate driver 513 may be formed on the same substrate as the display region 514, and the control circuit 511 may be formed as an external IC on a different substrate. Similarly, the gate driver 513 may be formed on the same substrate as the display region 514 and the other circuits may be formed as external ICs on a different substrate. Similarly, part of the source driver 512, the gate driver 513 and the control circuit 511 is formed on the same substrate as the display region 514, while the other circuits may be formed as external ICs on a different substrate.

Into the control circuit 511, an external video signal 500, a horizontal synchronizing signal 501 and a vertical synchronizing signal 502 are input. From the control circuit 511, a video signal 503, a source start pulse 504, a source clock 505, a gate start pulse 506 and a gate clock 507 are output.

The video signal 503, the source start pulse 504 and the source clock 505 are input into the source driver 512, and the source driver 512 may output voltage or current into the display region 514 in accordance with the video signal 503.

The gate start pulse 506 and the gate clock 507 are input into the gate driver 513, and the gate driver 513 may output a timing signal for writing a signal output from the source driver 512 to the display region 514.

When an external video signal 500 has a different frequency from the video signal 503, a control signal of timing for driving the source driver 512 and the gate driver 513 also has a different frequency from the input horizontal synchronizing signal 501 and vertical synchronizing signal 502. Thus, the control signal of timing for driving the source driver 512 and the gate driver 513 should be processed as well as the video signal 503. The control circuit 511 may be a circuit having a function of processing the control signal. For example, when the video signal 503 has a twice frequency as high as the external video signal 500, the control circuit 511 interpolates the video signal included in the external video signal 500 to produce the video signal 503 having a twice frequency, and makes the control signal of timing have a twice frequency.

The control circuit 511 may include an image processing circuit 515 and a timing generation circuit 516 as shown in FIG. 5B.

Into the image processing circuit 515, the external video signal 500, a frequency control signal 508 may be input, while from the image processing circuit 515, the video signal 503 may be output.

Into the timing generation circuit 516, the horizontal synchronizing signal 501 and the vertical synchronizing signal 502 may be input, while from the timing generation circuit 516, the source start pulse 504, the source clock 505, the gate start pulse 506, the gate clock 507, and the frequency control signal 508 may be output. Note that the timing generation circuit 516 may include a memory, a register or the like for storing data of specifying a state of the frequency control signal 508. The timing generation circuit 516 may receive the signal of specifying a state of the frequency control signal 508 from the outside.

The image processing circuit 515 may include a movement detection circuit 520, a first memory 521, a second memory 522, a third memory 523, a luminance control circuit 524, and a high speed processing circuit 525 as shown in FIG. 5C.

The movement detection circuit 520 may receive a plurality of image data, detect movement of images, and output an intermediate image data of the plurality of image data.

The first memory 521 may receive the external video signal 500, hold the external video signal 500 for a certain period, and output the external video signal 500 to the movement detection circuit 520 and the second memory 522.

The second memory 522 may receive image data output from the first memory 521, hold the image data for a certain period, and output the image data to the movement detection circuit 520 and the high speed processing circuit 525.

A third memory 523 may receive image data output from the movement detection circuit 520, hold the image data for a certain period, and output the image data to the luminance control circuit 524.

The high speed processing circuit 525 may receive image data output from the second memory 522, image data output from the luminance control circuit 524, and the frequency control signal 508, and output the image data as the video signal 503.

When the external video signal 500 has a different frequency from the video signal 503, the video signal included in the external video signal 500 is interpolated by the image processing circuit 515 to produce the video signal 503. The input external video signal 500 is held in the first memory 521 once. At this time, the second memory 522 holds the image data input in the previous frame. The movement detection circuit 520 may read the image data held in the first memory 521 and the second memory 522 as appropriate and a movement vector may be detected from the difference of the image data in the first memory 521 and the second memory 522, and further, intermediate image data may be produced. The produced intermediate image data is held by the third memory 523.

When the movement detection circuit 520 produces the intermediate image data, the high speed processing circuit 525 outputs the image data held in the second memory 522 as the video signal 503. After that, the image data held in the third memory 523 is output as the video signal 503 through the luminance control circuit 524. The updating frequency for the second memory 522 and the third memory 523 is the same as the frequency of the external video signal 500; however, the frequency of the video signal 503 to be output through the high speed processing circuit 525 may be different from the frequency of the external video signal 500. Specifically, the frequency of the video signal 503 is preferably 1.5, 2, or 3 times as high as the external video signal 500, but various frequencies can be adopted without limitations. The frequency of the video signal 503 may be specified by the frequency control signal 508.

The configuration of the image processing circuit 515 in FIG. 5D is a configuration in which the fourth memory 526 is added to the configuration of the image processing circuit 515 in FIG. 5C. In this manner, the image data output from the fourth memory 526 in addition to the image data output from the first memory 521 and the image data output from the second memory 522 are output into the movement detection circuit 520, thereby accurately detecting the movement of an image.

In addition, in a case where the input image data has already included a movement vector for data-compression, when image data is based on the standard of MPEG (moving picture expert group), for example, an intermediate image may be produced as an interpolation image using the image data. At this time, a part for generating the movement vector included in the movement detection circuit 520 is unnecessary. In addition, encoding and decoding processes of the external video signal 500 become simple, thereby reducing power consumption.

Figure 6A:
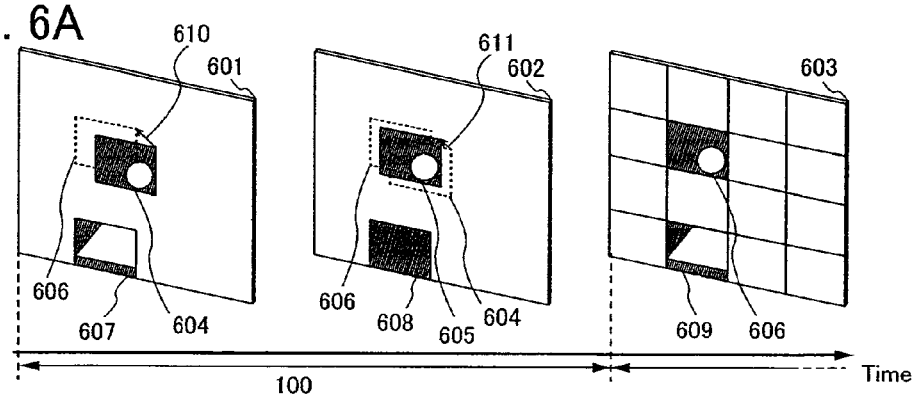
FIGS. 6A to 6E illustrates image producing methods of a semiconductor device of the present invention as modes of the present invention.

Next, with reference to FIGS. 6A to 6E, a method in which the movement of an image from frame to frame is detected to form an intermediate image is described. FIGS. 6A to 6E schematically illustrate images displayed when the display frame rate is twice as high as the input frame rate. FIG. 6A schematically illustrates a method of detecting the movement of the image with time indicated by the horizontal axis. The period 100 denotes one frame period. A first image 601 is a basic image of the previous frame, a second image 602 is an interpolation image, and a third image 603 is a basic image of the current frame. In the images, a first region 604, a second region 605, a third region 606, a fourth region 607, a fifth region 608 and a sixth region 609 are provided as regions not having time tendency.

The method of obtaining the second region 605 in the second image 602 from the third region 606 of the third image 603 and the first region 604 of the first image 601 may be the above-described method. In other words, the first image 601, the second image 602, the third image 603, the first region 604, the second region 605, the third region 606, the movement vector 610 and the displacement vector 611 in FIG. 6A may correspond to the first image 401, the second image 402, the third image 403, the first region 404, the second region 405, the third region 406, the movement vector 409 and the displacement vector 410 in FIG. 4A, respectively.

The image data included in the fourth region 607 and the sixth region 609 are not substantially moved in the first image 601 and the third image 603. At this time, image data produced in the fifth region 608 may be an average of the image data of the fourth region 607 in the first image 601 and the image data of the sixth region 609 in the third image 603; however, as shown in FIG. 6A, the image data in the fifth region 608 may be a black image having low luminance. In other words, an intermediate image may be produced for the region in which the image is moved so much and a black image may be produced for the region in which the image is not moved so much. Thus, the typical luminance of the second image 602 becomes small and thus display can be pseudo impulse type display. In this manner, the image is interpolated by motion interpolation and the display may be close to pseudo impulse type display by provision of difference in typical luminance between images to be displayed. Thus, motion can be smoothed and afterimages to human eyes can be reduced, and thereby the motion blur can be drastically reduced.

When either an intermediate image or a black image is produced, the movement vector 610 may have a threshold value. The threshold value of the movement vector 610 is preferably three times as high as that of one pixel, more preferably twice as high as that of one pixel.

Figure 6B:
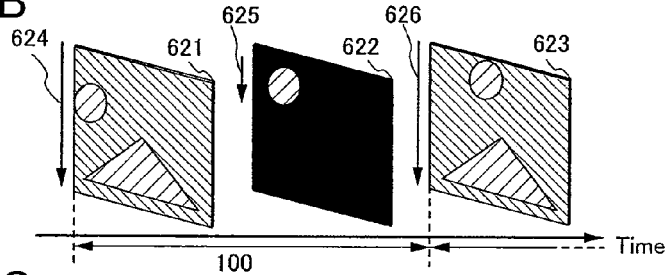

FIG. 6B schematically illustrates shift of an image when an intermediate image is produced by the method shown in FIG. 6A. The period 100 denotes one frame period. A first image 621 is a basic image of the previous frame, a second image 622 is an interpolation image, and a third image 623 is a basic image of the current frame. Arrows 624, 625, 626 illustrate scanning of images by scanning signals.

FIG. 6B illustrates an image including both of a region whose position is changed from frame to frame (the circular region) and a region whose position is not changed from frame to frame (the triangle region) as one example. At this time, in the driving method shown in FIG. 6B, the second image 622 is produced in different ways in a region in which the movement vector is large and in a region in which the movement vector is small. The movement vector is detected based on the movement of the image. Specifically, the region in which the movement vector is large (here, the circular region) employs the intermediate image and the region in which the movement vector is small (here, the triangle region) employs the black image. In this manner, the typical luminance of the second image 622 is low so that display can be pseudo impulse type display. In this manner, the image is interpolated by motion interpolation and the display may be pseudo impulse type display by provision of difference in typical luminance between images to be displayed. Thus, motion can be smoothed and afterimages to human eyes can be reduced, and thereby the motion blur can be drastically reduced.

In FIG. 6B, when the image data of the second image 622 is written into the display region, instead of writing black data positively, the data may be written into only the region in which the image is moved broadly, while the data of the first image 621 may be held in the region in which the image is not moved so much, without wiring the data therein. At this time, when the data of the first image 621 is written, a scan signal is scanned entirely as indicated by the arrow 624. Next, when the data of the second image 622 is written, the scan signal is scanned in only the region in which the image is moved so much as indicated by the arrow 625. When the data of the third image 623 is written, the scan signal is scanned entirely as indicated by the arrow 626. Thus, it is unnecessary to write data in a region which moves less and in which the intermediate image is not needed to be displayed, which leads to reduction of power consumption. In addition, noises are not generated in production of the second image 622, which leads to improvement of the image quality.

Figure 6C:
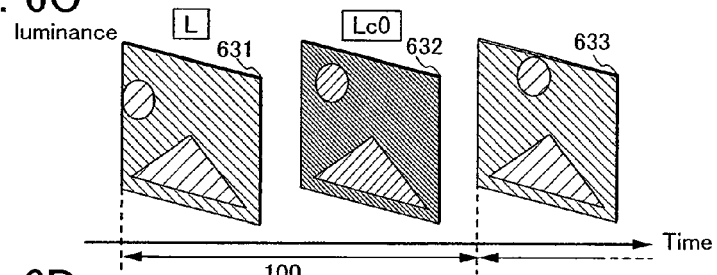
Figure 6D:
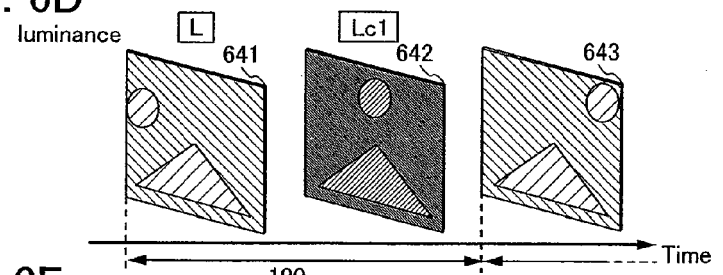
Figure 6E:
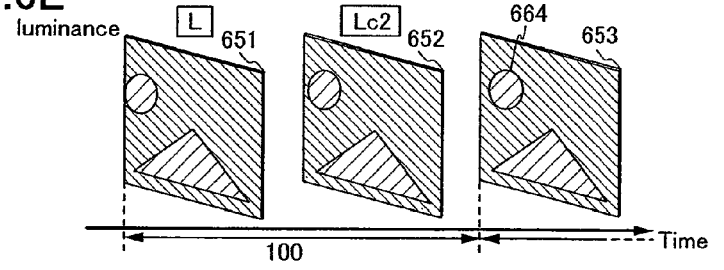

FIGS. 6C to 6E illustrate images including both of a region which is changed from frame to frame (the circular region) and a region which is not changed from frame to frame (the triangle region) as one example. In FIGS. 6C to 6E, the distance in which the images are moved is different in the regions in which the images are moved from frame to frame.

In FIG. 6C, the period 100 denotes one frame period. A first image 631 is a basic image of the previous frame, a second image 632 is an interpolation image, and a third image 633 is a basic image of the current frame. Here, the second image 632 may be an intermediate between the first image 631 and the third image 633 by detection of the movement amount (movement vector) of the image from the first image 631 to the third image 633. Further, the second image 632 is an image to be at the intermediate state between the first image 631 and the third image 633, and may have luminance which is controlled by a certain rule. The certain rule may, specifically, be determined based on the amplitude of the movement vector.

In FIG. 6D, the period 100 denotes one frame period, a first image 641 is a basic image of the previous frame, a second image 642 is an interpolation image, and a third image 643 is a basic image of the current frame. Here, the second image 642 may be an image to be intermediate state between the first image 641 and the third image 643 by detection of the movement amount (movement vector) of the image from the first image 641 to the third image 643. Further, the second image 642 is an image to be at the intermediate state between the first image 641 and the third image 643, and may have luminance which is controlled by a certain rule. The certain rule may, specifically, be determined based on the amplitude of the movement vector.

In FIG. 6E, the period 100 denotes one frame period, the first image 651 is a basic image of the previous frame, the second image 652 is an interpolation image, and the third image 653 is a basic image of the current frame. Note that the second image 652 may be an image to be in at the intermediate state between the first image 651 and the third image 653 by detection of the movement amount (movement vector) of the image from the first image 651 to the third image 653. Further, the second imaged 652 is an intermediate image between the first image 651 and the third image 653, and may have luminance which is controlled by a certain rule. The certain rule may, specifically, be determined based on the amplitude of the movement vector.

In FIGS. 6C to 6E, FIGS. 6C, 6D, and 6E illustrate driving methods in which a region (circular region) is moved from frame to frame. The movement amount is the largest in FIG. 6D, the movement amount is the second largest in FIG. 6C, and the movement amount is the third largest in FIG. 6E. At this time, the luminance of the interpolation image may be determined by the magnitude of the detected movement vector.

In other words, the luminance of the second image 632 in FIG. 6C is Lc0, the luminance of the second image 642 in FIG. 6D is Lc1, and the luminance of the second image 652 in FIG. 6E is Lc2. Lc0, Lc1 and Lc2 may satisfy Lc1<Lc0<LC2. In other words, as larger the movement amount of the region from frame to frame, the luminance of the interpolation image may be smaller. Thus, when the movement amount of the image is large and the moving image is blurred, display can be made closer to pseudo impulse type display. In this manner, the image is interpolated by motion interpolation, and a difference of typical luminance between displayed images may be provided to make pseudo impulse type display. Therefore, the motion can be smoothed and afterimages to human eyes can be suppressed, which leads to drastical reduction of the motion blur.

In addition, when the movement of an image is small, and motion blur does not occur so much, display can be close to hold type display, and thus, flickers and power consumption can be reduced.

Note that the control amount in luminance of an image may be determined by not only the movement amount of a detected movement vector, but also setting by a user or external environment (such as surrounding brightness or temperature), or a combination of the above.

Figure 7A:
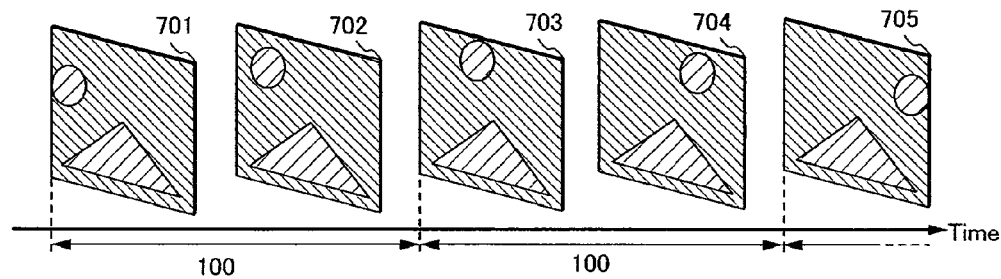
FIGS. 7A to 7C illustrates modes of the present invention.
Figure 7B:
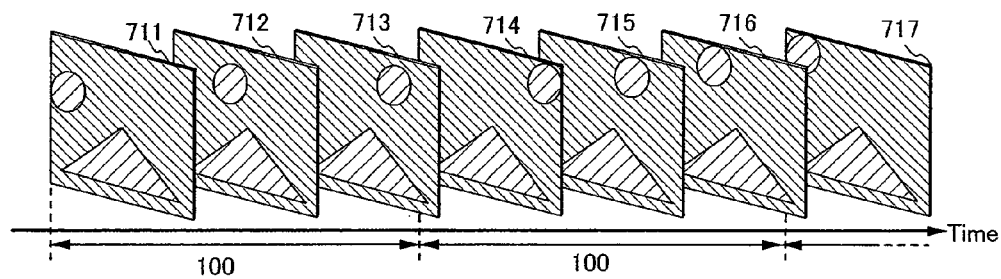
Figure 7C:
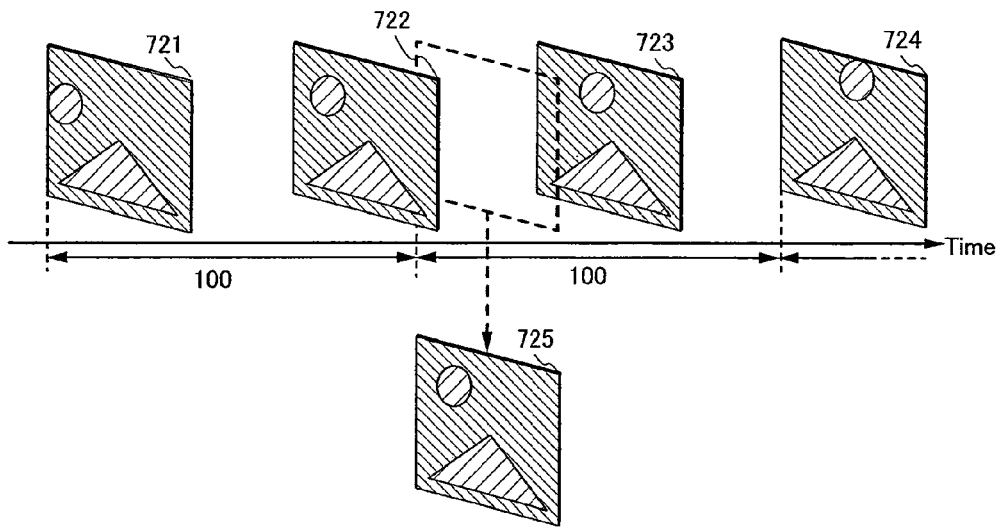

Then, with reference to FIGS. 7A to 7C, a method of relating movement of an image to a display frame rate is described. FIGS. 7A to 7C schematically illustrate modes in which displayed images are changed with time, with time indicated by the horizontal axis. FIGS. 7A to 7C illustrate intermediate images by using a region whose position is moved from frame to frame (a circular region) and a region whose position is not moved from frame to frame (a triangle region). FIG. 7A is a mode in which the display frame rate is twice as high as the input frame rate. FIG. 7B is a mode in which the display frame rate is three times as high as the input frame rate. FIG. 7C is a mode in which the display frame rate is 1.5 times as high as the input frame rate.

In FIG. 7A, the period 100 denotes one frame period. A first image 701 is a basic image of the previous frame, a second image 702 is an interpolation image of the previous frame, a third image 703 is a basic image of the current frame, a fourth image 704 is an interpolation image of the current frame, and a fifth image 705 is a basic image of the next frame.

In FIG. 7A, the second image 702 may be an image to be at the intermediate state between the first image 701 and the third image 703 by detection of the movement amount of the image from the first image 701 to the third image 703. Similarly, the fourth image 704 may be an image to be at the intermediate state between the third image 703 and the fifth image 705 by detection of the movement amount of the image from the third image 703 to the fifth image 705.

In FIG. 7B, the period 100 denotes one frame period. A first image 711 is a basic image of the previous frame, a second image 712 is a first interpolation image of the previous frame, a third image 713 is a second interpolation image of the previous frame, a fourth image 714 is a basic image of the current frame, a fifth image 715 is a first interpolation image of the current frame, a sixth image 716 is a second interpolation image of the current frame, and a seventh image 717 is a basic frame of the next frame.

In FIG. 7B, the second image 712 and the third image 713 may be intermediate images between the first image 711 and the fourth image 714 by detection of movement amount of the image from the first image 711 to the fourth image 714. Similarly, the fifth image 715 and the sixth image 716 may be intermediate images between the fourth image 714 and the seventh image 717 by detection of the movement amount of an image from the fourth image 714 to the seventh image 717.

In FIG. 7C, the period 100 denotes one frame period. A first image 721 is a basic image of the previous frame, a second image 722 is a first interpolation image, a third image 723 is a second interpolation image, and a fourth image 724 is a basic image of the next frame. Note that a fifth image 725 is a basic image of the current frame, although the fifth image 725 is not needed to be displayed actually.

In FIG. 7C, the second image 722 and the third image 723 may be images to be at the intermediate state between the first image 721 and the fourth image 724 by detection of the movement amount of the image from the first image 721 to the fourth image 724 via the fifth image 725.

In FIGS. 7A to 7C, the movement amount of regions whose positions are moved in frames are different in the basic images. In other words, the movement amount of the image shown in FIG. 7B (the display frame rate is three times) is the largest, the movement amount of the image shown in FIG. 7A (the display frame rate is twice) is the second largest, and the movement amount of the image shown in FIG. 7C (the display frame rate is 1.5 times) is the third largest. In this manner, in accordance with the movement amount of images, the frequency of the display frame rate may be changed for display. In this manner, a driving frequency suitable for the movement amount of an image can be selected, and thus the smoothness of the image can be enhanced and motion blur can be effectively reduced, and the increase of generated heat due to the increases of power consumption and processing amount can be reduced. In addition, flickers in the small movement of an image can also be reduced.

Note that the display frame rate may be determined by not only the movement amount of a detected movement vector, but also setting by a user or external environment (such as surrounding brightness or temperature), or a combination of the above.

The interpolation images shown in FIGS. 7A to 7C are images to be at the intermediate state between plural basic images, and may have luminance controlled by a certain rule. The certain rule may specifically be determined by the amplitude of the movement vector, setting by a user or external environment (such as surrounding brightness or temperature), or a combination of the above. In this manner, the image is interpolated by motion interpolation, and a difference of typical luminance between displayed images may be provided to make the display pseudo impulse type display. Therefore, the motion can be smoothed and afterimages to human eyes can be suppressed, which leads to drastic reduction of the motion blur.

Next, with reference to FIGS. 8A to 8E, a method of relating movement of an image to a driving method is described. FIGS. 8A to 8E schematically illustrate modes in which displayed images are changed with time, with time indicated by the horizontal axis. FIGS. 8A to 8E illustrate intermediate images by using a region whose position is moved from frame to frame (a circular region) and a region which is not moved from frame to frame (a triangle region).

Figure 8A:
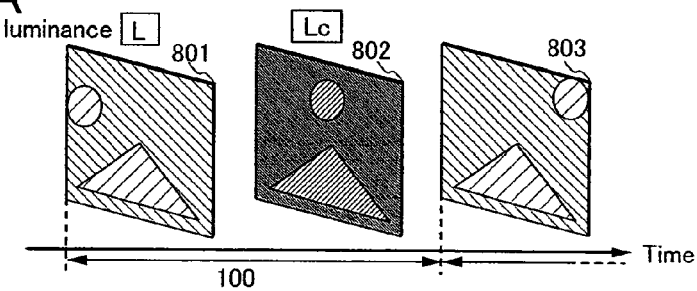
FIGS. 8A to 8E illustrates modes of the present invention.

In FIG. 8A, the period 100 denotes one frame period. A first image 801 is a basic image of the previous frame, a second image 802 is an interpolation image of the previous frame, and a third image 803 is a basic image of the current frame. Note that the second image 802 may be an image to be at the intermediate state between the first image 801 and the third image 803 by detection of the movement amount (movement vector) of the image from the first image 801 to the third image 803. Further, the second image 802 is an intermediate image between the first image 801 and the third image 803, and further may have luminance controlled by a certain rule. The certain rule may specifically be determined by the amplitude of the movement vector, setting by a user or external environment (such as surrounding brightness or temperature), or a combination of the above.

FIG. 8A illustrates the driving method described in Embodiment Mode 1. In other words, the movement amount of the image is detected from image data included in plural frames, and an intermediate image between the images included in the plural frames is used as an interpolation image and the luminance of the interpolation image is changed. In this embodiment mode, the driving method illustrated in FIG. 8A is called as luminance control double-frame rate driving.

Figure 8B:
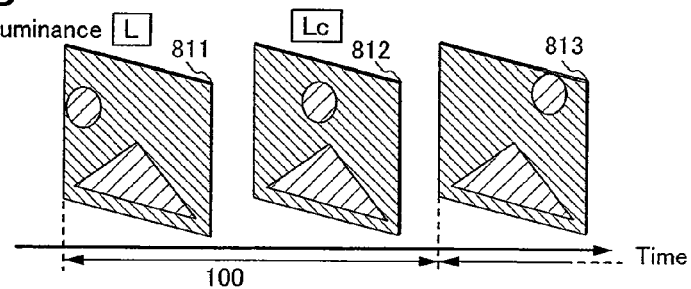

In FIG. 8B, the period 100 denotes one frame period. A first image 811 is a basic image of the previous frame, a second image 812 is an interpolation image of the previous frame, and a third image 813 is a basic image of the current frame. Note that the second image 812 may be an image to be at the intermediate state between the first image 811 and the third image 813 by detection of the movement amount (movement vector) of the image from the first image 811 to the third image 813. Further, the second image 812 is an intermediate image between the first image 811 and the third image 813, and further may have display frame rate controlled by a certain rule. The certain rule may specifically be determined by the amplitude of the movement vector, setting by a user or external environment (such as surrounding brightness or temperature), or a combination of the above.

FIG. 8B illustrates a method in which the movement amount of an image is detected from image data included in plural frames, and an intermediate image between the images included in the plural frames is used as an interpolation image and the display frame rate is made higher than the input frame rate. In this embodiment mode, the driving method illustrated in FIG. 8B is called double-frame rate driving.

Figure 8C:
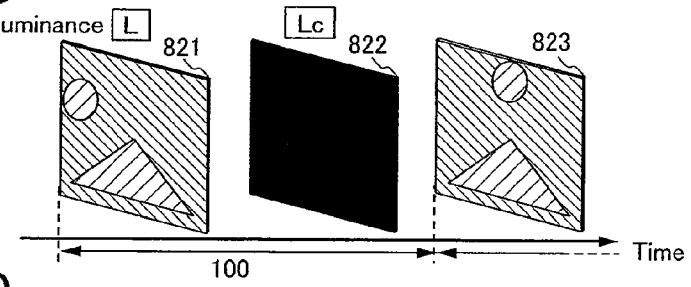

In FIG. 8C, the period 100 denotes one frame period. A first image 821 is a basic image of the previous frame, a second image 822 is an interpolation image of the previous frame, and a third image 823 is a basic image of the current frame. The second image 822 may be an image obtained by controlling luminance of the first image 821 by a certain rule. The certain rule may specifically be determined by the amplitude of the movement vector, setting by a user or external environment (such as surrounding brightness or temperature), or a combination of the above.

FIG. 8C illustrates a method in which a dark image or a black image is used as an interpolation image to make pseudo impulse type display. In this embodiment mode, the driving method illustrated in FIG. 8C is called black frame insertion driving.

Figure 8D:
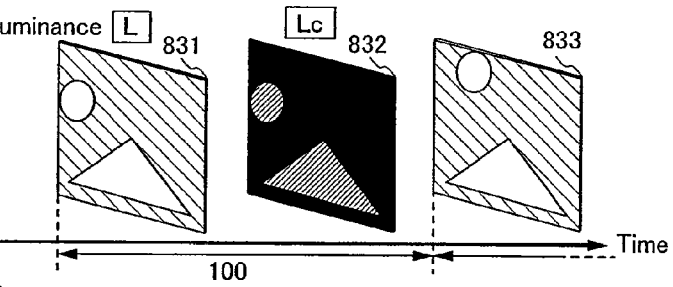

In FIG. 8D, the period 100 denotes one frame period. A first image 831 is a basic image of the previous frame, a second image 832 is an interpolation image of the previous frame, and a third image 833 is a basic image of the current frame. The second image 832 may be an image formed by a certain rule in accordance with the image data of the first image 831. The certain rule may specifically be determined by the amplitude of the movement vector, setting by a user or external environment (such as surrounding brightness or temperature), or a combination of the above.

In FIG. 8D, the grayscale level of the first image 831 is made higher and the second image 832 is displayed as an interpolation image for a portion having saturated luminance to interpolate the grayscale of the first image 831, which leads to pseudo impulse type display. In this embodiment mode, the driving method illustrated in FIG. 8D is grayscale interpolation driving.

Figure 8E:
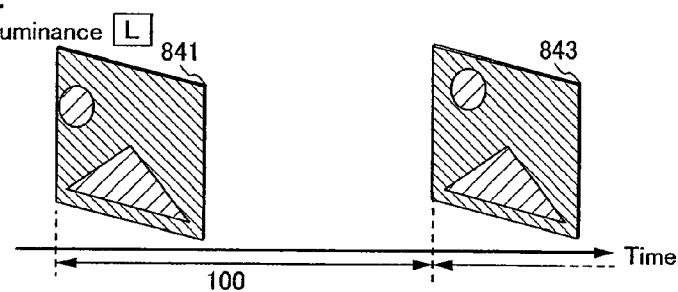

In FIG. 8E, the period 100 denotes one frame period. A first image 841 is a basic image of the previous frame, and a second image 843 is a basic image of the current frame.

FIG. 8E illustrates hold-type driving in which a basic image is being displayed during one frame.

In FIGS. 8A to 8E, the movement amount of the regions which are moved from frame to frame is different in the basic images. In other words, the movement amount of the image illustrated in FIG. 8A (luminance control double-frame rate driving) is the largest, the movement amount of the image illustrated in FIG. 8B (double-frame rate driving) is the second largest, the movement amount of the image illustrated in FIG. 8C (black frame insertion driving) is the third largest, the movement amount of the image illustrated in FIG. 8D (grayscale interpolation driving) is the fourth largest, and the movement amount of the image illustrated in FIG. 8E (hold-type driving) is the fifth largest. In this manner, in accordance with the movement amount of an image, the driving method may be changed for display. Thus, an appropriate driving method to the movement amount can be selected to reduce motion blur effectively and suppress the increase of heat generation along with the increase of the power consumption and the processing amount. In addition, flickers in the small movement of an image can also be reduced.

Figure 9:
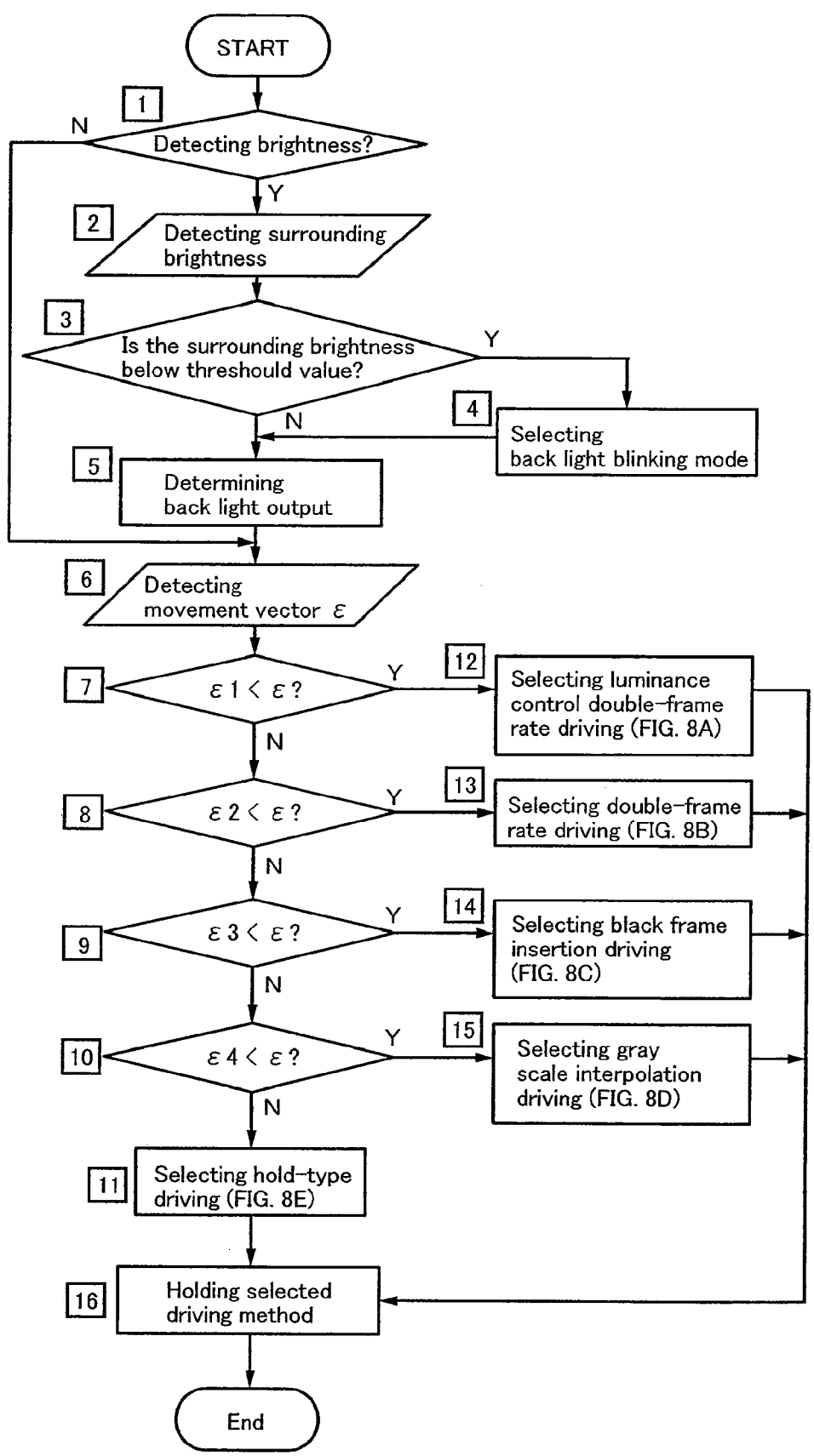
FIG. 9 is a flow chart of a semiconductor device according to the present invention.

Next, FIG. 9 is a flow chart describing selection of a driving method based on movement of an image and surrounding brightness.

After the start of the flow, whether to detect surrounding brightness or not is selected in the first step. When it is selected, go to the second step. When it is not selected, go to the sixth step. Note that the time of not detecting surrounding brightness includes a case where a display device or a semiconductor device in this specification does not have means for detecting surrounding brightness.

In the second step, surrounding brightness is detected. Then, go to the third step.

In the third step, whether the brightness detected in the second step is equal to or lower than a threshold value of predetermined brightness is judged. When it is equal to or lower than the threshold value, go to the fourth step. When it is higher than the threshold value of brightness, go to the fifth step. Note that the threshold value of brightness may be stored in a memory in the display device or the semiconductor device of this specification. In addition, the threshold value of brightness may be designated by a user.

In the fourth step, when the display device or the semiconductor device in this specification has a back light like liquid crystal displays, a back light blinking mode is selected. Then, go to the fifth step. Meanwhile, when the display device or the semiconductor device in this specification does not have a back light, directly go to the fifth step. In addition, the back light blinking mode may be a mode in which the luminance of the whole back light is increased or decreased at one time or a mode in which the luminance of a part of the back light is increased or decreased sequentially. When the back light blinking mode is selected, if the maximum luminance of the backlight is the same, the average luminance becomes small, which leads to darkness of the backlight. However, if surrounding brightness is equal to or lower than the threshold value, the darkness of the backlight accelerates recognition of display, suppress black luminance (black blurring or bright black display), and the power consumption.

In the fifth step, when the display device or the semiconductor device in accordance with this specification has a back light like liquid crystal displays, backlight output is determined. Then, go to the sixth step. Meanwhile, when the display device or the semiconductor device in this specification does not have a back light, directly go to the sixth step or the maximum luminance may be determined by detected brightness and then, go to the sixth step. Note that when the surrounding brightness is small, the backlight output is preferably small. Thus, while low black luminance is achieved, the power consumption can be reduced.

In the sixth step, a movement vector $\in$ is detected. After that, go to the seventh step. Note that the movement vector $\in$ is regarded as a scalar quantity here.

In the sixth step, the movement vector $\in$ detected from an image may be one movement vector or a vector obtained from plural movement vectors. For example, plural movement vectors are detected, and a movement vector $\in$ to be used for selection of a driving method may be obtained from the size and number of the detected movement vectors.

In the seventh step, whether the movement vector $\in$ is larger than a first threshold value $\in 1$ of the movement vector is judged. When the movement vector $\in$ is larger than the first threshold value $\in 1$, go to the twelfth step. When it is not, go to the eighth step.

In the eighth step, whether the movement vector $\in$ is larger than a second threshold value $\in 2$ of the movement vector is judged. When the movement vector $\in$ is larger than the second threshold value $\in 2$ and equal to or smaller than the first threshold value $\in 1$, go to the thirteenth step. When it is not, go to the ninth step.

In the ninth step, whether the movement vector $\in$ is larger than a third threshold value $\in 3$ of the movement vector is judged. When the movement vector $\in$ is larger than the third threshold value $\in 3$ and equal to or smaller than the second threshold value $\in 2$, go to the fourteenth step. When it is not, go to the tenth step.

In the tenth step, whether the movement vector $\in$ is larger than a fourth threshold value $\in 4$ of the movement vector is judged. When the movement vector $\in$ is larger than the fourth threshold value $\in 4$ of the movement vector and equal to or smaller than the third threshold value $\in 3$, go to the fifteenth step. When it is not, go to the eleventh step.

In the eleventh step, hold-type driving (FIG. 8E) is selected. Then, go to the sixth step.

In the twelfth step, luminance control double-frame rate driving (FIG. 8A) is selected. Then, go to the sixteenth step.

In the thirteenth step, double-frame rate driving (FIG. 8B) is selected. After that, go to the sixteenth step.

In the fourteenth step, black frame insertion driving (FIG. 8C) is selected. Then, go to the sixteenth step.

In the fifteenth step, grayscale interpolation driving (FIG. 8D) is selected. Then, go to the sixteenth step.

In the sixteenth step, a selected driving method is held for a certain period. Then, the flow is finished.

In the sixteenth step, a period for maintaining the driving method can be selected as appropriate. For example, the driving method may be shifted for each frame based on the movement vector detected in each frame; every several seconds; every several minuets, or the period for maintaining the driving method may be determined based on a displayed mode set by a user.

In this manner, a driving method is selected in accordance with the flow chart illustrated in FIG. 9, and thus a driving method suitable for the movement amount of an image can be selected. Accordingly, motion blur can be effectively reduced and the increase of heat generation along with the increase of the power consumption and the processing amount can be suppressed. In addition, flickers in the small movement of an image can also be reduced.

In this embodiment mode, four threshold values of the movement vectors are adopted, and one of five driving methods is selected based on the threshold values. However, a driving method selectable here is not limited to the above driving methods, and various driving methods can be used. In addition, if the number of the driving methods selectable is large, the driving circuit becomes complicated and the processing is also complicated; therefore, the number is preferably five or less. Therefore, manufacturing cost and power consumption can be reduced.

The magnitude relationship of the threshold values $\in 1$ to $\in 4$ of the movement vectors may satisfy $0 < \in 4 < \in 3 < \in 2 < \in 1$.

Note that the content of this embodiment mode can be freely combined with the other embodiment modes.

Moreover, the elements or components of the drawings in this embodiment mode can each be combined with elements or components of drawings in other embodiment modes.

Embodiment Mode 3

Embodiment Mode 1 has described the method in which the movement amount of an image is detected from image data included in plural frames and an intermediate image between the images in the plural frames is regarded as an interpolation image, and the luminance of the interpolation image is changed. The method of changing luminance of the interpolation image may be various methods.

Embodiment Mode 3 will describe a method for controlling luminance of an image. Note that the image whose luminance is controlled by the method described in this embodiment mode may be an interpolation image or a basic image.

With reference to FIGS. 10A to 10F, methods of controlling luminance of an image are exemplified. FIGS. 10A to 10F each illustrate a relationship of luminance to grayscale of an image (luminance-grayscale characteristics), where the horizontal axis (X-axis) represents grayscale and the vertical axis (Y-axis) represents luminance. In FIGS. 10A to 10F, a curve 1000, a grayscale X1010, and luminance Y1020 represent luminance-grayscale characteristics before controlling luminance, the maximum grayscale in the curve 1000, and the maximum luminance in the curve 1000, respectively.

The curve 1000 is shown by a concave curve. This is because brightness sensitive to human eyes is not proportional to the physical luminance, and human eyes are more sensitive to brightness in the small range of luminance than brightness in the large range of luminance. In other words, in order to obtain excellent grayscale to human eyes, it is necessary that the variation in luminance of the large range of luminance is larger than that in the small range of luminance.

When excellent grayscale to human eyes is obtained, the curve 1000 is a curve expressed by Expression 1.

$$Y = X^\gamma \qquad \text{[Expression 1]}$$

In the expression 1, Y represents (physical) luminance, X represents grayscale, and γ represents a constant. When the constant γ falls within 2<γ<3, excellent grayscale to human eyes is obtained. Note that X and Y may be standardized.

For the above reasons, the curve 1000 is shown by a concave curve, and the other curves have shapes depending on the curve 1000. However, in this embodiment mode, how the luminance-grayscale characteristics of an image are controlled is described, but the shape of the curve 1000 is not specifically described. In other words, the shape of the curve 1000 is preferably shown by a concave curve; however, it may be a straight line, a convex curve, or a curved line having one or more inflection points.

Figure 10A:
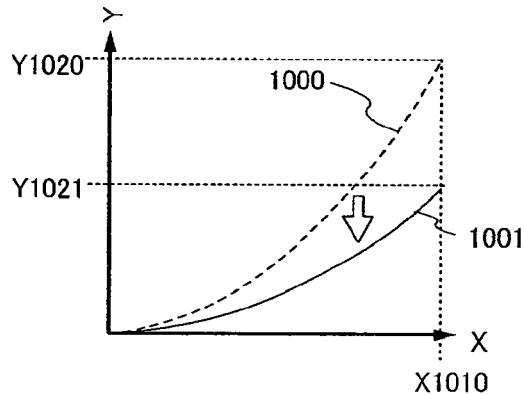
FIGS. 10A to 10F illustrate control methods of luminance of a semiconductor device according to the present invention.

In FIG. 10A, a curve 1001 represents luminance-grayscale characteristic after controlling luminance. In the curve 1001, the maximum grayscale is the grayscale X1010 and the maximum luminance is luminance Y1021. The curve 1001 may be obtained by dividing the curve 1000 by a coefficient A of 1 or more in the whole region of grayscale. At this time, the luminance-grayscale characteristics of the curve 1001 can be represented by Expression 2.

$$Y = \left(\frac{X}{A}\right)^\gamma \qquad \text{[Expression 2]}$$

In FIG. 10A, the curve 1001 may also be obtained by dividing the curve 1000 by a coefficient B of 1 or more with respect to luminance in the whole region of grayscale. At this time, the luminance-grayscale characteristics of the curve 1001 can be represented by Expression 3.

$$Y = \frac{1}{B} X^\gamma \qquad \text{[Expression 3]}$$

The control method of luminance-grayscale characteristics represented by Expression 2 can be realized by dividing image data for specifying luminance. At this time, the luminance can be controlled by image data processing, and thus precise control can be done.

The control method of luminance-grayscale characteristics represented by Expression 3 can be realized by changing driving conditions of the whole display device. For example, in liquid crystal display devices, the luminance of a backlight is controlled to realize the control of a typical luminance. At this time, the image data processing is simple to reduce heat generation and power consumption.

In the expressions 2 and 3, when γ-th power of A is equal to B, the both expressions are equal to each other. In other words, the curve 1001 of luminance-grayscale characteristics after controlling luminance can be obtained by any of the control methods.

Figure 10B:
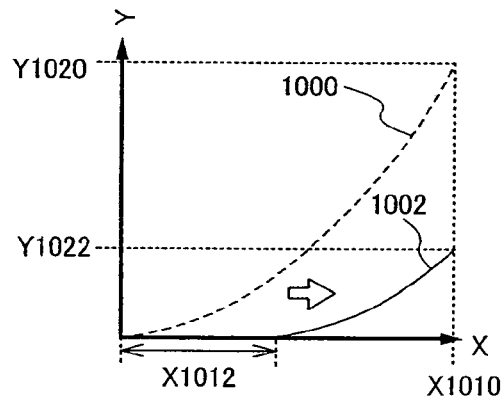

In FIG. 10B, a curve 1002 represents luminance-grayscale characteristics of an image after controlling luminance. In the curve 1002, the maximum grayscale is a grayscale X1010 and the maximum luminance is luminance Y1022. The curve 1001 may be obtained by subtraction of a positive number A from the curve 1000 in the whole region of grayscale. The grayscale quantity corresponding to A is X1012. At this time, the luminance-grayscale characteristics of the curve 1002 can be represented by Expression 4.

$$Y = (X - A)^\gamma \qquad \text{[Expression 4]}$$

Note that when A is larger than X, Y is 0.

The control method of luminance-grayscale characteristic represented by Expression 4 can be realized by subtracting image data for specifying luminance. At this time, the luminance can be controlled by image data processing, and thus precise control can be done.

Figure 10C:
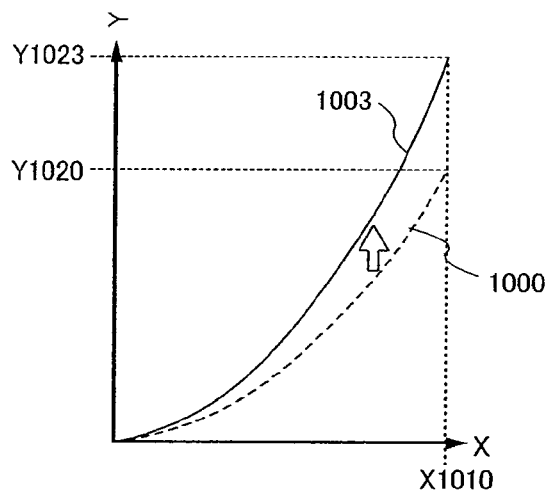

In FIG. 10C, a curve 1003 represents luminance-grayscale characteristic of an image after controlling luminance. In the curve 1003, the maximum grayscale is a grayscale X1010 and the maximum luminance is luminance Y1023. The curve 1003 may be obtained by multiplying the curve 1000 by a coefficient A of 1 or more in the whole region of grayscale. At this time, the luminance-grayscale characteristics of the curve 1003 can be represented by Expression 5.

$$Y = (AX)^\gamma \qquad \text{[Expression 5]}$$

In FIG. 10C, the curve 1003 may be obtained by multiplying the curve 1000 by a coefficient B of 1 or more with respect to luminance in the whole region of grayscale. At this time, the luminance-grayscale characteristics of the curve 1003 can be represented by Expression 6.

$$Y = BX^\gamma \qquad \text{[Expression 6]}$$

The control method of luminance-grayscale characteristic represented by Expression 5 can be realized by multiplying image data for specifying luminance. At this time, the luminance can be controlled by image data processing, and thus precise control can be done.

The control method of luminance-grayscale characteristic represented by Expression 6 can be realized by increasing and decreasing the luminance itself This corresponds to that, in liquid crystal display devices, the luminance of backlight is controlled. At this time, the image data processing is simple to reduce heat generation and power consumption.

In the expressions 5 and 6, when γ-th power of A is equal to B, the both expressions are equal to each other. In other words, the curve 1003 of luminance-grayscale characteristics after controlling luminance can be obtained by any of the control methods.

Figure 10D:
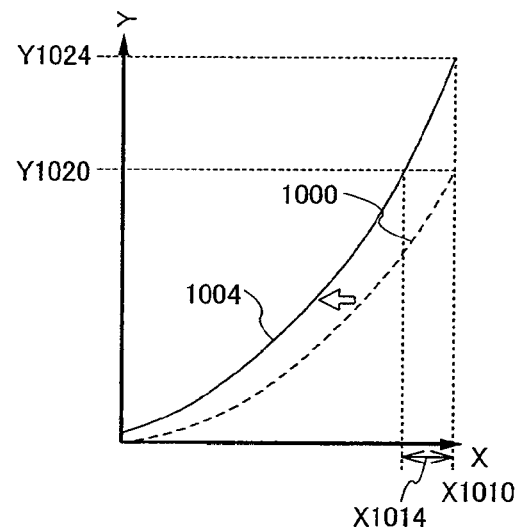

In FIG. 10D, a curve 1004 represents luminance-grayscale characteristics after controlling luminance. In the curve 1004, the maximum grayscale is a grayscale X1010 and the maximum luminance is luminance Y1024. The curve 1004 may be obtained by addition of a positive number A to the curve 1000 in the whole region of grayscale. The grayscale quantity corresponding to A is X1014. At this time, the luminance-grayscale characteristics of the curve 1004 can be represented by Expression 7.

$$Y = (X + A)^\gamma \qquad \text{[Expression 7]}$$

The control method of luminance-grayscale characteristic represented by Expression 7 can be realized by addition to image data for specifying luminance. At this time, the luminance can be controlled by image data processing, and thus precise control can be done.

Figure 10E:
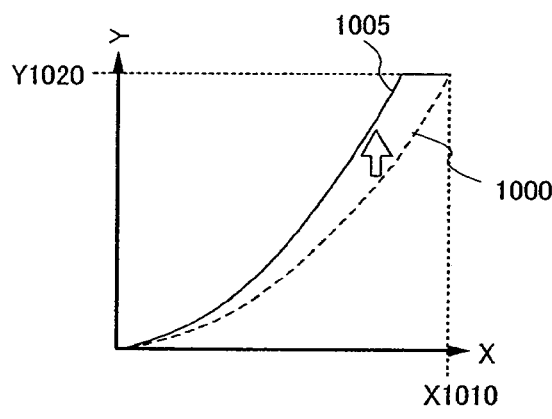

In FIG. 10E, a curve 1005 represents luminance-grayscale characteristics of an image after controlling luminance. The curve 1005 may be controlled by the same control method as the curve 1003; however, the curve 1005 is different from the curve 1003 in that the upper limit of luminance is the maximum luminance of the curve 1000. Thus, the maximum grayscale of the curve 1005 is the grayscale X1010 and the maximum luminance of the curve 1005 is luminance Y1020. The luminance-grayscale characteristics of the curve 1005 can be represented by Expression 5, within the grayscale range except at the upper limit luminance Y1020.

Figure 10F:
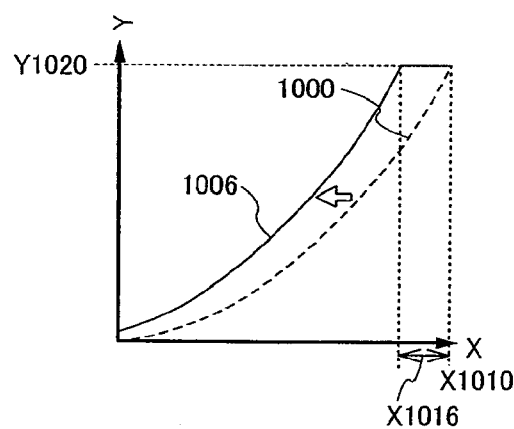

In FIG. 10F, a curve 1006 is luminance-grayscale characteristics of an image after controlling luminance. The curve 1006 may be controlled in the same control method as the curve 1004; however, the curve 1006 is different from the curve 1004 in that the upper limit of luminance is the maximum luminance of the curve 1000. Thus, the maximum grayscale of the curve 1006 is X1010 and the maximum luminance of the curve 1006 is luminance Y1020. In addition, the grayscale quantity added in the whole region of grayscale is X1016. The luminance-grayscale characteristics of the curve 1006 can be represented by Expression 7, within the grayscale range except at the upper limit luminance Y1020.

In this embodiment mode, except for in FIGS. 10C and 10D, cases are described where the upper limit luminance in the luminance-grayscale characteristics after controlling luminance of an image is the maximum luminance Y1020 before controlling the luminance; however, in all cases, as shown in FIGS. 10C and 10D, the maximum luminance after controlling luminance can be higher than that before controlling the luminance.

Next, with reference to FIGS. 11A to 11D, examples of controlling luminance of an image are described. FIGS. 11A to 11D each illustrate a relationship of luminance to grayscale of an image (luminance-grayscale characteristics), where the horizontal axis (X-axis) represents grayscale and the vertical axis (Y-axis) represents luminance. In FIGS. 11A to 11D, a curve 1000, a grayscale X1010, and luminance Y1020 represent luminance-grayscale characteristics of an image before controlling luminance, the maximum grayscale in the curve 1000, and the maximum luminance in the curve 1000, respectively.

Figure 11A:
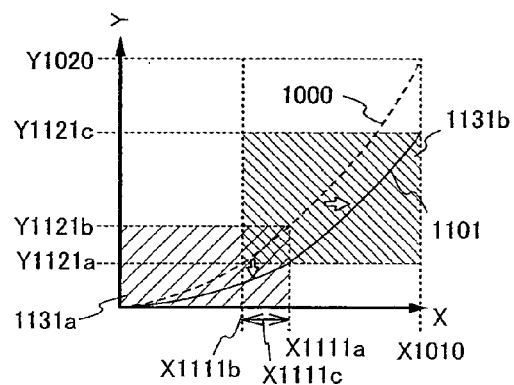
FIGS. 11A to 11D illustrate control methods of luminance of a semiconductor device according to the present invention.

In FIG. 11A, a curve 1101 represents luminance-grayscale characteristics of an image after controlling luminance. The curve 1101 is luminance-grayscale characteristics obtained by providing two regions (regions 1131a and 1131b) in the luminance-grayscale plane and conducting different processing to the curve 1000 in each region. In addition, a grayscale X1111a is a grayscale at the border portion in which the luminance-grayscale characteristics of the curve 1101 changes; a grayscale X1111b is a grayscale obtained by subtracting a grayscale X1111c from a grayscale X1111a; the grayscale X1111c is a processed grayscale amount in the region 1131b; luminance Y1121a is the maximum luminance of the curve 1101 in the region 1131a; luminance Y1121b is luminance of the curve 1000 in the grayscale X1111a; and luminance Y1121c is the maximum luminance of the curve 1101 in the region 1131b.

The region 1131a is a region having the grayscale range from 0 to the grayscale X1111a and the luminance range from 0 to the luminance Y1121b. In the region 1131a, the processing to the curve 1000 may be division by a coefficient A1 of 1 or more. In the region 1131a, the curve 1101 may be a curve having a minimum grayscale of 0, the maximum grayscale of X1111a, the minimum luminance of 0, and the maximum luminance of Y1121a, and represented by Expression 2 (A is A1).

The region 1131b is a region having the grayscale range from the grayscale X1111b to the grayscale X1010 and the luminance range from luminance Y1121a to the luminance Y1121c. In the region 1131b, the processing to the curve 1000 may be subtraction by a positive number A2. The grayscale amount corresponding to A2 is X1111c. In the region 1131b, the curve 1101 may be a curve having a minimum grayscale of X1111a, the maximum grayscale of X1010, the minimum luminance of Y1121a, and the maximum luminance of Y1121c and represented by Expression 4 (A is A2).

The curve 1101 may be continuous in the grayscale X1111a. Thus, because an unnatural outline does not appear at the border portion of grayscales, image quality can be enhanced.

The control method of luminance-grayscale characteristics illustrated in FIG. 11A can be realized by processing image data for specifying luminance. At this time, the luminance can be controlled by image data processing, and thus precise control can be done.

Figure 11B:
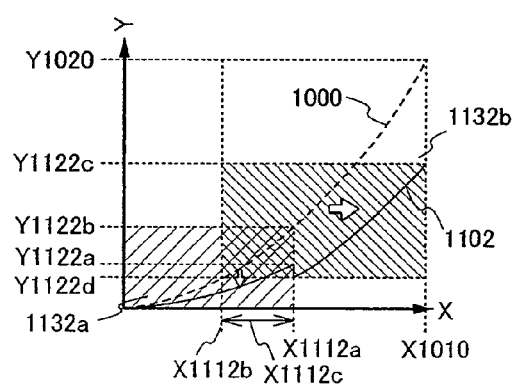

In FIG. 11B, the curve 1102 represents luminance-grayscale characteristics of an image after controlling luminance. The curve 1102 represents luminance-grayscale characteristics obtained by providing two regions (regions 1132a and 1132b) in the luminance-grayscale plane and conducting different processing to the curve 1000 in each region. In addition, a grayscale X1112a is a grayscale at the border portion of the curve 1102 in which the luminance-grayscale characteristics change; a grayscale X1112b is a grayscale obtained by subtracting a grayscale X1112c from a grayscale X1112a; the grayscale X1112c is a processed grayscale amount in the region 1132b; luminance Y1122a is the maximum luminance of the curve 1102 in the region 1132a; luminance Y1122b is luminance of the curve 1000 in the grayscale X1112a; luminance Y1122c is the maximum luminance of the curve 1102 in the region 1132b; and luminance Y1122d is the minimum luminance of the curve 1102 in the region 1132b.

The region 1132a is a region having the grayscale range from 0 to the grayscale X1112a and the luminance range from 0 to the luminance Y1122b. In the region 1132a, the processing to the curve 1000 may be division by a coefficient A1 of 1 or more. In the region 1132a, the curve 1102 may be a curve having a minimum grayscale of 0, the maximum grayscale of X1112a, the minimum luminance of 0, and the maximum luminance of Y1122a, and represented by Expression 2 (A is A1).

The region 1132b is a region having the grayscale range from the grayscale X1112b to the grayscale X1010 and the luminance range from luminance Y1122a to the luminance Y1122c. In the region 1132b, the processing to the curve 1000 may be subtraction by a positive number A2. The grayscale amount corresponding to A2 is X1112c. In the region 1132b, the curve 1102 may be a curve having a minimum grayscale of X1112a, the maximum grayscale of X1010, the minimum luminance of Y1122d, and the maximum luminance of Y1122c, and represented by Expression 4 (A is A2).

Note that the curve 1102 may be discontinuous in the grayscale X1112a such that the grayscale decreases (luminance Y1122a>luminance Y1122d). Thus, the luminance difference between the curve 1000 and the curve 1102 can be decreased in the low grayscale region to reduce flickers. In the high grayscale region, the luminance difference between the curve 1000 and the curve 1102 can be increased to reduce motion blur.

The control method of luminance-grayscale characteristics illustrated in FIG. 11B can be realized by processing image data for specifying luminance. At this time, the luminance can be controlled by image data processing, and thus precise control can be done.

Figure 11C:
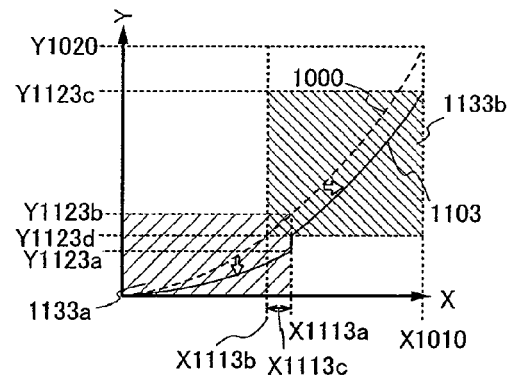

In FIG. 11C, a curve 1103 represents luminance-grayscale characteristics after controlling luminance. The curve 1103 represents luminance-grayscale characteristics obtained by providing two regions (regions 1133a and 1133b) in the luminance-grayscale plane and conducting different processing to the curve 1000 in each region. In addition, a grayscale X1113a is a grayscale at the border portion of the curve 1103 in which the luminance-grayscale characteristics change; a grayscale X1113b is a grayscale obtained by subtracting a grayscale X1113c from a grayscale X1113a; the grayscale X1113c is a processed grayscale amount in the region 1133b; luminance Y1123a is the maximum luminance of the curve 1103 in the region 1133a; luminance Y1123b is luminance of the curve 1000 in the grayscale X1113a; luminance Y1123c is the maximum luminance of the curve 1000 in the region 1133b; luminance Y1123d is the minimum luminance of the curve 1103 in the region 1133b.

The region 1133a is a region having the grayscale range from 0 to the grayscale X1113a and the luminance range from 0 to the luminance Y1123b. In the region 1133a, the processing to the curve 1000 may be division by a coefficient A1 of 1 or more. In the region 1133a, the curve 1103 may be a curve having a minimum grayscale of 0, the maximum grayscale of X1113a, the minimum luminance of 0, and the maximum luminance of Y1123a, and represented by Expression 2 (A is A1).

The region 1133b is a region having the grayscale range from the grayscale X1113b to the grayscale X1010 and the luminance range from luminance Y1123d to the luminance Y1123c. In the region 1133b, the processing to the curve 1000 may be subtraction by a positive number A2. The grayscale amount corresponding to A2 is X1113c. In the region 1133b, the curve 1103 may be a curve having a minimum grayscale of X1113a, the maximum grayscale of X1010, the minimum luminance of Y1123d, and the maximum luminance of Y1123c, and represented by Expression 4 (A is A2).

Note that the curve 1103 may be discontinuous in the grayscale X1113a such that the grayscale increases (luminance Y1123a<luminance Y1123d). Thus, the luminance difference between the curve 1000 and the curve 1103 can be increased in the low grayscale region to reduce motion blur. In the high grayscale region, the luminance difference between the curve 1000 and the curve 1103 can be decreased to reduce flickers.

The control method of luminance-grayscale characteristics illustrated in FIG. 11C can be realized by processing image data for specifying luminance. At this time, the luminance can be controlled by image data processing, and thus precise control can be done.

Figure 11D:
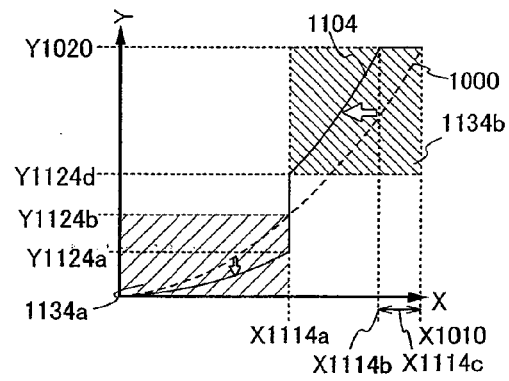

In FIG. 11D, a curve 1104 represents luminance-grayscale characteristics after controlling luminance. The curve 1104 represents luminance-grayscale characteristics obtained by providing two regions (regions 1134a and 1134b) in the luminance-grayscale plane and conducting different processing to the curve 1000 in each region. In addition, a grayscale X1114a is a grayscale at the border portion of the curve 1104 in which the luminance-grayscale characteristics change; a grayscale X1114b is a grayscale obtained by subtracting a grayscale X1114c from a grayscale X1010; the grayscale X1114 is a processed grayscale amount in the region 1134b; luminance Y1124a is the maximum luminance of the curve 1104 in the region 1134a; luminance Y1124b is luminance of the curve 1000 in the grayscale X1114a; and luminance Y1124d is the minimum luminance of the curve 1104 in the region 1134b.

The region 1134a is a region having the grayscale range from 0 to the grayscale X1114a and the luminance range from 0 to the luminance Y1124b. In the region 1134a, the processing to the curve 1000 may be division by a coefficient A1 of 1 or more. In the region 1134a, the curve 1104 may be a curve having a minimum grayscale of 0, the maximum grayscale of X1114a, the minimum luminance of 0, and the maximum luminance of Y1124a, and represented by Expression 2 (A is A1).

The region 1134b is a region having the grayscale range from the grayscale X1114a to the grayscale X1010 and the luminance range from luminance Y1124d to the luminance Y1020. In the region 1134b, the processing to the curve 1000 may be addition by a positive number A2. The grayscale amount corresponding to A2 is X1114c. In the region from the grayscale X1114a to the grayscale X1114b of the region 1134b, the curve 1104 may be a curve having a minimum grayscale of X1114a, the maximum grayscale of X1114b, the minimum luminance of Y1124d, and the maximum luminance of Y1020, and represented by Expression 4 (A is A2). In the region from the grayscale X1114b to the grayscale X1010, the luminance may be constant at the maximum luminance of Y1020.

Note that the curve 1104 may be discontinuous in the grayscale X1114a such that the grayscale increases (luminance Y1124a<luminance Y1124d). Thus, since it is darker in the low grayscale region and it is lighter in the high grayscale region, contrast can be enhanced.

The control method of luminance-grayscale characteristics illustrated in FIG. 11D can be realized by processing image data for specifying luminance. At this time, the luminance can be controlled by image data processing, and thus precise control can be done.

Figure 12A:
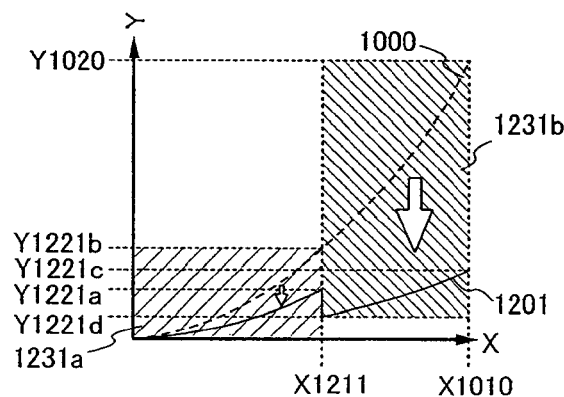
FIGS. 12A to 12C illustrate control methods of luminance of a semiconductor device according to the present invention.
Figure 12B:
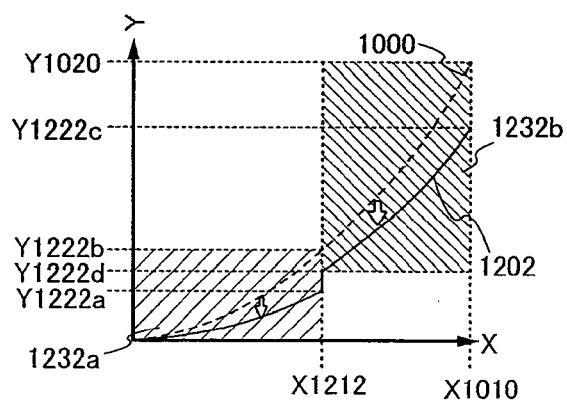
Figure 12C:
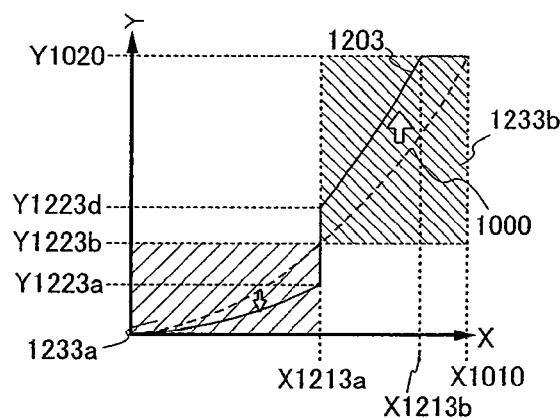

Next, with reference to FIGS. 12A to 12C, examples of controlling luminance of an image are described. FIGS. 12A to 12C each illustrate a relationship of luminance to grayscale of an image (luminance-grayscale characteristics), where the horizontal axis (X-axis) represents grayscale and the vertical axis (Y-axis) represents luminance. In FIGS. 12A to 12C, a curve 1000, a grayscale X1010, and luminance Y1020 represent luminance-grayscale characteristics of an image before controlling luminance, the maximum grayscale in the curve 1000, and the maximum luminance in the curve 1000, respectively.

In FIG. 12A, a curve 1201 represents luminance-grayscale characteristics of an image after controlling luminance. The curve 1201 is luminance-grayscale characteristics obtained by providing two regions (regions 1231a and 1231b) in the luminance-grayscale plane and conducting different processing to the curve 1000 in each region. In addition, a grayscale X1211 is a grayscale at the border portion of the curve 1201 in which the luminance-grayscale characteristics change; luminance Y1221a is the maximum luminance of the curve 1201 in the region 1231a; luminance Y1121b is luminance of the curve 1000 in the grayscale X1211; luminance Y1221c is the maximum luminance of the curve 1201 in the region 1231b; and luminance Y1221d is the minimum luminance of the curve 1201 in the region 1231b.

The region 1231a is a region having the grayscale range from 0 to the grayscale X1211 and the luminance range from 0 to the luminance Y1221b. In the region 1231a, the processing to the curve 1000 may be division by a coefficient A1 of 1 or more. In the region 1231a, the curve 1201 may be a curve having a minimum grayscale of 0, the maximum grayscale of X1121a, the minimum luminance of 0, and the maximum luminance of Y1221a, and represented by Expression 2 (A is A1).

The region 1231b is a region having the grayscale range from the grayscale X1211 to the grayscale X1010 and the luminance range from luminance Y1221a to the luminance Y1020. In the region 1231b, the processing to the curve 1000 may be division by a coefficient A2 or 1 or more. In the region 1231b, the curve 1201 may be a curve having a minimum grayscale of X1211, the maximum grayscale of X1010, the minimum luminance of Y1221d, and the maximum luminance of Y1221c and represented by Expression 4 (A is A2).

Note that the curve 1201 may be discontinuous in the grayscale X1211 such that the grayscale decreases (luminance Y1221a>luminance Y1221d). Thus, the luminance difference between the curve 1000 and the curve 1201 can be decreased in the low grayscale region to reduce flickers. In the high grayscale region, the luminance difference between the curve 1000 and the curve 1201 can be increased to reduce motion blur.

The control method of luminance-grayscale characteristics illustrated in FIG. 12A can be realized by processing image data for specifying luminance. At this time, the luminance can be controlled by image data processing, and thus precise control can be done.

In FIG. 12B, a curve 1202 represents luminance-grayscale characteristics after controlling luminance. The curve 1202 is luminance-grayscale characteristics obtained by providing two regions (regions 1232a and 1232b) in luminance-grayscale plane and conducting different processing to the curve 1000 in each region. In addition, a grayscale X1212 is a grayscale at the border portion of the curve 1202 in which the luminance-grayscale characteristics change; luminance Y1222a is the maximum luminance of the curve 1202 in the region 1232a; luminance Y1122b is luminance of the curve 1000 in the grayscale X1212; luminance Y1122c is the maximum luminance of the curve 1202 in the region 1232b; and luminance Y1122d is the minimum luminance of the curve 1202 in the region 1232b.

The region 1232a is a region having the grayscale range from 0 to the grayscale X1212 and the luminance range from 0 to the luminance Y1222b. In the region 1232a, the processing to the curve 1000 may be division by a coefficient A1 of 1 or more. In the region 1232a, the curve 1202 may be a curve having a minimum grayscale of 0, the maximum grayscale of X1122, the minimum luminance of 0, and the maximum luminance of Y1222a, and represented by Expression 2 (A is A1).

The region 1232b is a region having the grayscale range from the grayscale X1212 to the grayscale X1010 and the luminance range from luminance Y1222d to the luminance Y1020. In the region 1232a, the processing to the curve 1000 may be division by a coefficient A2 of 1 or more. In the region 1232b, the curve 1202 may be a curve having a minimum grayscale of X1212, the maximum grayscale of X1010, the minimum luminance of Y1222a, and the maximum luminance of Y1222c and represented by Expression 4 (A is A2).

Note that the curve 1202 may be discontinuous in the grayscale X1212 such that the grayscale increases (luminance Y1122a<luminance Y1122d). Thus, the luminance difference between the curve 1000 and the curve 1202 can be increased in the low grayscale region to reduce motion blur. In the high grayscale region, the luminance difference between the curve 1000 and the curve 1202 can be decreased to reduce flickers.

The control method of luminance-grayscale characteristics illustrated in FIG. 12B can be realized by processing image data for specifying luminance. At this time, the luminance can be controlled by image data processing, and thus precise control can be done.

In FIG. 12C, a curve 1203 represents luminance-grayscale characteristics after controlling luminance. The curve 1203 is luminance-grayscale characteristics obtained by providing two regions (regions 1233a and 1233b) in luminance-grayscale plane and conducting different processing to the curve 1000 in each region. In addition, a grayscale X1213a is a grayscale at the border portion of the curve 1203 in which the luminance-grayscale characteristics change; luminance Y1223a is the maximum luminance of the curve 1203 in the region 1233a; luminance Y1223b is luminance of the curve 1000 in the grayscale X1213a; and luminance Y1223d is the minimum luminance of the curve 1203 in the region 1233b.

The region 1233a is a region having the grayscale range from 0 to the grayscale X1213a and the luminance range from 0 to the luminance Y1223b. In the region 1233a, the processing to the curve 1000 may be division by a coefficient A1 of 1 or more. In the region 1233a, the curve 1203 may be a curve having a minimum grayscale of 0, the maximum grayscale of X1213a, the minimum luminance of 0, and the maximum luminance of Y1223a, and represented by Expression 2 (A is A1).

The region 1233b is a region having the grayscale range from the grayscale X1213 to the grayscale X1010 and the luminance range from luminance Y1223b to the luminance Y1020. In the region 1233b, the processing to the curve 1000 may be division by a coefficient A2 of 1 or more. In the region from the grayscale X1213a to the grayscale X1213b of the region 1233b, the curve 1203 may be a curve having a minimum grayscale of X1213a, the maximum grayscale of X1213b, the minimum luminance of Y1223d, and the maximum luminance of Y1020 and represented by Expression 5 (A is A2). In the region from the grayscale X1213b to the grayscale X1010, luminance may be constant at the maximum luminance of Y1020.

Note that the curve 1203 may be discontinuous in the grayscale X1213a such that the grayscale increases (luminance Y1223a<luminance Y1223d). Thus, since it is darker in the low grayscale region and it is lighter in the high grayscale region, contrast can be enhanced.

The control method of luminance-grayscale characteristics illustrated in FIG. 12C can be realized by processing image data for specifying luminance. At this time, the luminance can be controlled by image data processing, and thus precise control can be done.

Next, with reference to FIGS. 13A to 13D, examples of controlling luminance of an image are described. FIGS. 13A to 13D each illustrate a relationship of luminance to grayscale of an image (luminance-grayscale characteristics), where the horizontal axis (X-axis) represents grayscale and the vertical axis (Y-axis) represents luminance. In FIGS. 13A to 13D, a curve 1000, a grayscale X1010, and luminance Y1020 represent luminance-grayscale characteristics before controlling luminance, the maximum grayscale in the curve 1000, and the maximum luminance in the curve 1000, respectively.

Figure 13A:
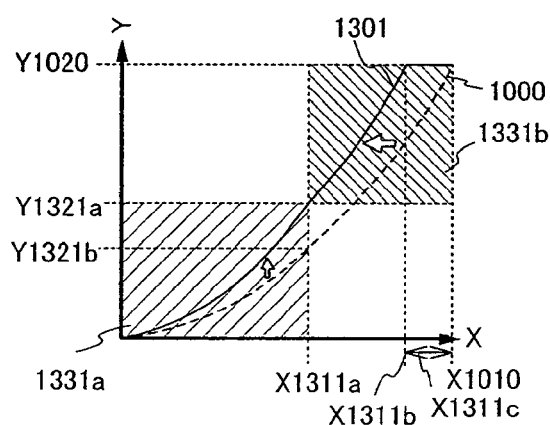
FIGS. 13A to 13D illustrate control methods of luminance of a semiconductor device according to the present invention.

In FIG. 13A, a curve 1301 represents luminance-grayscale characteristics after controlling luminance. The curve 1301 is luminance-grayscale characteristics obtained by providing two regions (regions 1331a and 1331b) in luminance-grayscale plane and conducting different processing to the curve 1000 in each region. In addition, a grayscale X1311a is a grayscale at the border portion of the curve 1301 in which the luminance-grayscale characteristics change; a grayscale X1311b is a grayscale obtained by subtracting a grayscale X1311c from a grayscale X1010; the grayscale X1311c is a processed grayscale amount in the region 1331b; luminance Y1321a is the maximum luminance of the curve 1301 in the region 1331a; and luminance Y1321b is luminance of the curve 1000 in the grayscale X1311a.

The region 1331a is a region having the grayscale range from 0 to the grayscale X1311a and the luminance range from 0 to the luminance Y1321b. In the region 1331a, the processing to the curve 1000 may be multiplication by a coefficient A1 of 1 or more. In the region 1331a, the curve 1301 may be a curve having a minimum grayscale of 0, the maximum grayscale of X1311a, the minimum luminance of 0, and the maximum luminance of Y1321a, and represented by Expression 5 (A is A1).

The region 1331b is a region having the grayscale range from the grayscale X1311a to the grayscale X1010 and the luminance range from luminance Y1321a to the luminance Y1020. In the region 1331b, the processing to the curve 1000 may be addition by a positive number A2. The grayscale amount corresponding to A2 is X1311c. In the region from the grayscale X1311a to the grayscale 1311b of the region 1331b, the curve 1301 may be a curve having a minimum grayscale of X1311a, the maximum grayscale of X1311b, the minimum luminance of Y1321a, and the maximum luminance of Y1020 and represented by Expression 7 (A is A2). In the region from the grayscale X1311b to the grayscale X1010, luminance may be constant at the maximum luminance of Y1020.

The curve 1301 may be continuous in the grayscale X1311a. Thus, because an unnatural outline does not appear on a border portion of grayscale, image quality can be enhanced.

The control method of luminance-grayscale characteristics illustrated in FIG. 13A can be realized by processing image data for specifying luminance. At this time, the luminance can be controlled by image data processing, and thus precise control can be done.

Figure 13B:
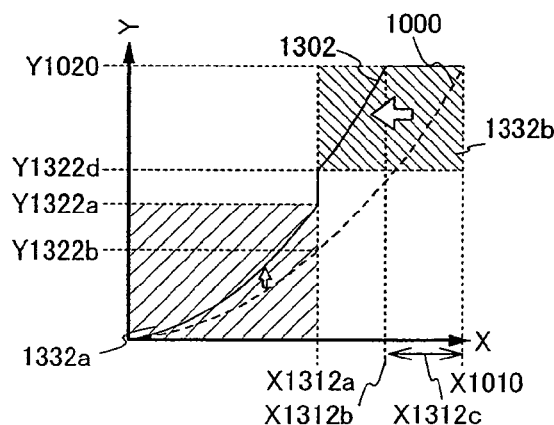

FIG. 13B represents luminance-grayscale characteristics of an image after controlling luminance. A curve 1302 represents luminance-grayscale characteristics obtained by providing two regions (regions 1332a and 1332b) in luminance-grayscale plane and conducting different processing to the curve 1000 in each region. In addition, a grayscale X1312a is a grayscale at the border portion of the curve 1302 in which the luminance-grayscale characteristics change; a grayscale X1312b is a grayscale obtained by subtracting a grayscale X1312c from a grayscale X1010; the grayscale X1312c is a processed grayscale amount in the region 1332b; luminance Y1322a is the maximum luminance of the curve 1302 in the region 1332a; luminance Y1322b is luminance of the curve 1302 in the grayscale X1312a; and luminance Y1322d is the minimum luminance of the curve 1302 in the region 1332b. The region 1332a is a region having the grayscale range from 0 to the grayscale X1312a and the luminance range from 0 to the luminance Y1322a. In the region 1332a, the processing to the curve 1000 may be multiplication by a coefficient A1 of 1 or more. In the region 1332a, the curve 1302 may be a curve having a minimum grayscale of 0, the maximum grayscale of X1312a, the minimum luminance of 0, and the maximum luminance of Y1322a, and represented by Expression 5 (A is A1).

The region 1332b is a region having the grayscale range from the grayscale X1312b to the grayscale X110 and the luminance range from luminance Y1322d to the luminance Y1020. In the region 1332b, the processing to the curve 1000 may be addition of a positive number A2. The grayscale amount corresponding to A2 is X1312c. In the region from the grayscale X1312a to the grayscale X1312b of the region 1332b, the curve 1302 may be a curve having a minimum grayscale of X1312a, the maximum grayscale of X1312b, the minimum luminance of Y1322d, and the maximum luminance of Y1020 and represented by Expression 7 (A is A2). In the region from the grayscale X1312b to the grayscale X1010, luminance may be constant at the maximum luminance of Y1020.

Note that the curve 1302 may be discontinuous in the grayscale X1312a such that the grayscale increases (luminance Y1322a<luminance Y1322d). Thus, the luminance difference between the curve 1000 and the curve 1302 can be decreased in the low grayscale region to reduce flickers. In the high grayscale region, the luminance difference between the curve 1000 and the curve 1302 can be increased to reduce motion blur.

The control method of luminance-grayscale characteristics illustrated in FIG. 13B can be realized by processing image data for specifying luminance. At this time, the luminance can be controlled by image data processing, and thus precise control can be done.

Figure 13C:
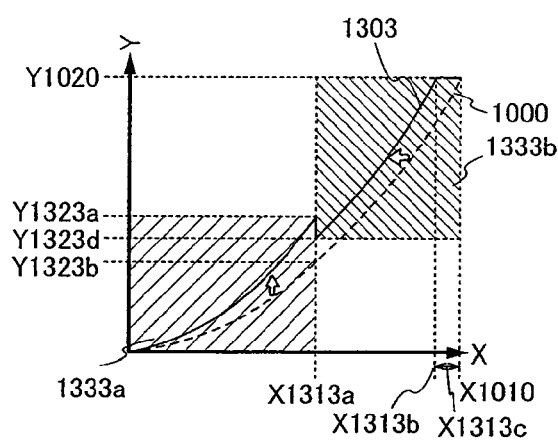

In FIG. 13C, the curve 1303 represents luminance-grayscale characteristics after controlling luminance. A curve 1303 represents luminance-grayscale characteristics obtained by providing two regions (regions 1333a and 1333b) in luminance-grayscale plane and conducting different processing to the curve 1000 in each region. In addition, a grayscale X1313a is a grayscale at the border portion of the curve 1303 in which the luminance-grayscale characteristics change; a grayscale X1313b is a grayscale obtained by subtracting a grayscale X1313c from a grayscale X1010; the grayscale X1313c is a processed grayscale amount in the region 1333b; luminance Y1323a is the maximum luminance of the curve 1303 in the region 1333a; luminance Y1323b is luminance of the curve 1000 in the grayscale X1313a; and luminance Y1323d is the minimum luminance of the curve 1303 in the region 1333b.

The region 1333a is a region having the grayscale range from 0 to the grayscale X1313a and the luminance range from 0 to the luminance Y1323a. In the region 1333a, the processing to the curve 1000 may be multiplication by a coefficient A1 of 1 or more. In the region 1333a, the curve 1303 may be a curve having a minimum grayscale of 0, the maximum grayscale of X1313a, the minimum luminance of 0, and the maximum luminance of Y1323a, and represented by Expression 5 (A is A1).

The region 1333b is a region having the grayscale range from the grayscale X1313a to the grayscale X1010 and the luminance range from luminance Y1323d to the luminance Y1020. In the region 1333b, the processing to the curve 1000 may be addition of a positive number A2. The grayscale amount corresponding to A2 is X1313c. In the region from the grayscale X1313a to the grayscale X1313b of the region 1333b, the curve 1303 may be a curve having a minimum grayscale of X1313a, the maximum grayscale of X1313b, the minimum luminance of Y1323d, and the maximum luminance of Y1020 and represented by Expression 7 (A is A2). In the region from the grayscale X1313b to the grayscale X1010, luminance may be constant at the maximum luminance of Y1020.

Note that the curve 1303 may be discontinuous in the grayscale X1313a such that the grayscale decreases (luminance Y1323a>luminance Y1323d). Thus, the luminance difference between the curve 1000 and the curve 1303 can be increased in the low grayscale region to reduce motion blur. In the high grayscale region, the luminance difference between the curve 1000 and the curve 1303 can be increased to reduce flickers.

The control method of luminance-grayscale characteristics illustrated in FIG. 13C can be realized by processing image data for specifying luminance. At this time, the luminance can be controlled by image data processing, and thus precise control can be done.

Figure 13D:
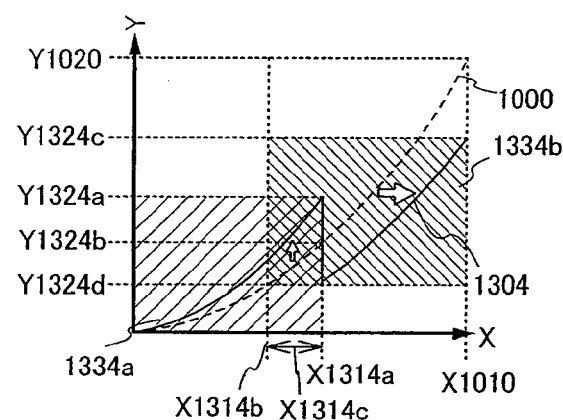

In FIG. 13D, the curve 1304 represents luminance-grayscale characteristics after controlling luminance. A curve 1304 represents luminance-grayscale characteristics obtained by providing two regions (regions 1334a and 1334b) in luminance-grayscale plane and conducting different processing to the curve 1000 in each region. In addition, a grayscale X1314a is a grayscale at the border portion of the curve 1304 in which the luminance-grayscale characteristics change; a grayscale X1314b is a grayscale obtained by subtracting a grayscale X1314c from a grayscale X1314a; the grayscale X1314c is a processed grayscale amount in the region 1334b; luminance Y1324a is the maximum luminance of the curve 1304 in the region 1334a; luminance Y1324b is luminance of the curve 1000 in the grayscale X1314a; luminance Y1324c is the maximum luminance of the curve 1304 in the region 1334b; and luminance Y1324d is the minimum luminance of the curve 1304 in the region 1334b.

The region 1334a is a region having the grayscale range from 0 to the grayscale X1314a and the luminance range from 0 to the luminance Y1324b. In the region 1334a, the processing to the curve 1000 may be multiplication by a coefficient A1 of 1 or more. In the region 1334a, the curve 1304 may be a curve having a minimum grayscale of 0, the maximum grayscale of X1314a, the minimum luminance of 0, and the maximum luminance of Y1324a, and represented by Expression 5 (A is A1).

The region 1334b is a region having the grayscale range from the grayscale X1314b to the grayscale X1010 and the luminance range from luminance Y1324d to the luminance Y1324c. In the region 1334b, the processing to the curve 1000 may be subtraction of a positive number A2. The grayscale amount corresponding to A2 is X1314c. In the region 1334b, the curve 1304 may be a curve having a minimum grayscale of X1314a, the maximum grayscale of X1010, the minimum luminance of Y1324d, and the maximum luminance of Y1324c and represented by Expression 4 (A is A2).

Note that the curve 1304 may be discontinuous in the grayscale X1314a such that the grayscale decreases (luminance Y1324a>luminance Y1324d). Thus, since it is darker in the low grayscale region and it is lighter in the high grayscale region, contrast can be decreased.

The control method of luminance-grayscale characteristics illustrated in FIG. 13D can be realized by processing image data for specifying luminance. At this time, the luminance can be controlled by image data processing, and thus precise control can be done.

Figure 14A:
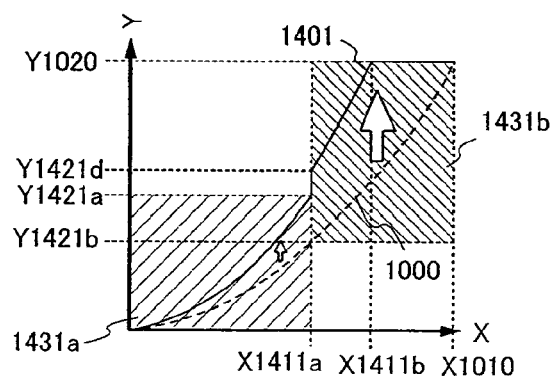
FIGS. 14A to 14C illustrate control methods of luminance of a semiconductor device according to the present invention.
Figure 14B:
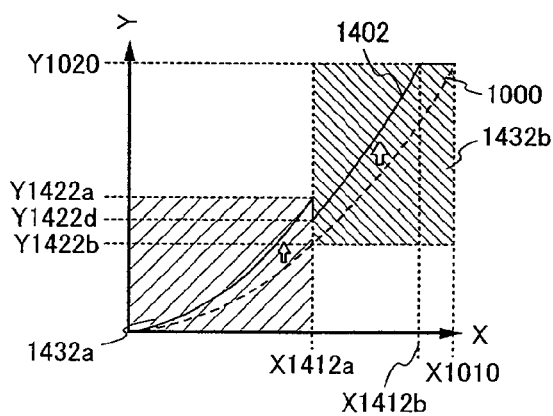
Figure 14C:
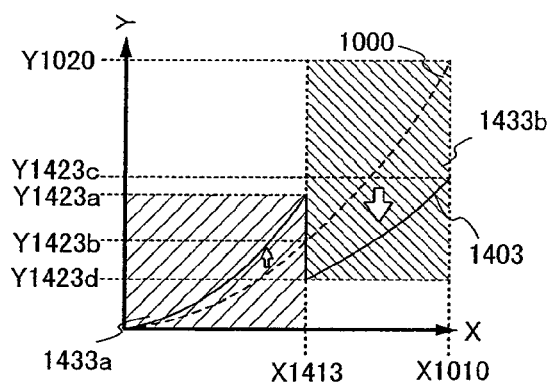

Next, with reference to FIGS. 14A to 14C, examples of controlling luminance of an image are described. FIGS. 14A to 14C each illustrate a relationship of luminance to grayscale of an image (luminance-grayscale characteristics), where the horizontal axis (X-axis) represents grayscale and the vertical axis (Y-axis) represents luminance. In FIGS. 14A to 14C, a curve 1000, a grayscale X1010, and luminance Y1020 represent luminance-grayscale characteristics before controlling luminance, the maximum grayscale in the curve 1000, and the maximum luminance in the curve 1000, respectively.

In FIG. 14A, a curve 1401 represents luminance-grayscale characteristics after controlling luminance. The curve 1401 is luminance-grayscale characteristics obtained by providing two regions (regions 1431a and 1431b) in luminance-grayscale plane and conducting different processing to the curve 1000 in each region. In addition, a grayscale X1411a is a grayscale at the border portion of the curve 1401 in which the luminance-grayscale characteristics change; a grayscale X1411b is the minimum grayscale of grayscales in which the luminance of the curve 1401 is luminance Y1020; luminance Y1421a is the maximum luminance of the curve 1401 in the region 1431a; luminance Y1421b is luminance of the curve 1000 in the grayscale X1411a; and luminance Y1421d is the minimum luminance of the curve 1401 in the region 1431b.

The region 1431a is a region having the grayscale range from 0 to the grayscale X1411a and the luminance range from 0 to the luminance Y1421a. In the region 1431a, the processing to the curve 1000 may be multiplication by a coefficient A1 of 1 or more. In the region 1431a, the curve 1401 may be a curve having a minimum grayscale of 0, the maximum grayscale of X1411a, the minimum luminance of 0, and the maximum luminance of Y1421a, and represented by Expression 5 (A is A1).

The region 1431b is a region having the grayscale range from the grayscale X1411a to the grayscale X1010 and the luminance range from luminance Y1421a to the luminance Y1020. In the region 1431b, the processing to the curve 1000 may be multiplication by a coefficient A2 of 1 or more. In the region from the grayscale X1411a to the grayscale 1411b of the region 1431b, the curve 1401 may be a curve having a minimum grayscale of X1411a, the maximum grayscale of X1411b, the minimum luminance of Y1421d, and the maximum luminance of Y1020 and represented by Expression 5 (A is A2). In the region from the grayscale X1411b to the grayscale X1010, luminance may be constant at the maximum luminance of Y1020.

Note that the curve 1401 may be discontinuous in the grayscale X1411a such that the grayscale increases (luminance Y1421a<luminance Y1421d). Thus, the luminance difference between the curve 1000 and the curve 1401 can be decreased in the low grayscale region to reduce flickers. In the high grayscale region, the luminance difference between the curve 1000 and the curve 1401 can be increased to reduce motion blur.

The control method of luminance-grayscale characteristics illustrated in FIG. 14A can be realized by processing image data for specifying luminance. At this time, the luminance can be controlled by image data processing, and thus precise control can be done.

In FIG. 14B, a curve 1402 represents luminance-grayscale characteristics after controlling luminance. The curve 1402 is luminance-grayscale characteristics obtained by providing two regions (regions 1432a and 1432b) in luminance-grayscale plane and conducting different processing to the curve 1000 in each region. In addition, a grayscale X1412a is a grayscale at the border portion of the curve 1402 in which the luminance-grayscale characteristics change; a grayscale X1412b is the minimum grayscale of grayscales in which the luminance of the curve 1402 is luminance Y1020; luminance Y1422a is the maximum luminance of the curve 1402 in the region 1432a; luminance Y1422b is luminance of the curve 1000 in the grayscale X1412a; and luminance Y1422d is the minimum luminance of the curve 1402 in the region 1432b.

The region 1432a is a region having the grayscale range from 0 to the grayscale X1412a and the luminance range from 0 to the luminance Y1422a. In the region 1432a, the processing to the curve 1000 may be multiplication by a coefficient A1 of 1 or more. In the region 1432a, the curve 1402 may be a curve having a minimum grayscale of 0, the maximum grayscale of X1412a, the minimum luminance of 0, and the maximum luminance of Y1422a, and represented by Expression 5 (A is A1).

The region 1432b is a region having the grayscale range from the grayscale X1412a to the grayscale X1010 and the luminance range from luminance Y1422a to the luminance Y1020. In the region 1432b, the processing to the curve 1000 may be multiplication by a coefficient A2 of 1 or more. In the region from the grayscale X1412a to the grayscale X1412b of the region 1432b, the curve 1402 may be a curve having a minimum grayscale of X1412a, the maximum grayscale of X1412b, the minimum luminance of Y1422d, and the maximum luminance of Y1020 and represented by Expression 5 (A is A2). In the region from the grayscale X1412b to the grayscale X1010, luminance may be constant at the maximum luminance of Y1020.

Note that the curve 1402 may be discontinuous in the grayscale X1412 such that the grayscale decreases (luminance Y1422a>luminance Y1422d). Thus, the luminance difference between the curve 1000 and the curve 1402 can be increased in the low grayscale region to reduce motion blur. In the high grayscale region, the luminance difference between the curve 1000 and the curve 1402 can be decreased to reduce flickers.

The control method of luminance-grayscale characteristics illustrated in FIG. 14B can be realized by processing image data for specifying luminance. At this time, the luminance can be controlled by image data processing, and thus precise control can be done.

In FIG. 14C, a curve 1403 represents luminance-grayscale characteristics after controlling luminance. The curve 1403 is luminance-grayscale characteristics obtained by providing two regions (regions 1433a and 1433b) in luminance-grayscale plane and conducting different processing to the curve 1000 in each region. In addition, a grayscale X1413 is a grayscale at the border portion of the curve 1403 in which the luminance-grayscale characteristics change; luminance Y1423a is the maximum luminance of the curve 1403 in the region 1433a; luminance Y1423b is luminance of the curve 1000 in the grayscale X1413; luminance Y1423c is the maximum luminance of the curve 1403 in the region 1433b; and luminance Y1423d is the minimum luminance of the curve 1403 in the region 1433b.

The region 1433a is a region having the grayscale range from 0 to the grayscale X1413 and the luminance range from 0 to the luminance Y1423b. In the region 1433a, the processing to the curve 1000 may be multiplication by a coefficient A1 of 1 or more. In the region 1433a, the curve 1403 may be a curve having a minimum grayscale of 0, the maximum grayscale of X1413, the minimum luminance of 0, and the maximum luminance of Y1423a, and represented by Expression 5 (A is A1).

The region 1433b is a region having the grayscale range from the grayscale X1413 to the grayscale X1010 and the luminance range from luminance Y1423d to the luminance Y1020. In the region 1433b, the processing to the curve 1000 may be division by a coefficient A2 o 1 or more. In the region 1433b, the curve 1403 may be a curve having a minimum grayscale of X1413, the maximum grayscale of X1010, the minimum luminance of Y1423d, and the maximum luminance of Y1423c and represented by Expression 2 (A is A2).

Note that the curve 1403 may be discontinuous in the grayscale X1413 such that the grayscale decreases (luminance Y1423a>luminance Y1423d). Thus, since it is darker in the low grayscale region and it is lighter in the high grayscale region, contrast can be decreased.

The control method of luminance-grayscale characteristics illustrated in FIG. 14C can be realized by processing image data for specifying luminance. At this time, the luminance can be controlled by image data processing, and thus precise control can be done.

Figure 15A:
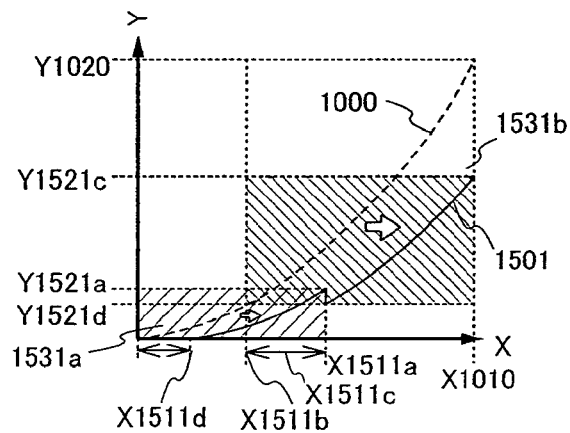
FIGS. 15A to 15C illustrate control methods of luminance of a semiconductor device according to the present invention.
Figure 15B:
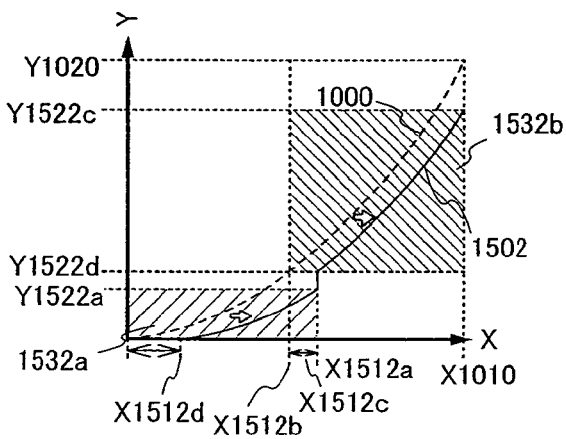
Figure 15C:
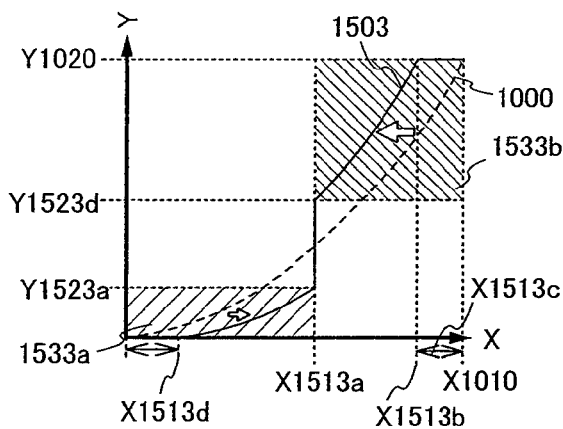

Next, with reference to FIGS. 15A to 15C, examples of controlling luminance of an image are described. FIGS. 15A to 15C each illustrate a relationship of luminance to grayscale of an image (luminance-grayscale characteristics), where the horizontal axis (X-axis) represents grayscale and the vertical axis (Y-axis) represents luminance. In FIGS. 15A to 15C, a curve 1000, a grayscale X1010, and luminance Y1020 represent luminance-grayscale characteristics before controlling luminance, the maximum grayscale in the curve 1000, and the maximum luminance in the curve 1000, respectively.

In FIG. 15A, a curve 1501 represents luminance-grayscale characteristics after controlling luminance. The curve 1501 is luminance-grayscale characteristics obtained by providing two regions (regions 1531a and 1531b) in luminance-grayscale plane and conducting different processing to the curve 1000 in each region. In addition, a grayscale X1111a is a grayscale at the border portion of the curve 1501 in which the luminance-grayscale characteristics change; a grayscale X1511b is a grayscale by subtracting a grayscale X1511c from the grayscale X1511a; the grayscale X1511c is a processed grayscale amount in the region 1531b; a grayscale X1511d is a processed grayscale amount in the region 1531a; luminance Y1521a is the maximum luminance of the curve 1501 in the region 1531a; luminance Y1521b is luminance of the curve 1501 in the grayscale X1531a; luminance Y1521c is the maximum luminance of the curve 1501 in the region 1531b; and luminance Y1521d is the minimum luminance of the curve 1501 in the region 1531b.

The region 1531a is a region having the grayscale range from 0 to the grayscale X1511a and the luminance range from 0 to the luminance Y1521b. In the region 1531a, the processing to the curve 1000 may be addition of a positive number A1. The grayscale amount corresponding to A1 is X1511d. In the region 1531a, the curve 1501 may be a curve having a minimum grayscale of 0, the maximum grayscale of X1511a, the minimum luminance of 0, and the maximum luminance of Y1521a, and represented by Expression 4 (A is A1). Note that the luminance of the curve 1501 within the range of the grayscale 0 to the grayscale X1511d may be 0.

The region 1531b is a region having the grayscale range from the grayscale X1511b to the grayscale X1010 and the luminance range from luminance Y1521d to the luminance Y1521c. In the region 1531b, the processing to the curve 1000 may be subtraction by a positive number A2. The grayscale amount corresponding to A2 is X1511c. In the region 1531b, the curve 1501 may be a curve having a minimum grayscale of X1511a, the maximum grayscale of X1010, the minimum luminance of Y1521d, and the maximum luminance of Y1521c and represented by Expression 4 (A is A2).

Note that the curve 1501 may be discontinuous in the grayscale X1511 such that the grayscale decreases (luminance Y1521a>luminance Y1521d). Thus, the luminance difference between the curve 1000 and the curve 1501 can be decreased in the low grayscale region to reduce flickers. In the high grayscale region, the luminance difference between the curve 1000 and the curve 1501 can be increased to reduce motion blur.

The control method of luminance-grayscale characteristics illustrated in FIG. 15A can be realized by processing image data for specifying luminance. At this time, the luminance can be controlled by image data processing, and thus precise control can be done.

In FIG. 15B, a curve 1502 represents luminance-grayscale characteristics after controlling luminance. The curve 1502 is luminance-grayscale characteristics obtained by providing two regions (regions 1532a and 1532b) in luminance-grayscale plane and conducting different processing to the curve 1000 in each region. In addition, a grayscale X1512a is a grayscale at the border portion of the curve 1502 in which the luminance-grayscale characteristics change; a grayscale X1512b is a grayscale by subtracting a grayscale X1512c from the grayscale X1512a; the grayscale X1512c is a processed grayscale amount in the region 1532b; a grayscale X1512d is a processed grayscale amount in the region 1532a; luminance Y1522a is the maximum luminance of the curve 1502 in the region 1532a; luminance Y1522c is the maximum luminance of the curve 1502 in the region 1532b; and luminance Y1522d is the minimum luminance of the curve 1502 in the region 1532b.

The region 1532a is a region having the grayscale range from 0 to the grayscale X1512 and the luminance range from 0 to the luminance Y1522b. In the region 1532a, the processing to the curve 1000 may be subtraction by a positive number A1. The grayscale amount corresponding to A1 is X1512d. In the region 1532a, the curve 1502 may be a curve having a minimum grayscale of 0, the maximum grayscale of X1512a, the minimum luminance of 0, and the maximum luminance of Y1522a, and represented by Expression 4 (A is A1). Note that the luminance of the curve 1502 within the range of the grayscale 0 to the grayscale X1512d may be 0.

The region 1532b is a region having the grayscale range from the grayscale X1512a to the grayscale X1010 and the luminance range from luminance Y1522d to the luminance Y1522c. In the region 1532b, the processing to the curve 1000 may be subtraction by a positive number A2. The grayscale amount corresponding to A2 is X1512c. In the region 1532b, the curve 1502 may be a curve having a minimum grayscale of X1512a, the maximum grayscale of X1010, the minimum luminance of Y1522d, and the maximum luminance of Y1522c and represented by Expression 4 (A is A2).

Note that the curve 1502 may be discontinuous in the grayscale X1512 such that the grayscale increases (luminance Y1522a<luminance Y1522d). Thus, the luminance difference between the curve 1000 and the curve 1502 can be increased in the low grayscale region to reduce motion blur. In the high grayscale region, the luminance difference between the curve 1000 and the curve 1502 can be decreased to reduce flickers.

The control method of luminance-grayscale characteristics illustrated in FIG. 15B can be realized by processing image data for specifying luminance. At this time, the luminance can be controlled by image data processing, and thus precise control can be done.

In FIG. 15C, a curve 1503 represents luminance-grayscale characteristics after controlling luminance. The curve 1503 is luminance-grayscale characteristics obtained by providing two regions (regions 1533a and 1533b) in luminance-grayscale plane and conducting different processing to the curve 1000 in each region. In addition, a grayscale X1513a is a grayscale at the border portion of the curve 1503 in which the luminance-grayscale characteristics change; a grayscale X1513b is a grayscale by subtracting a grayscale X1513c from the grayscale X1010; a grayscale X1513c is a processed grayscale amount in the region 1533b; a grayscale X1513d is a processed grayscale amount in the region 1533a; luminance Y1523a is the maximum luminance of the curve 1503 in the region 1533a; and luminance Y1523d is the minimum luminance of the curve 1503 in the region 1533b.

The region 1533a is a region having the grayscale range from 0 to the grayscale X1513a and the luminance range from 0 to the luminance Y1523a. In the region 1533a, the processing to the curve 1000 may be subtraction by a positive number A1. The grayscale amount corresponding to A1 is X1513d. In the region 1533a, the curve 1503 may be a curve having a minimum grayscale of 0, the maximum grayscale of X1513a, the minimum luminance of 0, and the maximum luminance of Y1523a, and represented by Expression 4 (A is A1). Note that the luminance of the curve 1503 within the range of the grayscale 0 to the grayscale X1513d may be 0.

The region 1533b is a region having the grayscale range from the grayscale X1513a to the grayscale X1010 and the luminance range from luminance Y1523a to the luminance Y1020. In the region 1533b, the processing to the curve 1000 may be addition of a positive number A2. The grayscale amount corresponding to A2 is X1513c. In the region from the grayscale X1513a to the grayscale X1513b of the region 1533b, the curve 1503 may be a curve having a minimum grayscale of X1513a, the maximum grayscale of X1513b, the minimum luminance of Y1523d, and the maximum luminance of Y1020 and represented by Expression 7 (A is A2). In the region from the grayscale X1513b to the grayscale X1010, the luminance may be constant at the maximum luminance of Y1020.

Note that the curve 1503 may be discontinuous in the grayscale X1513a such that the grayscale increases (luminance Y1523a<luminance Y1523d). Thus, since it is darker in the low grayscale region and it is lighter in the high grayscale region, contrast can be increased.

The control method of luminance-grayscale characteristics illustrated in FIG. 15C can be realized by processing image data for specifying luminance. At this time, the luminance can be controlled by image data processing, and thus precise control can be done.

Next, with reference to FIGS. 16A to 16D, examples of controlling luminance of an image are described. FIGS. 16A to 16D each illustrate a relationship of luminance to grayscale of an image (luminance-grayscale characteristics), where the horizontal axis (X-axis) represents grayscale and the vertical axis (Y-axis) represents luminance. In FIGS. 16A to 16D, a curve 1000, a grayscale X1010, and luminance Y1020 represent luminance-grayscale characteristics before controlling luminance, the maximum grayscale in the curve 1000, and the maximum luminance in the curve 1000, respectively.

Figure 16A:
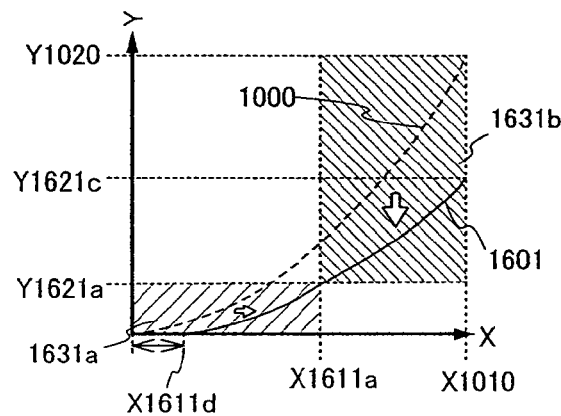
FIGS. 16A to 16D illustrate control methods of luminance of a semiconductor device according to the present invention.

In FIG. 16A, a curve 1601 represents luminance-grayscale characteristics after controlling luminance. The curve 1601 is luminance-grayscale characteristics obtained by providing two regions (regions 1631a and 1631b) in luminance-grayscale plane and conducting different processing to the curve 1000 in each region. In addition, a grayscale X1611a is a grayscale at the border portion of the curve 1601 in which the luminance-grayscale characteristics change; a grayscale X1611d is a processed grayscale amount in the region 1631a; luminance Y1621a is the maximum luminance of the curve 1601 in the region 1631a; and luminance Y1621c is the maximum luminance of the curve 1601 in the region 1631b.

The region 1631a is a region having the grayscale range from 0 to the grayscale X1611a and the luminance range from 0 to the luminance Y1621a. In the region 1631a, the processing to the curve 1000 may be subtraction by a positive number A1. The grayscale amount corresponding to A1 is X1611d. In the region 1631a, the curve 1601 may be a curve having a minimum grayscale of 0, the maximum grayscale of X1611a, the minimum luminance of 0, and the maximum luminance of Y1621a, and represented by Expression 4 (A is A1). Note that the luminance of the curve 1601 within the range of the grayscale 0 to the grayscale X1611d may be 0.

The region 1631b is a region having the grayscale range from the grayscale X1611a to the grayscale X1010 and the luminance range from luminance Y1621a to the luminance Y1020. In the region 1631b, the processing to the curve 1000 may be division by a coefficient A2 of 1 or more. In the region 1631b, the curve 1601 may be a curve having a minimum grayscale of X1611a, the maximum grayscale of X010, the minimum luminance of Y1621a, and the maximum luminance of Y1621c and represented by Expression 2 (A is A2).

Note that the curve 1601 may be continuous in the grayscale X1611a. Thus, because an unnatural outline does not appear on a border portion of grayscale, image quality can be enhanced.

The control method of luminance-grayscale characteristics illustrated in FIG. 16A can be realized by processing image data for specifying luminance. At this time, the luminance can be controlled by image data processing, and thus precise control can be done.

Figure 16B:
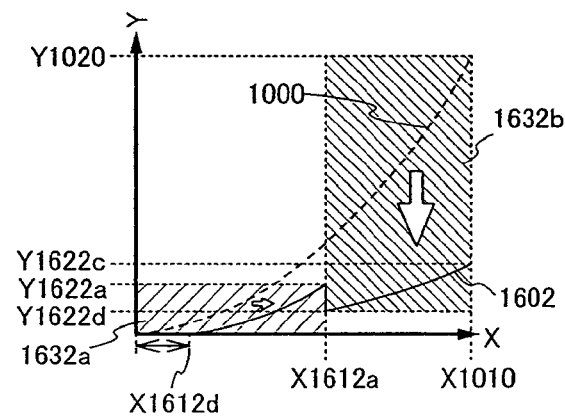

In FIG. 16B, a curve 1602 represents luminance-grayscale characteristics after controlling luminance. The curve 1602 is luminance-grayscale characteristics obtained by providing two regions (regions 1632a and 1632b) in luminance-grayscale plane and conducting different processing to the curve 1000 in each region. In addition, a grayscale X1612a is a grayscale at the border portion of the curve 1602 in which the luminance-grayscale characteristics change; a grayscale X1612d is a processed grayscale amount in the region 1632a; luminance Y1622a is the maximum luminance of the curve 1602 in the region 1632a; luminance Y1622c is the maximum luminance of the curve 1602 in the region 1632b; and luminance Y1622d is the minimum luminance of the curve 1602 in the region 1632b.

The region 1632a is a region having the grayscale range from 0 to the grayscale X1612a and the luminance range from 0 to the luminance Y1622a. In the region 1632a, the processing to the curve 1000 may be subtraction by a positive number A1. The grayscale amount corresponding to A1 is X1612d. In the region 1632a, the curve 1602 may be a curve having a minimum grayscale of 0, the maximum grayscale of X1612a, the minimum luminance of 0, and the maximum luminance of Y1622a, and represented by Expression 4 (A is A1). Note that the luminance of the curve 1602 within the range of the grayscale 0 to the grayscale X1612d may be 0.

The region 1632b is a region having the grayscale range from the grayscale X1612a to the grayscale X1010 and the luminance range from luminance Y1622d to the luminance Y1020. In the region 1632b, the processing to the curve 1000 may be division by a coefficient A2 of 1 or more. In the region 1632b, the curve 1602 may be a curve having a minimum grayscale of X1612a, the maximum grayscale of X110, the minimum luminance of Y1622d, and the maximum luminance of Y1622c and represented by Expression 4 (A is A2).

Note that the curve 1602 may be discontinuous in the grayscale X1612a such that the grayscale decreases (luminance Y1622a>luminance Y1622d). Thus, the luminance difference between the curve 1000 and the curve 1602 can be decreased in the low grayscale region to reduce flickers. In the high grayscale region, the luminance difference between the curve 1000 and the curve 1602 can be increased to reduce motion blur.

The control method of luminance-grayscale characteristics illustrated in FIG. 16B can be realized by processing image data for specifying luminance. At this time, the luminance can be controlled by image data processing, and thus precise control can be done.

Figure 16C:
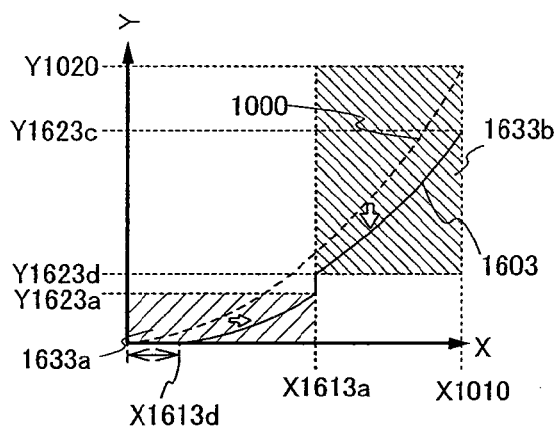

In FIG. 16C, a curve 1603 represents luminance-grayscale characteristics after controlling luminance. The curve 1603 is luminance-grayscale characteristics obtained by providing two regions (regions 1633a and 1633b) in luminance-grayscale plane and conducting different processing to the curve 1000 in each region. In addition, a grayscale X1613a is a grayscale at the border portion of the curve 1603 in which the luminance-grayscale characteristics change; a grayscale X1613d is a processed grayscale amount in the region 1633a; luminance Y1623a is the maximum luminance of the curve 1603 in the region 1633a; luminance Y1623c is the maximum luminance of the curve 1603 in the region 1633b; and luminance Y1623d is the minimum luminance of the curve 1603 in the region 1633b.

The region 1633a is a region having the grayscale range from 0 to the grayscale X1613a and the luminance range from 0 to the luminance Y1623a. In the region 1633a, the processing to the curve 1000 may be subtraction by a positive number A1. The grayscale amount corresponding to A1 is X1613d. In the region 1633a, the curve 1603 may be a curve having a minimum grayscale of 0, the maximum grayscale of X1613a, the minimum luminance of 0, and the maximum luminance of Y1623a, and represented by Expression 4 (A is A1). Note that the luminance of the curve 1603 within the range of the grayscale 0 to the grayscale X1613d may be 0.

The region 1633b is a region having the grayscale range from the grayscale X1613a to the grayscale X1010 and the luminance range from luminance Y1623d to the luminance Y1020. In the region 1633b, the processing to the curve 1000 may be division by a coefficient A2 of 1 or more. In the region 1633b, the curve 1603 may be a curve having a minimum grayscale of X1613a, the maximum grayscale of X1010, the minimum luminance of Y1623d, and the maximum luminance of Y1623c and represented by Expression 2 (A is A2).

Note that the curve 1603 may be discontinuous in the grayscale X1613a such that the grayscale increases (luminance Y1623a<luminance Y1623d). Thus, the luminance difference between the curve 1000 and the curve 1603 can be increased in the low grayscale region to reduce motion blur. In the high grayscale region, the luminance difference between the curve 1000 and the curve 1603 can be decreased to reduce flickers.

The control method of luminance-grayscale characteristics illustrated in FIG. 16C can be realized by processing image data for specifying luminance. At this time, the luminance can be controlled by image data processing, and thus precise control can be done.

Figure 16D:
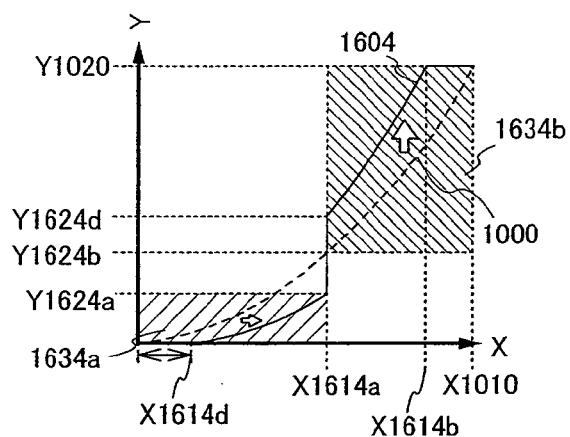

In FIG. 16D, a curve 1604 represents luminance-grayscale characteristics after controlling luminance. The curve 1604 is luminance-grayscale characteristics obtained by providing two regions (regions 1634a and 1634b) in luminance-grayscale plane and conducting different processing to the curve 1000 in each region. In addition, a grayscale X1614a is a grayscale at the border portion of the curve 1604 in which the luminance-grayscale characteristics change; a grayscale X1614b is a minimum grayscale of grayscales in which the luminance of the curve 1604 is luminance Y1020; a grayscale X1614d is a processed grayscale amount in the region 1634a; luminance Y1624a is the maximum luminance of the curve 1604 in the region 1634a; luminance Y1624b is luminance of the curve 1000 in the grayscale X1614a; and luminance Y1624d is the minimum luminance of the curve 1604 in the region 1634b.

The region 1634a is a region having the grayscale range from 0 to the grayscale X1614a and the luminance range from 0 to the luminance Y1624a. In the region 1634a, the processing to the curve 1000 may be subtraction by a positive number A1. The grayscale amount corresponding to A1 is X1614d. In the region 1634a, the curve 1604 may be a curve having a minimum grayscale of 0, the maximum grayscale of X1614a, the minimum luminance of 0, and the maximum luminance of Y1624a, and represented by Expression 4 (A is A1). Note that the luminance of the curve 1604 within the range of the grayscale 0 to the grayscale X1614d may be 0.

The region 1634b is a region having the grayscale range from the grayscale X1614a to the grayscale X1010 and the luminance range from luminance Y1624b to the luminance Y1020. In the region 1634b, the processing to the curve 1000 may be division by a coefficient A2 of 1 or more. In the region from the grayscale X1614a to the grayscale X1614b of the region 1634b, the curve 1604 may be a curve having a minimum grayscale of X1614a, the maximum grayscale of X1614b, the minimum luminance of Y1624d, and the maximum luminance of Y1020 and represented by Expression 5 (A is A2). In the region from the grayscale X1614b to the grayscale X1010, the luminance may be constant at the maximum luminance Y1020.

Note that the curve 1604 may be discontinuous in the grayscale X1614a such that the grayscale increases (luminance Y1624a<luminance Y1624d). Thus, since it is darker in the low grayscale region and it is lighter in the high grayscale region, contrast can be increased.

The control method of luminance-grayscale characteristics illustrated in FIG. 16D can be realized by processing image data for specifying luminance. At this time, the luminance can be controlled by image data processing, and thus precise control can be done.

Figure 17A:
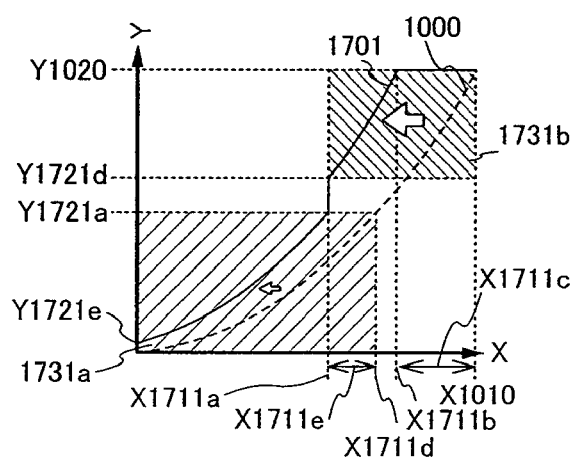
FIGS. 17A to 17C illustrate control methods of luminance of a semiconductor device according to the present invention.
Figure 17B:
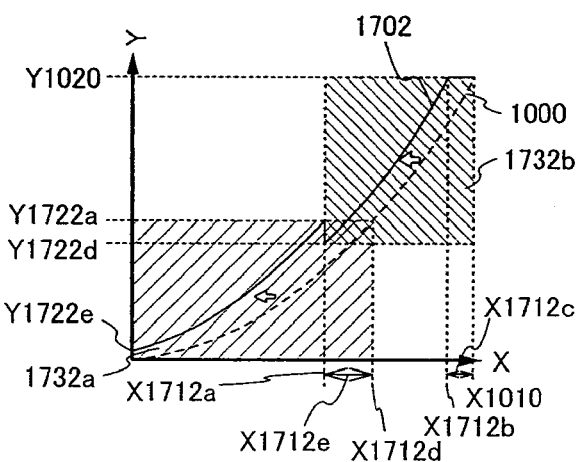
Figure 17C:
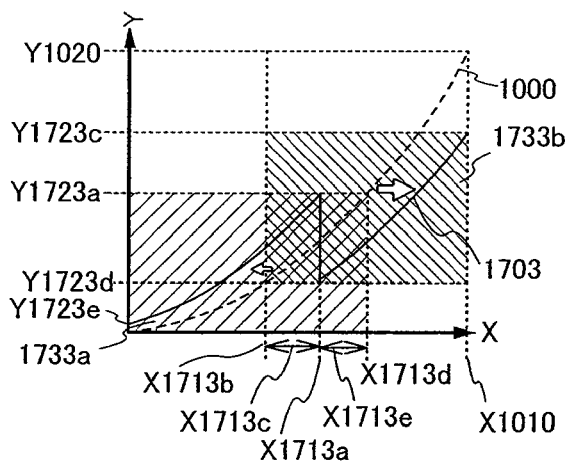

Next, with reference to FIGS. 17A to 17C, examples of controlling luminance of an image are described. FIGS. 17A to 17C each illustrate a relationship of luminance to grayscale of an image (luminance-grayscale characteristics), where the horizontal axis (X-axis) represents grayscale and the vertical axis (Y-axis) represents luminance. In FIGS. 17A to 17C, a curve 1000, a grayscale X110, and luminance Y1020 represent luminance-grayscale characteristics before controlling luminance, the maximum grayscale in the curve 1000, and the maximum luminance in the curve 1000, respectively.

In FIG. 17A, a curve 1701 represents luminance-grayscale characteristics after controlling luminance. The curve 1701 is luminance-grayscale characteristics obtained by providing two regions (regions 1731a and 1731b) in luminance-grayscale plane and conducting different processing to the curve 1000 in each region. In addition, a grayscale X1711a is a grayscale at the border portion of the curve 1701 in which the luminance-grayscale characteristics change; a grayscale X1711b is a grayscale by subtracting a grayscale X1711c from the grayscale X1010; a grayscale X1711c is a processed grayscale amount in the region 1731b; a grayscale X1711d is a grayscale by addition a grayscale X1711e to the grayscale X1711a; a grayscale X1711e is a processed grayscale amount in the region 1731a; luminance Y1721a is the maximum luminance of the curve 1701 in the region 1731a; luminance Y1721d is the minimum luminance of the curve 1701 in the region 1731b; and luminance Y1721e is luminance of the curve 1701 at the grayscale of 0.

The region 1731a is a region having the grayscale range from 0 to the grayscale X1711d and the luminance range from 0 to the luminance Y1721a. In the region 1731a, the processing to the curve 1000 may be addition of a positive number A1. The grayscale amount corresponding to A1 is X1711e. In the region 1731a, the curve 1701 may be a curve having a minimum grayscale of 0, the maximum grayscale of X1711a, the minimum luminance of Y1721e, and the maximum luminance of Y1721a, and represented by Expression 4 (A is A1).

The region 1731b is a region having the grayscale range from the grayscale X1711a to the grayscale X1010 and the luminance range from luminance Y1721d to the luminance Y1020. In the region 1731b, the processing to the curve 1000 may be addition of a positive number A2. The grayscale amount corresponding to A2 is X1711c. The grayscale amount corresponding to A2 is X1711c. In the region from the grayscale X1711a to the grayscale X1711b of the region 1731b, the curve 1701 may be a curve having a minimum grayscale of X1711a, the maximum grayscale of X1711b, the minimum luminance of Y1721d, and the maximum luminance of Y1020 and represented by Expression 7 (A is A2). In the region from the grayscale X1711b to the grayscale X1010, luminance may be constant at the maximum luminance of Y1020.

Note that the curve 1701 may be discontinuous in the grayscale X1711a such that the grayscale increases (luminance Y1721a<luminance Y1721d). Thus, the luminance difference between the curve 1000 and the curve 1701 can be decreased in the low grayscale region to reduce flickers. In the high grayscale region, the luminance difference between the curve 1000 and the curve 1701 can be increased to reduce motion blur.

The control method of luminance-grayscale characteristics illustrated in FIG. 17A can be realized by processing image data for specifying luminance. At this time, the luminance can be controlled by image data processing, and thus precise control can be done.

In FIG. 17B, a curve 1702 represents luminance-grayscale characteristics after controlling luminance. The curve 1702 is luminance-grayscale characteristics obtained by providing two regions (regions 1732a and 1732b) in luminance-grayscale plane and conducting different processing to the curve 1000 in each region. In addition, a grayscale X1712a is a grayscale at the border portion of the curve 1702 in which the luminance-grayscale characteristics change; a grayscale X1712b is a grayscale by subtracting a grayscale X1712c from the grayscale X110; a grayscale X1712c is a processed grayscale amount in the region 1732b; a grayscale X1712d is a grayscale by addition a grayscale X1712e to the grayscale X1712a; a grayscale X1712e is a processed grayscale amount in the region 1732a; luminance Y1722a is the maximum luminance of the curve 1702 in the region 1732a; luminance Y1722d is the minimum luminance of the curve 1702 in the region 1732b; and luminance Y1722e is luminance of the curve 1702 at the grayscale of 0.

The region 1732a is a region having the grayscale range from 0 to the grayscale X1712d and the luminance range from 0 to the luminance Y1722a. In the region 1732a, the processing to the curve 1000 may be addition of a positive number A1. The grayscale amount corresponding to A1 is X1712e. In the region 1732a, the curve 1702 may be a curve having a minimum grayscale of 0, the maximum grayscale of X1712a, the minimum luminance of Y1722e, and the maximum luminance of Y1722a, and represented by Expression 7 (A is A1).

The region 1732b is a region having the grayscale range from the grayscale X1712a to the grayscale X1010 and the luminance range from luminance Y1722d to the luminance Y1020. In the region 1732b, the processing to the curve 1000 may be addition of a positive number A2. The grayscale amount corresponding to A2 is X1712c. In the region from the grayscale X1712a to the grayscale X1712b of in the region 1732b, the curve 1702 may be a curve having a minimum grayscale of X1712a, the maximum grayscale of X1712b, the minimum luminance of Y1722d, and the maximum luminance of Y1020 and represented by Expression 7 (A is A2). In the region from the grayscale X1712b to the grayscale X1010, luminance may be constant at the maximum luminance of Y1020.

Note that the curve 1702 may be discontinuous in the grayscale X1712a such that the grayscale decreases (luminance Y1722a>luminance Y1722d). Thus, the luminance difference between the curve 1000 and the curve 1702 can be increased in the low grayscale region to reduce motion blur. In the high grayscale region, the luminance difference between the curve 1000 and the curve 1702 can be decreased to reduce flickers.

The control method of luminance-grayscale characteristics illustrated in FIG. 17B can be realized by processing image data for specifying luminance. At this time, the luminance can be controlled by image data processing, and thus precise control can be done.

In FIG. 17C, a curve 1703 represents luminance-grayscale characteristics after controlling luminance. The curve 1703 is luminance-grayscale characteristics obtained by providing two regions (regions 1733a and 1733b) in luminance-grayscale plane and conducting different processing to the curve 1000 in each region. In addition, a grayscale X1713a is a grayscale at the border portion of the curve 1703 in which the luminance-grayscale characteristics change; a grayscale X1713b is a grayscale by subtracting a grayscale X1713c from the grayscale X1713a; a grayscale X1713c is a processed grayscale amount in the region 1733b; a grayscale X1713d is a grayscale by addition a grayscale X1713e to the grayscale X1713a; the grayscale X1713e is a processed grayscale amount in the region 1733a; luminance Y1723a is the maximum luminance of the curve 1703 in the region 1733a; luminance Y1723c is the maximum luminance of the curve 1703 in the region 1733b; luminance Y1723d is the minimum luminance of the curve 1703 in the region 1733b and luminance Y1723e is luminance of the curve 1703 at the grayscale of 0.

The region 1733a is a region having the grayscale range from 0 to the grayscale X1713d and the luminance range from 0 to the luminance Y1723a. In the region 1733a, the processing to the curve 1000 may be addition of a positive number A1. The grayscale amount corresponding to A1 is X1713e. In the region 1733a, the curve 1703 may be a curve having a minimum grayscale of 0, the maximum grayscale of X1713a, the minimum luminance of X1723e, and the maximum luminance of Y1723a, and represented by Expression 7 (A is A1).

The region 1733b is a region having the grayscale range from the grayscale X1713b to the grayscale X1010 and the luminance range from luminance Y1723d to the luminance Y1723c. In the region 1733b, the processing to the curve 1000 may be addition of a positive number A2. The grayscale amount corresponding to A2 is X1713c. In the region 1733b, the curve 1703 may be a curve having a minimum grayscale of X1713a, the maximum grayscale of X1010, the minimum luminance of Y1723d, and the maximum luminance of Y1723c and represented by Expression 4 (A is A2).

Note that the curve 1703 may be discontinuous in the grayscale X1713 such that the grayscale decreases (luminance Y1723a>luminance Y1723d). Thus, since it is lighter in the low grayscale region and it is darker in the high grayscale region, contrast can be decreased.

The control method of luminance-grayscale characteristics illustrated in FIG. 17C can be realized by processing image data for specifying luminance. At this time, the luminance can be controlled by image data processing, and thus precise control can be done.

Next, with reference to FIGS. 18A to 18D, examples of controlling luminance of an image are described. FIGS. 18A to 18D each illustrate a relationship of luminance to grayscale of an image (luminance-grayscale characteristics), where the horizontal axis (X-axis) represents grayscale and the vertical axis (Y-axis) represents luminance. In FIGS. 18A to 18D, a curve 1000, a grayscale X010, and luminance Y1020 represent luminance-grayscale characteristics before controlling luminance, the maximum grayscale in the curve 1000, and the maximum luminance in the curve 1000, respectively.

Figure 18A:
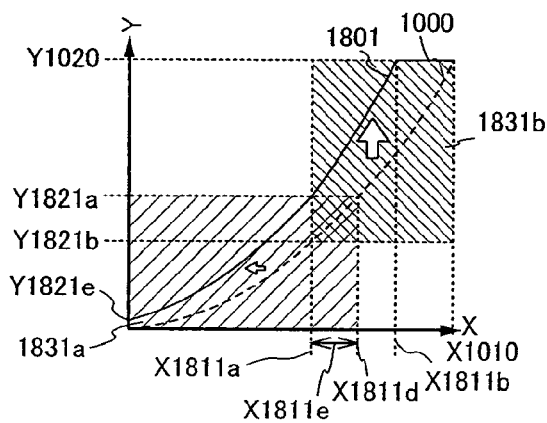
FIGS. 18A to 18D illustrate control methods of luminance of a semiconductor device according to the present invention.

In FIG. 18A, a curve 1801 represents luminance-grayscale characteristics after controlling luminance. The curve 1801 is luminance-grayscale characteristics obtained by providing two regions (regions 1831a and 1831b) in luminance-grayscale plane and conducting different processing to the curve 1000 in each region. In addition, a grayscale X1811a is a grayscale at the border portion of the curve 1801 in which the luminance-grayscale characteristics change; a grayscale X1811b is the minimum grayscale of grayscales in which the luminance of the curve 1801 is luminance Y1020; a grayscale X1811d is a grayscale by addition the grayscale X1811e to the grayscale X1811a; a grayscale X1811e is a processed grayscale amount in the region 1831a; luminance Y1821a is the maximum luminance of the curve 1801 in the region 1831a; luminance Y1821b is luminance of the curve 1000 in the grayscale X1811a; and luminance Y1821e is luminance of the curve 1801 at the grayscale of 0.

The region 1831a is a region having the grayscale range from 0 to the grayscale X1811d and the luminance range from 0 to the luminance Y1821a. In the region 1831a, the processing to the curve 1000 may be addition of a positive number A1. The grayscale amount corresponding to A1 is X1811e. In the region 1831a, the curve 1801 may be a curve having a minimum grayscale of 0, the maximum grayscale of X1811a, the minimum luminance of Y1821e, and the maximum luminance of Y1821a, and represented by Expression 7 (A is A1).

The region 1831b is a region having the grayscale range from the grayscale X1811a to the grayscale X1010 and the luminance range from luminance Y1821b to the luminance Y1020. In the region 1831b, the processing to the curve 1000 may be division by a coefficient A2 of 1 or more. In the region 1831b, in the region from the grayscale X1811a to the grayscale X1811b, the curve 1801 may be a curve having a minimum grayscale of X1811a, the maximum grayscale of X1811b, the minimum luminance of Y1821a, and the maximum luminance of Y1020 and represented by Expression 5 (A is A2). In the region from the grayscale X1811b to the grayscale X1010, the luminance may be constant at the maximum luminance of Y1020.

Note that the curve 1801 may be continuous in the grayscale X1811a. Thus, because an unnatural outline does not appear on a border portion of grayscale, image quality can be enhanced.

The control method of luminance-grayscale characteristics illustrated in FIG. 18A can be realized by processing image data for specifying luminance. At this time, the luminance can be controlled by image data processing, and thus precise control can be done.

Figure 18B:
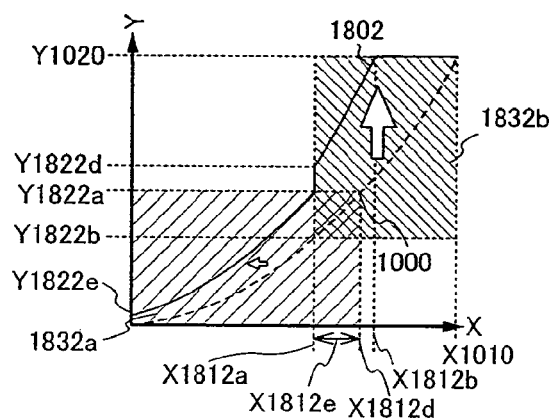

In FIG. 18B, a curve 1802 represents luminance-grayscale characteristics after controlling luminance. The curve 1802 is luminance-grayscale characteristics obtained by providing two regions (regions 1832a and 1832b) in luminance-grayscale plane and conducting different processing to the curve 1000 in each region. In addition, a grayscale X1812a is a grayscale at the border portion of the curve 1802 in which the luminance-grayscale characteristics change; a grayscale X1812*b* is the minimum grayscale of grayscales in which the luminance of the curve 1802 is luminance Y1020; a grayscale X1812*d* is a grayscale by addition a grayscale X1812*e* to the grayscale X1812*a*; the grayscale X1812*e* is a processed grayscale amount in the region 1832*a*; luminance Y1822*a* is the maximum luminance of the curve 1802 in the region 1832*a*; luminance Y1822*b* is luminance of the curve 1000 in the grayscale X1812*a*; luminance Y1822*d* is the minimum luminance of the curve 1802 in the region 1832*b*; and luminance Y1822*e* is luminance of the curve 1802 at the grayscale of 0.

The region 1832*a* is a region having the grayscale range from 0 to the grayscale X1812*d* and the luminance range from 0 to the luminance Y1822*a*. In the region 1832*a*, the processing to the curve 1000 may be addition of a positive number A1. The grayscale amount corresponding to A1 is X1812*e*. In the region 1832*a*, the curve 1802 may be a curve having a minimum grayscale of 0, the maximum grayscale of X1812*a*, the minimum luminance of Y1822*e*, and the maximum luminance of Y1822*a*, and represented by Expression 7 (A is A1).

The region 1832*b* is a region having the grayscale range from the grayscale X1812*a* to the grayscale X1010 and the luminance range from luminance Y1822*b* to the luminance Y1020. In the region 1832*b*, the processing to the curve 1000 may be multiplication by a coefficient A2 of 1 or more. In the region from the grayscale X1812*a* to the grayscale X1812*b* of the region 1832*b*, the region the curve 1802 may be a curve having a minimum grayscale of X1812*a*, the maximum grayscale of X1812*b*, the minimum luminance of Y1822*d*, and the maximum luminance of Y1020 and represented by Expression 5 (A is A2). In the region from the grayscale X1812*b* to the grayscale X1010, the luminance may be constant at the maximum luminance of Y1020.

Note that the curve 1802 may be discontinuous in the grayscale X1812 such that the grayscale increases (luminance Y1822*a*<luminance Y1822*d*). Thus, the luminance difference between the curve 1000 and the curve 1802 can be decreased in the low grayscale region to reduce flickers. In the high grayscale region, the luminance difference between the curve 1000 and the curve 1802 can be increased to reduce motion blur.

The control method of luminance-grayscale characteristics illustrated in FIG. 18B can be realized by processing image data for specifying luminance. At this time, the luminance can be controlled by image data processing, and thus precise control can be done.

Figure 18C:
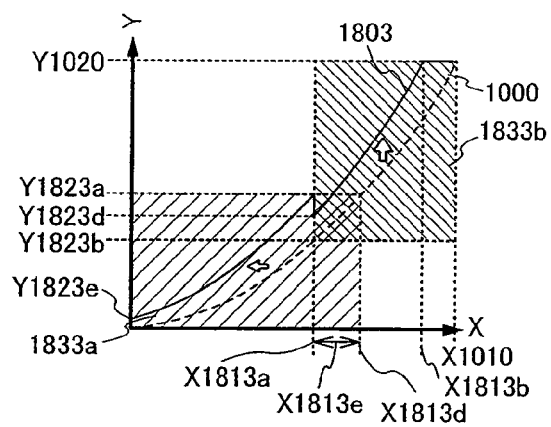

In FIG. 18C, a curve 1803 represents luminance-grayscale characteristics after controlling luminance. The curve 1803 is luminance-grayscale characteristics obtained by providing two regions (regions 1833*a* and 1833*b*) in luminance-grayscale plane and conducting different processing to the curve 1000 in each region. In addition, a grayscale X1813*a* is a grayscale at the border portion of the curve 1803 in which the luminance-grayscale characteristics change; a grayscale X1813*b* is the minimum grayscale of grayscales in which the luminance of the curve 1803 is luminance Y1020; a grayscale X1813*d* is a grayscale by addition a grayscale X1813*e* to the grayscale X1812*a*; the grayscale X1813*e* is a processed grayscale amount in the region 1833*a*; luminance Y1823*a* is the maximum luminance of the curve 1803 in the region 1833*a*; luminance Y1823*b* is luminance of the curve 1000 in the grayscale X1813*a*; luminance Y1823*d* is the minimum luminance of the curve 1803 in the region 1833*b*; and luminance Y1823*e* is luminance of the curve 1803 at the grayscale of 0.

The region 1833*a* is a region having the grayscale range from 0 to the grayscale X1813*d* and the luminance range from 0 to the luminance Y1823*a*. In the region 1833*a*, the processing to the curve 1000 may be addition of a positive number A1. The grayscale amount corresponding to A1 is X1813*e*. In the region 1833*a*, the curve 1803 may be a curve having a minimum grayscale of 0, the maximum grayscale of X1813*a*, the minimum luminance of Y1823*e*, and the maximum luminance of Y1823*a*, and represented by Expression 7 (A is A1).

The region 1833*b* is a region having the grayscale range from the grayscale X1813*a* to the grayscale X1010 and the luminance range from luminance Y1823*b* to the luminance Y1020. In the region 1833*b*, the processing to the curve 1000 may be multiplication by a coefficient A2 of 1 or more. In the region from the grayscale X1813*a* to the grayscale X1813*b* of the region 1833*b*, the curve 1803 may be a curve having a minimum grayscale of X1813*a*, the maximum grayscale of X1813*b*, the minimum luminance of Y1823*d*, and the maximum luminance of Y1020 and represented by Expression 5 (A is A2). In the region from the grayscale X1813*b* to the grayscale X110, the luminance may be constant at the maximum luminance Y1020.

Note that the curve 1803 may be discontinuous in the grayscale X1813*a* such that the grayscale decreases (luminance Y1823*a*>luminance Y1823*d*). Thus, the luminance difference between the curve 1000 and the curve 1803 can be increased in the low grayscale region to reduce motion blur. In the high grayscale region, the luminance difference between the curve 1000 and the curve 1803 can be decreased to reduce flickers.

The control method of luminance-grayscale characteristics illustrated in FIG. 18C can be realized by processing image data for specifying luminance. At this time, the luminance can be controlled by image data processing, and thus precise control can be done.

Figure 18D:
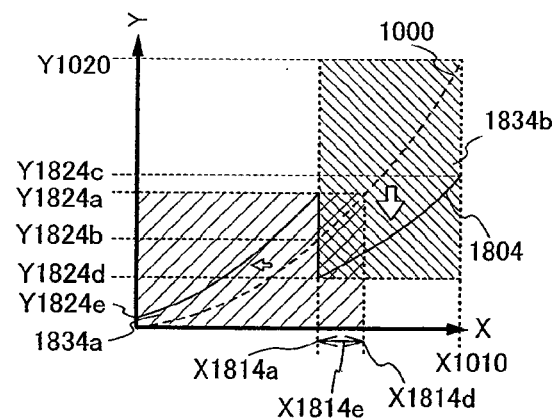

In FIG. 18D, a curve 1804 represents luminance-grayscale characteristics after controlling luminance. The curve 1804 is luminance-grayscale characteristics obtained by providing two regions (regions 1834*a* and 1834*b*) in luminance-grayscale plane and conducting different processing to the curve 1000 in each region. In addition, a grayscale X1814*a* is a grayscale at the border portion of the curve 1804 in which the luminance-grayscale characteristics change; a grayscale X1814*d* is a grayscale by addition a grayscale X1814*e* to the grayscale X1814*a*; the grayscale X1814*e* is a processed grayscale amount in the region 1834*a*; luminance Y1824*a* is the maximum luminance of the curve 1804 in the region 1834*a*; luminance Y1824*b* is luminance of the curve 1000 in the grayscale X1814*a*; luminance Y1824*c* is the maximum luminance of the curve 1804 in the region 1834*b*; luminance Y1824*d* is the minimum luminance of the curve 1804 in the region 1834*b*; and luminance Y1824*e* is luminance of the curve 1804 at the grayscale of 0.

The region 1834*a* is a region having the grayscale range from 0 to the grayscale X1814*d* and the luminance range from 0 to the luminance Y1824*a*. In the region 1834*a*, the processing to the curve 1000 may be addition of a positive number A1. The grayscale amount corresponding to A1 is X1814*e*. In the region 1834*a*, the curve 1804 may be a curve having a minimum grayscale of 0, the maximum grayscale of X1814*a*, the minimum luminance of Y1824*e*, and the maximum luminance of Y1824*a*, and represented by Expression 7 (A is A1).

The region 1834*b* is a region having the grayscale range from the grayscale X1814*a* to the grayscale X1010 and the luminance range from luminance Y1824*d* to the luminance Y1824*c*. In the region 1834*b*, the processing to the curve 1000 may be division by a coefficient A2 of 1 or more. In the region 1834*b*, the curve 1804 may be a curve having a minimum grayscale of X1814*a*, the maximum grayscale of X1010, the minimum luminance of Y1824*d*, and the maximum luminance of Y1824*c* and represented by Expression 2 (A is A2).

Note that the curve 1804 may be discontinuous in the grayscale X1814*a* such that the grayscale decreases (luminance Y1824*a*>luminance Y1824*d*). Thus, since it is lighter in the low grayscale region and it is darker in the high grayscale region, contrast can be decreased.

The control method of luminance-grayscale characteristics illustrated in FIG. 18D can be realized by processing image data for specifying luminance. At this time, the luminance can be controlled by image data processing, and thus precise control can be done.

In the above examples of the control method for luminance of an image, the luminance-grayscale characteristics obtained by conducting the same processing to the curve 1000 in all regions in the luminance-grayscale plane, and luminance-grayscale characteristics obtained by providing two regions in the luminance-grayscale plane and conducting different processing to the curve 1000 in each region have been described. However the region for the same processing is not limited to the above examples, and an arbitrary number of regions can be provided, for example, three regions, four regions or more regions may be provided.

Of the control methods for luminance of an image, in the case where plural regions provided, it is possible that the driving conditions of the whole display device can be changed. For example, in a liquid crystal display device, luminance of a backlight may be partially controlled for each image data. At this time, image data processing is easy, and thus power consumption and heat generation can be reduced. In addition, when a black image is displayed, light leakage can be reduced to enhance contrast.

Note that the content of this embodiment mode can be freely combined with the other embodiment modes.

Moreover, the elements or components of the drawings in this embodiment mode can each be combined with elements or components of drawings in other embodiment modes.

Embodiment Mode 4

Embodiment Mode 4 will exemplify methods of reducing motion blur by a driving method of a display device or a semiconductor device according to the present invention.

FIGS. 19A to 19E illustrate modes in which the display frame rate is three times as high as the input frame rate. FIGS. 19A to 19E schematically illustrate the change with time of images to be displayed with time indicated by the horizontal axis. FIGS. 19A to 19E each illustrate the image at the intermediate state, using the region whose position is changed from frame to frame (the circular region) and the region whose position is not changed from frame to frame (the triangle region).

Figure 19A:
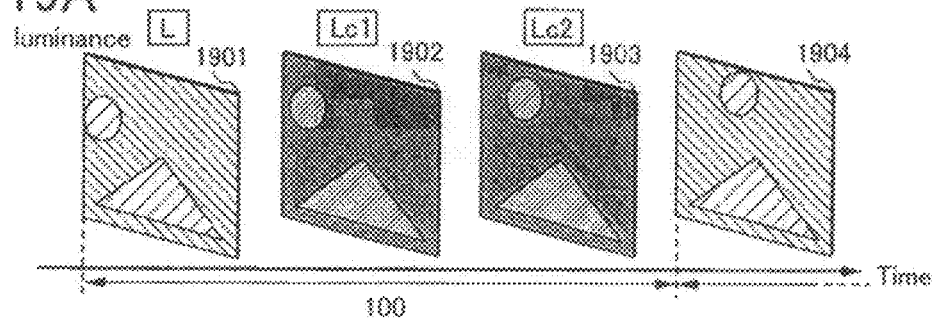
FIGS. 19A to 19E illustrate modes of the present invention.

In FIG. 19A, the period 100 denotes one frame period. A first image 1901 denotes a basic image of the previous frame, a second image 1902 is a first interpolation image of the previous frame, a third image 1903 is a second interpolation image of the previous frame, and a fourth image 1904 is a basic image of the current frame.

FIG. 19A illustrates the driving method described in Embodiment Mode 1. In other words, the movement amount of an image is detected from image data included in plural frames to make an image at the intermediate state between the images of the plural frames as an interpolation image, and luminance of the interpolation image is changed. The second image 1902 and the third image 1903 interpolate image data by motion interpolation. In this manner, a moving object of the image is subjected to the motion interpolation to interpolate the image data, thereby achieving the smooth display.

At this time, the typical luminance of the first image 1901 is L, the typical luminance of the second image 1902 is Lc1, and the typical luminance of the third image 1903 is Lc2, which preferably satisfies L>Lc1, L>Lc2 or Lc1=Lc2. Preferably, they may satisfy 0.1 L<Lc1=Lc2<0.8 L, more preferably 0.2 L<Lc1=Lc2<0.5 L. By control of the luminance to satisfy the expression, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced.

Note that the luminance of a backlight may be reduced, when the second image 1902 and the third image 1903 are displayed. Thus, light leakage can be reduced to enhance display contrast. Further, power consumption can be reduced.

Figure 19B:
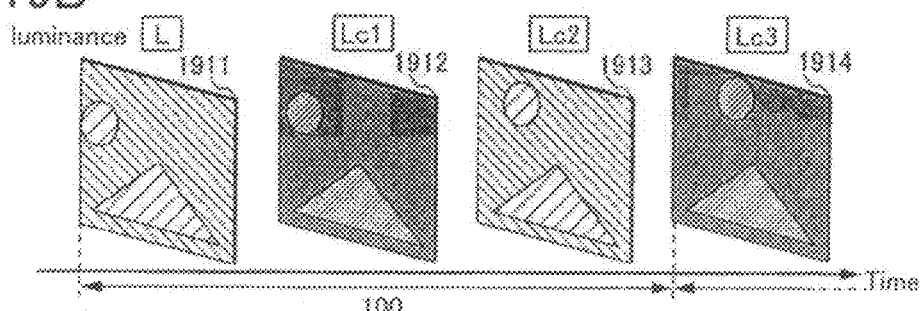

In FIG. 19B, the period 100 denotes one frame period. A first image 1911 is a basic image of the previous frame, a second image 1912 is a first interpolation image of the previous frame, a third image 1913 is a second interpolation image of the previous frame, and a fourth image 1914 is a basic image of the current frame.

Similar to FIG. 19A, in FIG. 19B, the movement amount of an image is detected from image data included in plural frames to make an image at the intermediate state between the images of the plural frames as an interpolation image, and luminance of the interpolation image is changed. The second image 1912 and the third image 1913 interpolate image data by motion interpolation. In this manner, a moving object on the image is subjected to the motion interpolation to interpolate the image data, thereby achieving the smooth display.

Regardless of a basic image or an interpolation image, FIG. 19B is different from FIG. 19A in that images for luminance control are displayed alternately. In other words, the typical luminance of the first image 1911 is L, the typical luminance of the second image 1912 is Lc1, the typical luminance of the third image 1913 is Lc2, and the typical luminance of the fourth image 1914 is Lc3 which may satisfy L>Lc1, L=Lc2, L>Lc3, Lc1<Lc2, Lc1=Lc3, or Lc2>Lc3. Preferably, they may satisfy 0.1 L=0.1 Lc2<Lc1=Lc3<0.8 L=0.8 Lc2, more preferably 0.2 L=0.2 Lc2<Lc1=Lc3<0.5 L=0.5 Lc2. In this manner, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced. In addition to that, the frequency of the typical luminance change can be made large to reduce flickers.

Since images for luminance control are displayed alternately, the luminance of even the interpolation image is not reduced and almost the same as the basic image in some cases. In such cases, the average luminance is increased to increase usage efficiency of light. Thus, display luminance is enhanced and power consumption can be reduced.

Note that the luminance of a backlight may be reduced, when the second image 1912 and the fourth image 1914 are displayed. Thus, light leakage can be reduced to enhance display contrast. Further, power consumption can be reduced.

Figure 19C:
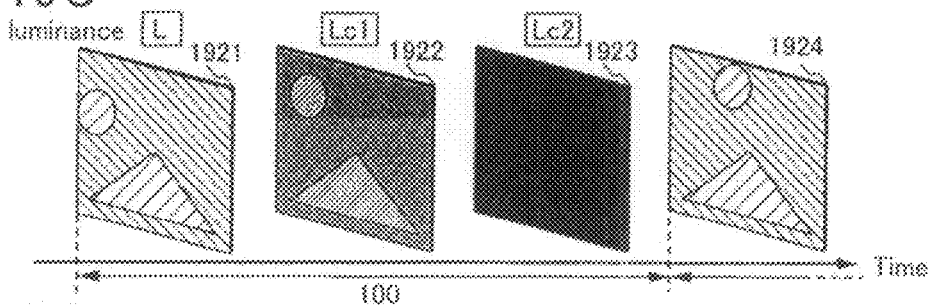

In FIG. 19C, the period 100 denotes one frame period. A first image 1921 is a basic image of the previous frame, a second image 1922 is a first interpolation image of the previous frame, a third image 1923 is a second interpolation image of the previous frame, and a fourth image 1924 is a basic image of the current frame.

Similar to FIG. 19A, in FIG. 19C, the movement amount of an image is detected from image data included in plural frames to make an image at the intermediate state between the images of the plural frames as an interpolation image, and luminance of the interpolation image is changed. The second image 1922 and the third image 1923 interpolate image data by motion interpolation. In this manner, a moving object of the image is subjected to the motion interpolation to interpolate the image data, thereby achieving the smooth display.

FIG. 19C is different from FIG. 19A in that the luminance of the third image 1923 is reduced entirely to make a black image or a dark image which is close to the black image (substantially black image). In other words, the typical luminance of the first image 1921 is L, the typical luminance of the second image 1922 is Lc1, and the typical luminance of the third image 1913 is Lc2 which may satisfy L>Lc1, L>Lc2, or Lc1>Lc2. Preferably, they may satisfy Lc2=0<0.1 L<Lc1<0.8 L, more preferably Lc2=0<0.2 L<Lc1<0.5 L. In this manner, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced. Note that the interpolation image may be one type of interpolation image. Thus, the load to the image data processing can be reduced, and power consumption and generated heat can be suppressed. The luminance change from the first image 1921 to the third image 1923 can be smoothed to reduce flickers.

The luminance of a backlight may be reduced when the second image 1922 is displayed. In addition, the luminance of the backlight may be 0 when the third image 1923 is displayed. As a result, light leakage can be reduced to enhance display contrast. Further, power consumption can also be reduced.

Figure 19D:
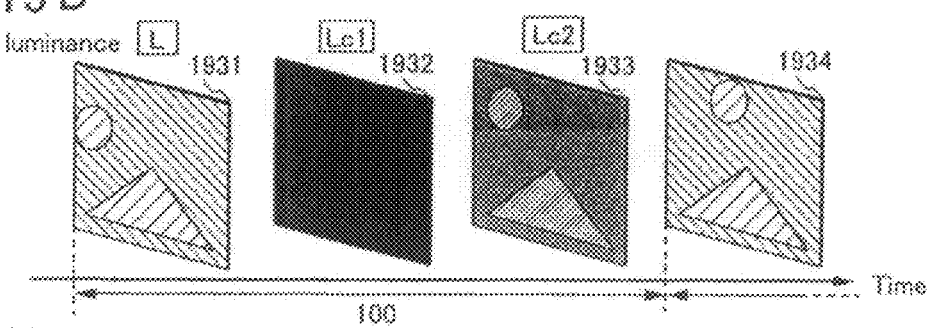

In FIG. 19D, the period 100 denotes one frame period. A first image 1931 is a basic image of the previous frame, a second image 1932 is a first interpolation image of the previous frame, a third image 1933 is a second interpolation image of the previous frame, and a fourth image 1934 is a basic image of the current frame.

Similar to FIG. 19A, FIG. 19D illustrates a method in which the movement amount of an image is detected from image data included in plural frames to make an image at the intermediate state between the images of the plural frames as an interpolation image, and luminance of the interpolation image is changed. In other words, the second image 1932 and the third image 1933 interpolate image data by motion interpolation. In this manner, a moving object on the image is subjected to the motion interpolation to interpolate the image data, thereby achieving the smooth display.

FIG. 19D is different from FIG. 19A in that the luminance of the second image 1932 is reduced entirely to make a black image or a dark image which is close to the black image (substantially black image). In other words, the typical luminance of the first image 1931 is L, the typical luminance of the second image 1932 is Lc1, and the typical luminance of the third image 1933 is Lc2 which may satisfy L>Lc2, L>Lc1, or Lc1<Lc2. Preferably, they may satisfy Lc1=0<0.1 L<Lc2<0.8 L, more preferably Lc1=0<0.2 L<Lc2<0.5 L. In this manner, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced. Note that the interpolation image may be one type of interpolation image. Thus, the load to the image data processing can be reduced, and power consumption and generated heat can be suppressed. The luminance change from the second image 1932 to the fourth image 1934 can be smooth to reduce flickers.

When a display device using a display element with a slow response speed of voltage is used like a liquid crystal display device, a driving method (overdriving) which changes luminance higher than a predetermined luminance can be adopted to increase the response speed of the display element. As shown in FIG. 19D, a black image is inserted as the second image 1932 between the first image 1931 and the third image 1933, which is the same as the overdriving. Thus, the speed of displaying the third image 1933 is increased.

The luminance of a backlight may be 0 when the second image 1932 is displayed. In addition, the luminance of the backlight may be reduced when the third image 1923 is displayed. As a result, light leakage can be reduced to enhance display contrast. Further, power consumption can also be reduced.

Figure 19E:
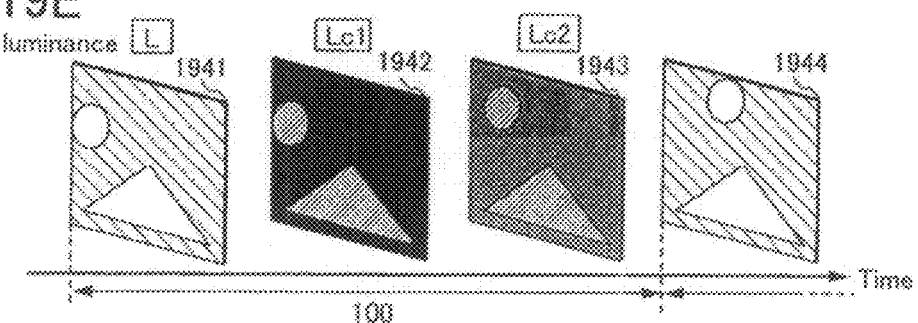

In FIG. 19E, the period 100 denotes one frame period. A first image 1941 is a basic image of the previous frame, a second image 1942 is a first interpolation image of the previous frame, a third image 1943 is a second interpolation image of the previous frame, and a fourth image 1944 is a basic image of the current frame.

Similar to FIG. 19A, FIG. 19E illustrates in which a method the movement amount of an image is detected from image data included in plural frames to make an image at the intermediate state between the images of the plural frames as an interpolation image, and luminance of the interpolation image is changed. In other words, the second image 1942 and the third image 1943 interpolate image data by motion interpolation. In this manner, a moving object on the image is subjected to the motion interpolation to interpolate the image data, thereby achieving the smooth display.

FIG. 19E is different from FIG. 19A in that when the grayscale level of the first image 1941 is made high, in a saturated portion of luminance, the second image 1942 is displayed as an interpolation image to interpolate the grayscale of the first image 1941. In other words, the typical luminance of the first image 1941 is L, the typical luminance of the second image 1942 is Lc1, and the typical luminance of the third image 1943 is Lc2 which may satisfy L>Lc1, L>Lc2, or Lc1<Lc2. Preferably, they may satisfy Lc1<0.1 L<Lc2<0.8 L, more preferably Lc1<0.2 L<Lc2<0.5 L. In this manner, display can be made pseudo impulse type display, and thus afterimages are not perceived by human eyes.

In this manner, two different causes of motion blur (non-smoothness in movement of images and afterimages to human eyes) are removed at one time, so that motion blur can be drastically reduced. Note that the interpolation image produced by the movement vector may be one type of interpolation image. Thus, the load to the image data processing can be reduced, and power consumption and generated heat can be suppressed.

Note that the luminance of a backlight may be reduced, when the second image 1942 and the third image 1943 are displayed. Thus, light leakage can be reduced to enhance display contrast. Further, power consumption can be reduced.

The methods illustrated in FIGS. 19A to 19D can be freely combined with the methods illustrated FIG. 6A to 6E and FIGS. 7A to 7C. Specifically, an interpolation image is made to be at the intermediate state between plural basic images and further may have a display frame rate controlled by a certain rule. The certain rule may specifically be determined by the amplitude of the movement vector, setting by a user or external environment (such as surrounding brightness or temperature), or a combination of the above. When the display frame rate is high, the luminance of the interpolation image is gradually changed with respect to time, thereby smoothing display of moving images and the change of luminance. Accordingly, motion blur and flickers can be reduced. Further, a bright image and a dark image may be displayed alternately. In this manner, the frequency of typical luminance change can be made large to reduce flickers.

FIGS. 20A to 20E illustrate modes in which the display frame rate is three times as high as the input frame rate. FIGS. 20A to 20E schematically illustrate the change with time of images to be displayed with time indicated by the horizontal axis. FIGS. 20A to 20E each illustrate the image at the intermediate state of the region which is changed from frame to frame (the circular region) and the region which is not changed from frame to frame (the triangle region).

Figure 20A:
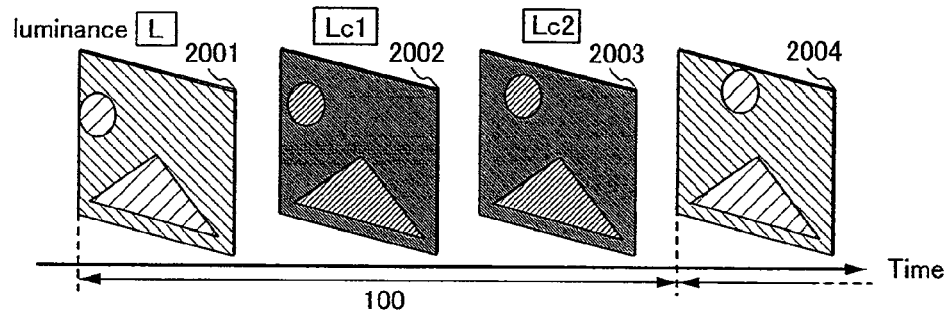
FIGS. 20A to 20E illustrate modes of the present invention.

In FIG. 20A, the period 100 denotes one frame period. A first image 2001 denotes a basic image of the previous frame, a second image 2002 is a first interpolation image of the previous frame, a third image 2003 is a second interpolation image of the previous frame, and a fourth image 2004 is a basic image of the current frame.

FIG. 20A illustrates the driving method described in Embodiment Mode 1. In other words, the movement amount of an image is detected from image data included in plural frames to make an image at the intermediate state between the images of the plural frames as an interpolation image, and luminance of the interpolation image is changed. The second image 2002 and the third image 2003 interpolate image data by motion interpolation. In this manner, a moving object is interpolated on the image to interpolate the image data, thereby achieving the smooth display.

At this time, the typical luminance of the first image 2001 is L, the typical luminance of the second image 2002 is Lc1, and the typical luminance of the third image 2003 is Lc2, which may satisfy L>Lc1, L>Lc2 or Lc1=Lc2. Preferably, they may satisfy 0.1 L<Lc1=Lc2<0.8 L, more preferably 0.2 L<Lc1=Lc2<0.5 L. By control of the luminance to satisfy the expression, display can be made close to pseudo impulse type display, and thus afterimages are not perceived by human eyes.

In this manner, two different causes of motion blur (non-smoothness in movement of images and afterimages to human eyes) are removed at one time, so that motion blur can be drastically reduced.

Note that the luminance of a backlight may be reduced, when the second image 2002 and the third image 2003 are displayed. Thus, light leakage can be reduced to enhance display contrast. Further, power consumption can be reduced.

Figure 20B:
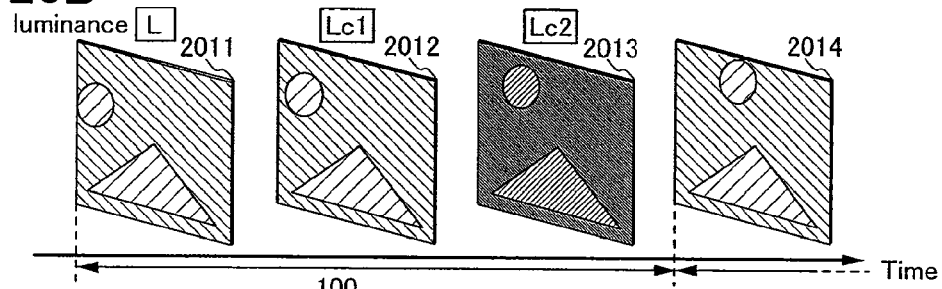

In FIG. 20B, the period 100 denotes one frame period. A first image 2011 is a basic image of the previous frame, a second image 2012 is a first interpolation image of the previous frame, a third image 2013 is a second interpolation image of the previous frame, and a fourth image 2014 is a basic image of the current frame.

Similar to FIG. 20A, in FIG. 20B, the movement amount of an image is detected from image data included in plural frames to make an image at the intermediate state between the images of the plural frames as an interpolation image, and luminance of the interpolation image is changed. The second image 2012 and the third image 2013 interpolate image data by motion interpolation. In this manner, a moving object is interpolated on the image to interpolate the image data, thereby achieving the smooth display.

FIG. 20B is different from FIG. 20A in that the luminance of the basic image and the second image 2012 are not changed while the luminance of the third image 2013 is changed. In other words, the typical luminance of the first image 2011 is L, the typical luminance of the second image 2012 is Lc1, and the typical luminance of the third image 2013 is Lc2 which may satisfy L=Lc1, L>Lc2 or Lc1>Lc2. Preferably, they may satisfy 0.1 L=0.1 Lc1<Lc2<0.8 L=0.8 Lc1, more preferably 0.2 L=0.2 Lc1<Lc2<0.5 L=0.5 Lc1. In this manner, display can be made close to pseudo impulse type display, and thus afterimages are not perceived by human eyes.

In this manner, two different causes of motion blur (non-smoothness in movement of images and afterimages to human eyes) are removed at one time, so that motion blur can be drastically reduced. Since the average luminance in one frame period is large, power consumption can be reduced.

Note that the luminance of a backlight may be reduced, when the third image 2013 is displayed. Thus, light leakage can be reduced to enhance display contrast. Further, power consumption can be reduced.

Figure 20C:
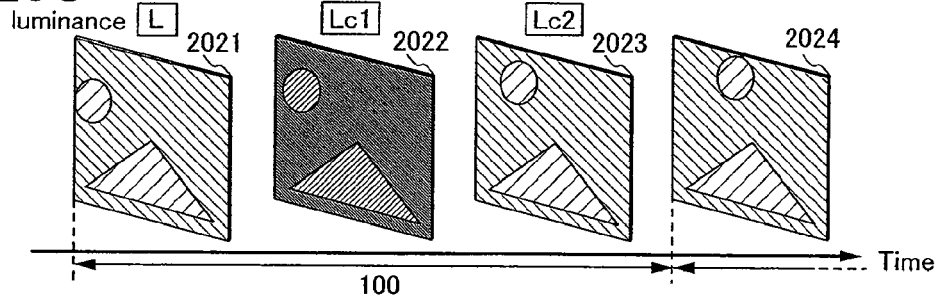

In FIG. 20C, the period 100 denotes one frame period. A first image 2021 is a basic image of the previous frame, a second image 2022 is a first interpolation image of the previous frame, a third image 2023 is a second interpolation image of the previous frame, and a fourth image 2024 is a basic image of the current frame.

Similar to FIG. 20A, in FIG. 20C, the movement amount of an image is detected from image data included in plural frames to make an image at the intermediate state between the images of the plural frames as an interpolation image, and luminance of the interpolation image is changed. The second image 2022 and the third image 2023 interpolate image data by motion interpolation. In this manner, a moving object is interpolated on the image to interpolate the image data, thereby achieving the smooth display.

FIG. 20C is different from FIG. 20A in that the luminance of the basic image and the third image 2023 are not changed while the luminance of the second image 2022 is changed. In other words, the typical luminance of the first image 2021 is L, the typical luminance of the second image 2022 is Lc1, and the typical luminance of the third image 2023 is Lc2 which may satisfy L>Lc1, L=Lc2, or Lc1<Lc2. Preferably, they may satisfy 0.1 L=0.1 Lc2<Lc1<0.8 L=0.8 Lc2, more preferably 0.2 L=0.2 Lc2<Lc1<0.5 L=0.5 Lc2. In this manner, display can be made close to pseudo impulse type display, and thus afterimages are not perceived by human eyes.

In this manner, two different causes of motion blur (non-smoothness in movement of images and afterimages to human eyes) are removed at one time, so that motion blur can be drastically reduced. Since the average luminance in one frame period is high, power consumption can be reduced.

The luminance of a backlight may be reduced when the second image 2022 is displayed. As a result, light leakage can be reduced to enhance display contrast. Further, power consumption can also be reduced.

Figure 20D:
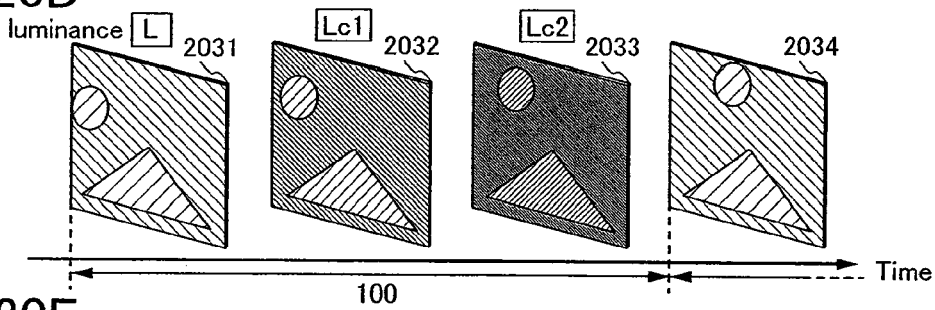

In FIG. 20D, the period 100 denotes one frame period. A first image 2031 is a basic image of the previous frame, a second image 2032 is a first interpolation image of the previous frame, a third image 2033 is a second interpolation image of the previous frame, and a fourth image 2034 is a basic image of the current frame.

Similar to FIG. 20A, FIG. 20D illustrates in which a method the movement amount of an image is detected from image data included in plural frames to make an image at the intermediate state between the images of the plural frames as an interpolation image, and luminance of the interpolation image is changed. The second image 2032 and the third image 2033 interpolate image data by motion interpolation. In this manner, a moving object is interpolated on the image to interpolate the image data, thereby achieving the smooth display.

FIG. 20D is different from FIG. 20A in that the change amounts of luminance of the second image 2032 and the third image 2033 which are interpolation images are different. In other words, the typical luminance of the first image 2031 is L, the typical luminance of the second image 2032 is Lc1, and the typical luminance of the third image 2033 is Lc2 which may satisfy L>Lc1, L>Lc2, or Lc1>Lc2. Preferably, Lc1 may satisfy 0.2 L<Lc1<0.8 L and Lc2 may satisfy 0.1 L<Lc2<0.5 L. In this manner, display can be made close to pseudo impulse type display, and thus afterimages are not perceived by human eyes.

In this manner, Two different causes of motion blur (non-smoothness in movement of images and afterimages to human eyes) are removed at one time, so that motion blur can be drastically reduced. The luminance changed from the first image 2031 to the third image 2033 can be smooth to reduce flickers.

The luminance of a backlight may be reduced when the second image 2032 and the third image 2033 are displayed. As a result, light leakage can be reduced to enhance display contrast. Further, power consumption can also be reduced.

Figure 20E:
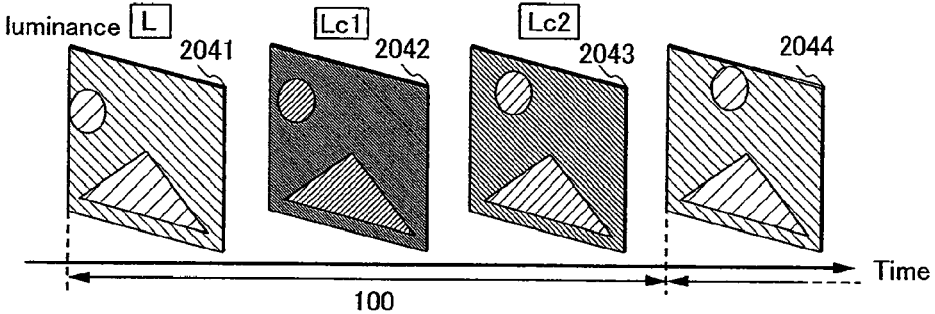

In FIG. 20E, the period 100 denotes one frame period. A first image 2041 is a basic image of the previous frame, a second image 2042 is a first interpolation image of the previous frame, a third image 2043 is a second interpolation image of the previous frame, and a fourth image 2044 is a basic image of the current frame.

Similar to FIG. 20A, FIG. 20E illustrates in which a method the movement amount of an image is detected from image data included in plural frames to make an image at the intermediate state between the images of the plural frames as an interpolation image, and luminance of the interpolation image is changed. The second image 2042 and the third image 2043 interpolate image data by motion interpolation. In this manner, a moving object is interpolated on the image to interpolate the image data, thereby achieving the smooth display.

FIG. 20E is different from FIG. 20A in that the change amounts of luminance of the second image 2042 and the third image 2043 which are interpolation images are different. In other words, the typical luminance of the first image 2041 is L, the typical luminance of the second image 2042 is Lc1, and the typical luminance of the third image 2043 is Lc2 which may satisfy L>Lc1, L>Lc2, or Lc1<Lc2. Preferably, Lc1 may satisfy 0.1 L<Lc1<0.5 L, and Lc2 may satisfy 0.2 L<Lc2<0.8 L. In this manner, display can be made close to pseudo impulse type display, and thus afterimages are not perceived by human eyes.

In this manner, Two different causes of motion blur (non-smoothness in movement of images and afterimages to human eyes) are removed at one time, so that motion blur can be drastically reduced. The luminance changed from the second image 2042 to the fourth image 2044 can be smooth to reduce flickers.

Note that the luminance of a backlight may be reduced, when the second image 2042 and the third image 2043 are displayed. Thus, light leakage can be reduced to enhance display contrast. Further, power consumption can be reduced.

When a display device using a display element with a slow response to voltage is used like a liquid crystal display device, a driving method (overdriving) which changes luminance more than a predetermined luminance can be adopted to increase the response speed of the display element. As shown in FIG. 20D, a black image is inserted as the second image 2042 between the first image 2041 and the third image 2043, which is the same as the overdriving. Thus, the speed of displaying the third image 2043 is increased.

The methods illustrated in FIGS. 20A to 20E can be freely combined with the methods illustrated in FIG. 6A to 6E and FIGS. 7A to 7C. Specifically, an interpolation image is made to be at the intermediate state between plural basic images and may have a display frame rate controlled by a certain rule. The certain rule may specifically be determined by the amplitude of the movement vector, setting by a user or external environment (such as surrounding brightness or temperature), or a combination of the above. When the display frame rate is large, the luminance of the interpolation image is gradually changed with respect to time, thereby smoothing moving images and the change of luminance. Accordingly, motion blur and flickers can be reduced. Further, a bright image and a dark image may be display alternately. In this manner, the frequency of typical luminance change can be made large to reduce flickers.

Figure 21A:
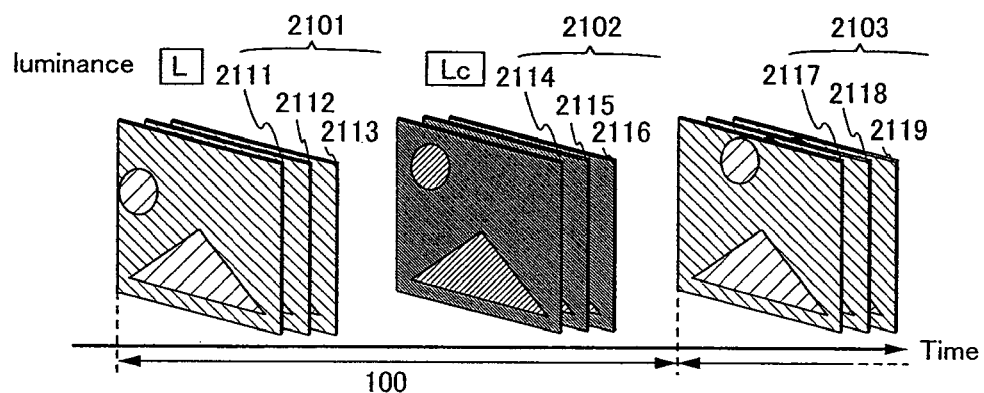
FIGS. 21A and 21B illustrate modes of the present invention.
Figure 21B:
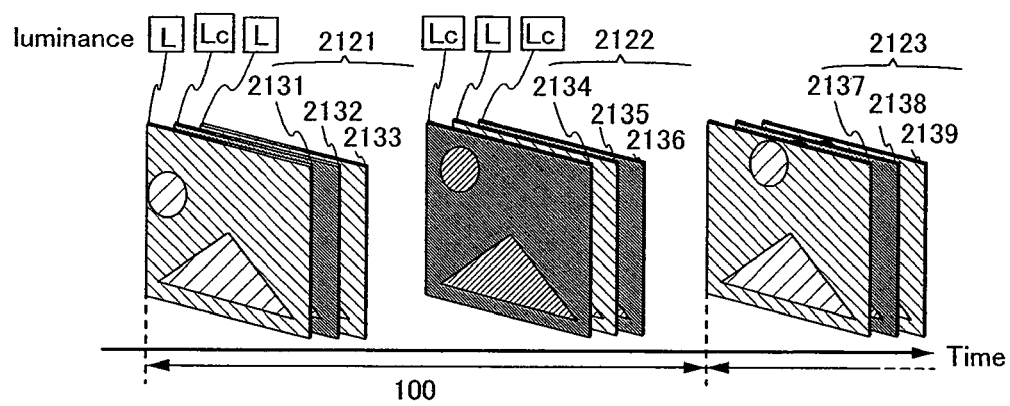

With reference to FIGS. 21A and 21B, another driving method in this specification is described. FIGS. 21A and 21B schematically illustrate the change with time of images to be displayed with time indicated by the horizontal axis. FIGS. 21A and 21B each illustrate the image at the intermediate state of the region which is changed from frame to frame (the circular region) and the region which is not changed from frame to frame (the triangle region). FIGS. 21A and 21B illustrate modes in which a plurality of subframes are used to display one image.

In FIG. 21A, the period 100 denotes one frame period. A first image 2101 is a basic image of the previous frame, a second image 2102 is an interpolation image of the previous frame, and a third image 2103 is a basic image of the current frame. Note that the first image 2101, the second image 2102 and the third image 2103 may each include a plurality of subframes. A plurality of subframes for displaying the first image 2101 are SF2111, SF2112 and SF2113; a plurality of subframes for displaying the second image 2102 are SF2114, SF2115 and SF2116; and a plurality of subframes for displaying the third image 2103 are SF2117, SF2118 and SF 2119.

FIG. 21A illustrates in which a driving method in which the movement amount of an image is detected from image data included in plural frames to make an image at the intermediate state between the images of the plural frames as an interpolation image, and luminance of the interpolation image is changed. The luminance of the first image 2101 is different from that of the second image 2102, while the typical luminance of the plurality of subframes in each image is generally the same. In other words, the second image 2102 interpolates image data by motion interpolation. In this manner, a moving object is interpolated on the image to interpolate the image data, thereby achieving the smooth display.

The typical luminance of the plural subframes SF2111, SF2112 and SF2113 for displaying the first image 2101 is L; the typical luminance of the plural subframes SF2114, SF2115 and SF2116 for displaying the second image 2102 is Lc which may satisfy a relationship of 0.1 L<Lc<0.8 L, more preferably 0.2 L<Lc<0.5 L. In this manner, display can be made close to pseudo impulse type display, and thus afterimages are not perceived by human eyes.

In this manner, Two different causes of motion blur (non-smoothness in movement of images and afterimages to human eyes) are removed at one time, so that motion blur can be drastically reduced.

In FIG. 21B, the period 100 denotes one frame period. A first image 2121 is a basic image of the previous frame, a second image 2122 is an interpolation image of the previous frame, and a third image 2123 is a basic image of the current frame. Note that the first image 2121, the second image 2122 and the third image 2123 may each include a plurality of subframes. A plurality of subframes for displaying the first image 2121 are SF2131, SF2132 and SF2133; a plurality of subframes for displaying the second image 2122 are SF2134, SF2135 and SF2136; and a plurality of subframes for displaying the third image 2123 are SF2137, SF2138 and SF2139.

FIG. 21B illustrates in which a method the movement amount of an image is detected from image data included in plural frames to make an image at the intermediate state between the images of the plural frames as an interpolation image, luminance of the interpolation image is changed and luminance of subframes to be displayed are changed alternately in the display order. In other words, the second image 2102 and the third image 2103 interpolate image data by motion interpolation. In this manner, a moving object is interpolated on the image to interpolate the image data, thereby achieving the smooth display.

The typical luminance of the subframes SF2131, SF2133 and SF2135 is L; the typical luminance of the subframes SF2132, SF2134 and SF2136 is Lc which may satisfy 0.1 L<Lc<0.8 L more preferably 0.2 L<Lc<0.5 L. In this manner, display can be made close to pseudo impulse type display, and thus afterimages are not perceived by human eyes.

In this manner, Two different causes of motion blur (non-smoothness in movement of images and afterimages to human eyes) are removed at one time, so that motion blur can be drastically reduced. Moreover, the frequency of typical luminance change can be made large to reduce flickers.

As the method for dividing an image into the plurality of subframes, a field sequential method in which an image is divided for each color, a time grayscale method in which an image is divided based on grayscales, or the like can be adopted, any driving method can be adopted as the driving method in this specification. The number of subframes for an image may be any number, without being limited to three.

Note that the content of this embodiment mode can be freely combined with the other embodiment modes.

The elements or components of the drawings in this embodiment mode can each be combined with elements or components of drawings in other embodiment modes.

Embodiment Mode 5

Embodiment Mode 5 will describe an example of a driving timing in a method of driving a display device or a semiconductor device in this specification.

Figure 22A:
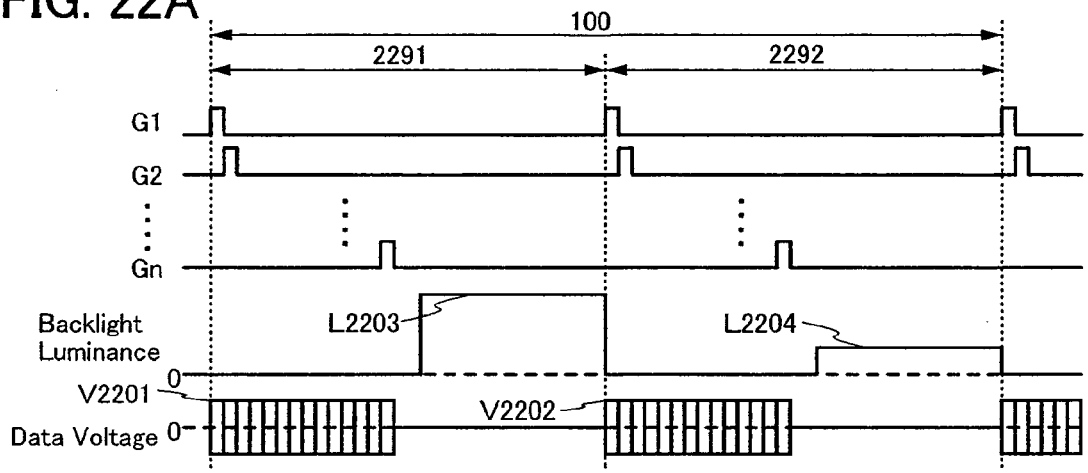
FIGS. 22A to 22C are timing charts of semiconductor devices according to the present invention.
Figure 22B:
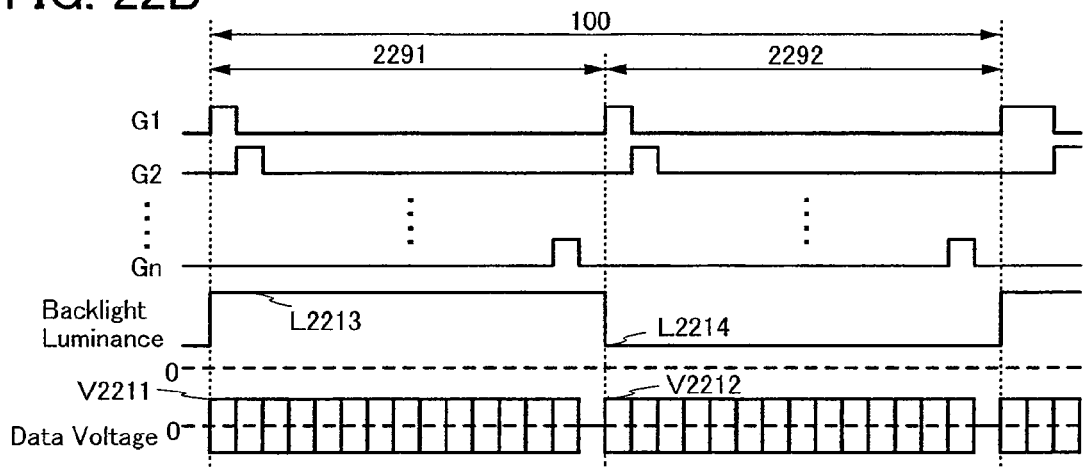
Figure 22C:
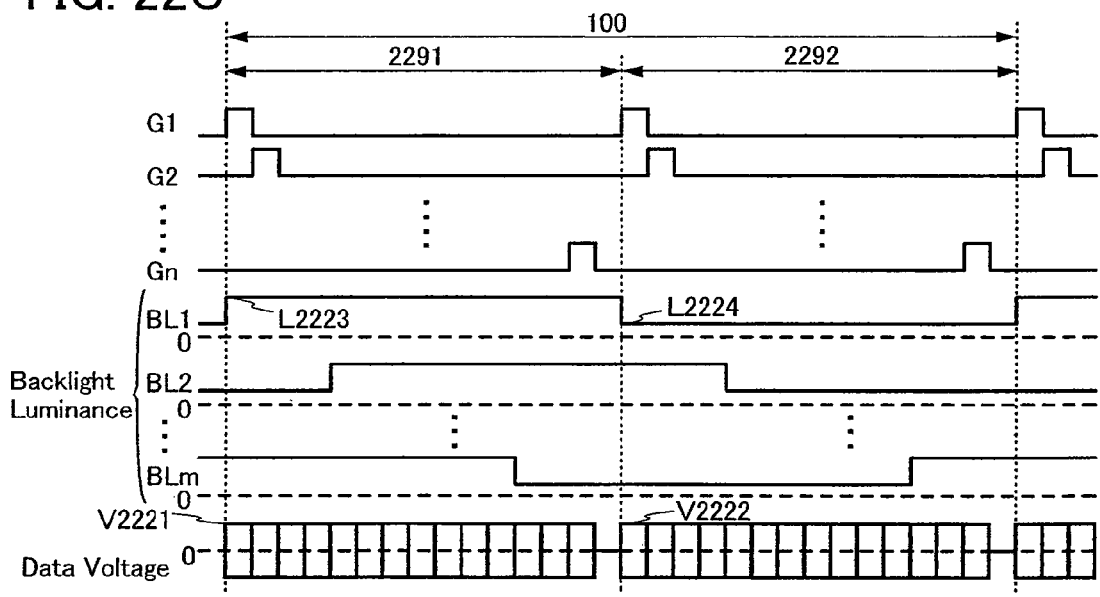

First, with reference to FIGS. 22A to 22C, a method in which the luminance of an image is controlled by a backlight is described. FIGS. 22A to 22C are timing charts in a case where a display frame rate is twice as high as an input frame rate. The period 100 denotes one frame period, a period 2291 is a period in which a first image is displayed, and a period 2292 is a period in which a second image is displayed. In FIGS. 22A to 22C, an original image is displayed in the period 2291, and an image having the decreased luminance is displayed in the period 2292.

In FIGS. 22A to 22C, G1 to Gn denote scan lines, and voltage of each scan line is shown in the timing chart. The scan line may be, for example, an output terminal of the gate driver 513 in FIG. 5A. The output terminal of the gate driver 513 may be connected to pixel circuits in the display region 514 so that the pixel circuits can be selected (scanned) by each line. FIGS. 22A to 22C illustrate the pixel circuits which are scanned according to the timing charts of the scan lines G1 to Gn. Further, FIGS. 22A to 22C illustrate the scanning, which is to be started from the scan line G1 and terminated at the scan line Gn.

The timing chart of FIG. 22A illustrates a case where the luminance of the backlight is set to be 0 in a scanning period, and after scanning of all the scan lines is completed, the backlight is made to emit light to perform display. In FIG. 22A, voltage V2201 and voltage V2202 represent the upper limits in an absolute value of data voltage, and luminance L2203 and luminance L2204 represent the backlight luminance.

In the period 2291, the luminance of the backlight is 0 in a scanning period, and the upper limit in the absolute value of the data voltage is the voltage V2201. Note that the data voltage may be varied depending on each pixel circuit and thus has a larger range of voltage values. After the scanning of all the scan lines is completed, the backlight luminance is set to be the luminance L2203 to perform display.

In the period 2292, the luminance of the backlight is 0 in a scanning period, and the upper limit in the absolute value of the data voltage is the voltage V2202. After the scanning of all the scan lines is completed, the backlight luminance is set to be the luminance L2204 to perform display.

Here, the backlight luminance L2203 in the period 2291 may be higher than the backlight luminance L2204 in the period 2292. Accordingly, the display can be close to pseudo impulse type display; thus, afterimages to human eyes can be suppressed.

Note that the voltage V2201 and the voltage V2202 may be almost the same. Accordingly, image data can be easily processed; therefore, power consumption and heat generation can be reduced.

In the timing chart illustrated in FIG. 22A, the display is made closer to pseudo impulse type display by the luminance L2203 and the luminance L2204 that are varied, and moreover, the luminance of the backlight is set to be 0 in the scanning period; therefore, the display can be much closer to the impulse type. Accordingly, an effect of suppressing afterimages to human eyes can be enhanced, and motion blur can be drastically reduced.

In the timing chart illustrated in FIG. 22B, the backlight is made to emit light also in the scanning period. Then, the backlight luminance is made varied in the periods 2291 and 2292, so that the luminance of the image is controlled. In FIG. 22B, voltage V2211 and voltage V2212 represent the upper limits in an absolute value of data voltage, and luminance L2213 and luminance L2214 represent the backlight luminance.

In the period 2291, the upper limit in the absolute value of the data voltage is the voltage V2211. Further, display is performed by setting the backlight luminance to be the luminance L2213 in the scanning period.

In the period 2292, the upper limit in the absolute value of the data voltage is the voltage V2212. Further, display is performed by setting the backlight luminance to be the luminance L2214 in the scanning period.

Here, the backlight luminance L2213 in the period 2291 may be higher than the backlight luminance L2214 in the period 2292. Accordingly, the display can be close to pseudo impulse type display; thus, afterimages to human eyes can be suppressed.

Note that the voltage V2211 and the voltage V2212 may be almost the same. Accordingly, image data can be easily processed; therefore, power consumption and heat generation can be reduced.

Note that in the timing chart illustrated in FIG. 22B, frequencies of the scan lines G1 to Gn and data voltage can be decreased by making the backlight to emit light also in the scanning period. Accordingly, power consumption and heat generation can be reduced.

The timing chart in FIG. 22C illustrates a case where a plurality of backlights BL1 to BLm which can individually control the luminance are provided. The luminance of the plurality of backlights BL1 to BLm may be controlled in accordance with scanning timings of the scan lines G1 to Gn. In this specification, such a method is referred to as a backlight scanning method. In FIG. 22C, voltage V2221 and voltage V2222 represent the upper limits in an absolute value of data voltage, and luminance L2223 and luminance L2224 represent the backlight luminance.

Note that the number of the plurality of backlights may be the same as that of the scan lines. In this case, since the backlight luminance can be changed in accordance with the scanning timing by backlight scanning, the correct luminance can be displayed.

Note that the number of the plurality of backlights may be smaller than that of the scan lines. In this case, a plurality of scan lines are provided for one backlight and the scanning timings are adjusted for the scan lines and the backlight. Accordingly, the number of the backlights and the manufacturing cost can be reduced. Further, because of simplicity of driving, power consumption and heat generation can be reduced.

Note that the voltage V2221 and the voltage V2222 may be almost the same. Accordingly, image data can be easily processed; therefore, power consumption and heat generation can be reduced.

In FIGS. 22A to 22C, an original image is displayed in the period 2291, and an image with the decreased luminance is displayed in the period 2292. However, the present invention is not limited thereto, and various combinations can be used. For example, an original image may be displayed in the period 2291, and an image with the increased luminance may be displayed in the period 2292; an image with the decreased luminance may be displayed in the period 2291, and an original image may be displayed in the period 2292; or an image with the enhanced luminance may be displayed in the period 2291, and an original image may be displayed in the period 2292.

Note that FIGS. 22A to 22C illustrate the timing charts in a case where a display frame rate is twice as high as an input frame rate, but the present invention is not limited thereto, and various frame rates can be adopted. For example, the display frame rate may be 1.5 times, 3 times, or 4 or more times as high as the input frame rate.

Figure 23A:
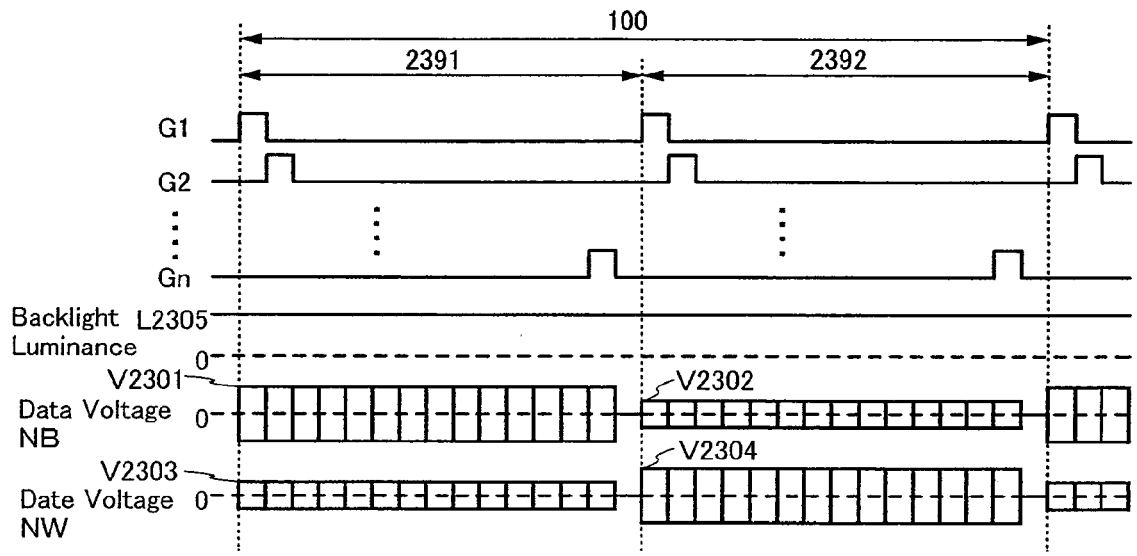
FIGS. 23A and 23B are timing charts of semiconductor devices according to the present invention.
Figure 23B:
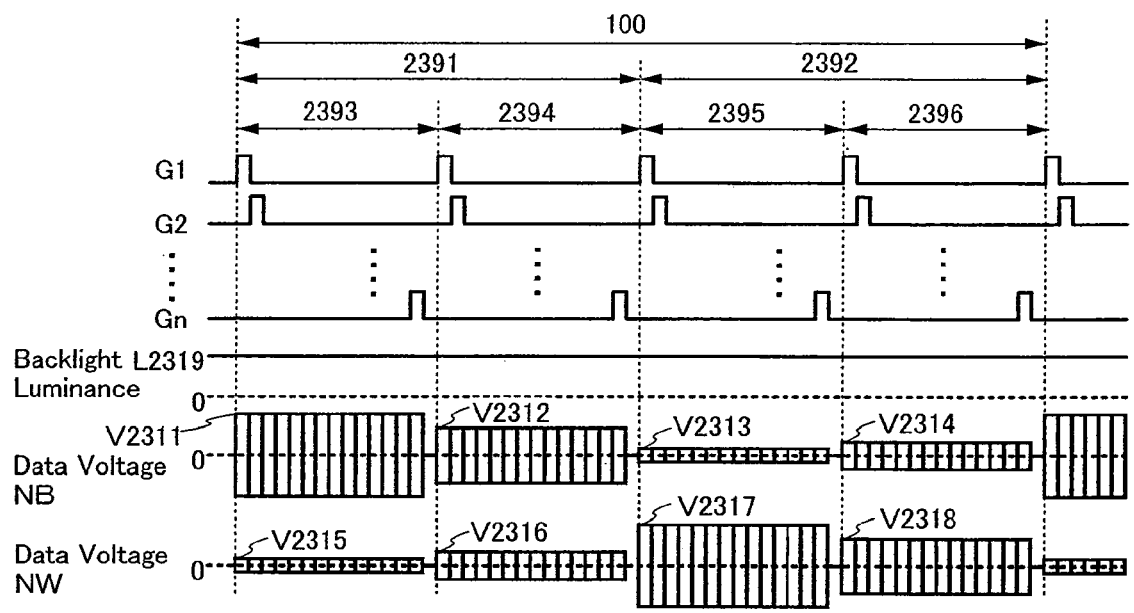

Next, a method in which the luminance of an image is controlled by data voltage is described with reference to FIGS. 23A and 23B. FIGS. 23A and 23B are timing charts in the case where a display frame rate is twice as high as an input frame rate. The period 100 denotes one frame period, a period 2391 is a period in which a first image is displayed, and a period 2392 is a period in which a second image is displayed. In FIGS. 23A and 23B, an original image is displayed in the period 2391, and an image with the decreased luminance is displayed in the period 2392.

In FIGS. 23A and 23B, G1 to Gn denote scan lines, and voltage of each scan line is illustrated in the timing chart. The scan line may be, for example, an output terminal of the gate driver 513 in FIG. 5A. The output terminal of the gate driver 513 may be connected to pixel circuits in the display region 514 so that the pixel circuits are selected (scanned) by each line. FIGS. 23A and 23B illustrate the pixel circuits which are scanned according to the timing charts of the scan lines G1 to Gn. Further, FIGS. 23A and 23B illustrate the scanning, which is to be started from the scan line G1 and terminated at the scan line Gn.

FIGS. 23A and 23B illustrate two kinds of data voltage, the data voltage in the case where a display element is normally-black type (data voltage NB) and the data voltage in the case where a display element is normally-white type (data voltage NW). Here, a normally-black type display element is a display element which displays black (has the minimum luminance) when a data voltage of 0 is applied (no voltage is applied) to a pixel circuit and in which the luminance is enhanced as the applied voltage gets higher. On the other hand, a normally-white type display element is a display element which displays white (has the maximum luminance) when a data voltage of 0 is applied (no voltage is applied) to a pixel circuit and in which the luminance is decreased as the applied voltage gets higher.

In the timing chart illustrated in FIG. 23A, the luminance of the backlight is constant in the one frame period 100, and the luminance of an image in the period 2391 and the luminance of an image in the period 2392 are changed by the data voltage. In FIG. 23A, voltage V2301, voltage V2302, voltage V2303, and voltage V2304 represent the upper limit in an absolute value of the data voltage, and luminance L2305 represents the backlight luminance.

The upper limit voltage V2301 in an absolute value of the data voltage NB in the period 2391 of FIG. 23A is made higher than the upper limit voltage V2302 of an absolute value of the data voltage NB in the period 2392 of FIG. 23A. The normally-black type display element has higher luminance as the applied voltage gets higher. Therefore, when the upper limit in the absolute value of the data voltage is high, the luminance of a whole image is high compared to the case where the upper limit is low. That is, by setting the voltage V2301 higher than the voltage V2302 like the data voltage NB in FIG. 23A, the luminance of an image in the period 2391 is higher than the luminance of an image in the period 2392. Accordingly, the display can be close to pseudo impulse type display; thus, afterimages to human eyes can be suppressed and motion blur can be reduced.

The upper limit voltage V2303 of an absolute value of the data voltage NW in the period 2391 of FIG. 23A is made lower than the upper limit voltage V2304 of an absolute value of the data voltage NW in the period 2392 of FIG. 23A. The normally-white type display element has lower luminance as the applied voltage gets higher. Therefore, when the upper limit in the absolute value of the data voltage is low, the luminance of a whole image is high compared to the case where the upper limit is high. That is, by setting the voltage V2303 lower than the voltage V2304 like the data voltage NW in FIG. 23A, the luminance of an image in the period 2391 is higher than the luminance of an image in the period 2392. Accordingly, the display can be close to pseudo impulse type display; thus, afterimages to human eyes can be suppressed and motion blur can be reduced.

In the timing chart illustrated in FIG. 23B, overdriving is shown, which is performed in a case where the luminance of the backlight is constant in the one frame period 100, and the luminance of an image in the period 2391 and the luminance of an image in the period 2392 are changed by the data voltage. At this time, in each of the periods 2391 and 2392, scanning of each of the scan lines G1 to Gn may be performed twice by dividing the period into a first half part and a second half part. In the first half part, overdriving is performed, and the luminance of an original image is displayed in the second half part, so that the response speed of the display element is improved. In FIG. 23B, a period 2393 represents the first half part of the period 2391; a period 2394 represents the second half part of the period 2391; a period 2395 represents the first half part of the period 2392; a period 2396 represents the second half part of the period 2392; voltage V2311, voltage V2312, voltage V2313, voltage V2314, voltage V2315, voltage V2316, voltage V2317, and voltage 2318 represent the upper limits in an absolute value of the data voltage; and luminance L2309 represents the backlight luminance.

First, the data voltage of the original image in the data voltage NB in FIG. 23B is described. The original voltage value of the data voltage NB in the periods 2391 and 2392 may be the voltage V2312 and the voltage V2314 in the second half part. When the voltage V2312 is made higher than the voltage V2314, the luminance of an image in the period 2391 can be made higher than the luminance of an image in the period 2392. Accordingly, the display can be close to pseudo impulse type display; thus, afterimages to human eyes can be suppressed and motion blur can be reduced.

Here, the data voltage NB in the first half part of the periods 2391 and 2392 may be overdriving voltage by which the data voltage becomes immediately closer to that in the second half part, which is an original voltage value. Specifically, the voltage should be reduced from the data voltage V2312 of an original image in the period 2391 to the data voltage V2314 of an original image in the period 2392. Therefore, in order to change the data voltage more rapidly, the data voltage V2313 in the period 2395 is made lower than the data voltage V2314 of an intended image. Accordingly, the data voltage can be changed from the data voltage V2312 to the data voltage V2314 more rapidly.

Similarly, the voltage should be increased from the data voltage V2314 of an original image in the period 2392 to the data voltage V2312 of an original image in the period 2391. Therefore, in order to change the data voltage more rapidly, the data voltage V2311 in the period 2393 is made higher than the data voltage V2312 of an intended image. Accordingly, the data voltage can be changed from the data voltage V2314 to the data voltage V2312 more rapidly.

Next, the data voltage of the original image in the data voltage NW in FIG. 23B is described. The original voltage value of the data voltage NW in the periods 2391 and 2392 may be the voltage V2316 and the voltage V2318 in the second half part. When the voltage V2316 is made lower than the voltage V2318, the luminance of an image in the period 2391 can be made higher than the luminance of an image in the period 2392. Accordingly, the display can be close to pseudo impulse type display; thus, afterimages to human eyes can be suppressed and motion blur can be reduced.

Here, the data voltage NW in the first half part of the periods 2391 and 2392 may be overdriving voltage by which the data voltage becomes immediately closer to that in the second half part, which is an original voltage value. Specifically, the voltage should be increased from the data voltage V2316 of an original image in the period 2391 to the data voltage V2318 of an original image in the period 2392. Therefore, in order to change the data voltage more rapidly, the data voltage V2317 in the period 2395 is made higher than the data voltage V2318 of an intended image. Accordingly, the data voltage can be changed from the data voltage V2316 to the data voltage V2318 more rapidly.

Similarly, the voltage should be reduced from the data voltage V2318 of an original image in the period 2392 to the data voltage V2316 of an original image in the period 2391. Therefore, in order to change the data voltage more rapidly, the data voltage V2315 in the period 2393 is made lower than the data voltage V2316 of an intended image. Accordingly, the data voltage can be changed from the data voltage V2318 to the data voltage V2316 more rapidly.

Note that in the timing chart illustrated in FIG. 23B, overdriving voltage is applied in the first half part of the periods 2391 and 2392, and voltage of an original image is applied in the second half part, but these voltage may be inverted. That is, voltage of an original image may be applied in the first half part of the periods 2391 and 2392, and overdriving voltage may be applied in the second half part. Also in this case, when the voltage of the original image is reduced, the applied voltage is made lower than the intended voltage in a period between periods in which the original image is displayed, whereas, when the voltage of the original image is increased, the applied voltage is made higher than the intended voltage in a period between periods in which the original image is displayed.

In FIG. 23B, the one frame period 100 is divided into four periods, but the present invention is not limited thereto, and the one frame period can be divided into any number of periods. For example, when the one frame period 100 is divided into three periods, the response speed of either the period 2391 or 2392 can be increased, and in addition thereto, the driving frequency can be reduced; therefore, power consumption and heat generation can be reduced.

Note that FIGS. 23A and 23B illustrate the timing charts in the case where a display frame rate is twice as high as an input frame rate, but the present invention is not limited thereto, and various frame rates can be used. For example, the display frame rate may be 1.5 times, 3 times, or 4 or more times as high as the input frame rate.

Note that examples illustrated in FIGS. 22A to 22C and examples illustrated in FIGS. 23A and 23B can be combined.

This embodiment mode can be freely combined with other embodiment modes.

The elements or components of the drawings in this embodiment mode can each be combined with elements or components of drawings in other embodiment modes.

Embodiment Mode 6

Embodiment Mode 6 will describe the display sequence of images having controlled luminance.

FIGS. 24A to 24E schematically show a change with time of the luminance of images that are displayed, with the horizontal axis as time.

Figure 24A:
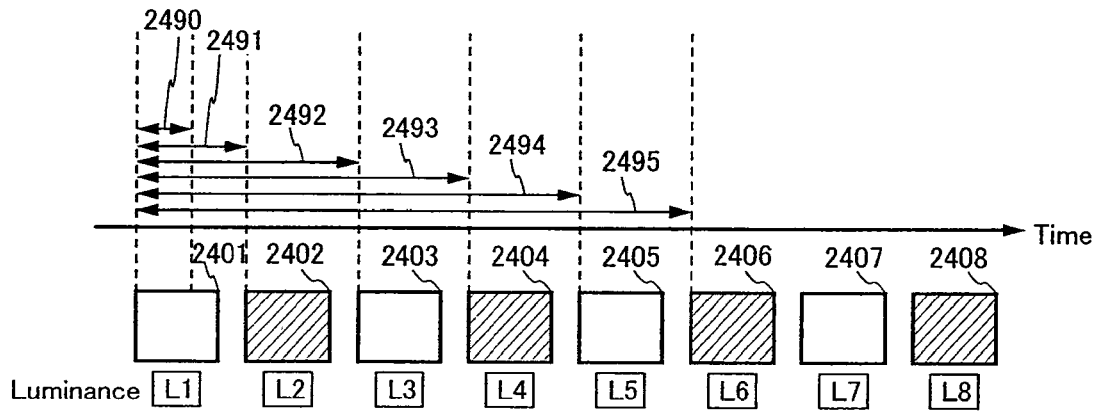
FIGS. 24A to 24E schematically illustrate luminance change with time of images.

FIG. 24A shows a case where an image having controlled luminance and an image having uncontrolled luminance are alternately displayed. In FIG. 24A, a first image 2401, a second image 2402, a third image 2403, a fourth image 2404, a fifth image 2405, a sixth image 2406, a seventh image 2407, and an eighth image 2408 are sequentially displayed. Here, the typical luminance of the first image 2401 is L1, the typical luminance of the second image 2402 is L2, the typical luminance of the third image 2403 is L3, the typical luminance of the fourth image 2404 is L4, the typical luminance of the fifth image 2405 is L5, the typical luminance of the sixth image 2406 is L6, the typical luminance of the seventh image 2407 is L7, and the typical luminance of the eighth image 2408 is L8.

When the typical luminance of the images that are adjacent in terms of time are compared, relationships L1>L2, L2<L3, L3>L4, L4<L5, L5>L6, L6<L7, and L7>L8 may be obtained. Accordingly, a frequency of changing the luminance can be increased; therefore, flickers can be reduced. In addition, since an image having controlled typical luminance is displayed, afterimages to human eyes can be suppressed, and motion blur can be reduced.

Note that among the first to eighth images, the image having controlled luminance may be a black image. The whole image may be black, or alternatively, a large part of the image may be black.

The above relationships of the luminance may be obtained only in a period during which images that are relatively similar to each other, e.g. motion images, are displayed. When the content of the image is suddenly changed, for example, when scenes are switched, the above relationships of the luminance are not necessarily required.

Periods 2490 to 2497 are one frame corresponding to an input frame rate when the first to eighth images are displayed.

When the period 2490 is one frame, a display frame rate is a half of the input frame rate, that is, corresponds to the case where during a period in which an image and the next image are displayed, another one of image is input. In this case, an image that is input but not displayed may also be provided.

When the period 2491 is one frame, the display frame rate and the input frame rate are equal to each other. In other words, the first to eighth images are all basic images. That is, this case corresponds to a case where a basic image having uncontrolled luminance and a basic image having controlled luminance are alternately displayed.

When the period 2492 is one frame, the display frame rate is twice as high as the input frame rate. At this time, the first image 2401, the third image 2403, the fifth image 2405, and the seventh image 2407 are basic images. Since the second image 2402, the fourth image 2404, the sixth image 2406, and the eighth image 2408 are images that are not input, these images are interpolation images generated by motion interpolation and the like. In other words, this case corresponds to a case where the luminance of the interpolation image is controlled for display.

When the period 2493 is one frame, the display frame rate is three times as high as the input frame rate. At this time, the first image 2401, the fourth image 2404, and the seventh image 2407 are basic images. Since the second image 2402, the third image 2403, the fifth image 2405, the sixth image 2406, and the eighth image 2408 are images that not input, these images are interpolation images generated by motion interpolation and the like. In this case, a frame in which the luminance of a first interpolation image (e.g. the second image 2402) in one frame is controlled for display and a frame in which the luminance of a basic image (e.g. the fourth image 2404) and the luminance of a second interpolation image (e.g. the sixth image 2406) in one frame are controlled for display are alternately provided.

When the period 2494 is one frame, the display frame rate is four times as high as the input frame rate. At this time, the first image 2401 and the fifth image 2405 are basic images. Since the second image 2402, the third image 2403, the fourth image 2404, the sixth image 2406, the seventh image 2407, and the eighth image 2408 are images that are not input, these images are interpolation images generated by motion interpolation and the like. In this case, the luminance of a first interpolation image (e.g. the second image 2402) and the luminance of a third interpolation image (e.g. the fourth image 2404) in one frame are controlled for display.

When the period 2495 is one frame, the display frame rate is five times as high as the input frame rate. At this time, the first image 2401 and the sixth image 2406 are basic images. Since the second image 2402, the third image 2403, the fourth image 2404, the fifth image 2405, the seventh image 2407, and the eighth image 2408 are images that are not input, these images are interpolation images generated by motion interpolation and the like. In this case, a frame in which the luminance of a first interpolation image (e.g. the second image 2402) and the luminance of a third interpolation image (e.g. the fourth image 2404) are controlled for display, and a frame in which the luminance of a basic image (e.g. the sixth image 2406), the luminance of a second interpolation image (e.g. the eighth image 2408), and the luminance of a fourth interpolation image (not illustrated) are controlled for display are alternately provided.

In this manner, the display frame rate with respect to the input frame rate can have various values when the first to eighth images are displayed.

As for FIGS. 24B to 24E, similarly, the display frame rate with respect to the input frame rate can have various values.

Figure 24B:
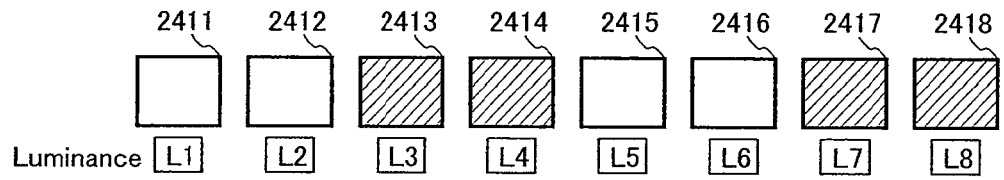

FIG. 24B shows a case where a pair of images having controlled luminance and a pair of images having uncontrolled luminance are alternately displayed. In FIG. 24B, a first image 2411, a second image 2412, a third image 2413, a fourth image 2414, a fifth image 2415, a sixth image 2416, a seventh image 2417, and an eighth image 2418 are sequentially displayed. Here, the typical luminance of the first image 2411 is L1, the typical luminance of the second image 2412 is L2, the typical luminance of the third image 2413 is L3, the typical luminance of the fourth image 2414 is L4, the typical luminance of the fifth image 2415 is L5, the typical luminance of the sixth image 2416 is L6, the typical luminance of the seventh image 2417 is L7, and the typical luminance of the eighth image 2418 is L8.

When the typical luminance of the images that are adjacent in terms of time are compared, relationships L1=L2, L2>L3, L3=L4, L<L5, L5=L6, L6>L7, and L7=L8 may be obtained. Accordingly, since an image having controlled typical luminance is displayed, afterimages to human eyes can be suppressed, and motion blur can be reduced.

Note that among the first to eighth images, the image having controlled luminance may be a black image. The whole image may be black, or alternatively, a large part of the image may be black.

The number of images having controlled luminance and images having uncontrolled luminance is not limited one or two and may be any number. For example, groups each including three images are alternately displayed, or groups each including four images are alternately displayed.

The above relationships of the luminance may be obtained only in a period in which images that are relatively similar to each other, e.g. motion images, are displayed. When the content of the image is suddenly changed, for example, when scenes are switched, the above relationships of the luminance are not necessarily required.

Figure 24C:
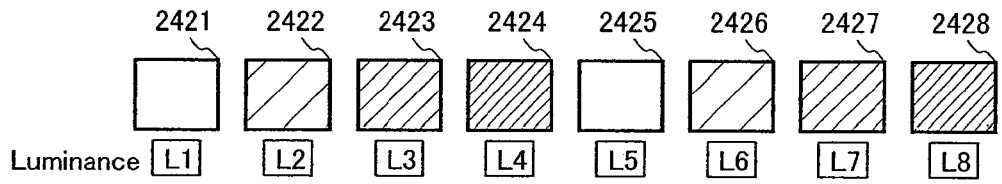

FIG. 24C shows a case where four images in which the luminance is controlled to be gradually decreased are sequentially displayed. In FIG. 24C, a first image 2421, a second image 2422, a third image 2423, a fourth image 2424, a fifth image 2425, a sixth image 2426, a seventh image 2427, and an eighth image 2428 are sequentially displayed. Here, the typical luminance of the first image 2421 is L1, the typical luminance of the second image 2422 is L2, the typical luminance of the third image 2423 is L3, the typical luminance of the fourth image 2424 is L4, the typical luminance of the fifth image 2425 is L5, the typical luminance of the sixth image 2426 is L6, the typical luminance of the seventh image 2427 is L7, and the typical luminance of the eighth image 2428 is L8.

When the typical luminance of the images that are adjacent in terms of time are compared, relationships L1>L2, L2>L3, L3>L4, L4<L5, L5>L6, L6>L7, and L7>L8 may be obtained. Accordingly, the luminance is gradually changed, and flickers can be reduced. In addition, since an image having controlled typical luminance is displayed, afterimages to human eyes can be suppressed, and motion blur can be reduced.

The number of images in which the luminance is controlled to be gradually decreased is not limited to four and may be any number. For example, groups each including three images are alternately displayed, or groups each including five images are alternately displayed.

Note that among the first to eighth images, the image having controlled luminance may be a black image. The whole image may be black, or alternatively, a large part of the image may be black.

The above relationships of the luminance may be obtained only in a period in which images that are relatively similar to each other, e.g. motion images, are displayed. When the content of the image is suddenly changed, for example, when scenes are switched, the above relationships of the luminance are not necessarily required.

Figure 24D:
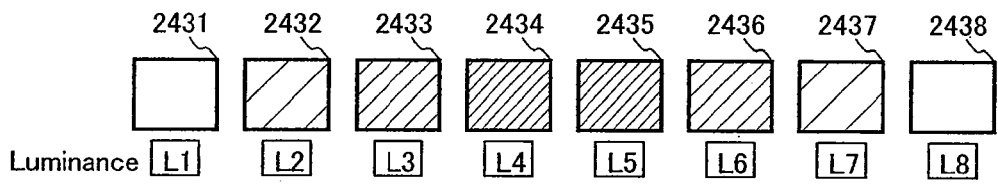

FIG. 24D shows a case where four images in which the luminance is controlled to be gradually decreased and four images in which the luminance is controlled to be gradually increased are sequentially displayed. In FIG. 24D, a first image 2431, a second image 2432, a third image 2433, a fourth image 2434, a fifth image 2435, a sixth image 2436, a seventh image 2437, and an eighth image 2438 are sequentially displayed. Here, the typical luminance of the first image 2431 is L1, the typical luminance of the second image 2432 is L2, the typical luminance of the third image 2433 is L3, the typical luminance of the fourth image 2434 is L4, the typical luminance of the fifth image 2435 is L5, the typical luminance of the sixth image 2436 is L6, the typical luminance of the seventh image 2437 is L7, and the typical luminance of the eighth image 2438 is L8.

When the typical luminance of the images that are adjacent in terms of time are compared, relationships L1>L2, L2>L3, L3>L4, L4=L5, L5<L6, L6<L7, and L7<L8 may be obtained. Accordingly, the luminance is gradually changed, and thus flickers can be reduced. Since an image having controlled typical luminance is displayed, afterimages to human eyes can be suppressed, and motion blur can be reduced.

The number of images in which the luminance is controlled to be gradually increased or decreased is not limited to four and may be any number. For example, groups each including three images are alternately displayed, or groups each including five images are alternately displayed.

Note that among the first to eighth images, the image having controlled luminance may be a black image. The whole image may be black, or alternatively, a large part of the image may be black.

The above relationships of the luminance may be obtained only in a period in which images that are relatively similar, e.g. motion images, are displayed. When the content of the image is suddenly changed, for example, when scenes are switched, the above relationships of the luminance are not necessarily required.

Figure 24E:
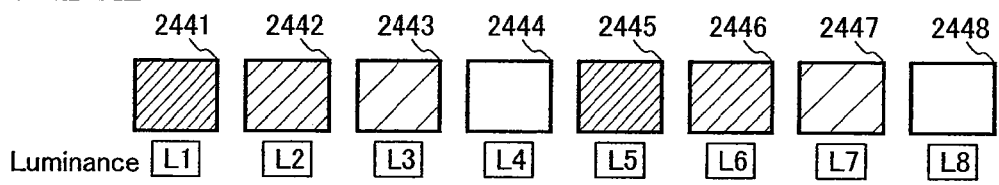

FIG. 24E shows a case where four images in which the luminance is controlled to be gradually increased are sequentially displayed. In FIG. 24E, a first image 2441, a second image 2442, a third image 2443, a fourth image 2444, a fifth image 2445, a sixth image 2446, a seventh image 2447, and an eighth image 2448 are sequentially displayed. Here, the typical luminance of the first image 2441 is L1, the typical luminance of the second image 2442 is L2, the typical luminance of the third image 2443 is L3, the typical luminance of the fourth image 2444 is L4, the typical luminance of the fifth image 2445 is L5, the typical luminance of the sixth image 2446 is L6, the typical luminance of the seventh image 2447 is L7, and the typical luminance of the eighth image 2448 is L8.

When the typical luminance of the images that are adjacent in terms of time are compared, relationships L1<L2, L2<L3, L3<L4, L4>L5, L5<L6, L6<L7, and L7>L8 may be obtained. Accordingly, the luminance is gradually changed, and thus flickers can be reduced. In addition, since an image having controlled typical luminance is displayed, afterimages to human eyes can be suppressed, and motion blur can be reduced.

The number of images in which the luminance is controlled to be gradually increased or decreased is not limited to four and may be any number. For example, groups each including three images are alternately displayed, or groups each including five images are alternately displayed.

Note that among the first to eighth images, the image having controlled luminance may be a black image. The whole image may be black, or alternatively, a large part of the image may be black.

The above relationships of the luminance may be obtained only in a period in which images that are relatively similar to each other, e.g. motion images, are displayed. When the content of the image is suddenly changed, for example, when scenes are switched, the above relationships of the luminance are not necessarily required.

This embodiment mode can be freely combined with other embodiment modes.

The elements or components of the drawings in this embodiment mode can each be combined with elements or components of drawings in other embodiment modes.

Embodiment Mode 7

Embodiment Mode 7 will describe a structure of a transistor and a method for manufacturing the transistor.

Figure 25A:
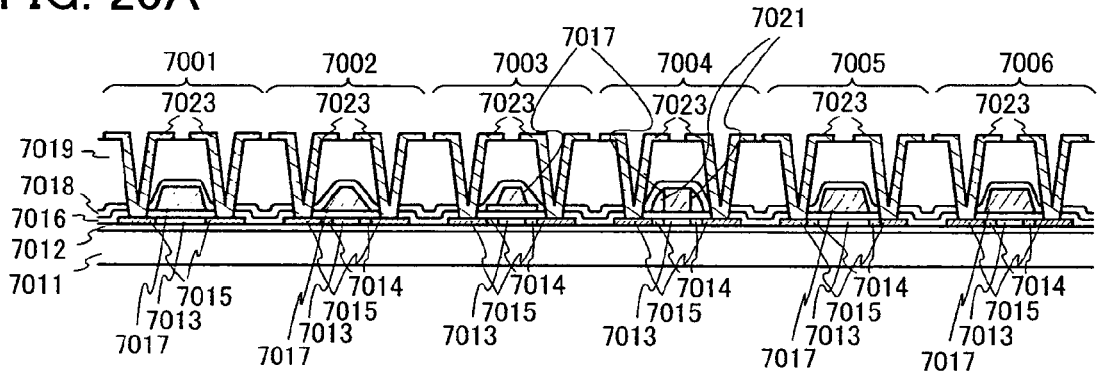
FIGS. 25A to 25G are cross-sectional views of a semiconductor device according to the present invention.
Figure 25B:
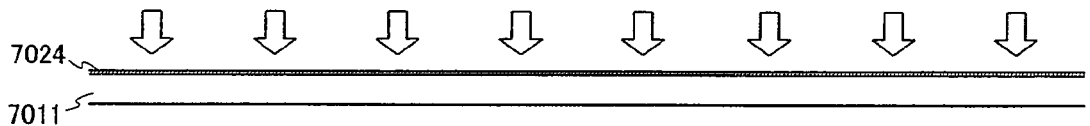
Figure 25C:
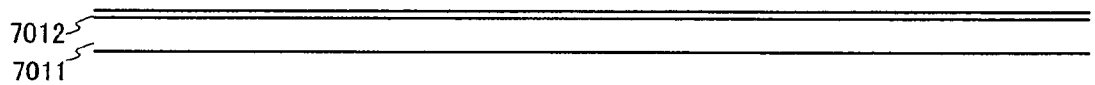
Figure 25D:
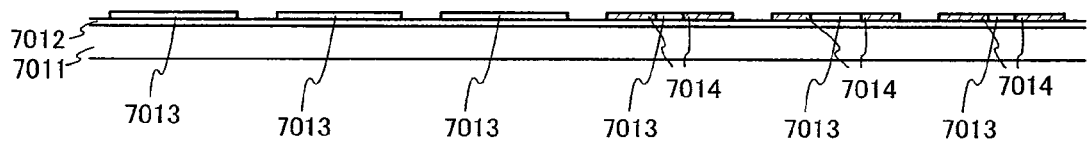
Figure 25E:
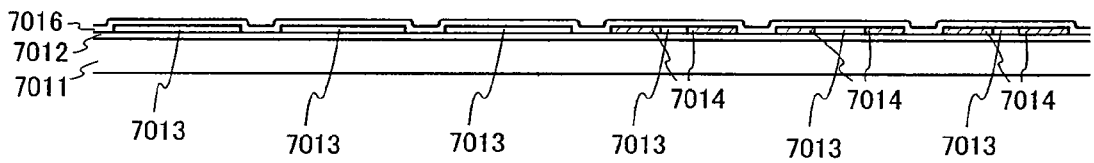
Figure 25F:
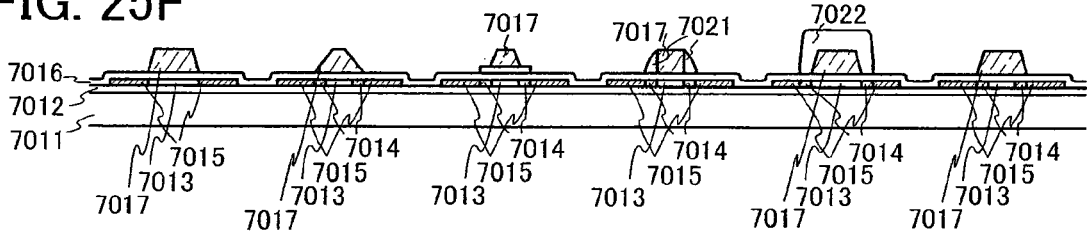
Figure 25G:
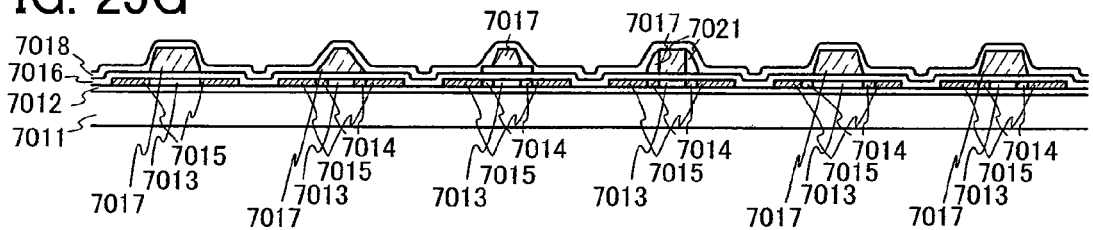

FIGS. 25A to 25G illustrate a structure of a transistor and a method for manufacturing the transistor. FIG. 25A illustrates a structural example of the transistor. FIGS. 25B to 25G exemplify the manufacturing method of the transistor.

The structure and the manufacturing method of a transistor are not limited to those illustrated in FIGS. 25A to 25G, and various structures and manufacturing methods can be employed.

A structural example of a transistor is described with reference to FIG. 25A. FIG. 25A is a cross-sectional view of plural transistors having different structures. In FIG. 25A, the plural transistors having different structures are arranged to be apposed; however, this arrangement is made for describing the structures of the transistors, and it is unnecessary to dispose the transistors actually as shown in FIG. 25A, and the transistors can be disposed as necessary.

Then, layers constituting a transistor are each described.

A substrate 7011 can be a glass substrate such as a barium borosilicate glass, an alumino borosilicate glass, a quartz substrate, a ceramic substrate or a metal substrate including stainless steel, for example. Besides these, a substrate formed of a synthetic resin having flexibility such as acrylic or plastic represented by polyethylene terephthalate (PET), polyethylene naphthalate (PEN), and polyethersulfone (PES) can be also used. By using such a flexible substrate, a bendable semiconductor device can be manufactured. A flexible substrate has no restrictions on an area and a shape of a substrate to be used, and thus, as the substrate 7011, for example, a rectangular substrate with a side of one meter or more is used, the productivity can be significantly improved. This merit is greatly advantageous as compared to the case of using a circular silicon substrate.

An insulating film 7012 serves as a base film. The insulating film 7012 is provided to prevent alkali metal such as Na or alkaline earth metal from the substrate 7011 from adversely affecting characteristics of a semiconductor element. The insulating film 7012 can have a single-layer structure or a stacked-layer structure of an insulating film(s) containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y). For example, when the insulating film 7012 is provided to have a two-layer structure, it is preferable that a silicon nitride oxide film be used as a first insulating film and a silicon oxynitride film be used as a second insulating film. When the insulating film 7012 is provided to have a three-layer structure, it is preferable that a silicon oxynitride film be used as a first insulating film, a silicon nitride oxide film be used as a second insulating film, and a silicon oxynitride film be used as a third insulating film.

Semiconductor layers 7013, 7014, and 7015 can be formed using an amorphous semiconductor, or a semi-amorphous semiconductor (SAS). Alternatively, a polycrystalline semiconductor film may be used. SAS is a semiconductor having an intermediate structure between amorphous and crystalline (including single crystal and polycrystalline) structures and having a third state which is stable in free energy. Moreover, SAS includes a crystalline region with a short range order and lattice distortion. A crystalline region of 0.5 to 20 nm can be observed at least in part of a SAS film. When silicon is contained as a main component, Raman spectrum shifts to a wave number side lower than 520 $cm^{-1}$. The diffraction peaks of (111) and (220) which are thought to be derived from a silicon crystalline lattice are observed by X-ray diffraction. SAS contains hydrogen or halogen of at least 1 atomic % or more to terminate dangling bonds. SAS is formed by glow discharge decomposition (plasma CVD) of a material gas. When silicon is contained as a main component, as the material gas, $Si_2H_6$, $SiH_2Cl_2$, $SiHCl_3$, $SiCl_4$, $SiF_4$, or the like can be used in addition to $SiH_4$. Further, $GeF_4$ may be mixed. Alternatively, the material gas may be diluted with $H_2$, or $H_2$ and one or more kinds of rare gas elements selected from He, Ar, Kr, and Ne. A dilution ratio may be in the range of 2 to 1000 times, pressure may be in the range of approximately 0.1 to 133 Pa, a power supply frequency may be 1 to 120 MHz and preferably 13 to 60 MHz, and a substrate heating temperature may be 300° C. or lower. A concentration of impurities in atmospheric components such as oxygen, nitrogen, and carbon is preferably $1 \times 10^{20}$ $cm^{-3}$ or less as impurity elements in the film. In particular, an oxygen concentration is $5 \times 10^{19}$/$cm^3$ or less, and preferably $1 \times 10^{19}$/$cm^3$ or less. Here, an amorphous semiconductor film is formed using a material containing silicon (Si) as its main component (e.g., $Si_xGe_{1-x}$) by a known method (such as a sputtering method, an LPCVD method, or a plasma CVD method). Then, the amorphous semiconductor film is crystallized by a known crystallization method such as a laser crystallization method, a thermal crystallization method using RTA or an annealing furnace, or a thermal crystallization method using a metal element which promotes crystallization.

An insulating film 7016 can have a single-layer structure or a stacked-layer structure of an insulating film(s) containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y).

A gate electrode 7017 can have a single-layer structure of a conductive film or a stacked-layer structure of two or three conductive films. As a material for the gate electrode 7017, a conductive film can be used. For example, a film of an element such as tantalum (Ta), titanium (Ti), molybdenum (Mo), tungsten (W), chromium (Cr), silicon (Si), or the like; a nitride film containing the element (typically, a tantalum nitride film, a tungsten nitride film, or a titanium nitride film); an alloy film in which the elements are combined (typically, a Mo—W alloy or a Mo—Ta alloy); a silicide film containing the element (typically, a tungsten silicide film or a titanium silicide film); and the like can be used. Note that the aforementioned film such as nitride film, alloy film, silicide film can have a single-layer structure or a stacked-layer structure.

An insulating film 7018 can have a single-layer structure or a stacked-layer structure of an insulating film containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y); or a film containing carbon, such as a DLC (Diamond Like Carbon), by a sputtering method, a plasma CVD method, and the like.

An insulating film 7019 can have a single-layer structure or a stacked-layer structure of a siloxane resin; an insulating film containing oxygen or nitrogen, such as silicon oxide ($SiO_x$), silicon nitride ($SiN_x$), silicon oxynitride ($SiO_xN_y$, x>y), or silicon nitride oxide ($SiN_xO_y$, x>y); or a film containing carbon, such as a DLC (Diamond-Like Carbon); an organic material such as epoxy, polyimide, polyamide, polyvinyl phenol, benzocyclobutene, or acrylic. Note that the siloxane resin corresponds to a resin having Si—O—Si bonds. Siloxane includes a skeleton structure of a bond of silicon (Si) and oxygen (O). As a substituent, an organic group containing at least hydrogen (such as an alkyl group or an aryl group) is used. Alternatively, a fluoro group, or a fluoro group and an organic group containing at least hydrogen can be used as a substituent. Note that the insulating film 7019 can be provided to cover the gate electrode 7017 directly without provision of the insulating film 7018.

As a conductive film 7023, a film of an element such as Al, Ni, C, W, Mo, Ti, Pt, Cu, Ta, Au, Mn, or the like, a nitride film containing the element, an alloy film in which the elements are combined, a silicide film containing the element, or the like can be used. For example, as an alloy containing some of such elements, an Al alloy containing C and Ti, an Al alloy containing Ni, an Al alloy containing C and Ni, an Al alloy containing C and Mn, or the like can be used. In the case of a stacked-layer structure, for example, a structure can be such that Al is interposed between Mo, Ti, or the like; thus, resistance of Al to heat or chemical reaction can be improved.

Next, characteristics of each structure is described with reference to the cross-sectional view of the plurality of transistors each having a different structure in FIG. 25A.

A transistor 7001 denotes a single drain transistor. Since it can be formed by a simple method, it is advantageous in low manufacturing cost and high yield. Note the taper angel is equal to or larger than 45° to smaller than 95°, more preferably, equal to or larger than 60° to smaller than 95°. Alternatively, the taper angle may be smaller than 45°. Here, the semiconductor layers 7013 and 7015 each have different concentration of impurities, and the semiconductor layer 7013 is used as a channel region and the semiconductor layers 7015 are used as a source region and a drain region. By controlling the amount of impurities in this manner, resistivity of the semiconductor layer can be controlled. Further, an electrical connection state between the semiconductor layer and the conductive film 7023 can be closer to ohmic contact. Note that as a method of separately forming the semiconductor layers each including different amount of impurities, a method where impurities are added to the semiconductor layer using the gate electrode 7017 as a mask can be used.

A transistor 7002 denotes a transistor in which the gate electrode 7017 has a certain tapered angle or more. Since it can be formed by a simple method, it is advantageous in low manufacturing cost and high yield. Here, the semiconductor layers 7013, 7014, and 7015 each have different concentration of impurities. The semiconductor layer 7013 is used as a channel region, the semiconductor layers 7014 as lightly doped drain (LDD) regions, and the semiconductor layers 7015 as a source region and a drain region. By controlling the amount of impurities in this manner, resistivity of the semiconductor layer can be controlled. Further, an electrical connection state between the semiconductor layer and the conductive film 7023 can be closer to ohmic contact. Moreover, since the transistor includes the LDD region, high electric field is hardly applied in the transistor, so that deterioration of the element due to hot carriers can be suppressed. Note that as a method of separately forming the semiconductor layers each including different amount of impurities, a method where impurities are added to the semiconductor layer using the gate electrode 7017 as a mask can be used. In the transistor 7002, since the gate electrode 7017 has a certain tapered angle or more, gradient of the concentration of impurities added to the semiconductor layer through the gate electrode 7017 can be provided, and the LDD region can be easily formed. Note the taper angel is equal to or larger than 45° to smaller than 95°, more preferably, equal to or larger than 60° to smaller than 95°. Alternatively, the taper angle may be smaller than 45°.

A transistor 7003 denotes a transistor in which the gate electrode 7017 includes at least two layers and a lower gate electrode is longer than an upper gate electrode. In this specification, the shape of the upper gate electrode and the lower gate electrode is referred to as a hat shape. When the gate electrode 7017 has such a hat shape, an LDD region can be formed without addition of a photomask. Note that a structure where the LDD region overlaps with the gate electrode 7017, like the transistor 7003, is particularly called a GOLD (Gate Overlapped LDD) structure. As a method of forming the gate electrode 7017 with such a hat shape, the following method may be used.

First, when the gate electrode 7017 is patterned, the lower and upper gate electrodes are etched by dry etching so that side surfaces thereof are inclined (tapered). Then, the inclination of the upper gate electrode is processed to be almost perpendicular by anisotropic etching. Thus, the gate electrode is formed such that the cross section is hat-shaped. Then, doping of impurity elements is conducted twice, so that the semiconductor layer 7013 used as a channel region, the semiconductor layers 7014 used as LDD regions, and the semiconductor layers 7015 used as a source region and a drain region are formed.

Note that a portion of the LDD region, which overlaps with the gate electrode 7017, is referred to as an Lov region, and a portion of the LDD region, which does not overlap with the gate electrode 7017, is referred to as an Loff region. The Loff region is highly effective in suppressing an off-current value, whereas it is not very effective in preventing deterioration in an on-current value due to hot carriers by relieving an electric field in the vicinity of the drain. On the other hand, the Lov region is highly effective in preventing deterioration in the on-current value by relieving the electric field in the vicinity of the drain, whereas it is not very effective in suppressing the off-current value. Thus, it is preferable to form a transistor having a structure corresponding to characteristics required for each of the various circuits. For example, when the semiconductor device is used for a display device, a transistor having an Loff region is preferably used as a pixel transistor in order to suppress the off-current value. On the other hand, as a transistor in a peripheral circuit, a transistor having an Lov region is preferably used in order to prevent deterioration in the on-current value by relieving the electric field in the vicinity of the drain.

A transistor 7004 denotes a transistor including a sidewall 7021 in contact with a side surface of the gate electrode 7017. When the transistor includes the sidewall 7021, a region overlapping with the sidewall 7021 can be formed as an LDD region.

A transistor 7005 denotes a transistor in which an LDD (Loff) region is formed by doping the semiconductor layer with an impurity element, using a mask 7022. Thus, the LDD region can surely be formed, and an off-current value of the transistor can be reduced.

A transistor 7006 denotes a transistor in which an LDD (Lov) region is formed by doping in the semiconductor layer with use of a mask. Thus, the LDD region can surely be formed, and deterioration in an on-current value can be prevented by relieving the electric field in the vicinity of the drain of the transistor.

Next, an example of a manufacturing process of a transistor is described with reference to FIGS. 25B to 25G Note that a structure and a manufacturing process of a transistor are not limited to those in FIGS. 25A to 25G, and various structures and manufacturing processes can be used.

In this embodiment mode, a surface of the substrate 7011, the insulating film 7012, the semiconductor layer 7013, the semiconductor layer 7014, the semiconductor layer 7015, the insulating film 7016, the insulating film 7018, and/or the insulating film 7019 is/are oxidized or nitrided by plasma treatment, so that the semiconductor layer or the insulating film can be oxidized or nitrided. By oxidizing or nitriding the semiconductor layer or the insulating film by plasma treatment in such a manner, a surface of the semiconductor layer or the insulating film is modified, and the insulating film can be formed to be denser than an insulating film formed by a CVD method or a sputtering method; thus, a defect such as a pinhole can be suppressed, and characteristics and the like of the semiconductor device can be improved. An insulating film 7024 which is subjected to the plasma treatment is referred to as a plasma-treated insulating film.

Note that silicon oxide ($SiO_x$) or silicon nitride ($SiN_x$) can be used for the sidewall 7021. As a method of forming the sidewall 7021 on the side surface of the gate electrode 7017, a method in which the gate electrode 7017 is formed, then, a silicon oxide ($SiO_x$) film or a silicon nitride ($SiN_x$) film is formed, and then, the silicon oxide ($SiO_x$) film or the silicon nitride ($SiN_x$) film is etched by anisotropic etching can be used, for example. Thus, the silicon oxide ($SiO_x$) film or the silicon nitride ($SiN_x$) film remains only on the side surface of the gate electrode 7017, so that the sidewall 7021 can be formed on the side surface of the gate electrode 7017.

Figure 29:
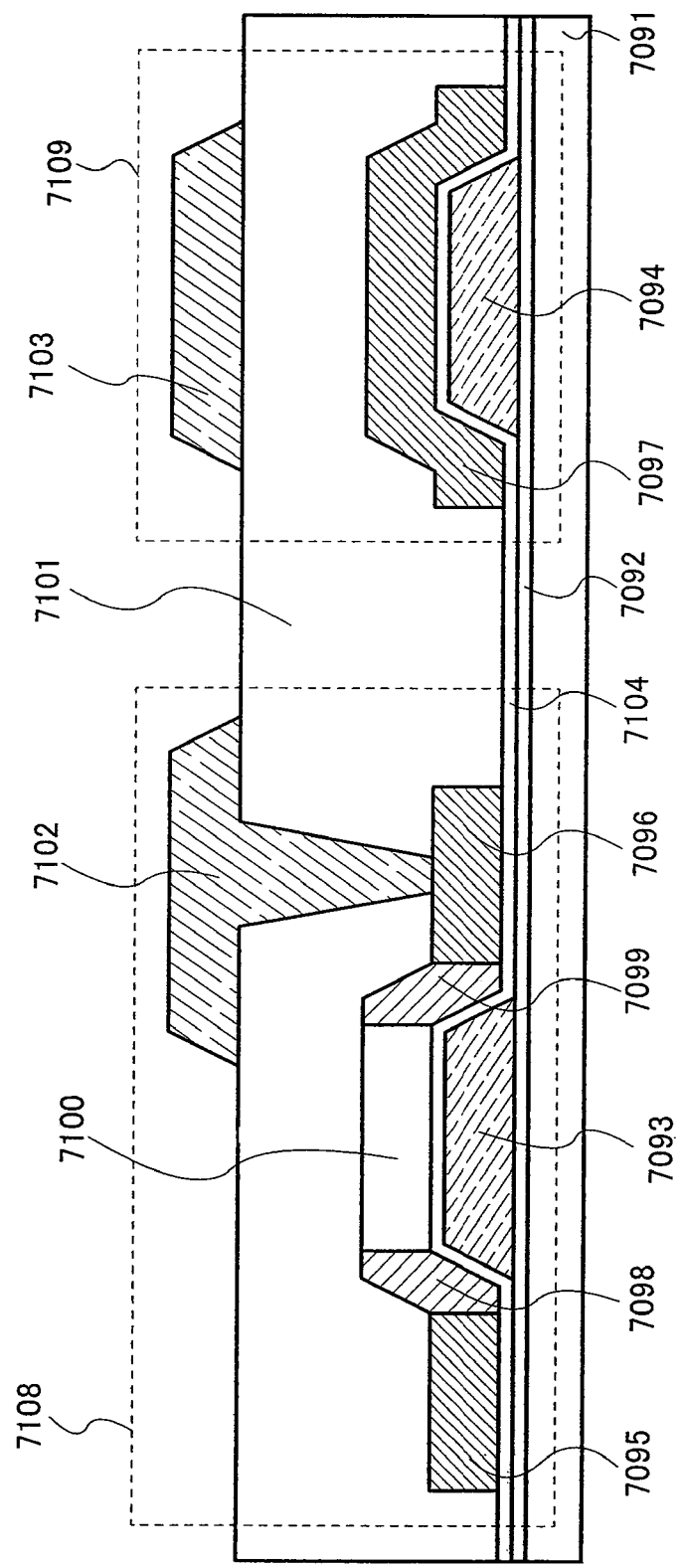
FIG. 29 is a cross-sectional view of a semiconductor device according to the present invention.

FIG. 29 illustrates cross-sectional structures of a bottom gate transistor and a capacitor.

A first insulating film (an insulating film 7092) is formed entirely over a substrate 7091. However, the first insulating film (an insulating film 7092) may not be formed in some cases without being limited to this structure. The first insulating film can prevent impurities from the substrate from adversely affecting a semiconductor layer and changing a property of a transistor. In other words, the first insulating film serves as a base film. Therefore, a highly reliable transistor can be manufactured. As the first insulating film, a single layer or a stacked layer of a silicon oxide film, a silicon nitride film and/or a silicon oxynitride film ($SiO_xN_y$) can be used.

A first conductive layer (a conductive layer 7093 and a conductive layer 7094) is formed over the first insulating film. The conductive layer 7093 includes a portion of a gate electrode of the transistor 7108. The conductive layer 7094 includes a portion of a first electrode of a capacitor 7109. As the first conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

A second insulating film (insulating film 7104) is formed to cover at least the first conductive layer. The second insulating film serves also as a gate insulating film. As the second insulating film, a single layer or a stacked layer of a silicon oxide film, a silicon nitride film and/or a silicon oxynitride film ($SiO_xN_y$) can be used.

As the second insulating film which is in contact with the semiconductor layer, a silicon oxide film is preferably used. This is because the trap levels at the interface between the semiconductor layer and the second insulating film can be reduced.

When the second insulating film is in contact with Mo, a silicon oxide film is preferably used as the second insulating film in contact with Mo. This is because the silicon oxide film does not oxidize Mo.

A semiconductor layer is formed in a portion over the second insulating film which overlaps with the first conductive layer by a photolithography method, an inkjet method, a printing method or the like. A portion of the semiconductor layer extends to a portion in which the second insulating film and the first conductive layer are not overlapped and which is over the second insulating film. The semiconductor layer includes a channel region (channel region 7100), an LDD region (an LDD region 7098, an LDD region 7099), and an impurity region (an impurity region 7095, an impurity region 7096, an impurity region 7097). The channel region 7100 serves as a channel region of the transistor 7108. The LDD regions 7098 and 7099 serve as LDD regions of the transistor 7108. Note that the LDD regions 7098 and 7099 are not necessarily formed. The impurity region 7095 includes a portion which acts as one of a source electrode and a drain electrode of the transistor 7108. The impurity region 7096 includes a portion which acts as the other one of a source electrode and a drain electrode of the transistor 7108. The impurity region 7097 includes a portion which acts as a second electrode of the capacitor 7109.

A third insulating film (insulating film 7101) is formed entirely. A contact hole is selectively formed in part of the third insulating film. The insulating film 7101 has a function of an interlayer insulating film. As the third insulating film, an inorganic material (e.g., silicon oxide ($SiO_x$), silicon nitride, or silicon oxynitride), an organic compound material having a low dielectric constant (e.g., a photosensitive or nonphotosensitive organic resin material), or the like can be used. Alternatively, a material including siloxane may be used. Siloxane is a material in which a skeleton structure is formed by a bond of silicon (Si) and oxygen (O). As a substituent, an organic group including at least hydrogen (e.g., an alkyl group or an aryl group) is used. As the substituent, a fluoro group can also be used. Alternatively, the organic group including at least hydrogen and the fluoro group may be used as the substituent.

A second conductive layer (a conductive layer 7102 and a conductive layer 7103) is formed over the third insulating film. The conductive layer 7102 is connected to the other of the source electrode and the drain electrode of the transistor 7108 through the contact hole formed in the third insulating film. Therefore, the conductive layer 7102 includes a portion which acts as the other one of the source electrode and the drain electrode of the transistor 7108. When the conductive layer 7103 is electrically connected to the conductive layer 7094, the conductive layer 7103 includes a portion which acts as a first electrode of the capacitor 7109. Alternatively, when the conductive layer 7103 is electrically connected to the conductive layer 7097, the conductive layer 7103 includes a portion which acts as a second electrode of the capacitor 7109. Alternatively, when the conductive layer 7103 is not connected to the conductive layers 7094 and 7097, another capacitor is formed other than the capacitor 7109. In this capacitor, the conductive layer 7103, the conductive layer 7097 and the insulating layer 7101 are used as a first electrode, a second electrode and an insulating layer respectively. Note that as the second conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

In steps after forming the second conductive layer, various insulating films or various conductive films may be formed.

Next, structure of a transistor using amorphous silicon (a-Si:H) or microcrystal silicon as a semiconductor layer of the transistor and a capacitor are described.

Figure 26:
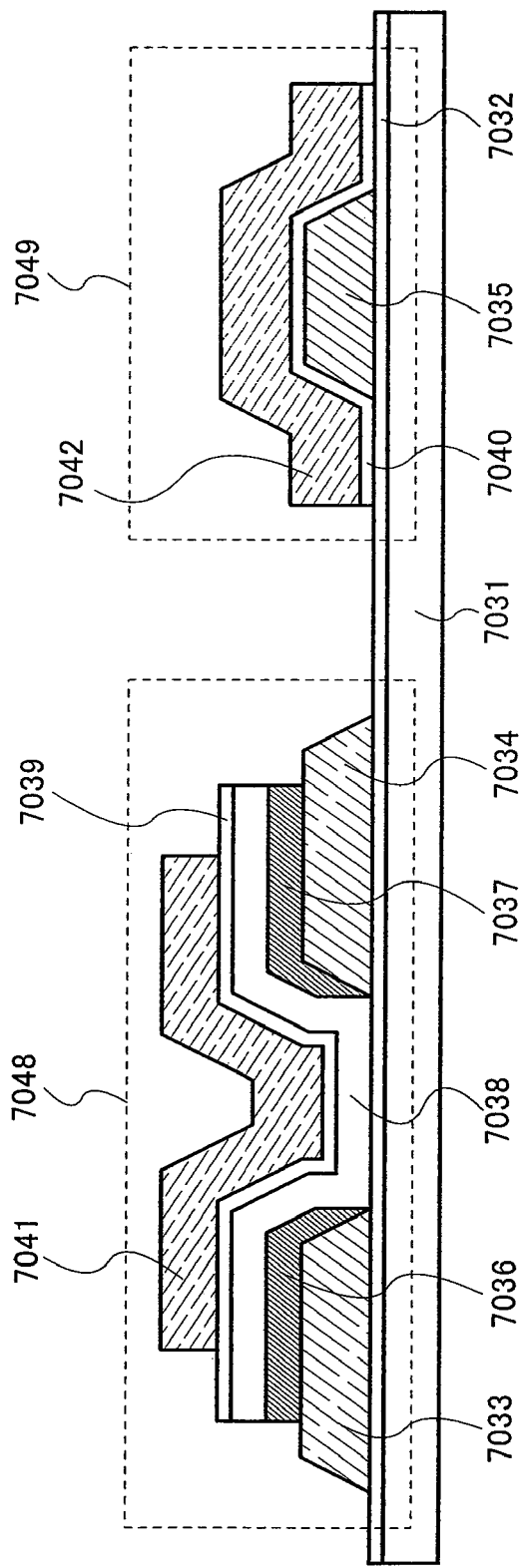
FIG. 26 is a cross-sectional view of a semiconductor device according to the present invention.

FIG. 26 illustrates cross-sectional structures of a top gate transistor and a capacitor.

A first insulating film (insulating film 7032) is formed entirely over a substrate 7031. The first insulating film can prevent impurities from the substrate from adversely affecting a semiconductor layer and changing a property of a transistor. In other words, the first insulating film serves as a base film. Therefore, a highly reliable transistor can be manufactured. As the first insulating film, a single layer or a stacked layer of a silicon oxide film, a silicon nitride film and/or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, the yield can be increased.

A first conductive layer (a conductive layer 7033, a conductive layer 7034 and a conductive layer 7035) is formed over the first insulating film. The conductive layer 7033 includes a portion which acts as one of a source electrode and a drain electrode of the transistor 7048. The conductive layer 7034 includes a portion which acts as the other one of a source electrode and a drain electrode of the transistor 7048. The conductive layer 7035 includes a portion of a first electrode of a capacitor 7049. As the first conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

Over the conductive layer 7033 and the conductive layer 7034, a first semiconductive layer (a semiconductor layer 7036 and a semiconductor layer 7037) is formed. The semiconductor layer 7036 includes a portion which acts as one of a source electrode and a drain electrode. The semiconductor layer 7037 includes a portion which acts as the other one of the source electrode and the drain electrode. As the first semiconductor layer, silicon including phosphorus or the like can be used.

A second semiconductor layer (a semiconductor layer 7038) is formed in a portion which is between the conductive layer 7033 and the conductive layer 7034 and over the first insulating film. A part of the semiconductor layer 7038 extends to a portion over the conductive layer 7033 and the conductive layer 7034. The semiconductor layer 7038 includes a portion which acts as a channel region of the transistor 7048. As the second semiconductor layer, a semiconductor layer having non-crystallinity such as amorphous silicon (a-Si:H), or a semiconductor layer such as microcrystal (μ-Si:H) can be used.

A second insulating film (an insulating film 7039 and an insulating film 7040) is formed to cover at least the semiconductor layer 7038 and the conductive layer 7035. The second insulating film serves as a gate insulating film. As the second insulating film, a single layer or a stacked layer of a silicon oxide film, a silicon nitride film and/or a silicon oxynitride film ($SiO_xN_y$) can be used.

As the second insulating film which is in contact with the second semiconductor layer, a silicon oxide film is preferably used. This is because the trap levels at the interface between the second semiconductor layer and the second insulating film can be reduced.

When the second insulating film is in contact with Mo, a silicon oxide film is preferably used as the second insulating film in contact with Mo. This is because the silicon oxide film does not oxidize Mo.

A second conductive layer (a conductive layer 7041 and a conductive layer 7042) is formed over the second insulating film. The conductive layer 7041 includes a portion which acts as a gate electrode of the transistor 7048. The conductive layer 7042 serves as a second electrode or a wiring of a capacitor 7049. As the second conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

In steps after forming the second conductive layer, various insulating films or various conductive films may be formed.

Figure 27:
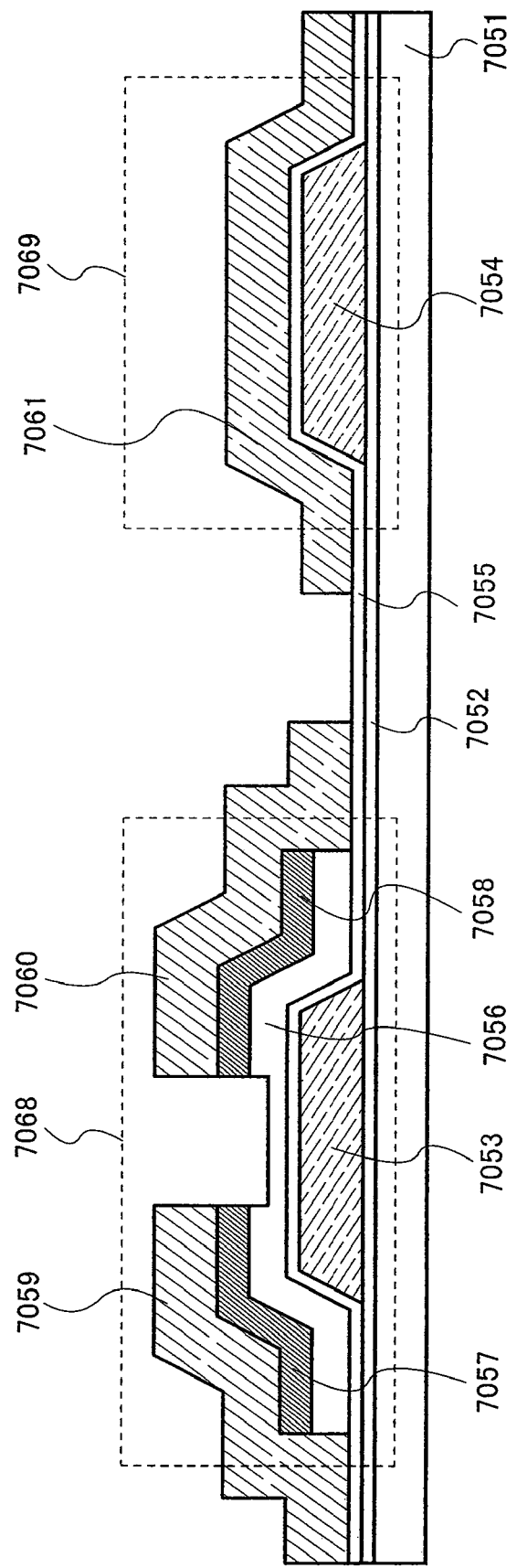
FIG. 27 is a cross-sectional view of a semiconductor device according to the present invention.

FIG. 27 illustrates cross-sectional structures of an inversely staggered (bottom gate) transistor and a capacitor. In particular, the transistor illustrated in FIG. 27 is a channel etch type transistor.

A first insulating film (an insulating film 7052) is formed entirely over a substrate 7051. The first insulating film can prevent impurities from the substrate from adversely affecting a semiconductor layer and changing a property of the transistor. In other words, the first insulating film serves as a base film. Therefore, a highly reliable transistor can be manufactured. As the first insulating film, a single layer or a stacked layer of a silicon oxide film, a silicon nitride film and/or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, the yield can be increased.

A first conductive layer (a conductive layer 7053 and a conductive layer 7054) is formed over the first insulating film. The conductive layer 7053 includes a portion which acts as a gate electrode of the transistor 7068. The conductive layer 7054 includes a portion which acts as a first electrode of a capacitor 7069. As the first conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

A second insulating film (an insulating film 7055) is formed to cover at least the first conductive layer. The second insulating film serves also as a gate insulating film. As the second insulating film, a single layer or a stacked layer of a silicon oxide film, a silicon nitride film and/or a silicon oxynitride film ($SiO_xN_y$) can be used.

As the second insulating film which is in contact with the semiconductor layer, a silicon oxide film is preferably used. This is because the trap levels at the interface between the semiconductor layer and the second insulating film can be reduced.

When the second insulating film is in contact with Mo, a silicon oxide film is preferably used as the second insulating film in contact with Mo. This is because the silicon oxide film does not oxidize Mo.

A first semiconductor layer (a semiconductive layer 7056) is formed in a portion over the second insulating film which overlaps with the first conductive layer by a photolithography method, an inkjet method, a printing method or the like. A portion of the semiconductor layer 7056 extends to a portion in which the second insulating film and the first conductive layer are not overlapped. The semiconductor layer 7056 includes a portion which acts as a channel region of the transistor 7068. As the semiconductor layer 7056, a semiconductor layer having non-crystallinity such as amorphous silicon (a-Si:H), or a semiconductor layer such as microcrystal (μ-Si:H) can be used.

In a portion over the first semiconductor layer, a second semiconductive layer (a semiconductor layer 7057 and a semiconductor layer 7058) is formed. The semiconductor layer 7057 includes a portion which acts as one of a source electrode and a drain electrode. The semiconductor layer 7058 includes a portion which acts as the other one of the source electrode and the drain electrode. As the second semiconductor layer, silicon including phosphorus or the like can be used.

A second conductive layer (a conductive layer 7059, a conductive layer 7060 and a conductive layer 7061) is formed over the second semiconductor layer and the second insulating film. The conductive layer 7059 includes a portion which acts as one of a source electrode and a drain electrode of the transistor 7068. The conductive layer 7060 includes a portion which acts as the other one of the source electrode and the drain electrode of the transistor 7068. The conductive layer 7061 includes a portion which acts as a second electrode of the capacitor 7069. Note that as the second conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

In steps after forming the second conductive layer, various insulating films or various conductive films may be formed.

A process of forming a channel etch type transistor is described as an example. The first semiconductor layer and the second semiconductor layer can be formed using the same mask. Specifically, the first semiconductor layer and the second semiconductor layer are formed sequentially. The first semiconductor layer and the second semiconductor layer are formed using the same mask.

A process of forming a channel etch type transistor is described as another example. Without using a new mask, a channel region of a transistor is formed. Specifically, after forming the second conductive layer, a part of the second semiconductor layer is removed using the second conductive layer as a mask. Alternatively, a portion of the second semiconductor layer is removed by using the same mask as the second conductive layer. The first semiconductor layer below the removed second semiconductor layer becomes a channel region of the transistor.

Figure 28:
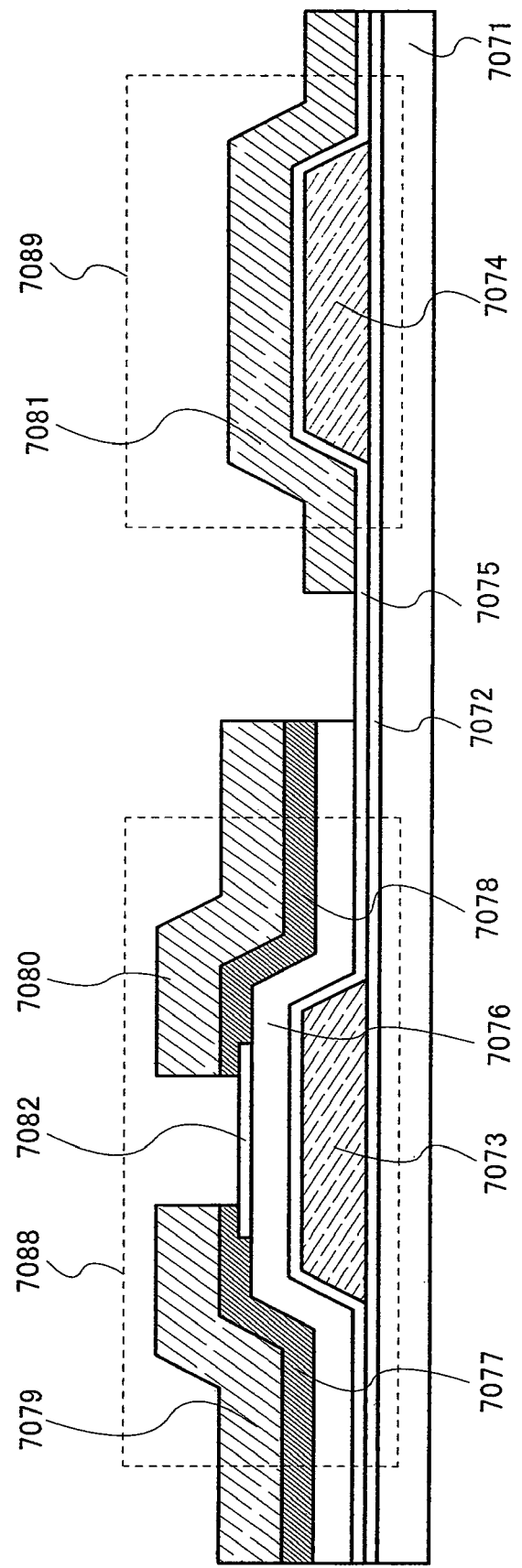
FIG. 28 is a cross-sectional view of a semiconductor device according to the present invention.

FIG. 28 illustrates cross-sectional structures of an inversely staggered (a bottom gate) transistor and a capacitor. In particular, the transistor illustrated in FIG. 28 is a channel protection (channel stop) type transistor.

A first insulating film (an insulating film 7072) is formed entirely over a substrate 7071. The first insulating film can prevent impurities from the substrate from adversely affecting a semiconductor layer and changing a property of a transistor. In other words, the first insulating film serves as a base film. Therefore, a highly reliable transistor can be manufactured. As the first insulating film, a single layer or a stacked layer of a silicon oxide film, a silicon nitride film and/or a silicon oxynitride film ($SiO_xN_y$) can be used.

The first insulating film is not necessarily formed. If the first insulating film is not formed, the number of steps can be reduced, and the manufacturing cost can be reduced. Since the structure can be simplified, the yield can be increased.

A first conductive layer (a conductive layer 7073 and a conductive layer 7074) is formed over the first insulating film. The conductive layer 7073 includes a portion which acts as a gate electrode of a transistor 7088. The conductive layer 7074 includes a portion which acts as a first electrode of a capacitor 7089. As the first conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

A second insulating film (an insulating film 7075) is formed to cover at least the first conductive layer. The second insulating film serves as a gate insulating film. As the second insulating film, a single layer or a stacked layer of a silicon oxide film, a silicon nitride film and/or a silicon oxynitride film ($SiO_xN_y$) can be used.

As the second insulating film which is in contact with the semiconductor layer, a silicon oxide film is preferably used. This is because the trap levels at the interface between the semiconductor layer and the second insulating film can be reduced.

When the second insulating film is in contact with Mo, a silicon oxide film is preferably used as the second insulating film in contact with Mo. This is because the silicon oxide film does not oxidize Mo.

A first semiconductor layer (a semiconductive layer 7076) is formed in a portion over the second insulating film which overlaps with the first conductive layer, by a photolithography method, an inkjet method, a printing method or the like. A portion of the semiconductor layer 7076 extends to a portion in which the second insulating film and the first conductive layer are not overlapped. The semiconductor layer 7076 includes a portion which acts as a channel region of the transistor 7088. As the semiconductor layer 7076, a semiconductor layer having non-crystallinity such as amorphous silicon (a-Si:H), or a semiconductor layer such as microcrystal (μ-Si:H) can be used.

A third insulating film (an insulating film 7082) is formed in a portion over the first semiconductor layer. The insulating film 7082 has a function of preventing the channel region of the transistor 7088 from being etched. In other words, the insulating film 7082 serves as a channel protection film (channel stop film). As the third insulating film, a single layer or a stacked layer of a silicon oxide film, a silicon nitride film and/or a silicon oxynitride film ($SiO_xN_y$) can be used.

In a portion over the first semiconductor layer and a portion over the third insulating film, a second semiconductive layer (a semiconductor layer 7077 and a semiconductor layer 7078) is formed. The semiconductor layer 7077 includes a portion which acts as one of a source electrode and a drain electrode. The semiconductor layer 7078 includes a portion which acts as the other one of the source electrode and the drain electrode. As the second semiconductor layer, silicon including phosphorus or the like can be used.

A second conductive layer (a conductive layer 7079, a conductive layer 7080 and a conductive layer 7081) is formed over the second semiconductor layer. The conductive layer 7079 includes a portion which acts as one of a source electrode and a drain electrode of the transistor 7088. The conductive layer 7080 includes a portion which acts as the other one of the source electrode and the drain electrode of the transistor 7088. The conductive layer 7081 includes a portion which acts as a second electrode of the capacitor 7089. Note that as the second conductive layer, Ti, Mo, Ta, Cr, W, Al, Nd, Cu, Ag, Au, Pt, Nb, Si, Zn, Fe, Ba, Ge or an alloy of these elements can be used. Further, a stacked layer including any of these (including an alloy thereof) can be used.

In steps after forming the second conductive layer, various insulating films or various conductive films may be formed.

The structures and manufacturing methods of such transistors have been described above. Such wirings, electrodes, conductive layers, conductive films, terminals, vias or plugs are formed to have one or more elements selected from the group consisting of aluminum (Al), tantalum (Ta), titanium (Ti), molybdenum (Mo), tungsten (W), neodymium (Nd), chromium (Cr), nickel (Ni), platinum (Pt), gold (Au), silver (Ag), copper (Cu), magnesium (Mg), scandium (Sc), cobalt (Co), zinc (Zn), niobium (Nb), silicon (Si), phosphorus (P), boron (B), arsenic (As), gallium (Ga), indium (In), tin (Sn), and oxygen (O); a compound or an alloy material including one or more of the elements in the group (for example, indium tin oxide (ITO), indium zinc oxide (IZO), indium tin oxide to which silicon oxide is added (ITSO), zinc oxide (ZnO), tin oxide (SnO), Cadmium tin oxide (CTO), aluminum neodymium (Al—Nd), magnesium silver (Mg—Ag), molybdenum-niobium (Mo—Nb) or the like); a substance in which these compounds are combined; or the like. Alternatively, such wirings, electrodes, conductive layers, conductive films, terminals are preferably formed to have a substance including such compounds, a compound of silicon and one or more of the elements selected from the group (silicide) (e.g., aluminum silicon, molybdenum silicon, nickel silicide); or a compound of nitrogen and one or more of the elements selected from the group (e.g., titanium nitride, tantalum nitride, molybdenum nitride).

Note that silicon (Si) may include a n-type impurity (such as phosphorus) or a p-type impurity (such as boron). The impurity contained in silicon can increase the conductivity or enables the same performance as normal conductors. Thus, such silicon can be utilized easily as wirings or electrodes.

Silicon can be any of various types of silicon such as single crystal silicon, polycrystal silicon, or microcrystal silicon. Alternatively, silicon having no crystallinity such as amorphous silicon can be used. By using single crystal silicon or polycrystal silicon, resistance of a wiring, an electrode, a conductive layer, a conductive film, or a terminal can be reduced. By using amorphous silicon or microcrystal silicon, a wiring or the like can be formed by a simple process.

In addition, aluminum or silver has high conductivity, and thus can reduce a signal delay. Since aluminum or silver can be easily etched, aluminum or silver can be easily patterned and processed minutely.

Further, copper has also high conductivity, and thus can reduce a signal delay. In using copper, a stacked structure is preferably employed to enhance adhesiveness.

Molybdenum and titanium are also preferable materials. This is because even if molybdenum or titanium is in contact with an oxide of a semiconductor (ITO, IZO or the like) or silicon, molybdenum or titanium does not cause defects. Further, molybdenum or titanium is easily etched and has high-heat resistance.

Tungsten is preferable since tungsten has high-heat resistance.

Neodymium is also preferable, since neodymium has an advantage of high heat resistance. In particular, an alloy of neodymium and aluminum is used to increase heat-resistance, thereby almost preventing hillocks of aluminum.

Moreover, silicon is preferable since silicon can be formed at the same time as a semiconductor layer included in a transistor, and has high-heat resistance.

Since ITO, IZO, ITSO, zinc oxide (ZnO), silicon (Si), tin oxide (SnO), and cadmium tin oxide (CTO) have light-transmitting properties, they can be used as a portion which light should pass through. For example, ITO, IZO, ITSO, zinc oxide (ZnO), silicon (Si), tin oxide (SnO), or cadmium tin oxide (CTO) can be used for a pixel electrode and/or a common electrode.

IZO is preferable since IZO is easily etched and processed. In etching IZO, almost no residues of IZO are left. Thus, when a pixel electrode is formed using IZO, defects (such as short-circuiting or orientation disorder) of a liquid crystal element or a light-emitting element can be reduced.

Such wirings, electrodes, conductive layers, conductive films, terminals, vias, or plugs may have a single-layer structure or a multilayer structure. By adopting a single-layer structure, a manufacturing process of such wirings, electrodes, conductive layers, conductive films, or terminals can be simplified; the number of days for a process can be reduced; and cost can be reduced. Alternatively, by employing a multilayer structure, an advantage of each material is taken and a disadvantage thereof is reduced so that a wiring or an electrode with high performance can be formed. For example, a low-resistant material (such as aluminum) is included in a multilayer structure, thereby reducing the resistance of such wirings. As another example, when a low heat-resistant material is interposed between high heat-resistant materials to form a stacked-layer structure, heat resistance of wirings or electrodes can be increased, utilizing advantages of such low heat-resistance materials. For example, a layer including aluminum is preferably interposed between layers including molybdenum, titanium, or neodymium as a stacked structure.

If wirings or electrodes are in direct contact with each other, an adverse effect is caused to each other in some cases. For example, one of a wiring and an electrode is mixed into another of the wirings or electrodes and changes the property, and thus, a desired function cannot be obtained. As another example, in forming a high-resistant portion, there is a problem in that it cannot be formed normally. In such a case, a reactive material is preferably sandwiched by or covered with a non-reactive material in a stacked structure. For example, when ITO is connected to aluminum, an alloy of titanium, molybdenum, and neodymium is preferably disposed between the ITO and the aluminum. As another example, when silicon is connected to aluminum, an alloy of titanium, molybdenum, and neodymium is preferably disposed between the silicon and the aluminum.

Note that the term "wiring" indicates a portion including a conductor. The shape of such a wiring may be linear; but not limited to, such a wiring may be short. Therefore, electrodes are included in such wirings.

Note that a carbon nanotube may be used for wirings, electrodes, conductive layers, conductive films, terminals, vias, or plugs. Since the carbon nanotube has a light-transmitting property, it can be used for a portion which light should pass thorough. For example, the carbon nanotube can be used for a pixel electrode and/or a common electrode.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 8

Embodiment Mode 8 will describe a configuration of a display device.

Figure 30A:
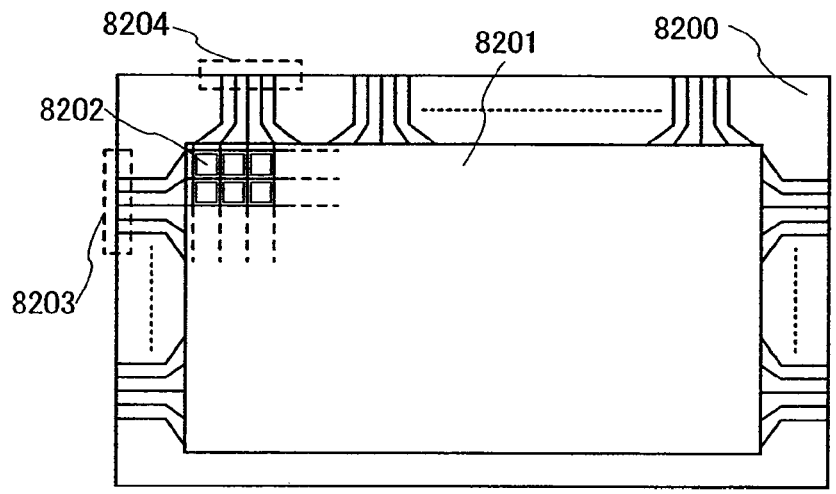
FIGS. 30A to 30C show configurations of peripheral circuits in semiconductor devices according to the present invention.

FIG. 30A illustrates a configuration of a display device. FIG. 30A is a top view of the display device.

A pixel portion 8201, a scan line side input terminal 8203 and a signal line side input terminal 8204 are formed over a substrate 8200, scan lines extend in a row direction from the scan line side input terminal 8203, and signal lines extend in a column direction from the signal line side input terminal 8204 over the substrate 8200. Pixels are disposed in matrix and each pixel 8202 is disposed at an intersection portion of the scan line and the signal line in the pixel portion 8201.

The case in which signals are input from an external driver circuit has been described above. However, the present invention is not limited to this case, and an IC chip can be mounted on a display device.

Figure 31A:
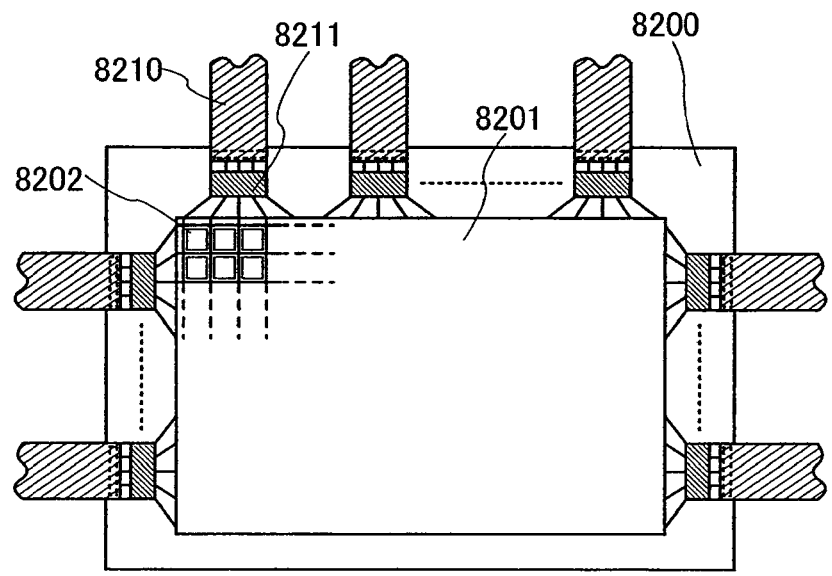
FIGS. 31A and 31B show configurations of peripheral circuits in semiconductor devices according to the present invention.

For example, as shown in FIG. 31A, an IC chip 8211 can be mounted on a substrate 8200 by a COG (chip on glass) method. In this case, inspection can be conducted before mounting the IC chip 8211 on the substrate 8200 to increase the yield of the display device. Further, the reliability can also increase. In addition, the same portions as those in FIG. 30A are denoted by the same reference numerals and the description thereof is omitted.

Figure 31B:
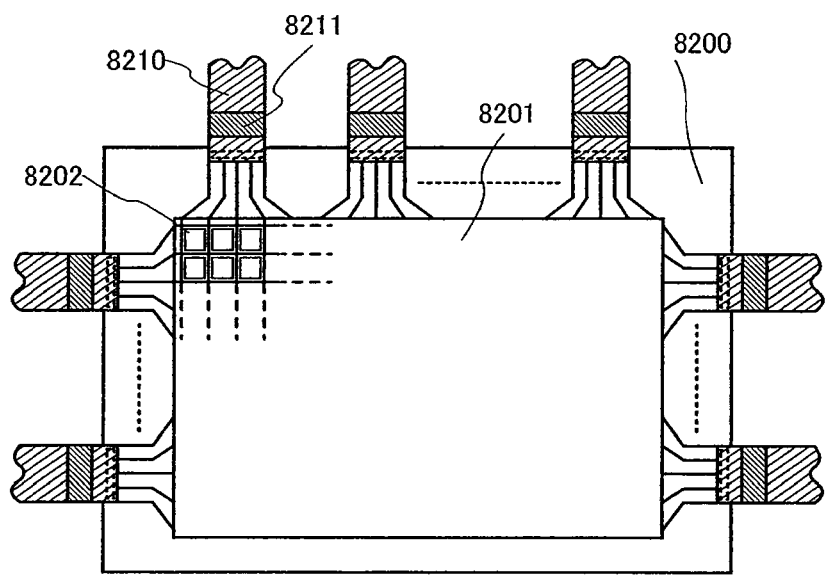

As another example, as shown in FIG. 31B, an IC chip 8211 can be mounted on an FPC 8210 (flexible printed circuit) by a TAB (tape automated bonding) method. In this case, inspection can be conducted before mounting the IC chip 8211 on the FPC 8210 to increase the yield of the display device. Further, the reliability can also increase. In addition, the same portions as those in FIG. 30A are denoted by the same reference numerals and the description thereof is omitted.

As well as the IC chip can be mounted on the substrate 8200, a driver circuit can be mounted on the substrate 8200.

Figure 30B:
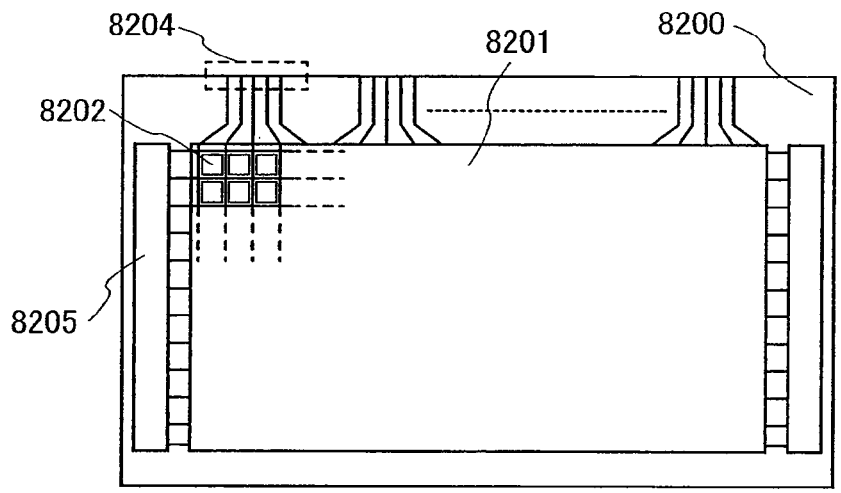

For example, as shown in FIG. 30B, a scan line driver circuit 8205 can be formed on a substrate 8200. In this case, the number of component parts can be reduced to decrease the manufacturing cost. The number of connection points between component parts can be reduced to enhance the reliability. Since the driving frequency of the scan line driver circuit 8205 is low, the scan line driver circuit 8205 can be easily formed using amorphous silicon or microcrystal silicon as a semiconductor layer of a transistor. In addition, an IC chip for outputting a signal to the signal line may be mounted on the substrate 8200 by a COG method. Alternatively, an FPC to which an IC chip for outputting a signal to a signal line is mounted by a TAB method may be disposed on the substrate 8200. In addition, an IC chip for controlling the scan line driver circuit 8205 may be mounted on the substrate 8200 by a COG method. Alternatively, an FPC to which an IC chip for controlling the scan line driver circuit 8205 is mounted by a TAB method may be disposed on the substrate 8200. In addition, the same portions as those in FIG. 30A are denoted by the same reference numerals and the description thereof is omitted.

Figure 30C:
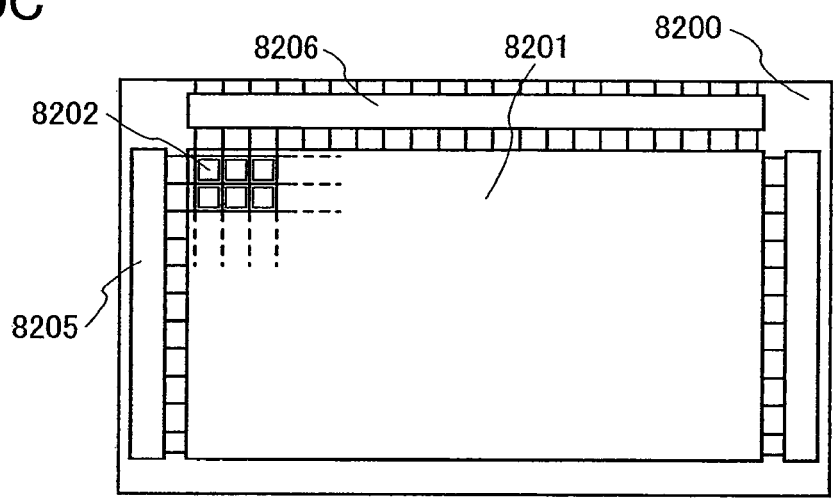

As another example, as shown in FIG. 30C, the scan line driver circuit 8205 and the signal line driver circuit 8206 are formed on the substrate 8200. Thus, the number of component parts can be reduced to decrease the manufacturing cost. The number of connection points between component parts can be reduced to enhance the reliability. In addition, an IC chip for controlling the scan line driver circuit 8205 may be mounted on the substrate 8200 by a COG method. Alternatively, an FPC to which an IC chip for controlling the scan line driver circuit 8205 is mounted by a TAB method may be disposed on the substrate 8200. An IC chip for controlling the signal line driver circuit 8206 may be mounted on the substrate 8200 by a COG method. Alternatively, an IC chip for controlling the signal line driver circuit 8206 may be mounted on the substrate 8200 by a TAB method. In addition, the same portions as those in FIG. 30A are denoted by the same reference numerals and the description thereof is omitted.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 9

Embodiment Mode 9 will describe operation of a display device.

Figure 32:
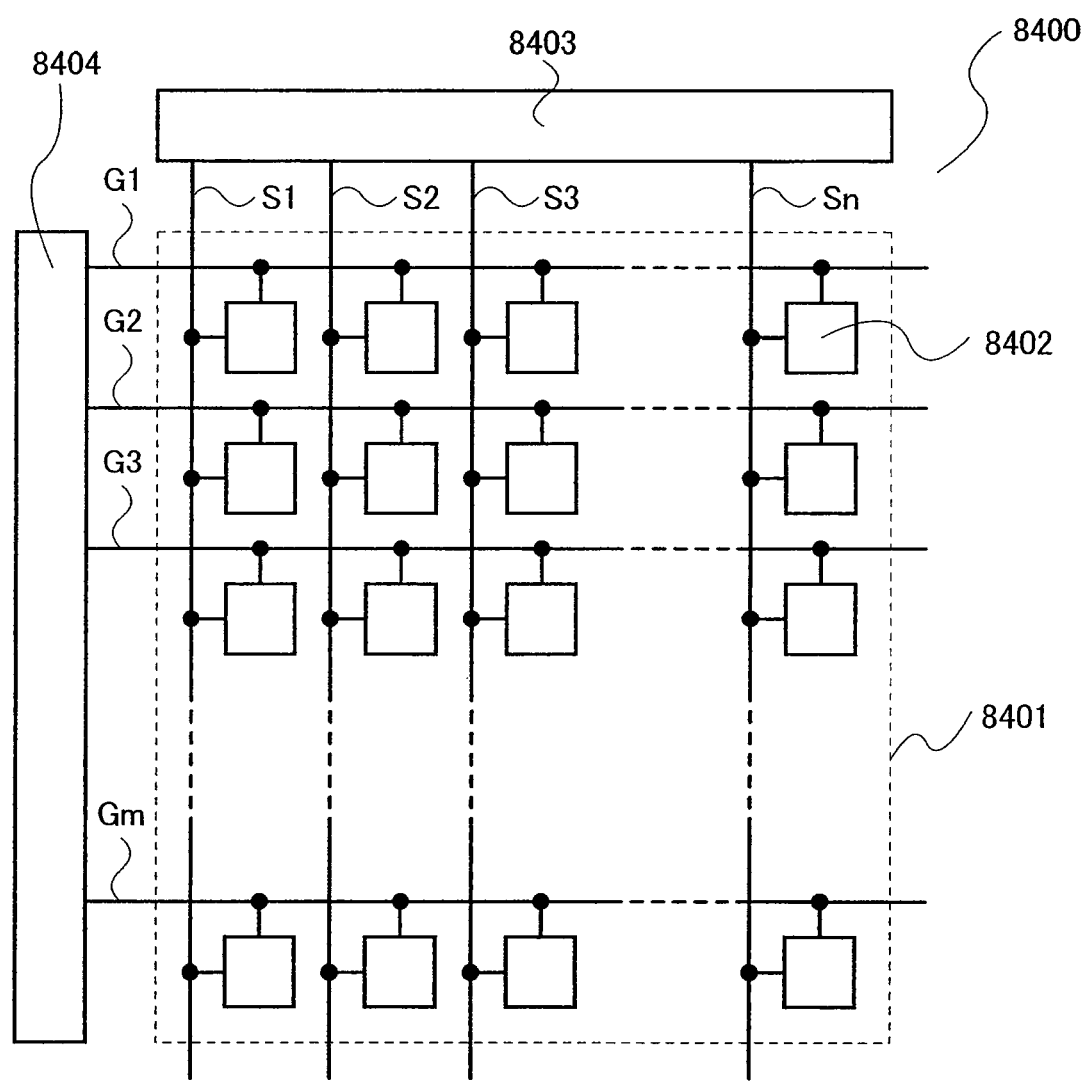
FIG. 32 illustrates a circuit configuration of a semiconductor device according to the present invention.

FIG. 32 illustrates a configuration of a display device as an example.

A display device 8400 includes a pixel portion 8401, a signal line driver circuit 8403, and a scan line driver circuit 8404. In the pixel portion 8401, a plurality of signal lines S1 to Sm extend from the signal line driver circuit 8403 in a column direction. In the pixel portion 8401, a plurality of scan lines G1 to Gn extend from the scan line driver circuit 8404 in a row direction. Pixels 8402 are disposed in matrix and each pixel is disposed at each intersection portion of the signal lines S1 to Sm and the scan lines G1 to Gn.

The signal line driver circuit 8403 has a function of outputting a signal to each of the signal lines S1 to Sn. This signal may be referred to as a video signal. Note that the scan line driver circuit 8404 has a function of outputting a signal to each of the scan lines G1 to Gm. This signal may be referred to as a scan signal.

The pixel 8402 may include at least a switching element connected to a signal line. This switching element is controlled to turn on or off by a potential of a scan line (a scan signal). When the switching element is turned on, the pixel 8402 is selected. On the other hand, when the switching element is turned off, the pixel 8402 is not selected.

When the pixel 8402 is selected (selection state), a video signal is input into the pixel 8402 from the signal line. The state of the pixel 8402 (e.g., luminance, transmittance, voltage of a storage capacitor) is changed in accordance with the input video signal.

When the pixel 8402 is not selected (non-selection state), the video signal is not input into the pixel 8402. Note that the pixel 8402 holds a potential corresponding the video signal input in the selection, and thus the pixel 8402 keeps the state (e.g., luminance, transmittance, voltage of a storage capacitor).

The configuration of the display device is not limited to that illustrated in FIG. 32. For example, an additional wiring (a scan line, a signal line, a power source line, a capacitor line or a common line) may be added in accordance with the configuration of the pixel 8402. As another example, a circuit having various functions may be added.

Figure 33:
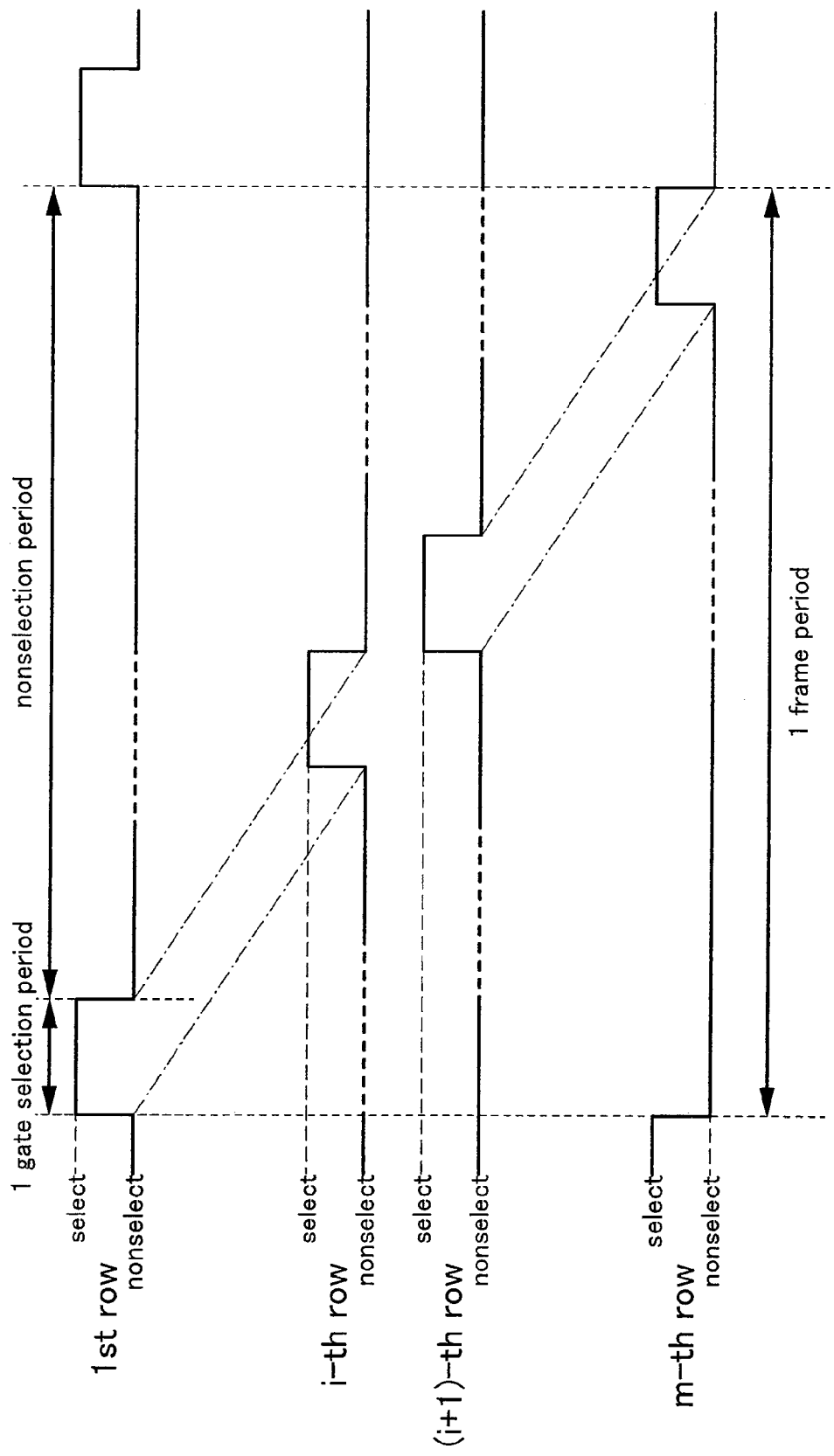
FIG. 33 is a timing chart of a semiconductor device according to the present invention.

FIG. 33 is one example of a timing chart for describing operation of a display device.

The timing chart in FIG. 33 illustrates one frame period which corresponds to a period during which an image of one screen is displayed. There is no particular limitation on one frame period, but one frame period is preferably ⅟60 second or shorter so that a man does not view flickers.

In the timing chart of FIG. 33, timing for selecting a scan line G1 at the first row, a scan line Gi (one of the scan lines G1 to Gm) at the i-th row, a scan line Gi+1 at the (i+1)-th row, and a scan line Gm at the m-th row are shown.

At the same time as a selection of a scan line, the pixel 8402 connected to the scan line is also selected. For example, when the scan line Gi at the i-th row is selected, the pixel 8402 connected to the scan line Gi at the i-th row is also selected.

The scan lines G1 to Gm are sequentially selected from the scan line G1 at the first row to the scan line Gm at the m-th row (the scan lines are scanned). For example, while the scan line Gi at the i-th row is selected, the scan lines other than the scan line Gi at the i-th row (Gi to Gi−1, Gi+1 to Gm) are not selected. During the next period, the scan line Gi+1 at the (i+1)-th row is selected. The period during which one scan line is selected is referred to as one gate selection period.

Therefore, when a scan line at a certain row is selected, plural pixels 8402 connected to the scan line each receive a video signal from the signal line G1 to the signal line Gm. For example, when the scan line Gi at the i-th row is selected, plural pixels 8402 connected to the scan line Gi at the i-th row each receive a given video signal from the signal lines S1 to Sn. In this manner, each of the plural pixels 8402 can be controlled individually by the scan signal and the video signal.

Figure 34:
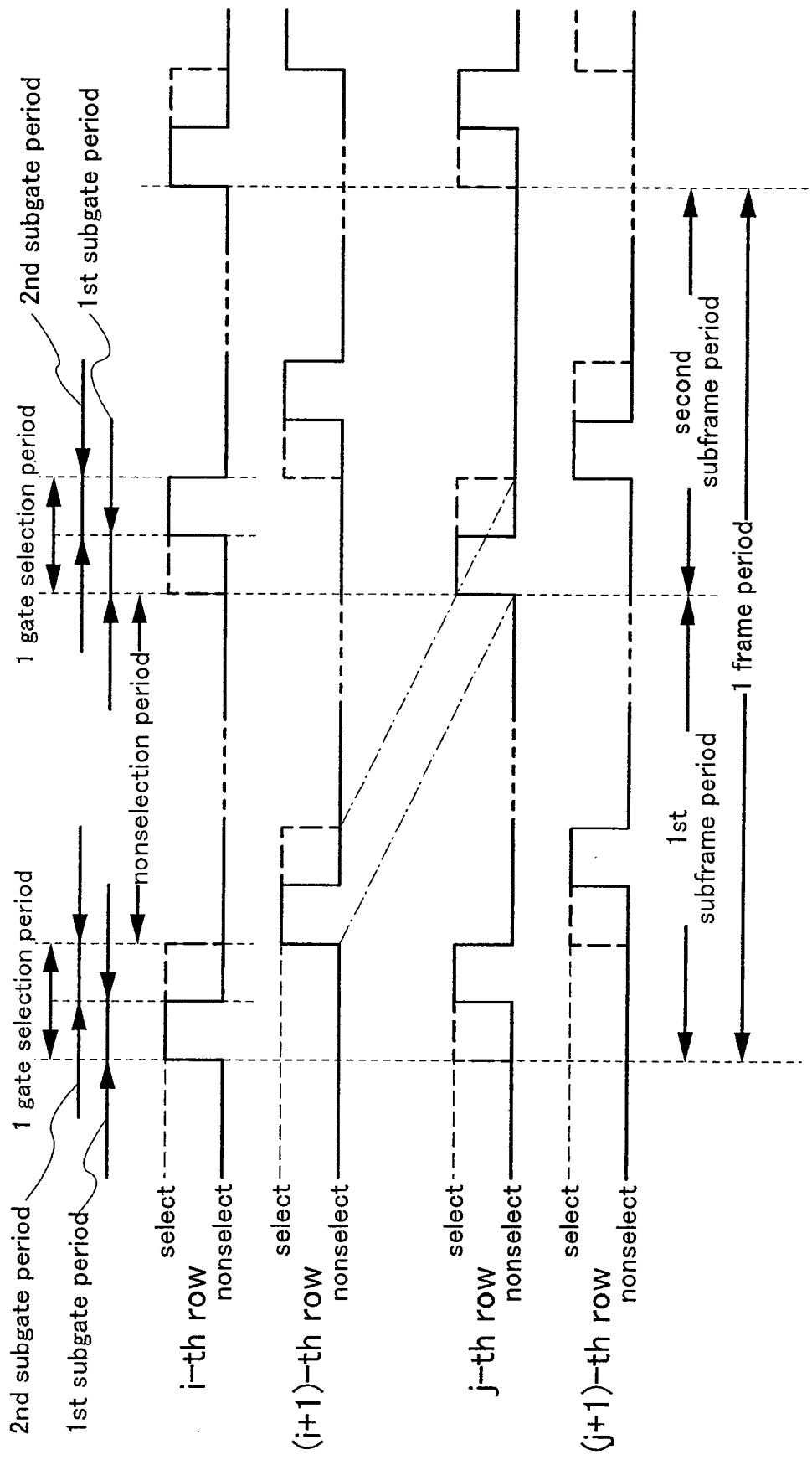
FIG. 34 is a timing chart of a semiconductor device according to the present invention.

Next, a case in which one gate selection period is divided into a plurality of sub gate selection periods is described. FIG. 34 is a timing chart in a case where one gate selection period is divided into two sub gate selection periods (a first sub gate selection period and a second sub gate selection period).

Note that one gate selection period is divided into three or more sub gate selection periods.

The timing chart of FIG. 34 illustrates one frame period corresponding to a period in which an image of one screen is displayed. There is no particular limitation on one frame period, but one frame period is preferably 1/60 second or shorter so that a man does not view flickers.

Note that one frame is divided into two subframes (a first subframe and a second subframe).

The timing chart of FIG. 34 illustrates timing for selecting the scan line Gi at the i-th row, a scan line Gi+1 at the (i+1)-th row, a scan line Gj (one of the scan lines Gi+1 to Gm) at the j-th row, and a scan line Gj+1 at the (j+1)-th row.

At the same time as the selection of the scan line, the pixel 8402 connected to the scan line is also selected. For example, when the scan line Gi at the i-th row, the pixel 8402 connected to the scan line Gi at the i-th row is also selected.

The scan lines G1 to Gm are each sequentially scanned in each subgate selection period. For example, in a certain one gate selection period, the scan line Gi at the i-th row is selected in the first subgate selection period, and the scan line Gj at the j-th row is selected in the second subgate selection period. Thus, in one gate selection period, it can be operated as if two rows of scan signals are selected. At this time, different signals are input to the signal lines S1 to Sn in the first subgate selection period and the second subgate selection period. Therefore, the plural pixels 8402 connected to the scan line Gi at the i-th row can receive a different signal from the plural pixels 8402 connected to the scan line Gj at the j-th row.

Next, a driving method for increasing image quality in displaying is described.

Figure 35A:
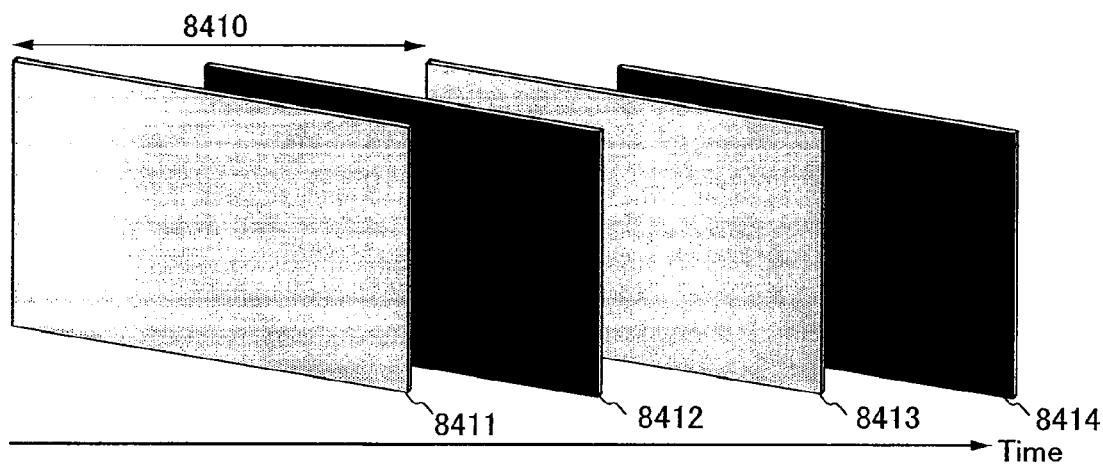
FIGS. 35A and 35B illustrate driving methods of semiconductor devices according to the present invention.
Figure 35B:
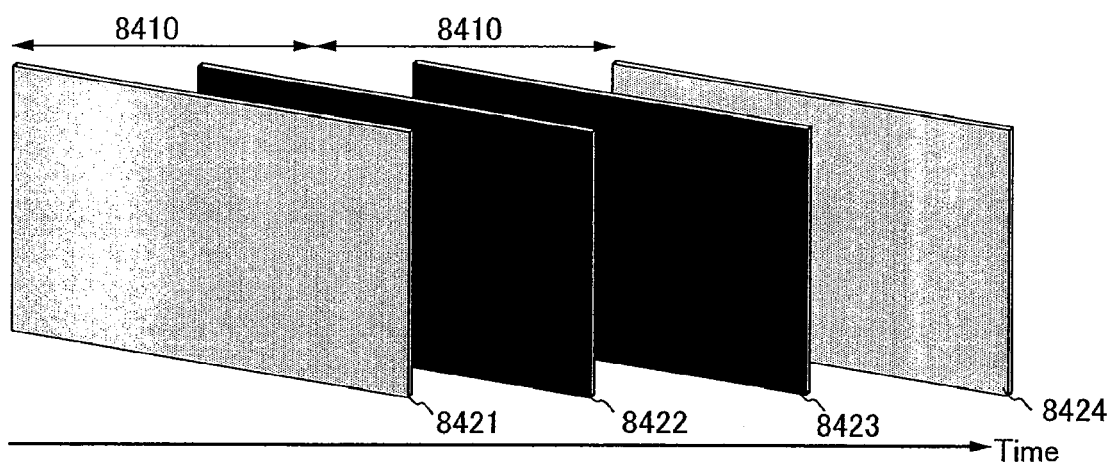

FIGS. 35A and 35B illustrate high frequency driving.

FIG. 35A illustrates a case where an interpolation image is displayed between two input images. A period 8410 is a cycle of an input video signal. An image 8411, an image 8412, an image 8413, and an image 8414 are a first input image, a first interpolation image, a second input image and a second interpolation image, respectively. The input image used here is an image formed based on a signal input from outside of a display device. Further, the interpolation image is an image which is displayed at a timing different from the input image and interpolates the input image.

The image 8412 is an image formed based on images signals of the image 8411 and the image 8413. Specifically, by a different between a position of an object included in the image 8411 and a position of an object included in the image 8413, the movement of the object is estimated, and the position of the object included in the image 8412 is regarded as an image at the intermediate state between the image 8411 and the image 8413. This process is referred to as motion interpolation. Since the image 8412 is an image formed by motion interpolation, the object at the intermediate (½) position which cannot be displayed in the input image, can be displayed, the movement of the object can be smoothed. In addition, the image 8412 can be formed by the average value of video signals of the image 8411 and the image 8413. In this manner, since the load to circuits due to the formation of the interpolation image can be reduced. Thus, power consumption can be reduced.

The image 8412 can be an image formed from the image 8411. Specifically, the brightness of the image 8411 is increased or decreased entirely or partially to form the image 8412. More specifically, the whole brightness of the image 8411 is made higher or lower by converting the gamma characteristics of the image 8411.

Note that the image 8412 may be a black image. In this manner, the quality of a moving image in a hold-type display device can be increased.

FIG. 35B illustrates a case where two interpolation images are displayed between two input images. A period 8410 is a cycle of an input video signal. An image 8421, an image 8422, an image 8423, and an image 8424 are a first input image, a first interpolation image, a second interpolation image and a second input image, respectively.

The image 8422 and the image 8423 are each an image formed based on images signals of the image 8421 and the image 8424. Specifically, the image 8422 and the image 8423 can be formed by motion interpolation using a different between a position of an object included in the image 8421 and a position of an object included in the image 8422. Since the image 8422 and the image 8423 are each an image formed by motion interpolation, the object at the intermediate positions (⅓ or ⅔) which cannot be displayed in the input image, can be displayed, the movement of the object can be smoothed. In addition, the image 8422 and the image 8423 can be formed by the average value of video signals of the image 8421 and the image 8424. In this manner, since the load to circuits due to the formation of the interpolation image can be reduced.

The image 8422 and the image 8423 can be an image formed from the image 8421. Specifically, the brightness of the image 8421 is increased or decreased entirely or partially to form the image 8422 and the image 8423. More specifically, the whole brightness of the image 8411 is made higher or lower by converting the gamma characteristics of the image 8411.

Note that the image 8422 and the image 8423 may be a black image. In this manner, the quality of a moving image in a hold-type display device can be increased.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 10

Embodiment Mode 10 will describe a peripheral portion of a liquid crystal panel.

Figure 36:
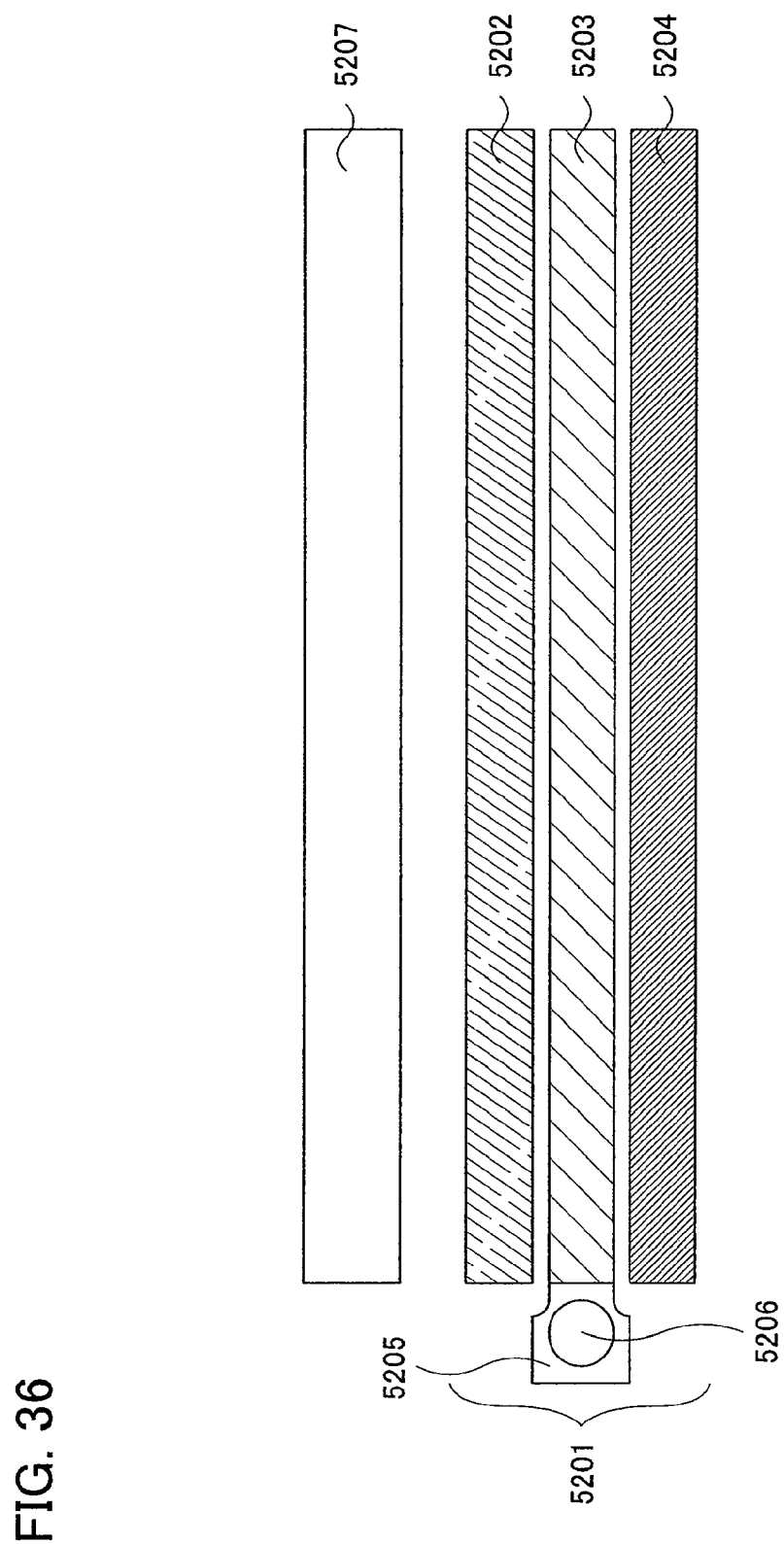
FIG. 36 is a cross-sectional view of a semiconductor device according to the present invention.

FIG. 36 illustrates an example of a liquid crystal display device including a so-called edge-light type backlight unit 5201 and a liquid crystal panel 5207. An edge-light type corresponds to a type in which a light source is provided at an end portion of a backlight unit and fluorescence of the light source is emitted from the entire light-emitting surface. The edge-light type backlight unit is thin and can save power.

The backlight unit 5201 includes a diffusion plate 5202, a light guide plate 5203, a reflection plate 5204, a lamp reflector 5205, and a light source 5206.

The light source 5206 has a function of emitting light as necessary. For example, as the light source 5206, a cold cathode tube, a hot cathode tube, a light-emitting diode, an inorganic EL element, an organic EL element, or the like can be used.

FIGS. 37A to 37D each illustrate a detailed structure of the edge-light type backlight unit. Note that description of a diffusion plate, a light guide plate, a reflection plate, and the like is omitted.

Figure 37A:
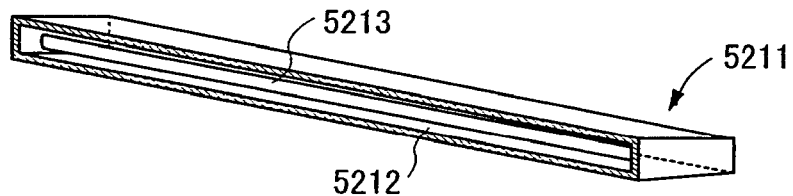
FIGS. 37A to 37D illustrate peripheral components of semiconductor devices according to the present invention.

A backlight unit 5211 shown in FIG. 37A has a structure in which a cold cathode tube 5213 is used as a light source. In addition, a lamp reflector 5212 is provided to efficiently reflect light from the cold cathode tube 5213. Such a structure is often used for a large display device because luminance from the cold cathode tube is high.

Figure 37B:
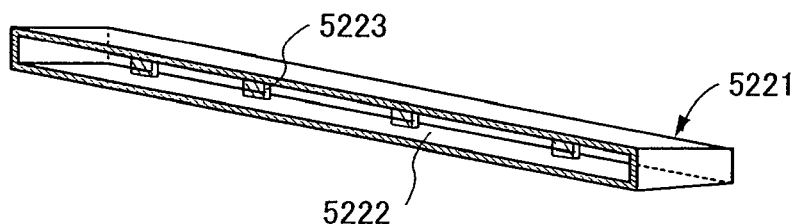

A backlight unit 5221 shown in FIG. 37B has a structure in which light-emitting diodes (LEDs) 5223 are used as light sources. For example, the light-emitting diodes (LEDs) 5223 which emit white light are provided with a predetermined interval therebetween. In addition, a lamp reflector 5222 is provided to efficiently reflect light from the light-emitting diodes (LEDs) 5223.

Figure 37C:
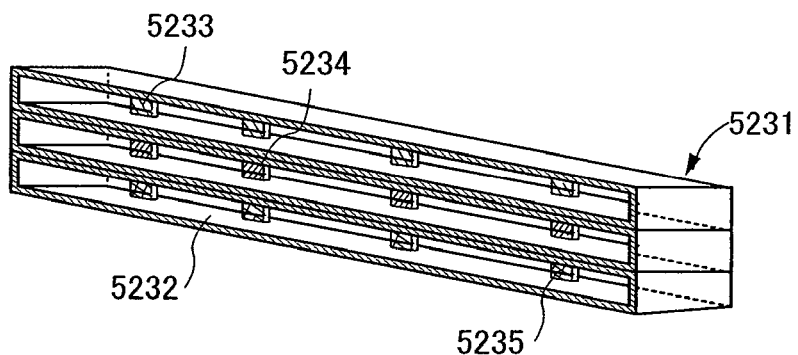

A backlight unit 5231 shown in FIG. 37C has a structure in which light-emitting diodes (LEDs) 5233, light-emitting diodes (LEDs) 5234, and light-emitting diodes (LEDs) 5235 of R, G, and B are used as light sources. The light-emitting diodes (LEDs) 5233, the light-emitting diodes (LEDs) 5234, and the light-emitting diodes (LEDs) 5235 of R, G, and B are each provided with a predetermined interval therebetween. By using the light-emitting diodes (LEDs) 5233, the light-emitting diodes (LEDs) 5234, and the light-emitting diodes (LEDs) 5235 of R, G, and B, color reproductivity can be improved. In addition, a lamp reflector 5232 is provided to efficiently reflect light from the light-emitting diodes.

Figure 37D:
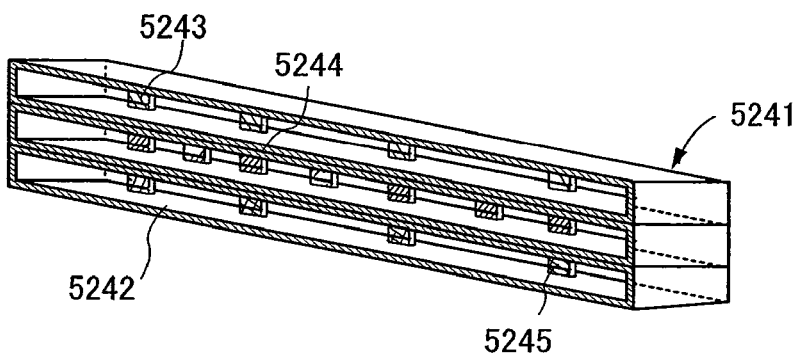

A backlight unit 5241 shown in FIG. 37D has a structure in which light-emitting diodes (LEDs) 5243, light-emitting diodes (LEDs) 5244, and light-emitting diodes (LEDs) 5245 of R, G, and B are used as light sources. For example, among the light-emitting diodes (LEDs) 5243, the light-emitting diodes (LEDs) 5244, and the light-emitting diodes (LEDs) 5245 of R, G, and B, the light-emitting diodes of a color with low emission intensity (e.g., green) are provided more than other light-emitting diodes. By using the light-emitting diodes (LEDs) 5243, the light-emitting diodes (LEDs) 5244, and the light-emitting diodes (LEDs) 5245 of R, G, and B, color reproductivity can be improved. In addition, a lamp reflector 5242 is provided to efficiently reflect light from the light-emitting diodes.

Figure 40:
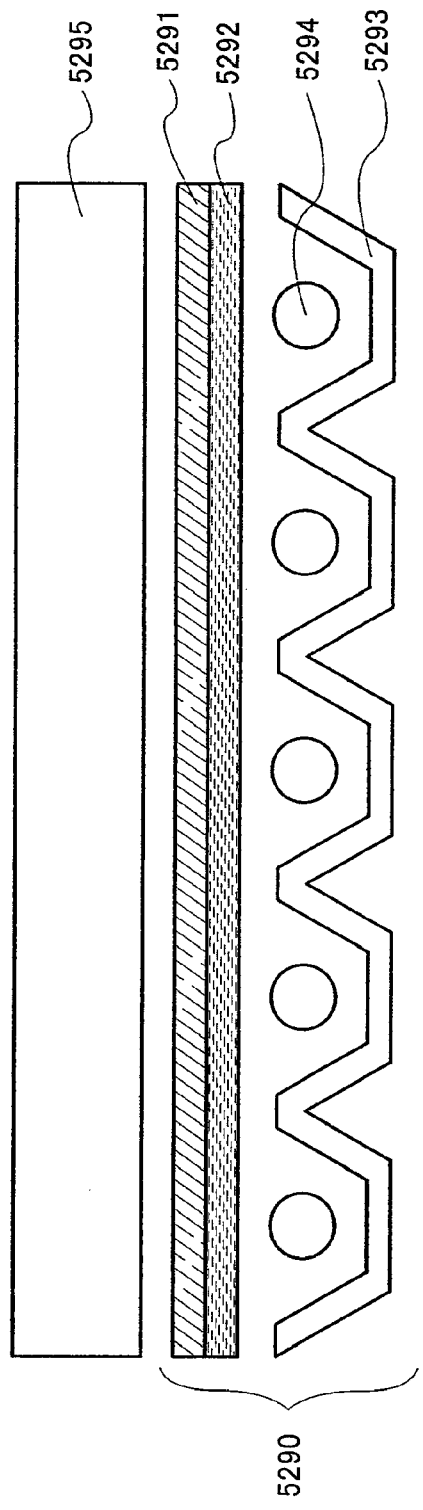
FIG. 40 is a cross-sectional view of a semiconductor device according to the present invention.

FIG. 40 illustrates an example of a liquid crystal display device including a so-called direct-type backlight unit and a liquid crystal panel. A direct-type corresponds to a type in which a light source is provided directly under a light-emitting surface and fluorescence of the light source is emitted from the entire light-emitting surface. The direct-type backlight unit can efficiently utilize emitted light quantity.

A backlight unit 5290 includes a diffusion plate 5291, a light-shielding plate 5292, a lamp reflector 5293, a light source 5294, and a liquid crystal panel 5295.

The light source 5294 has a function of emitting light as necessary. For example, as the light source 5294, a cold cathode tube, a hot cathode tube, a light-emitting diode, an inorganic EL element, an organic EL element, or the like can be used.

Figure 38:
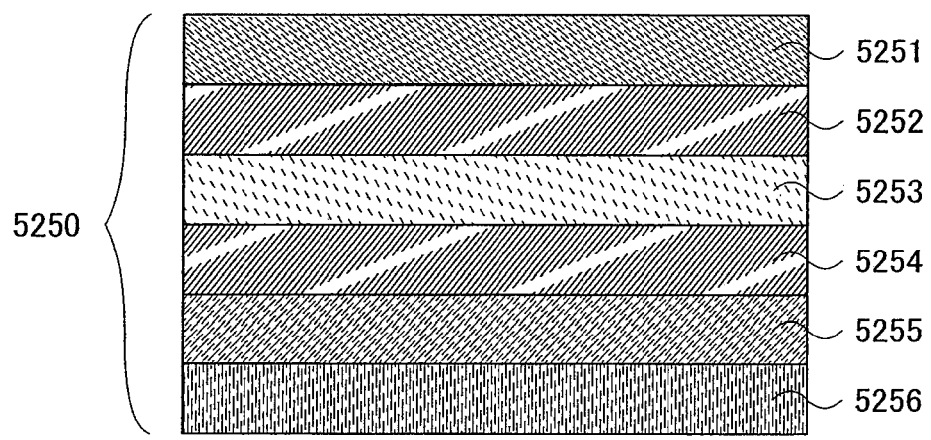
FIG. 38 is a cross-sectional view of a semiconductor device according to the present invention.

FIG. 38 is a view showing an example of a structure of a polarizing plate (also referred to as a polarizing film).

A polarizing film 5250 includes a protective film 5251, a substrate film 5252, a PVA polarizing film 5253, a substrate film 5254, an adhesive layer 5255, and a release film 5256.

When the PVA polarizing film 5253 is sandwiched by films to be base materials (the substrate film 5252 and the substrate film 5254) from both sides, reliability can be improved. Note that the PVA polarizing film 5253 may be sandwiched by triacetylcellulose (TAC) films with high transparency and high durability. Note also that each of the substrate films and the TAC films function as protective films of a polarizer included in the PVA polarizing film 5253.

The adhesive layer 5255 which is to be attached to a glass substrate of the liquid crystal panel is attached to one of the substrate films (the substrate film 5254). Note that the adhesive layer 5255 is formed by applying an adhesive to one of the substrate films (the substrate film 5254). The release film 5256 (a separate film) is provided to the adhesive layer 5255.

The protective film 5251 is provided to the other one of the substrates films (the substrate film 5252).

A hard coating scattering layer (an anti-glare layer) may be provided on a surface of the polarizing film 5250. Since the surface of the hard coating scattering layer has minute unevenness formed by AG treatment and has an anti-glare function which scatters external light, reflection of external light in the liquid crystal panel and surface reflection can be prevented.

Note also that plurality of optical thin film layers having different refractive indexes may be layered on the surface of the polarizing film 5250 (also referred to as anti-reflection treatment or AR treatment). The plurality of layered optical thin film layers having different refractive indexes can reduce reflectivity on the surface by an interference effect of light.

Figure 39A:
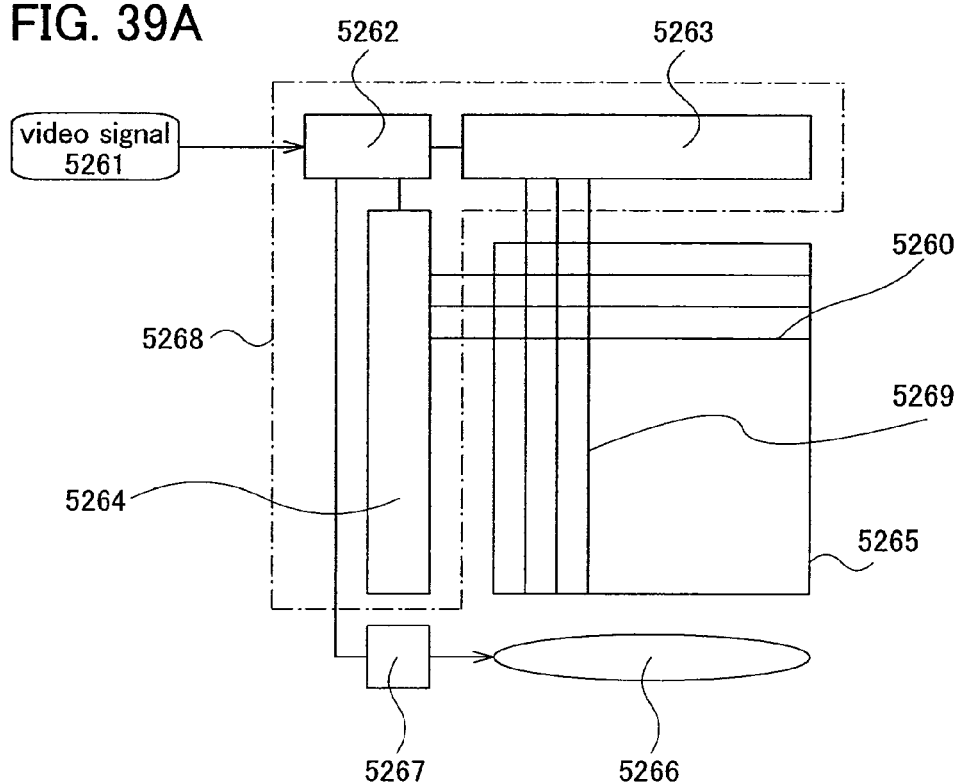
FIGS. 39A to 39C are block diagrams of semiconductor devices according to the present invention.

FIG. 39A is a diagram illustrating an example of a system block of the liquid crystal display device.

In a pixel portion 5265, signal lines 5269 which are extended from a signal line driver circuit 5263 are provided. In the pixel portion 5265, scan lines 5260 which are extended from a scan line driver circuit 5264 are also provided. In addition, a plurality of pixels are disposed in matrix at intersection portions of the signal lines 5269 and the scan lines 5260. Note that each of the plurality of pixels includes a switching element. Therefore, voltage for controlling inclination of liquid crystal molecules can be individually input to each of the plurality of pixels. A structure in which a switching element is provided at each intersection portion in this manner is referred to as an active matrix type. Note also that the present invention is not limited to such an active matrix type and a structure of a passive matrix type may be used. Since the passive matrix type does not have a switching element in each pixel, a process is simple.

A driver circuit portion 5268 includes a control circuit 5262, the signal line driver circuit 5263, and the scan line driver circuit 5264. A video signal 5261 is input to the control circuit 5262. The signal line driver circuit 5263 and the scan line driver circuit 5264 are controlled by the control circuit 5262 in accordance with this video signal 5261. Therefore, the control circuit 5262 inputs a control signal to each of the signal line driver circuit 5263 and the scan line driver circuit 5264. Then, the signal line driver circuit 5263 inputs a video signal to each of the signal lines 5269 and the scan line driver circuit 5264 inputs a scan signal to each of the scan lines 5260. Then, the switching element included in the pixel is selected in accordance with the scan signal and the video signal is input to a pixel electrode of the pixel.

Note that the control circuit 5262 also controls a power source 5267 in accordance with the video signal 5261. The power source 5267 includes a unit for supplying power to a lighting unit 5266. As the lighting unit 5266, an edge-light type backlight unit or a direct-type backlight unit can be used. Note also that a front light may be used as the lighting unit 5266. A front light corresponds to a plate-like lighting unit including a luminous body and a light conducting body, which is attached to the front surface side of a pixel portion and illuminates the whole area. By using such a lighting unit, the pixel portion can be uniformly illuminated at low power consumption.

Figure 39B:
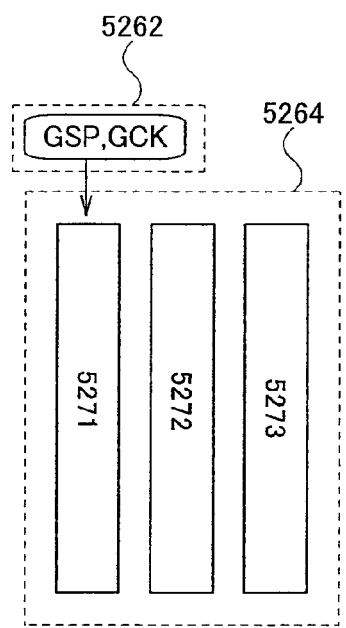

As shown in FIG. 39B, the scan line driver circuit 5264 includes a shift register 5271, a level shifter 5272, and a circuit functioning as a buffer 5273. A signal such as a gate start pulse (GSP) or a gate clock signal (GCK) is input to the shift register 5271.

Figure 39C:
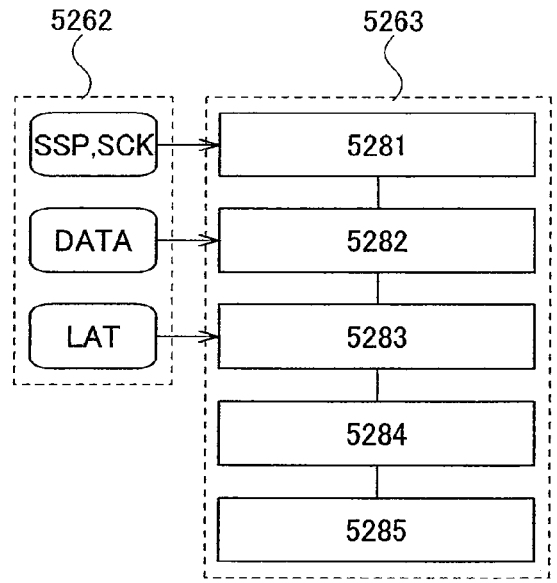

As shown in FIG. 39C, the signal line driver circuit 5263 includes a shift register 5281, a first latch 5282, a second latch 5283, a level shifter 5284, and a circuit functioning as a buffer 5285. The circuit functioning as the buffer 5285 corresponds to a circuit which has a function of amplifying a weak signal and includes an operational amplifier or the like. A signal such as a start pulse (SSP) is input to the level shifter 5284 and data (DATA) such as a video signal is input to the first latch 5282. A latch (LAT) signal can be temporally held in the second latch 5283 and is concurrently input to the pixel portion 5265. This is referred to as line-sequential driving. Therefore, when a pixel is used in which not line sequential driving but dot-sequential driving is performed, the second latch can be omitted.

Note that in this embodiment mode, various types of liquid crystal panels can be used. For example, a structure in which a liquid crystal layer is sealed between two substrates can be used as a liquid crystal panel. A transistor, a capacitor, a pixel electrode, an alignment film, or the like is formed over one of the substrates. A polarizing plate, a retardation plate, or a prism sheet may be provided on the surface opposite to a top surface of the one of the substrates. A color filter, a black matrix, an opposite electrode, an alignment film, or the like is provided on the other one of the substrates. Note that a polarizing plate or a retardation plate may be provided on the surface opposite to a top surface of the other one of the substrates. Note also that the color filter and the black matrix may be formed on the top surface of the one of the substrates. Note also that three-dimensional display can be performed by providing a slit (a grid) on the top surface side of the one of the substrates or the surface opposite to the top surface side of the one of the substrates.

Note also that each of the polarizing plate, the retardation plate, and the prism sheet can be provided between the two substrates. Alternatively, each of the polarizing plate, the retardation plate, and the prism sheet can be attached to or unified with one of the two substrates.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 11

Embodiment Mode 11 will describe a pixel structure and an operation of a pixel which can be applied to a liquid crystal display device.

Note that in this embodiment mode, as an operation mode of a liquid crystal element, a TN (Twisted Nematic) mode, an IPS (In-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, or the like can be used.

Figure 41A:
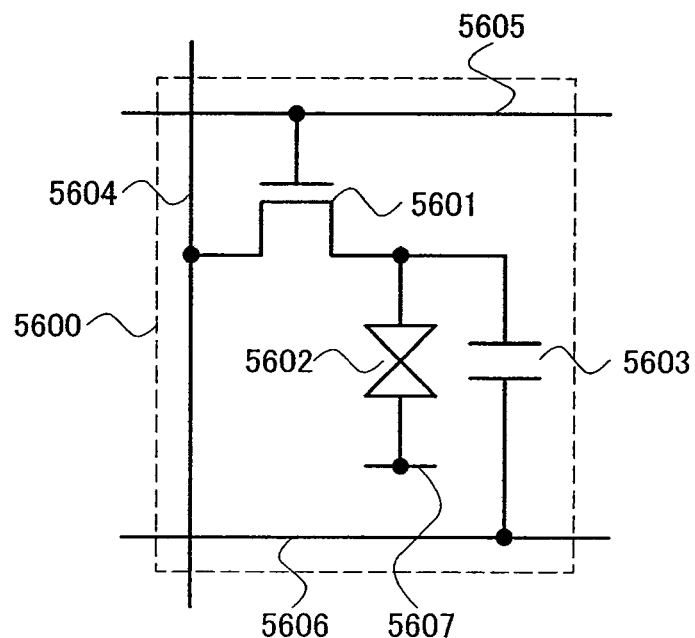
FIGS. 41A and 41B illustrate circuit configurations of semiconductor devices according to the present invention.

FIG. 41A is a diagram showing an example of a pixel structure which can be applied to the liquid crystal display device.

A pixel 5600 includes a transistor 5601, a liquid crystal element 5602, and a capacitor 5603. A gate of the transistor 5601 is connected to a wiring 5605. A first terminal of the transistor 5601 is connected to a wiring 5604. A second terminal of the transistor 5601 is connected to a first electrode of the liquid crystal element 5602 and a first electrode of the capacitor 5603. A second electrode of the liquid crystal element 5602 corresponds to an opposite electrode 5607. A second electrode of the capacitor 5603 is connected to a wiring 5606.

The wiring 5604 functions as a signal line. The wiring 5605 functions as a scan line. The wiring 5606 functions as a capacitor line. The transistor 5601 functions as a switch. The capacitor 5603 functions as a storage capacitor.

The transistor 5601 may function as a switch, and the transistor 5601 may be a p-channel transistor or an N-channel transistor.

Figure 41B:
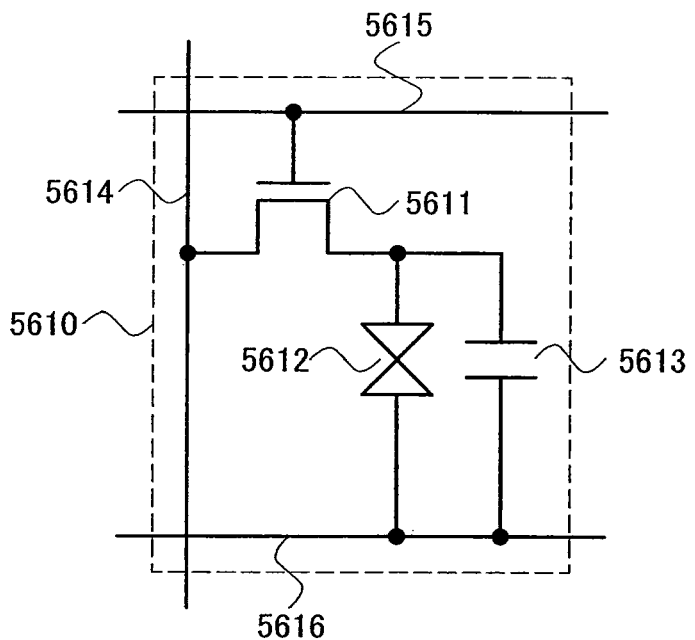

FIG. 41B illustrates an example of a pixel structure which can be applied to the liquid crystal display device. In particular, FIG. 41B is a diagram showing an example of a pixel structure which can be applied to a liquid crystal display device suitable for a lateral electric field-mode (including an IPS-mode and an FFS-mode).

A pixel 5610 includes a transistor 5611, a liquid crystal element 5612, and a capacitor 5613. A gate of the transistor 5611 is connected to a wiring 5615. A first terminal of the transistor 5611 is connected to a wiring 5614. A second terminal of the transistor 5611 is connected to a first electrode of the liquid crystal element 5612 and a first electrode of the capacitor 5613. A second electrode of the liquid crystal element 5612 is connected to a wiring 5616. A second electrode of the capacitor 5613 is connected to the wiring 5616.

The wiring 5614 functions as a signal line. The wiring 5615 functions as a scan line. The wiring 5616 functions as a capacitor line. The transistor 5611 functions as a switch. The capacitor 5613 functions as a storage capacitor.

The transistor 5611 may function as a switch, and the transistor 5611 may be a p-channel transistor or an N-channel transistor.

Figure 42:
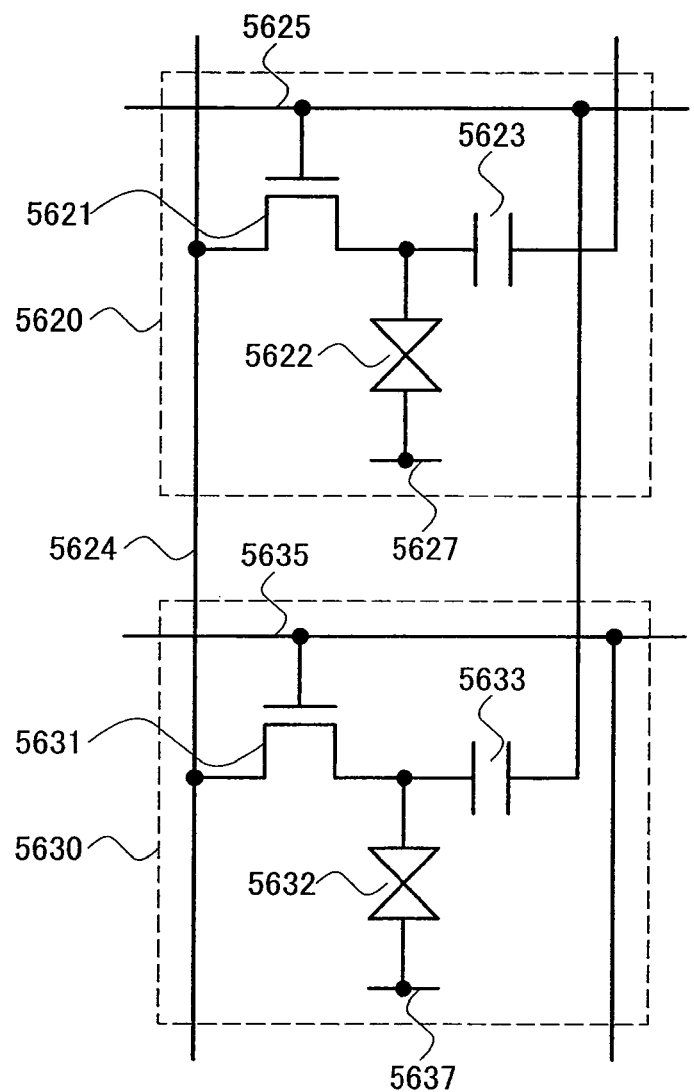
FIG. 42 illustrates a circuit configuration of a semiconductor device according to the present invention.

FIG. 42 illustrates an example of a pixel structure which can be applied to the liquid crystal display device. In particular, FIG. 42 illustrates an example of a pixel structure in which an aperture ratio of a pixel can be increased by reducing the number of wirings.

FIG. 42 illustrates two pixels which are provided in the same column direction (a pixel 5620 and a pixel 5630). For example, when the pixel 5620 is provided at the N-th row, the pixel 5630 is provided at the (N+1)th row.

The pixel 5620 includes a transistor 5621, a liquid crystal element 5622, and a capacitor 5623. A gate of the transistor 5621 is connected to a wiring 5625. A first terminal of the transistor 5621 is connected to a wiring 5624. A second terminal of the transistor 5621 is connected to a first electrode of the liquid crystal element 5622 and a first electrode of the capacitor 5623. A second electrode of the liquid crystal element 5622 corresponds to an opposite electrode 5627. A second electrode of the capacitor 5623 and a gate of a transistor of the previous row are connected to the same wiring.

The pixel 5630 includes a transistor 5631, a liquid crystal element 5632, and a capacitor 5633. A gate of the transistor 5631 is connected to a wiring 5635. A first terminal of the transistor 5631 is connected to a wiring 5624. A second terminal of the transistor 5631 is connected to a first electrode of the liquid crystal element 5632 and a first electrode of the capacitor 5633. A second electrode of the liquid crystal element 5632 corresponds to an opposite electrode 5637. A second electrode of the capacitor 5633 and the gate of the transistor of the previous row are connected to the same wiring (the wiring 5625).

The wiring 5624 functions as a signal line. The wiring 5625 functions as a scan line of the N-th row. The wiring 5625 also functions as a capacitor line of the (N+1)th row. The transistor 5621 functions as a switch. The capacitor 5623 functions as a storage capacitor.

The wiring 5635 functions as a scan line of the (N+1)th row. The wiring 5635 also functions as a capacitor line of an (N+2)th row. The transistor 5631 functions as a switch. The capacitor 5633 functions as a storage capacitor.

Each of the transistor 5621 and the transistor 5631 may function as a switch, and each of the transistor 5621 and the transistor 5631 may be a p-channel transistor or an N-channel transistor.

Figure 43:
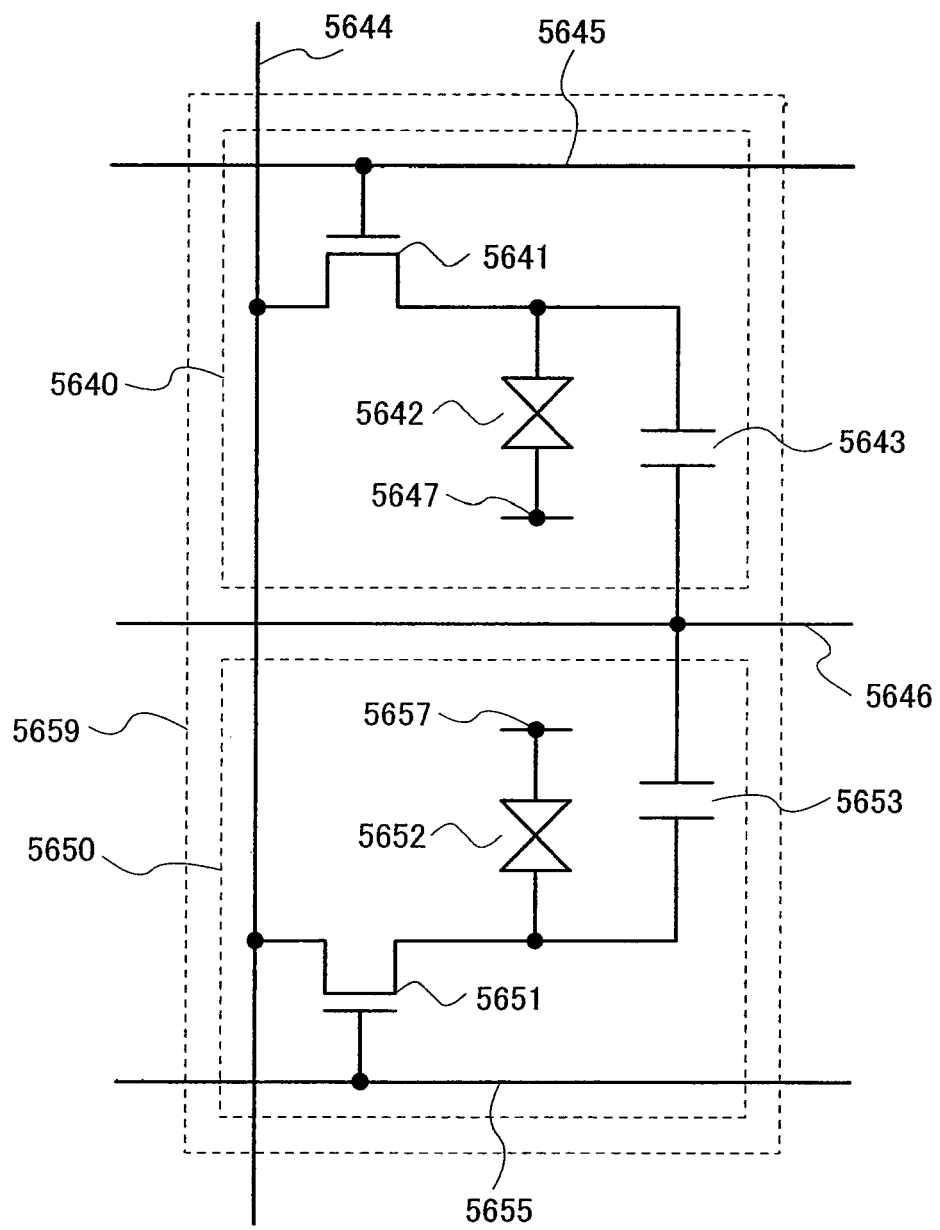
FIG. 43 illustrates a circuit configuration of a semiconductor device according to the present invention.

FIG. 43 illustrates an example of a pixel structure which can be applied to the liquid crystal display device. In particular, FIG. 43 illustrates an example of a pixel structure in which a viewing angle can be improved by using a subpixel.

A pixel 5659 includes a subpixel 5640 and a subpixel 5650. Although a case where the pixel 5659 includes two subpixels is described, the pixel 5659 may include three or more subpixels.

The subpixel 5640 includes a transistor 5641, a liquid crystal element 5642, and a capacitor 5643. A gate of the transistor 5641 is connected to a wiring 5645. A first terminal of the transistor 5641 is connected to a wiring 5644. A second terminal of the transistor 5641 is connected to a first electrode of the liquid crystal element 5642 and a first electrode of the capacitor 5643. A second electrode of the liquid crystal element 5642 corresponds to an opposite electrode 5647. A second electrode of the capacitor 5643 is connected to a wiring 5646.

The subpixel 5650 includes a transistor 5651, a liquid crystal element 5652, and a capacitor 5653. A gate of the transistor 5651 is connected to a wiring 5655. A first terminal of the transistor 5651 is connected to a wiring 5644. A second terminal of the transistor 5651 is connected to a first electrode of the liquid crystal element 5652 and a first electrode of the capacitor 5653. A second electrode of the liquid crystal element 5652 corresponds to an opposite electrode 5657. A second electrode of the capacitor 5653 is connected to a wiring 5646.

The wiring 5644 functions as a signal line. The wiring 5645 functions as a scan line. The wiring 5655 functions as a signal line. The wiring 5646 functions as a capacitor line. The transistor 5641 functions as a switch. The transistor 5651 functions as a switch. The capacitor 5643 functions as a storage capacitor. The capacitor 5653 functions as a storage capacitor.

The transistor 5641 may function as a switch, and the transistor 5641 may be a p-channel transistor or an N-channel transistor. The transistor 5651 may function as a switch, and the transistor 5651 may be a p-channel transistor or an N-channel transistor.

A video signal input to the subpixel 5640 may be a value which is different from that of a video signal input to the subpixel 5650. In this case, the viewing angle can be widened because alignment of liquid crystal molecules of the liquid crystal element 5642 and alignment of liquid crystal molecules of the liquid crystal element 5652 can be varied from each other.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 12

Embodiment Mode 12 will describe a method for driving a display device. In particular, a method for driving a liquid crystal display device is described.

A liquid crystal display panel which can be used for the liquid crystal display device described in this embodiment mode has a structure in which a liquid crystal material is sandwiched between two substrates. An electrode for controlling an electric field applied to the liquid crystal material is provided in each of the two substrates. A liquid crystal material corresponds to a material optical and electrical properties of which is changed by an electric field applied from outside. Therefore, a liquid crystal panel corresponds to a device in which desired optical and electrical properties can be obtained by controlling voltage applied to the liquid crystal material using the electrode provided for each of the two substrates. In addition, a large number of electrodes are disposed in a planar manner, each of the electrodes corresponds to a pixel, and voltages applied to the pixels are individually controlled. Therefore, a liquid crystal display panel which can display a clear image can be obtained.

Here, response time of the liquid crystal material with respect to change in an electric field depends on a gap between the two substrates (a cell gap) and a type of the liquid crystal material, and is generally several milliseconds to several ten milliseconds. Further, in the case where the amount of change in the electric field is small, the response time of the liquid crystal material is further lengthened. This characteristic causes a defect in image display such as an after image, persistence of vision, or decrease in contrast when the liquid crystal panel displays a moving image. In particular, when a half tone is changed into another half tone (change in the electric field is small), the above-described defect becomes noticeable.

Meanwhile, as a particular problem of a liquid crystal panel using an active matrix method, fluctuation in writing voltage due to constant electric charge driving is given. Constant electric charge driving in this embodiment mode is described below.

A pixel circuit using an active matrix method includes a switch which controls writing and a capacitor which holds an electric charge. A method for driving the pixel circuit using the active matrix method corresponds to a method in which predetermined voltage is written in a pixel circuit with a switch turned on, and the switch is turned off immediately after that, and an electric charge in the pixel circuit is held (a hold state). At the time of hold state, exchange of the electric charges between inside and outside of the pixel circuit is not performed (a constant electric charge). Usually, the length of the period during which the switch is turned off is approximately several hundreds times (by the number of scan lines) that of the period during which the switch is turned on. Therefore, it may be considered that the switch of the pixel circuit be almost always turned off. As described above, constant electric charge driving in this embodiment mode corresponds to a driving method in which a pixel circuit is in a hold state in almost all periods in driving a liquid crystal panel.

Next, electrical properties of the liquid crystal material are described. A dielectric constant as well as optical properties of the liquid crystal material are changed when an electric field applied from outside is changed. That is, when each pixel of the liquid crystal panel is regarded as a capacitor (a liquid crystal element) sandwiched between two electrodes, the capacitor corresponds to a capacitor, capacitance of which is changed in accordance with applied voltage. This phenomenon is called dynamic capacitance.

When a capacitor, capacitance of which is changed in accordance with applied voltage in this manner is driven by constant electric charge driving, the following problem occurs. If capacitance of a liquid crystal element is changed in a hold state in which an electric charge is not moved, applied voltage is also changed. This can be understood from the fact that the amount of electric charges is constant in a relational expression of (the amount of electric charges)=(capacitance)×(applied voltage).

Figure 47A:
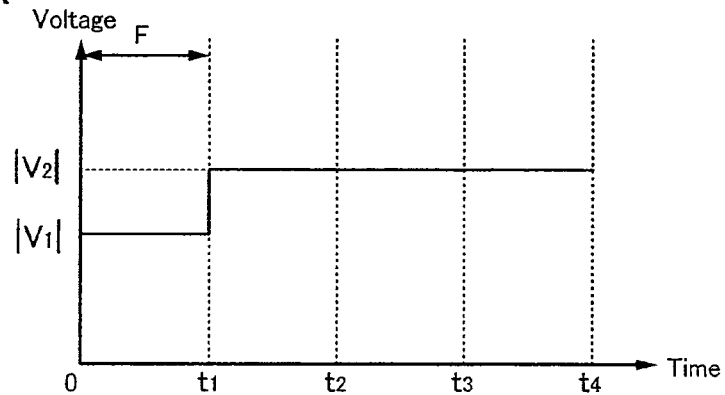
FIGS. 47A to 47C illustrate driving methods of semiconductor devices according to the present invention.
Figure 47B:
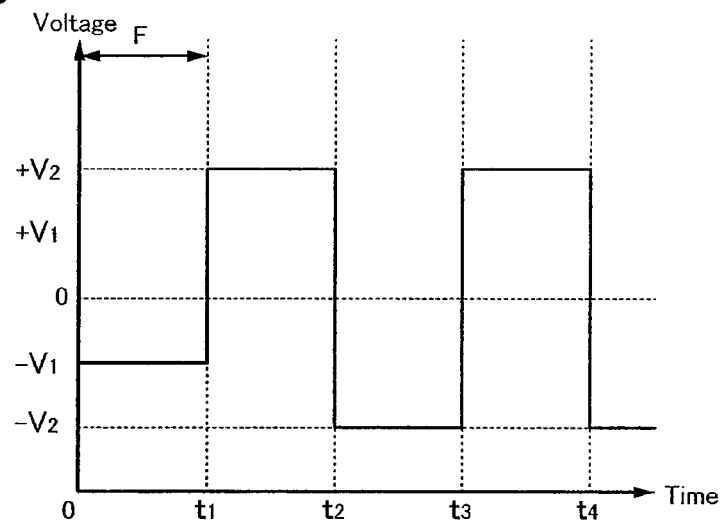
Figure 47C:
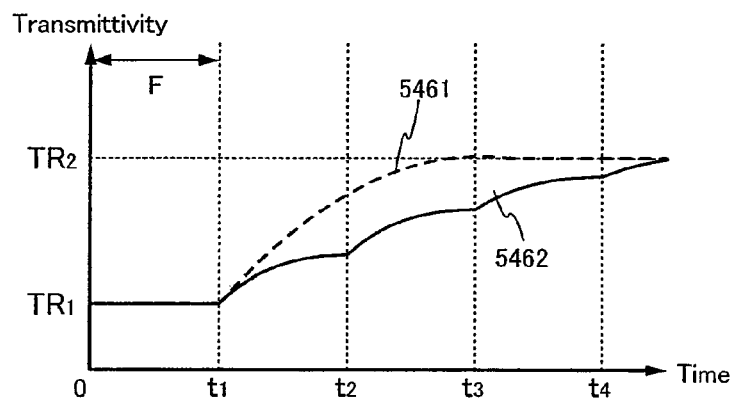

For the above reasons, voltage at the time of a hold state is changed from voltage at the time of writing because constant electric charge driving is performed in a liquid crystal panel using an active matrix method. Accordingly, change in transmittivity of the liquid crystal element is different from change in transmittivity of a liquid crystal element in a driving method which does not take a hold state. FIGS. 47A to 47C show this state. FIG. 47A illustrates an example of controlling voltage written in a pixel circuit in the case where time is represented by a horizontal axis and the absolute value of the voltage is represented by a vertical axis. FIG. 47B illustrates an example of controlling voltage written in the pixel circuit in the case where time is represented by a horizontal axis and the voltage is represented by a vertical axis. FIG. 47C illustrates change with time of transmittivity of the liquid crystal element in the case where the voltage shown in FIG. 47A or 47B is written in the pixel circuit when time is represented by a horizontal axis and the transmittivity of the liquid crystal element is represented by a vertical axis. In each of FIGS. 47A to 47C, a period F illustrates a period for rewriting the voltage and time for rewriting the voltage is described as $t_1$, $t_2$, $t_3$, and $t_4$.

Here, writing voltage corresponding to image data input to the liquid crystal display device corresponds to $|V_1|$ in rewriting at the time of 0 and corresponds to $|V_2|$ in rewriting at the time of $t_1$, $t_2$, $t_3$, and $t_4$ (see FIG. 47A).

Note that polarity of the writing voltage corresponding to image data input to the liquid crystal display device may be switched periodically (inversion driving: see FIG. 47B). Since direct voltage can be prevented from being applied to a liquid crystal as much as possible by using this method, burn-in or the like caused by deterioration of the liquid crystal element can be prevented. Note also that a period of switching the polarity (an inversion period) may be the same as a period of rewriting voltage. In this case, generation of flickers caused by inversion driving can be reduced because the inversion period is short. Further, the inversion period may be a period which is integral times of the period of rewriting voltage. In this case, power consumption can be reduced because the inversion period is long and the frequencies of changing polarity and writing voltage can be decreased.

FIG. 47C illustrates change with time of transmittivity of the liquid crystal element in the case where voltage as shown in FIG. 47A or 47B is applied to the liquid crystal element. Here, the voltage $|V_1|$ is applied to the liquid crystal element and transmittivity of the liquid crystal element after time passes sufficiently corresponds to $TR_2$. Similarly, the voltage $|V_2|$ is applied to the liquid crystal element and transmittivity of the liquid crystal element after time passes sufficiently corresponds to $TR_2$. When the voltage applied to the liquid crystal element is changed from $|V_1|$ to $|V_2|$ at the time of $t_1$, transmittivity of the liquid crystal element does not immediately become $TR_2$ as shown by a dashed line 5461 but slowly changes. For example, when the period of rewriting voltage is the same as a frame period of a video signal of 60 Hz (16.7 milliseconds), time for several frames is necessary until transmittivity is changed to $TR_2$.

Note that smooth change with time of transmittivity as shown in the dashed line 5461 corresponds to change with time of transmittivity when the voltage $|V_2|$ is accurately applied to the liquid crystal element. In an actual liquid crystal panel, for example, a liquid crystal panel using an active matrix method, transmittivity of the liquid crystal element does not have change with time as shown by the dashed line 5461 but has gradual change with time as shown by a solid line 5462 because voltage at the time of a hold state is changed from voltage at the time of writing due to constant electric charge driving. This is because the voltage is changed due to constant electric charge driving, so that it is impossible to reach intended voltage only by one writing. Accordingly, the response time of transmittivity of the liquid crystal element becomes further longer than original response time (the dashed line 5461) in appearance, so that a noticeable defect in image display such as an after image, persistence of vision, or decrease in contrast occurs.

Figure 48A:
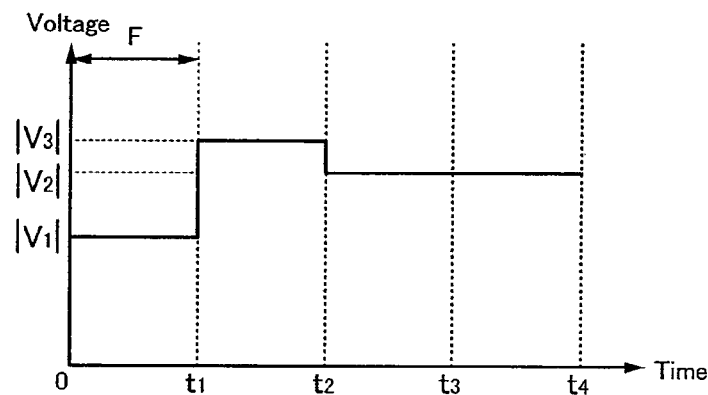
FIGS. 48A to 48C illustrate driving methods of semiconductor devices according to the present invention.
Figure 48B:
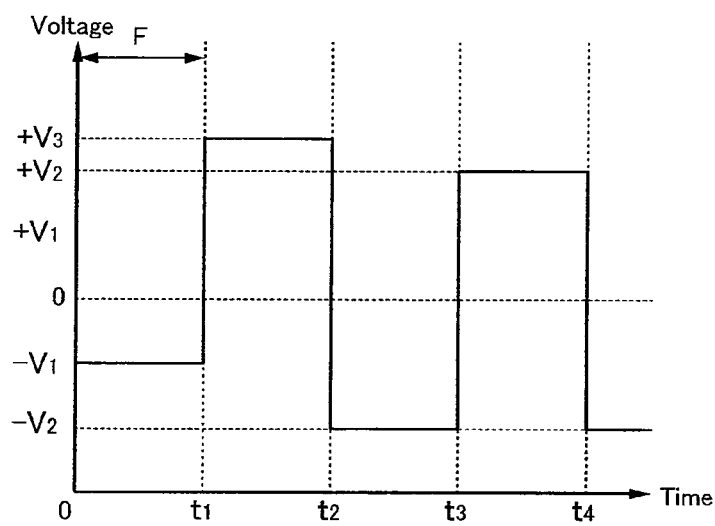
Figure 48C:
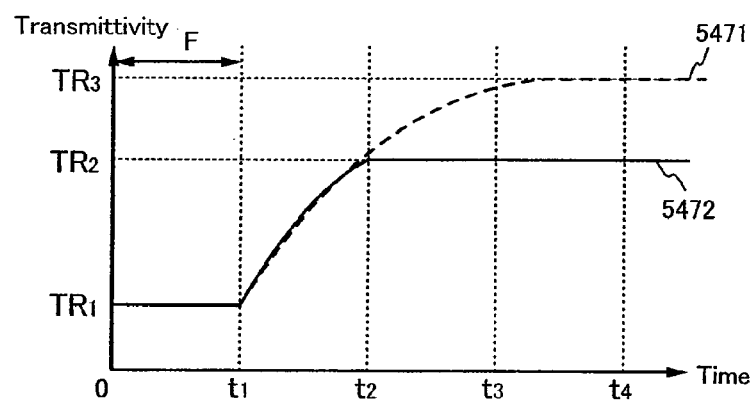

By using overdriving, it is possible to solve at the same time, problems of the long length of the original response speed of the liquid crystal element and the phenomenon in which the response time in appearance becomes further longer because of shortage of writing by dynamic capacitance and constant electric charge driving. FIGS. 48A to 48C show this state. FIG. 48A illustrates an example of controlling voltage written in a pixel circuit in the case where time is represented by a horizontal axis and the absolute value of the voltage is represented by a vertical axis. FIG. 48B illustrates an example of controlling voltage written in the pixel circuit in the case where time is represented by a horizontal axis and the voltage is represented by a vertical axis. FIG. 48C illustrates change with time of transmittivity of the liquid crystal element in the case where the voltage shown in FIG. 48A or 48B is written in the pixel circuit when time is represented by a horizontal axis and the transmittivity of the liquid crystal element is represented by a vertical axis. In each of FIGS. 48A to 48C, a period F illustrates a period for rewriting the voltage and time for rewriting the voltage is described as $t_1$, $t_2$, $t_3$, and $t_4$.

Here, writing voltage corresponding to image data input to the liquid crystal display device corresponds to $|V_1|$ in rewriting at the time of 0, corresponds to $|V_3|$ in rewriting at the time of $t_1$, and corresponds to $|V_3|$ in writing at the time of $t_2$, $t_3$, and $t_4$ (see FIG. 48A).

Note that polarity of the writing voltage corresponding to image data input to the liquid crystal display device may be switched periodically (inversion driving: see FIG. 48B). Since direct voltage can be prevented from being applied to a liquid crystal as much as possible by using this method, burn-in or the like caused by deterioration of the liquid crystal element can be prevented. Note also that a period of switching the polarity (an inversion period) may be the same as a period of rewriting voltage. In this case, generation of flickers caused by inversion driving can be reduced because the inversion period is short. Further, the inversion period may be a period which is integral times of the period of rewriting voltage. In this case, power consumption can be reduced because the inversion period is long and frequency of writing voltage can be decreased by changing the polarity.

FIG. 48C illustrates change with time of transmittivity of the liquid crystal element in the case where voltage as shown in FIG. 48A or 48B is applied to the liquid crystal element. Here, the voltage $|V_1|$ is applied to the liquid crystal element and transmittivity of the liquid crystal element after time passes sufficiently corresponds to $TR_1$. Similarly, the voltage $|V_2|$ is applied to the liquid crystal element and transmittivity of the liquid crystal element after time passes sufficiently corresponds to $TR_2$. Similarly, the voltage $|V_3|$ is applied to the liquid crystal element and transmittivity of the liquid crystal element after time passes sufficiently corresponds to $TR_3$. When the voltage applied to the liquid crystal element is changed from $|V_1|$ to $|V_3|$ at the time of $t_1$, transmittivity of the liquid crystal element is tried to be changed to $TR_3$ for several frames as shown by a dashed line 5471. However, application of the voltage $|V_3|$ is terminated at the time $t_2$ and the voltage $|V_2|$ is applied after the time $t_2$. Therefore, transmittivity of the liquid crystal element does not become as shown by the dashed line 5471 but becomes as shown by a solid line 5472. Here, it is preferable that a value of the voltage $|V_3|$ be set so that transmittivity is approximately $TR_2$ at the time of $t_2$. Here, the voltage $|V_3|$ is also referred to as overdriving voltage.

That is, the response time of the liquid crystal element can be controlled to some extent by changing $|V_3|$ which is the overdriving voltage. This is because the response time of the liquid crystal element is changed by the intensity of an electric field. Specifically, the response time of the liquid crystal element becomes shorter as the electric field is stronger, and the response time of the liquid crystal element becomes longer as the electric field is weaker.

Note that it is preferable that $|V_3|$ which is the overdriving voltage be changed in accordance with the amount of change in the voltage, i.e., the voltage $|V_1|$ and the voltage $|V_2|$ which supply intended transmittivity $TR_1$ and $TR_2$. This is because appropriate response time can be always obtained by changing the overdriving voltage $|V_3|$ in accordance with change in the response time of the liquid crystal element, even when the response time of the liquid crystal element is changed by the amount of change in the voltage.

Note also that it is preferable that $|V_3|$ which is the overdriving voltage be changed by a mode of the liquid crystal element such as a TN-mode, a VA-mode, an IPS-mode, or an OCB-mode. This is because appropriate response time can be always obtained by changing the overdriving voltage $|V_3|$ in accordance with change in the response time of the liquid crystal element, even when the response time of the liquid crystal element is changed by the mode of the liquid crystal element.

Note also that the voltage rewriting period F may be the same as a frame period of an input signal. In this case, a liquid crystal display device with low manufacturing cost can be obtained because a peripheral driver circuit of the liquid crystal display device can be simplified.

Note also that the voltage rewriting period F may be shorter than the frame period of the input signal. For example, the voltage rewriting period F may be one half (½) the frame period of the input signal, one third (⅓) the frame period of the input signal, or one third (⅓) or less the frame period of the input signal. It is effective to combine this method with a countermeasure against deterioration in quality of a moving image caused by hold driving of the liquid crystal display device, such as black data insertion driving, backlight blinking, backlight scanning, or intermediate image insertion driving by motion interpolation. That is, since required response time of the liquid crystal element is short in the countermeasure against deterioration in quality of a moving image caused by hold driving of the liquid crystal display device, the response time of the liquid crystal element can be shortened relatively easily by using overdriving described in this embodiment mode. Although the response time of the liquid crystal element can be substantially shortened by a cell gap, a liquid crystal material, a mode of the liquid crystal element, or the like, it is technically difficult to shorten the response time of the liquid crystal element. Therefore, it is very important to use a method for shortening the response time of the liquid crystal element by a driving method such as overdriving.

Note also that the voltage rewriting period F may be longer than the frame period of the input signal. For example, the voltage rewriting period F may be twice the frame period of the input signal, three times the frame period of the input signal, or three times or more the frame period of the input signal. It is effective to combine this method with a unit (a circuit) which determines whether voltage is rewritten or not for a long period or not. That is, when the voltage is not rewritten for a long period, an operation of the circuit can be stopped during the period, without performing a rewriting operation itself of the voltage. Therefore, a liquid crystal display device with low power consumption can be obtained.

Next, a specific method for changing the overdriving voltage $|V_3|$ in accordance with the voltage $|V_1|$ and the voltage $|V_2|$ which supply intended transmittivity $TR_1$ and $TR_2$ is described.

Since an overdriving circuit corresponds to a circuit for appropriately controlling the overdriving voltage $|V_3|$ in accordance with the voltage $|V_1|$ and the voltage $|V_2|$ which supply intended transmittivity $TR_1$ and $TR_2$, signals input to the overdriving circuit are a signal which is related to the voltage $|V_1|$ which supplies intended transmittivity $TR_1$ and a signal which is related to the voltage $|V_2|$ which supplies intended transmittivity $TR_2$, and a signal output from the overdriving circuit is a signal which is related to the overdriving voltage $|V_3|$. Here, each of these signals may have an analog voltage value such as the voltage applied to the liquid crystal element (e.g., $|V_1|$, $|V_2|$, or $|V_3|$) or may be a digital signal for supplying the voltage applied to the liquid crystal element. Here, the signal which is related to the overdriving circuit is described as a digital signal.

Figure 44A:
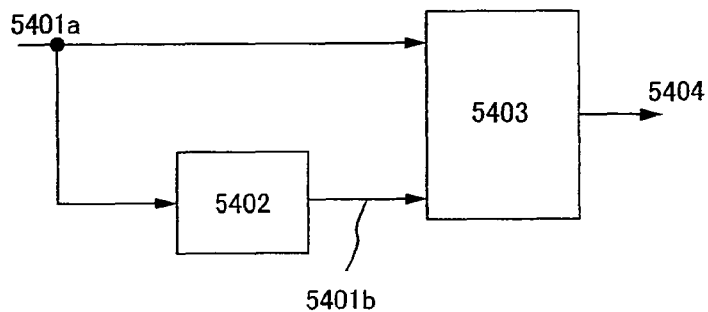
FIGS. 44A to 44E illustrate driving methods of semiconductor devices according to the present invention.

First, a general structure of the overdriving circuit is described with reference to FIG. 44A. Here, input video signals 5401*a* and 5401*b* are used as signals for controlling the overdriving voltage. As a result of processing these signals, an output video signal 5404 is to be output as a signal which supplies the overdriving voltage.

Here, since the voltage $|V_1|$ and the voltage $|V_2|$ which supply intended transmittivity $TR_1$ and $TR_2$ are video signals in adjacent frames, it is preferable that the input video signals 5401*a* and 5401*b* be similarly video signals in adjacent frames. In order to obtain such signals, the input video signal 5401*a* is input to a delay circuit 5402 in FIG. 44A and a signal which is consequently output can be used as the input video signal 5401*b*. For example, a memory can be given as the delay circuit 5402. That is, the input video signal 5401*a* is stored in the memory in order to delay the input video signal 5401*a* for one frame; a signal stored in the previous frame is taken out from the memory as the input video signal 5401*b* at the same time; and the input video signal 5401*a* and the input video signal 5401*b* are concurrently input to a correction circuit 5403. Therefore, the video signals in adjacent frames can be handled. By inputting the video signals in adjacent frames to the correction circuit 5403, the output video signal 5404 can be obtained. Note that when a memory is used as the delay circuit 5402, a memory having capacity for storing a video signal for one frame in order to delay the input video signal 5401*a* for one frame (i.e., a frame memory) can be obtained. Thus, the memory can have a function as a delay circuit without excess and deficiency of memory capacity.

Next, the delay circuit 5402 formed mainly for reducing memory capacity is described. Since memory capacity can be reduced by using such a circuit as the delay circuit 5402, manufacturing cost can be reduced.

Figure 44B:
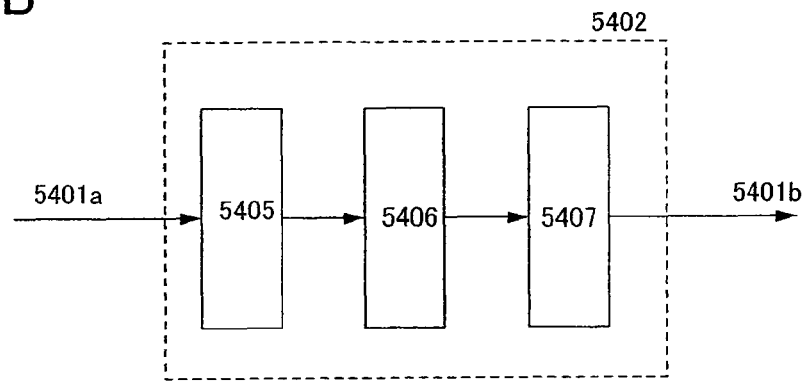

Specifically, a delay circuit as shown in FIG. 44B can be used as the delay circuit 5402 having such characteristics. The delay circuit 5402 shown in FIG. 44B includes an encoder 5405, a memory 5406, and a decoder 5407.

Operations of the delay circuit 5402 shown in FIG. 44B are as follows. First, compression treatment is performed by the encoder 5405 before the input video signal 5401*a* is stored in the memory 5406. Thus, size of data to be stored in the memory 5406 can be reduced. Accordingly, since memory capacity can be reduced, manufacturing cost can also be reduced. Then, a compressed video signal is transferred to the decoder 5407 and extension treatment is performed here. Thus, the previous signal which has been compressed by the encoder 5405 can be restored. Here, compression and extension treatment which is performed by the encoder 5405 and the decoder 5407 may be reversible treatment. Thus, since the video signal does not deteriorate even after compression and extension treatment is performed, memory capacity can be reduced without causing deterioration of quality of an image, which is finally displayed on a device. Further, compression and extension treatment which is performed by the encoder 5405 and the decoder 5407 may be non-reversible treatment. Thus, since the data size of the compressed video signal can be extremely made small, memory capacity can be significantly reduced.

Note that as a method for reducing memory capacity, various methods can be used as well as the above-described method. A method in which color information included in a video signal is reduced (e.g., tone reduction from 2.6 hundred thousand colors to 65 thousand colors is performed) or the amount of data is reduced (e.g., resolution is made small) without performing image compression by an encoder, or the like can be used.

Figure 44C:
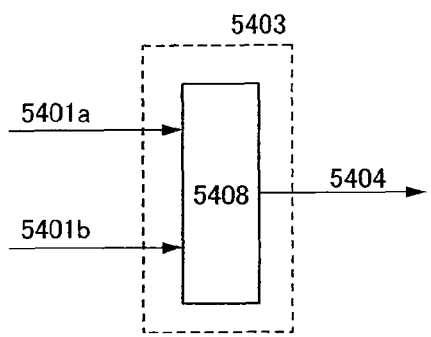

Next, specific examples of the correction circuit 5403 are described with reference to FIGS. 44C and 44E. The correction circuit 5403 corresponds to a circuit for outputting an output video signal having a certain value from two input video signals. Here, when the relationship between the two input video signals and the output video signal is non-linear and it is difficult to calculate the relation by simple operation, a look up table (an LUT) may be used as the correction circuit 5403. Since the relationship between the two input video signals and the output video signal is calculated in advance by measurement in an LUT, the output video signal corresponding to the two input video signals can be calculated only by seeing the LUT (see FIG. 44C). By using a LUT 5408 as the correction circuit 5403, the correction circuit 5403 can be realized without performing complicated circuit design or the like.

Here, since the LUT 5408 is one of memories, it is preferable to reduce memory capacity as much as possible in order to reduce manufacturing cost. As an example of the correction circuit 5403 for realizing reduction in memory capacity, a circuit shown in FIG. 44D can be given. The correction circuit 5403 shown in FIG. 44D includes an LUT 5409 and an adder 5410. Data of difference between the input video signal 5401*a* and the output video signal 5404 to be output is stored in the LUT 5409. That is, corresponding difference data from the input video signal 5401*a* and the input video signal 5401*b* is taken out from the LUT 5409 and the taken difference data and the input video signal 5401*a* are added by the adder 5410, so that the output video signal 5404 can be obtained. Note that when data stored in the LUT 5409 is difference data, memory capacity of the LUT 5409 can be reduced. This is because data size of difference data is smaller than data size of the output video signal 5404 itself, so that memory capacity necessary for the LUT 5409 can be made small.

In addition, when the output video signal can be calculated by simple operation such as four arithmetic operations of the two input video signals, the correction circuit 5403 can be realized by combination of simple circuits such as an adder, a subtracter, and a multiplier. Accordingly, it is not necessary to use a LUT, so that manufacturing cost can be significantly reduced. As such a circuit, a circuit shown in FIG. 44E can be given. The correction circuit 5403 shown in FIG. 44E includes a subtracter 5411, a multiplier 5412, and an adder 5413. First, difference between the input video signal 5401*a* and the input video signal 5401*b* is calculated by the subtracter 5411. After that, a differential value is multiplied by an appropriate coefficient by using the multiplier 5412. Then, by adding the differential value multiplied by the appropriate coefficient to the input video signal 5401*a* by the adder 5413, the output video signal 5404 can be obtained. By using such a circuit, it is not necessary to use the LUT. Therefore, manufacturing cost can be significantly reduced.

Figure 44E:
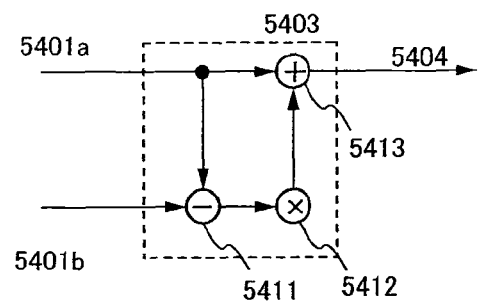
Figure 44D:
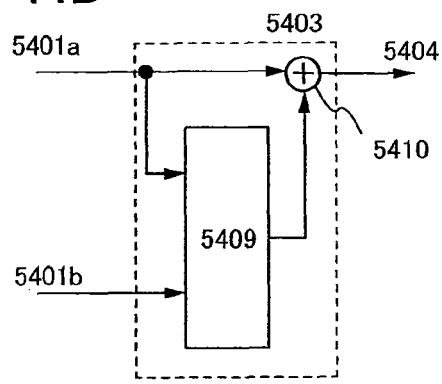

Note that by using the correction circuit 5403 shown in FIG. 44E under a certain condition, output of the inappropriate output video signal 5404 can be prevented. The condition is as follows. A value of difference between the output video signal 5404 which supplies the overdriving voltage and the input video signals 5401a and 5401b has linearity. In addition, the differential value corresponds to a coefficient multiplied by inclination of this linearity by using the multiplier 5412. That is, it is preferable that the correction circuit 5403 shown in FIG. 44E be used for a liquid crystal element having such properties. As a liquid crystal element having such properties, an IPS-mode liquid crystal element in which response time has little gray-scale dependency can be given. For example, by using the correction circuit 5403 shown in FIG. 44E for an IPS mode liquid crystal element in this manner, manufacturing cost can be significantly reduced and an overdriving circuit which can prevent output of the inappropriate output video signal 5404 can be provided.

Operations which are similar to those of the circuits shown in FIGS. 44A to 44E may be realized by software processing. As for the memory used for the delay circuit, another memory included in the liquid crystal display device, a memory included in a device which transfers an image displayed on the liquid crystal display device (e.g., a video card or the like included in a personal computer or a device similar to the personal computer) can be used for example. Thus, intensity of overdriving, availability, or the like can be selected in accordance with user's preference, in addition to reduction in manufacturing cost.

Figure 45A:
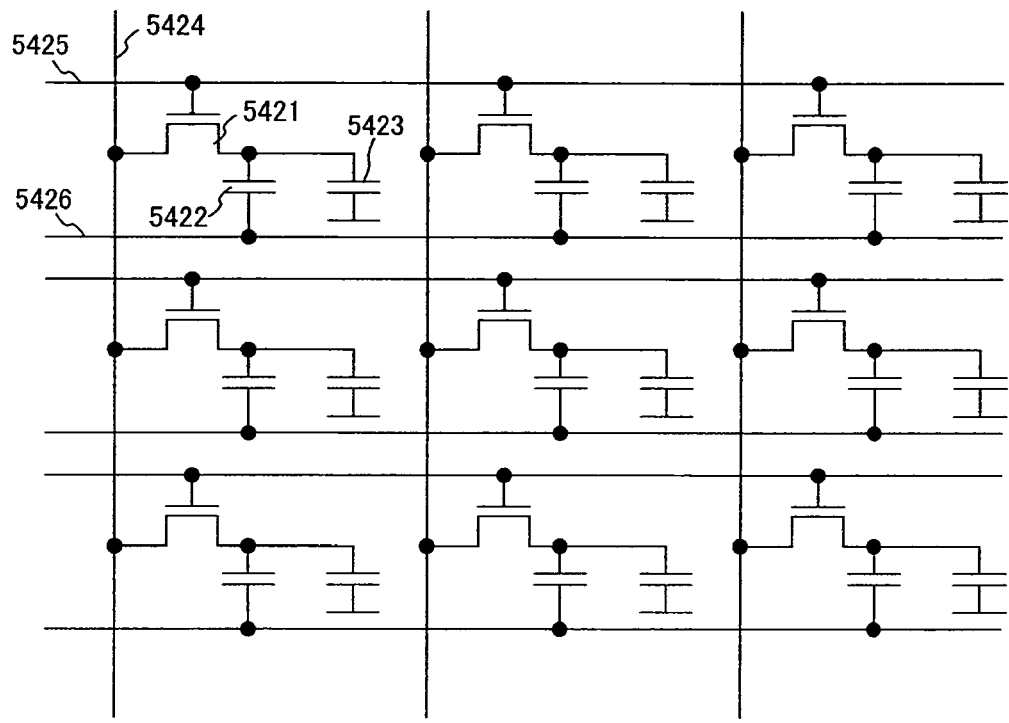
FIGS. 45A and 45B illustrate driving methods of semiconductor devices according to the present invention.

Driving which controls a potential of a common line is described with reference to FIGS. 45A and 45B. FIG. 45A illustrates a plurality of pixel circuits in which one common line is provided with respect to one scan line in a display device using a display element which has capacitive properties like a liquid crystal element. Each of the pixel circuits shown in FIG. 45A includes a transistor 5421, an auxiliary capacitor 5422, a display element 5423, a video signal line 5424, a scan line 5425, and a common line 5426.

A gate electrode of the transistor 5421 is electrically connected to the scan line 5425; one of a source electrode and a drain electrode of the transistor 5421 is electrically connected to the video signal line 5424; and the other of the source electrode and the drain electrode of the transistor 5421 is electrically connected to one of electrodes of the auxiliary capacitor 5422 and one of electrodes of the display element 5423. In addition, the other of the electrodes of the auxiliary capacitor 5422 is electrically connected to the common line 5426.

First, in each of pixels selected by the scan line 5425, voltage corresponding to a video signal is applied to the display element 5423 and the auxiliary capacitor 5422 through the video signal line 5424 because the transistor 5421 is turned on. At this time, when the video signal is a signal which makes all of pixels connected to the common line 5426 display a minimum grayscale or when the video signal is a signal which makes all of the pixels connected to the common line 5426 display the maximum grayscale, it is not necessary that the video signal be written in each of the pixels through the video signal line 5424. Voltage applied to the display element 5423 can be changed by changing a potential of the common line 5426 instead of writing the video signal through the video signal line 5424.

Figure 45B:
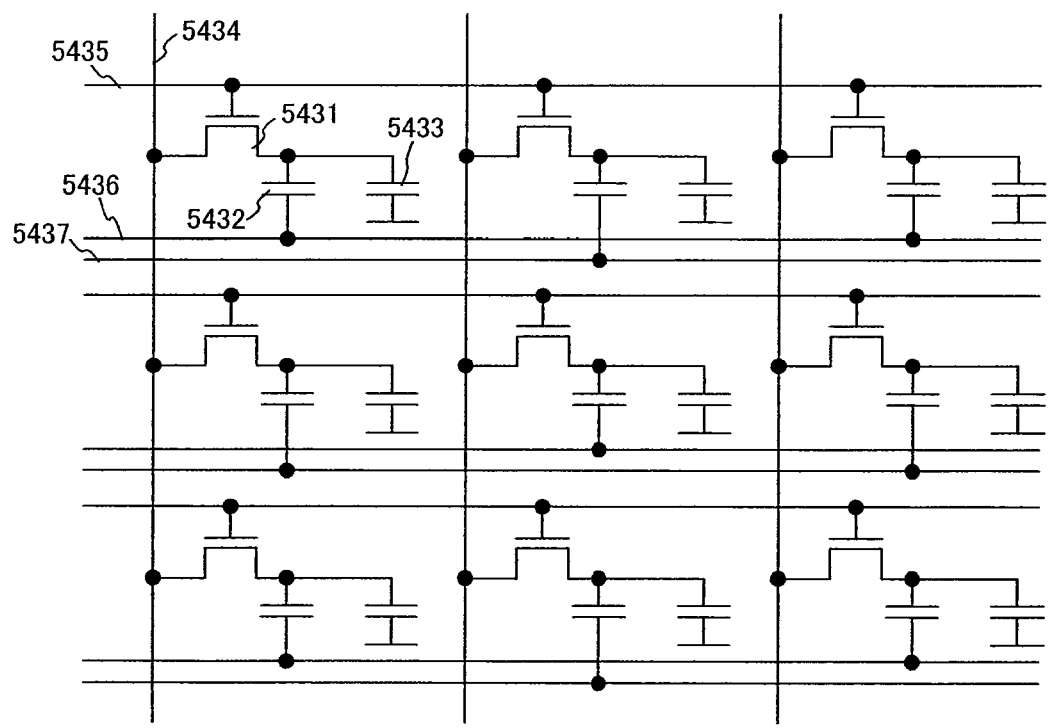

Next, FIG. 45B illustrates a plurality of pixel circuits in which two common lines are provided with respect to one scan line in a display device using a display element which has capacitive properties like a liquid crystal element. Each of the pixel circuits illustrated in FIG. 45B includes a transistor 5431, an auxiliary capacitor 5432, a display element 5433, a video signal line 5434, a scan line 5435, a first common line 5436, and a second common line 5437.

A gate electrode of the transistor 5431 is electrically connected to the scan line 5435; one of a source electrode and a drain electrode of the transistor 5431 is electrically connected to the video signal line 5434; and the other of the source electrode and the drain electrode of the transistor 5431 is electrically connected to one of electrodes of the auxiliary capacitor 5432 and one of electrodes of the display element 5433. In addition, the other of the electrodes of the auxiliary capacitor 5432 is electrically connected to the first common line 5436. Further, in a pixel which is adjacent to the pixel, the other of the electrodes of the auxiliary capacitor 5432 is electrically connected to the second common line 5437.

In the pixel circuits shown in FIG. 45B, the number of pixels which are electrically connected to one common line is small. Therefore, by changing a potential of the first common line 5436 or the second common line 5437 instead of writing a video signal through the video signal line 5434, frequency of changing voltage applied to the display element 5433 is significantly increased. In addition, source inversion driving or dot inversion driving can be performed. By performing source inversion driving or dot inversion driving, reliability of the element can be improved and a flicker can be suppressed.

Figure 46A:
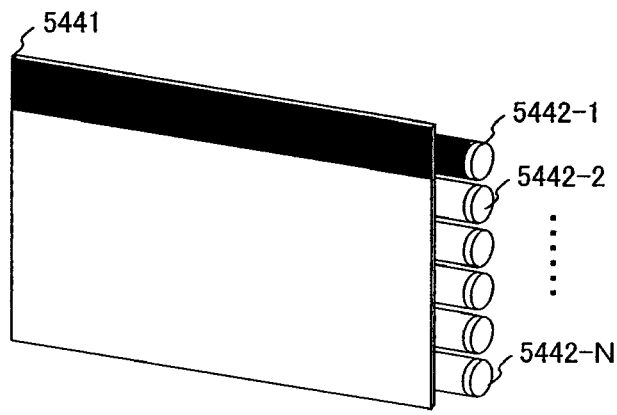
FIGS. 46A to 46C illustrate driving methods of semiconductor devices according to the present invention.

A scanning backlight is described with reference to FIGS. 46A to 46C. FIG. 46A is a view showing a scanning backlight in which cold cathode tubes are arranged. The scanning backlight shown in FIG. 46A includes a diffusion plate 5441 and N pieces of cold cathode tubes 5442-1 to 5442-N. The N pieces of the cold cathode tubes 5442-1 to 5442-N are disposed behind the diffusion plate 5441, so that the N pieces of the cold cathode tubes 5442-1 to 5442-N can be scanned while luminance thereof is changed.

Change in luminance of each of the cold cathode tubes in scanning is described with reference to FIG. 46C. First, luminance of the cold cathode tube 5442-1 is changed for a certain period. After that, luminance of the cold cathode tube 5442-2 which is provided adjacent to the cold cathode tube 5442-1 is changed for the same period. In this manner, luminance is changed sequentially from the cold cathode tube 5442-1 to the cold cathode tube 5442-N. Although luminance which is changed for a certain period is set to be lower than original luminance in FIG. 46C, it may also be higher than original luminance. In addition, although scanning is performed from the cold cathode tubes 5442-1 to 5442-N, scanning may also be performed from the cold cathode tubes 5442-N to 5442-1, which is in a reversed order.

Figure 46B:
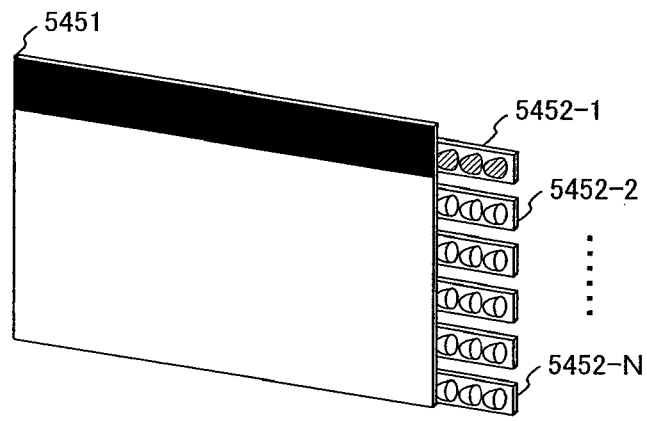
Figure 46C:
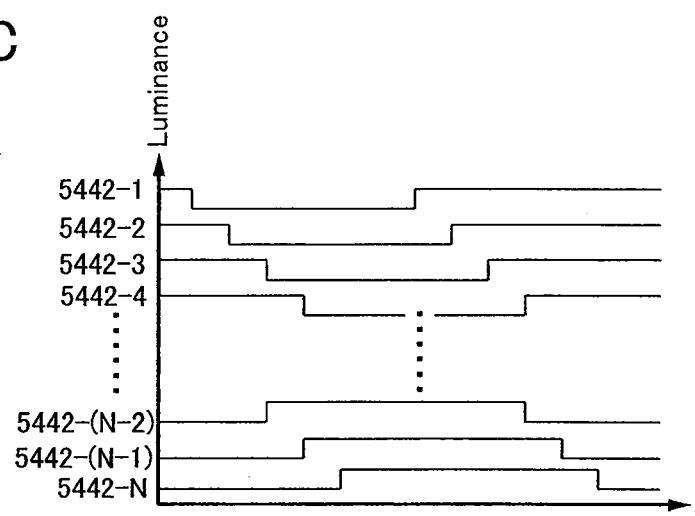

By performing driving as in FIGS. 46A to 46C, average luminance of the backlight can be decreased. Therefore, power consumption of the backlight, which mainly takes up power consumption of the liquid crystal display device, can be reduced.

Note that an LED may be used as a light source of the scanning backlight. The scanning backlight in this case is as shown in FIG. 46B. The scanning backlight shown in FIG. 46B includes a diffusion plate 5451 and light sources 5452-1 to 5452-N, in each of which LEDs are arranged. When the LED is used as the light source of the scanning backlight, there is an advantage in that the backlight can be thin and lightweight. In addition, there is also an advantage that a color reproduction area can be widened. Further, since the LEDs which are arranged in each of the light sources 5452-1 to 5452-N can be similarly scanned, a dot-scanning backlight can also be obtained. By using the dot-scanning backlight, image quality of a moving image can be further improved.

Note that when the LED is used as the light source of the backlight, driving can be performed by changing luminance as shown in FIG. 46C.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 13

Embodiment Mode 13 will describe a structure and an operation of a pixel in a display device.

Figures 49A, 49B:
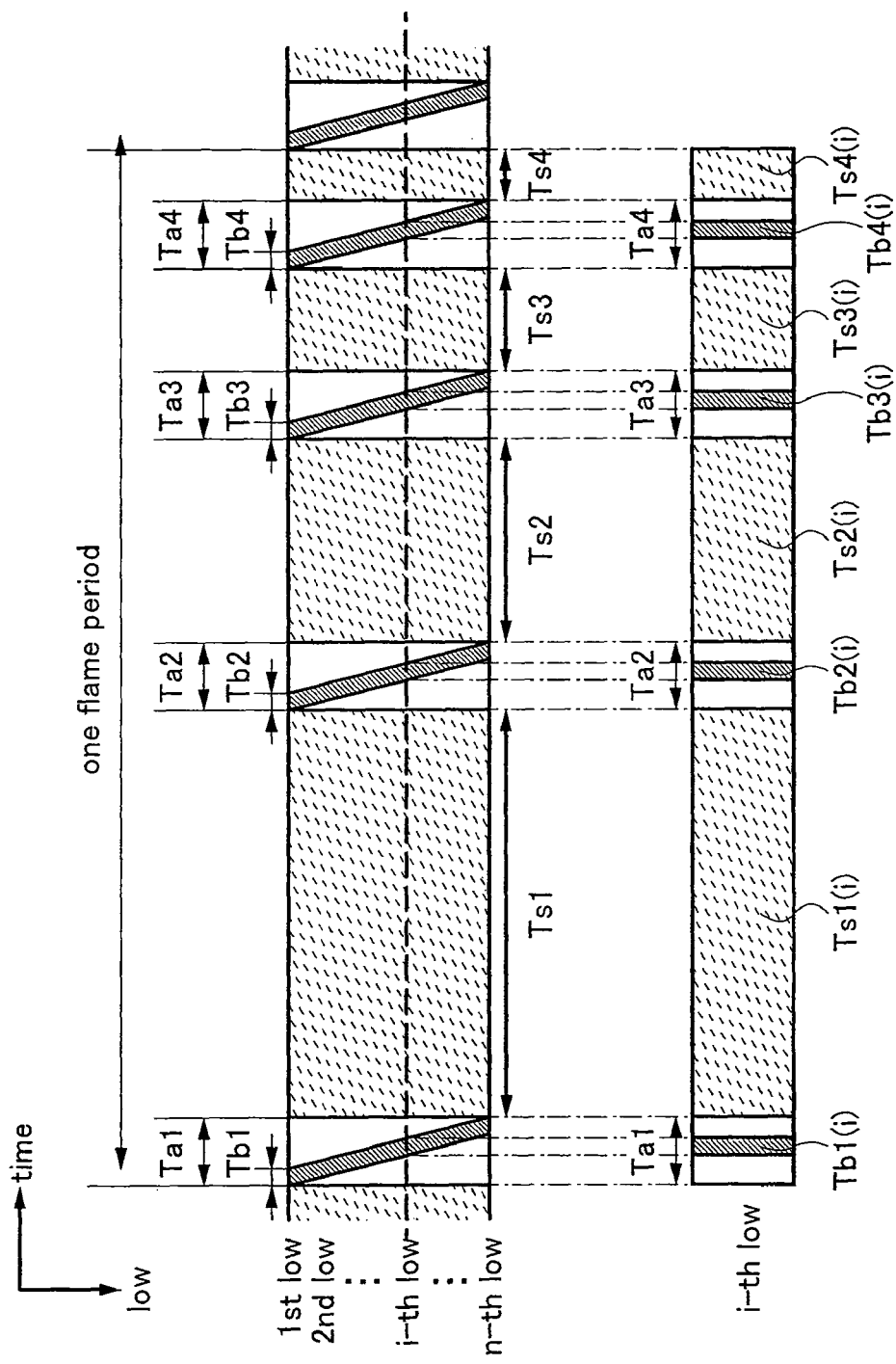
FIGS. 49A and 49B are timing charts of a semiconductor device according to the present invention.

FIGS. 49A and 49B are timing charts showing an example of digital time grayscale driving. The timing chart of FIG. 49A illustrates a driving method when a signal writing period (address period) to a pixel and a light-emitting period (sustain period) are divided.

One frame period is a period for fully displaying an image of one display region. One frame period includes a plurality of subframe periods, and one subframe period includes an address period and a sustain period. Address periods Ta1 to Ta4 indicate time for writing signals to pixels at all rows, and periods Tb1 to Tb4 indicate time for writing signals to pixels at one row (or one pixel). Sustain periods Ts1 to Ts4 indicate time for maintaining a lighting state or a non-lighting state in accordance with a video signal written to the pixel, and a ratio of the length of the sustain periods is set to satisfy Ts1:Ts2:Ts3:Ts4=$2^3$:$2^2$:$2^1$:$2^0$=8:4:2:1. A grayscale is expressed depending on which sustain period light emission is performed.

Here, the i-th pixel row is described with reference to FIG. 49B. First, in the address period Ta1, a pixel selection signal is input to a scan line in order from a first row, and in a period Tb1($i$) in the address period Ta1, a pixel at the i-th row is selected. Then, while the pixel at the i-th row is selected, a video signal is input to the pixel at the i-th row from a signal line. Then, when the video signal is written to the pixel at the i-th row, the pixel at the i-th row maintains the signal until a signal is input again. Lighting and non-lighting of the pixel at the i-th row in the sustain period Ts1 are controlled by the written video signal. Similarly, in the address periods Ta2, Ta3, and Ta4, a video signal is input to the pixel at the i-th row, and lighting and non-lighting of the pixel at the i-th row in the sustain periods Ts2, Ts3, and Ts4 are controlled by the video signal. Then, in each subframe period, a pixel to which a signal for not lighting in the address period and for lighting when the sustain period starts after the address period ends is written is lit.

Here, the case where a 4-bit grayscale is expressed has been described; however, the number of bits and the number of grayscales are not limited thereto. Note that lighting is not needed to be performed in order of Ts1, Ts2, Ts3, and Ts4, and the order may be random or light emission may be performed in the period divided into a plurality of periods. A ration of lighting times of Ts1, Ts2, Ts3, and Ts4 is not needed to be power-of-two, and may be the same length or slightly different from a power of two.

Next, a driving method when a signal writing period (address period) to a pixel and a light-emitting period (sustain period) are not divided is described. A pixel in a row in which a writing operation of a video signal is completed maintains the signal until another signal is written to the pixel (or the signal is erased). Data holding time is a period between the writing operation and the next writing operation of another signal to the pixel. In the data holding time, the pixel is lit or not lit in accordance with the video signal written to the pixel. The same operations are performed until the last row, and the address period ends. Then, an operation proceeds to a signal writing operation in a next subframe period sequentially from a row at which the data holding time ends.

As described above, in the case of a driving method in which a pixel is lit or not lit in accordance with a video signal written to the pixel immediately after the signal writing operation is completed and the data holding time starts, signals cannot be input to two rows at the same time, even if the data holding period is made shorter than the address period. Accordingly, address periods need to be prevented from overlapping with each other. Therefore, the data holding time cannot be made shorter than the address period. As a result, it becomes difficult to perform high-level grayscale display.

Figures 50A, 50B:
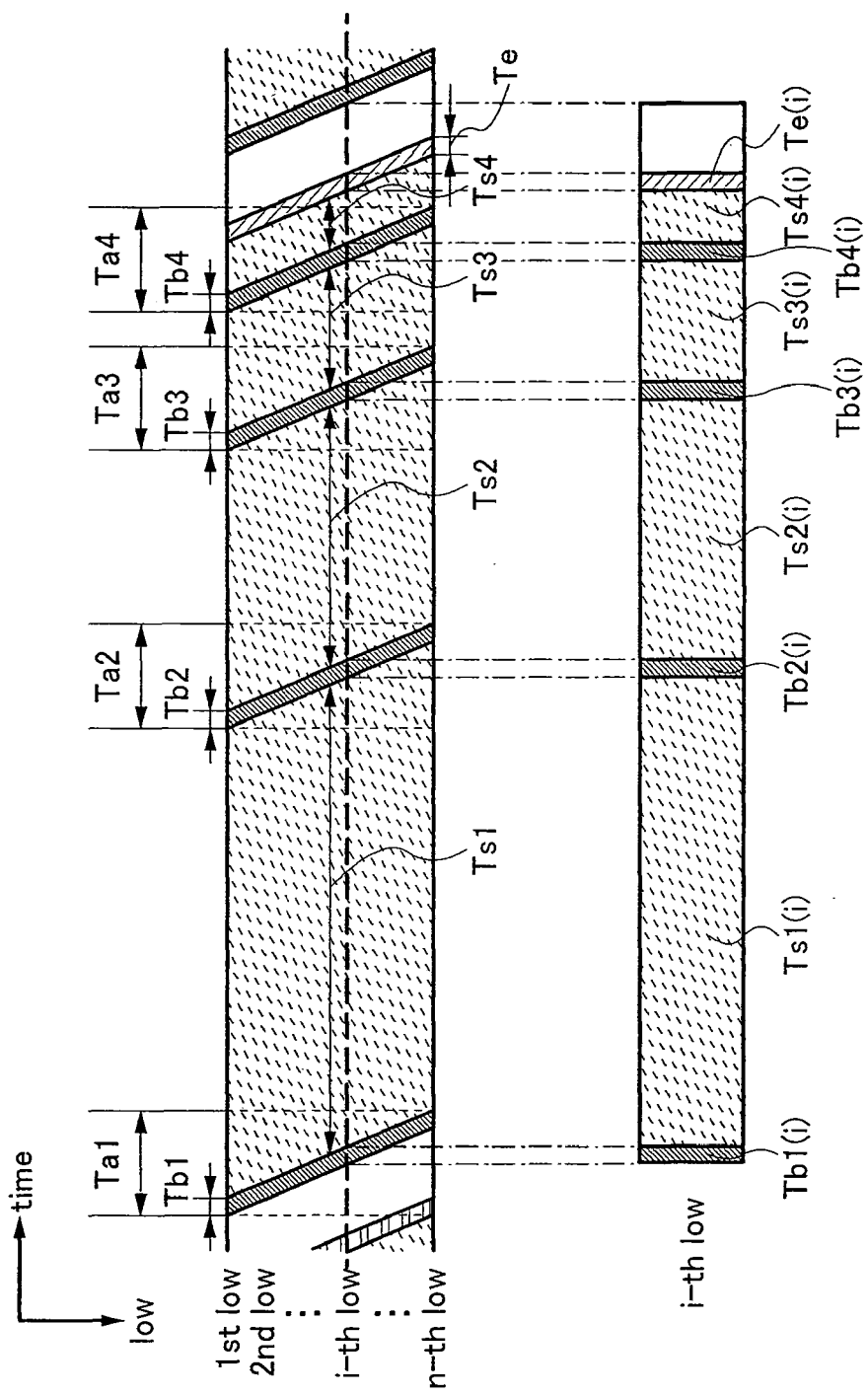
FIGS. 50A and 50B timing charts of a semiconductor device according to the present invention.

Thus, the data holding time is set to be shorter than the address period by providing an erasing period. FIG. 50A illustrates a driving method in which the data holding time is set shorter than the address period by providing an erasing period.

Here, the i-th pixel row is described with reference to FIG. 50B. In the address period Ta1, a pixel scan signal is input to a scan line in order from a first row, and a pixel is selected. Then, in the period Tb1($i$), while the pixel at the i-th row is selected, a video signal is input to the pixel at the i-th row. Then, when the video signal is written to the pixel at the i-th row, the pixel at the i-th row maintains the signal until a signal is input again. Lighting and non-lighting of the pixel at the i-th row in the sustain period Ts1($i$) are controlled by the written video signal. That is, the pixel at the i-th row is lit or not lit in accordance with the video signal written to the pixel immediately after the writing operation of the video signal to the i-th row is completed. Similarly, in the address periods Ta2, Ta3, and Ta4, a video signal is input to the pixel at the i-th row, and lighting and non-lighting of the pixel at the i-th row in the sustain periods Ts2, Ts3, and Ts4 are controlled by the video signal. Then, the end of a sustain period Ts4($i$) is set by the start of an erasing operation. This is because the pixel is forced to be not lit regardless of the video signal written to the pixel at the i-th row in an erasing time Te(i). That is, the data holding time of the pixel at the i-th row ends when the erasing time Te(i) starts.

Thus, a display device with a high-level grayscale, a high duty ratio (ratio of a lighting period in one frame period) can be provided, in which data holding time is shorter than an address period without dividing the address period and a sustain period can be provided. Reliability of a display element can be improved since instantaneous luminance can be lowered.

Here, the case where a 4-bit grayscale is expressed has been described; however, the number of bits and the number of grayscales are not limited thereto. Note that lighting is not needed to be performed in order of Ts1, Ts2, Ts3, and Ts4, and the order may be random or light emission may be performed in the period divided into a plurality of periods. A ration of lighting times of Ts1, Ts2, Ts3, and Ts4 is not needed to be power-of-two, and may be the same length or slightly different from a power of two.

A structure and an operation of a pixel to which digital time grayscale driving can be applied are described.

Figure 51:
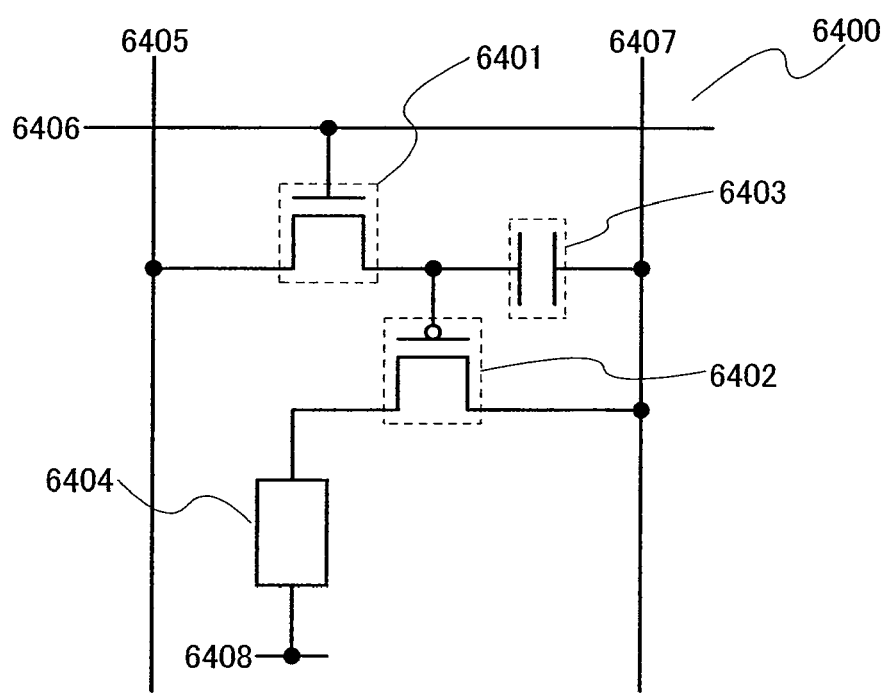
FIG. 51 illustrates a circuit configuration of a semiconductor device according to the present invention.

FIG. 51 is a diagram showing an example of a pixel structure to which digital time grayscale driving can be applied.

A pixel 6400 includes a switching transistor 6401, a driving transistor 6402, a light-emitting element 6404, and a capacitor 6403. A gate of the switching transistor 6401 is connected to a scan line 6406, a first electrode (one of a source electrode and a drain electrode) of the switching transistor 6401 is connected to a signal line 6405, and a second electrode (the other of the source electrode and the drain electrode) of the switching transistor 6401 is connected to a gate of the driving transistor 6402. The gate of the driving transistor 6402 is connected to a power supply line 6407 through the capacitor 6403, a first electrode of the driving transistor 6402 is connected to the power supply line 6407, and a second electrode of the driving transistor 6402 is connected to a first electrode (pixel electrode) of the light-emitting element 6404. A second electrode of the light-emitting element 6404 corresponds to a common electrode 6408.

The second electrode of the light-emitting element 6404 (the common electrode 6408) is set to a low power supply potential. The low power supply potential is a potential satisfying the low power supply potential<a high power supply potential with the high power supply potential set to the power supply line 6407 as a reference. As the low power supply potential, GND, 0 V, or the like may be employed, for example. A potential difference between the high power supply potential and the low power supply potential is applied to the light-emitting element 6404, and a current is supplied to the light-emitting element 6404. Here, in order to make the light-emitting element 6404 emit light, each potential is set so that the potential difference between the high power supply potential and the low power supply potential is a forward threshold voltage or higher.

Gate capacitance of the driving transistor 6402 may be used as a substitute for the capacitor 6403, so that the capacitor 6403 can be omitted. The gate capacitance of the driving transistor 6402 may be formed in a region where a source region, a drain region, an LDD region, overlaps with the gate electrode. Alternatively, capacitance may be formed between a channel region and the gate electrode.

In the case of voltage-input voltage driving method, a video signal is input to the gate of the driving transistor 6402 so that the driving transistor 6402 is in either of two states of being sufficiently turned on and turned off. That is, the driving transistor 6402 operates in a linear region.

The video signal such that the driving transistor 6402 operates in a saturation region is input, so that a current can be supplied to the light-emitting element 6404. When the light-emitting element 6404 is an element luminance of which is determined in accordance with a current, luminance decay due to deterioration of the light-emitting element 6404 can be suppressed. Further, when the video signal is an analog signal, a current corresponding to the video signal can be supplied to the light-emitting element 6404. In this case, analog grayscale driving can be performed.

A structure and an operation of a pixel called a threshold voltage compensation pixel are described. A threshold voltage compensation pixel can be applied to digital time grayscale driving and analog grayscale driving.

Figure 52:
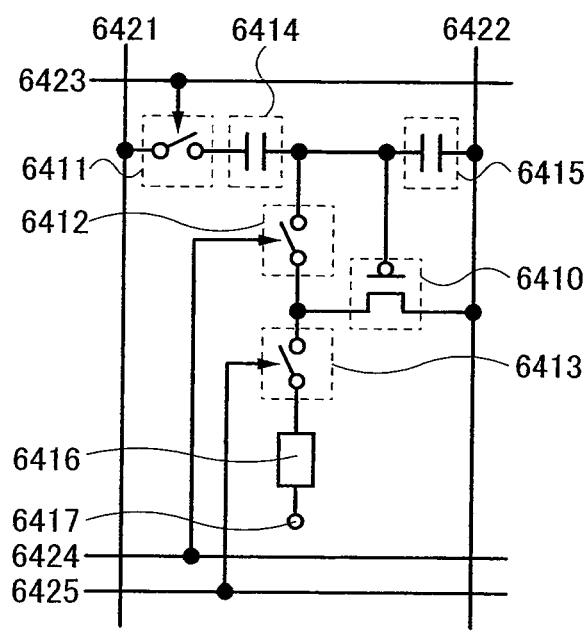
FIG. 52 illustrates a circuit configuration of a semiconductor device according to the present invention.

FIG. 52 is a diagram showing an example of a structure of a pixel called a threshold voltage compensation pixel.

The pixel in FIG. 52 includes a driving transistor 6410, a first switch 6411, a second switch 6412, a third switch 6413, a first capacitor 6414, a second capacitor 6415, and a light-emitting element 6416. A gate of the driving transistor 6410 is connected to a signal line 6421 through the first capacitor 6414 and the first switch 6411 in this order. Further, the gate of the driving transistor 6410 is connected to a power supply line 6422 through the second capacitor 6415. A first electrode of the driving transistor 6410 is connected to the power supply line 6422. A second electrode of the driving transistor 6410 is connected to a first electrode of the light-emitting element 6416 through the third switch 6413. Further, the second electrode of the driving transistor 6410 is connected to the gate of the driving transistor 6410 through the first electrode of the light-emitting element 6416. A second electrode of the light-emitting element 6416 corresponds to a common electrode 6417. Note that on/off of the first switch 6411, the second switch 6412, and the third switch 6413 is controlled by a signal input to a first scan line 6423, a signal input to a second scan line 6424, and a signal input to a third scan line 6425 respectively.

A pixel structure shown in FIG. 52 is not limited thereto. For example, a switch, a resistor, a capacitor, a transistor, a logic circuit, or the like may be added to the pixel in FIG. 52. For example, the second switch 6412 may include a p-channel transistor or an n-channel transistor, the third switch 6413 may include a transistor having polarity opposite to that of the second switch 6412, and the second switch 6412 and the third switch 6413 may be controlled by the same scan line.

A structure and an operation of a pixel called a current input pixel are described. A current input pixel can be applied to digital grayscale driving and analog grayscale driving.

Figure 53:
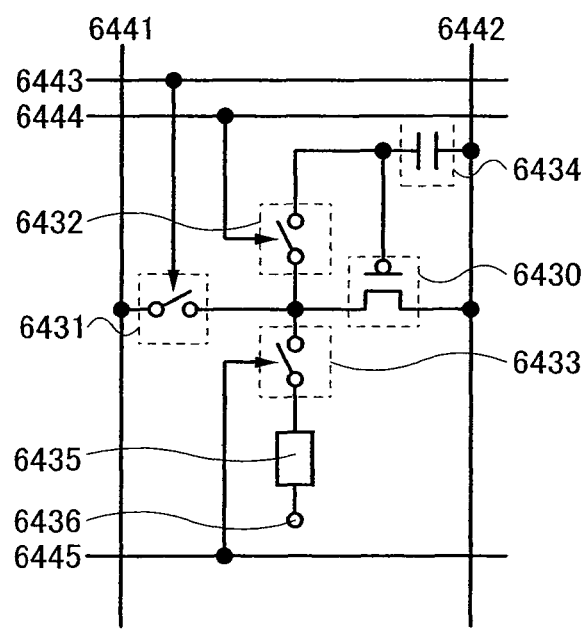
FIG. 53 illustrates a circuit configuration of a semiconductor device according to the present invention.

FIG. 53 illustrates an example of a structure of a pixel called a current input type.

The pixel in FIG. 53 includes a driving transistor 6430, a first switch 6431, a second switch 6432, a third switch 6433, a capacitor 6434, and a light-emitting element 6435. A gate of the driving transistor 6430 is connected to a signal line 6411 through the second switch 6432 and the first switch 6431 in this order. Further, the gate of the driving transistor 6430 is connected to a power supply line 6442 through the capacitor 6434. A first electrode of the driving transistor 6430 is connected to the power supply line 6442. A second electrode of the driving transistor 6430 is connected to the signal line 6441 through the first switch 6431. Further, the second electrode of the driving transistor 6430 is connected to a first electrode of the light-emitting element 6435 through the third switch 6433. A second electrode of the light-emitting element 6435 corresponds to a common electrode 6436.

A pixel structure shown in FIG. 53 is not limited thereto. For example, a switch, a resistor, a capacitor, a transistor, a logic circuit, or the like may be added to the pixel in FIG. 53. For example, the first switch 6431 may include a p-channel transistor or an n-channel transistor, the second switch 6432 may include a transistor with the same polarity as that of the first switch 6431, and the first switch 6431 and the second switch 6432 may be controlled by the same scan line. The second switch 6432 may be provided between the gate of the driving transistor 6430 and the signal line 6441. Note that on/off of the first switch 6431, the second switch 6432, and the third switch 6433 is controlled by a signal input to a first scan line 6443, a signal input to a second scan line 6444, and a signal input to a third scan line 6445 respectively.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 14

Embodiment Mode 14 will describe a pixel structure of a display device. In particular, a pixel structure of a display device using an organic EL element is described.

Figure 54A:
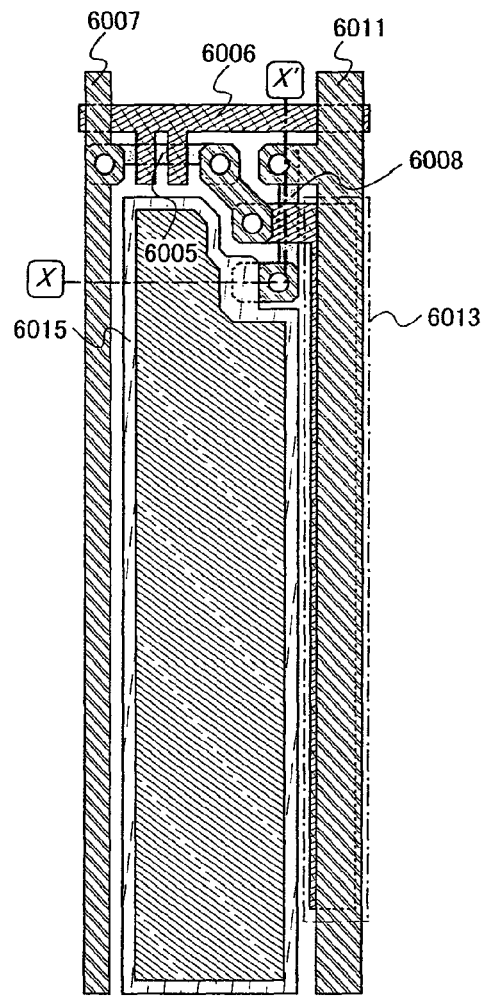
FIGS. 54A and 54B are a top view and a cross-sectional view of a semiconductor device according to the present invention.
Figure 54B:
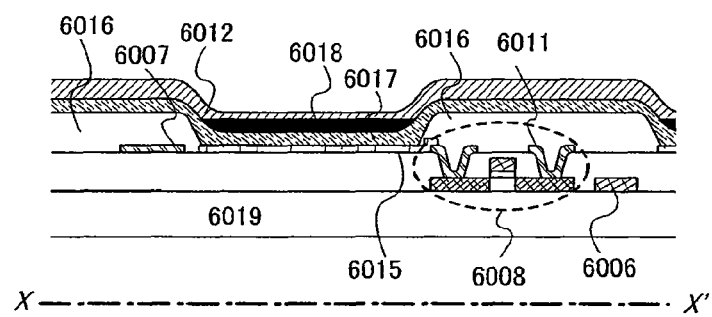

FIG. 54A illustrates an example of a top plan view (layout diagram) of a pixel including two transistors. FIG. 54B illustrates an example of a cross-sectional view along X-X' in FIG. 54A.

FIGS. 54A and 54B show a first transistor 6005, a first wiring 6006, a second wiring 6007, a second transistor 6008, a third wiring 6011, an opposite electrode 6012, a capacitor 6013, a pixel electrode 6015, a partition wall 6016, an organic conductive film 6017, an organic thin film 6018, and a substrate 6019. Note that it is preferable that the first transistor 6005 be used as a switching transistor, the second transistor 6008 as a driving transistor, the first wiring 6006 as a gate signal line, the second wiring 6007 as a source signal line, and the third wiring 6011 as a current supply line.

A gate electrode of the first transistor 6005 is electrically connected to the first wiring 6006, one of a source electrode and a drain electrode of the first transistor 6005 is electrically connected to the second wiring 6007, and the other of the source electrode or the drain electrode of the first transistor 6005 is electrically connected to a gate electrode of the second transistor 6008 and one electrode of the capacitor 60113. Note that the gate electrode of the first transistor 6005 includes a plurality of gate electrodes. Accordingly, a leakage current in the off state of the first transistor 6005 can be reduced.

One of a source electrode and a drain electrode of the second transistor 6008 is electrically connected to the third wiring 6011, and the other of the source electrode and the drain electrode of the second transistor 6008 is electrically connected to the pixel electrode 6015. Accordingly, a current flowing to the pixel electrode 6015 can be controlled by the second transistor 6008.

The organic conductive film 6017 is provided over the pixel electrode 6015, and the organic thin film 6018 (an organic compound layer) is further provided thereover. The opposite electrode 6012 is provided over the organic thin film 6018 (the organic compound layer). Note that the opposite electrode 6012 may be formed such that all pixels are commonly connected, or may be patterned using a shadow mask or the like.

Light emitted from the organic thin film 6018 (the organic compound layer) is transmitted through either the pixel electrode 6015 or the opposite electrode 6012.

In FIG. 54B, a case where light is emitted to the pixel electrode side, that is, a side on which the transistors and the like are formed is referred to as bottom emission; and a case where light is emitted to the opposite electrode side is referred to as top emission.

In the case of bottom emission, it is preferable that the pixel electrode 6015 be formed of a transparent conductive film. In the case of top emission, it is preferable that the opposite electrode 6012 be formed of a transparent conductive film.

In a light-emitting device for color display, EL elements having respective light emission colors of RGB may be separately formed, or an EL element with a single color may be formed over an entire surface uniformly and light emission of RGB can be obtained by using a color filter.

Note that the structures shown in FIGS. 54A and 54B are only examples, and various structures can be employed for a pixel layout, a cross-sectional structure, a stacking order of electrodes of an EL element, and the like, as well as the structures shown in FIGS. 54A and 54B. Further, as a light-emitting element, various elements such as a crystalline element such as an LED, and an element formed of an inorganic thin film can be used as well as the element formed of the organic thin film shown in the drawing.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

Embodiment Mode 15

Embodiment Mode 15 will describe examples of electronic devices.

Figure 55:
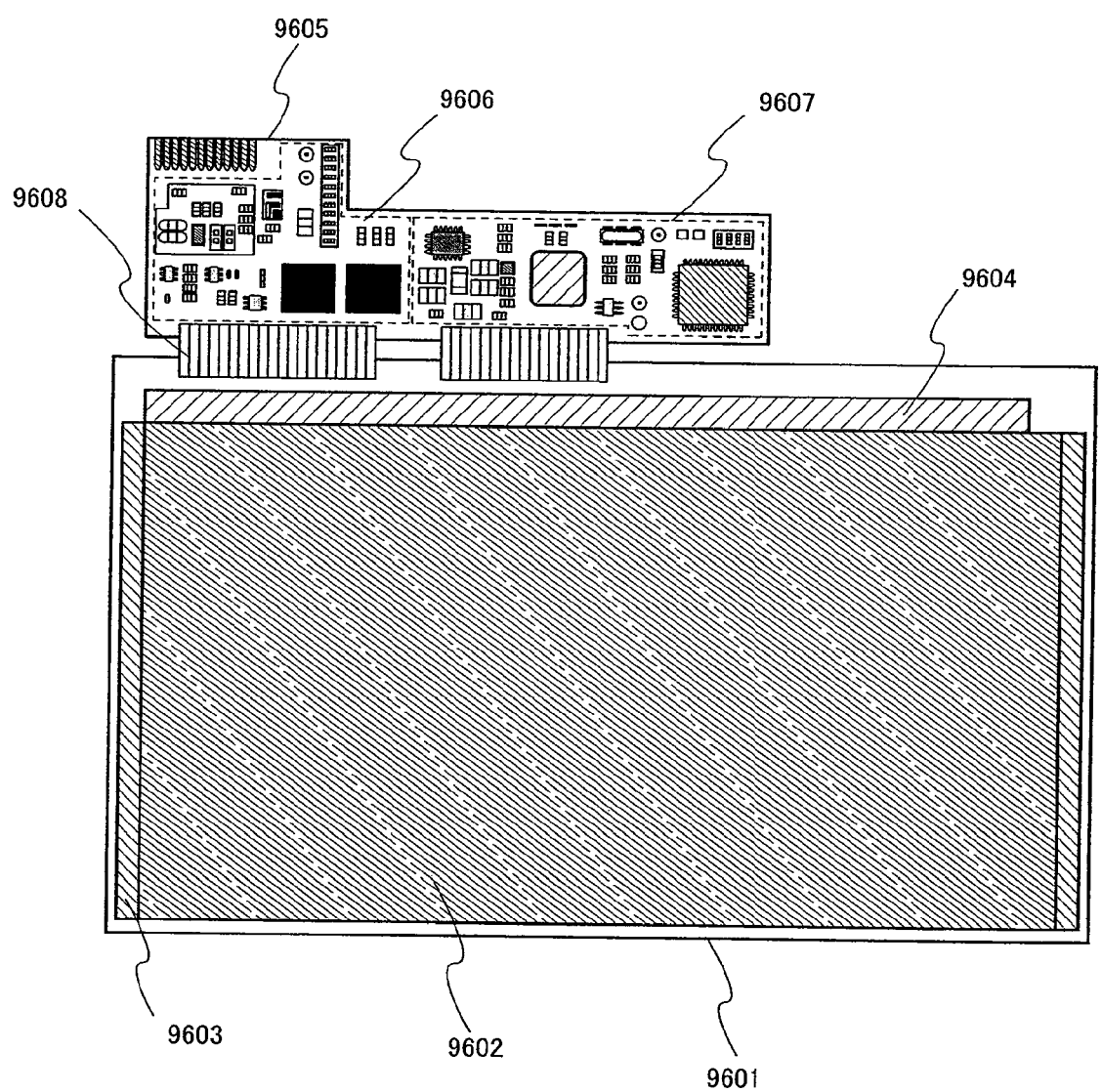
FIG. 55 illustrates an electronic device using a semiconductor device according to the present invention.

FIG. 55 illustrates a display panel module combining a display panel 9601 and a circuit board 9605. The display panel 9601 includes a pixel portion 9602, a scan line driver circuit 9603, and a signal line driver circuit 9604. The circuit board 9605 is provided with a control circuit 9606, a signal dividing circuit 9607, and the like, for example. The display panel 9601 and the circuit board 9605 are connected to each other by a connection wiring 9608. An FPC or the like can be used as the connection wiring.

Figure 56:
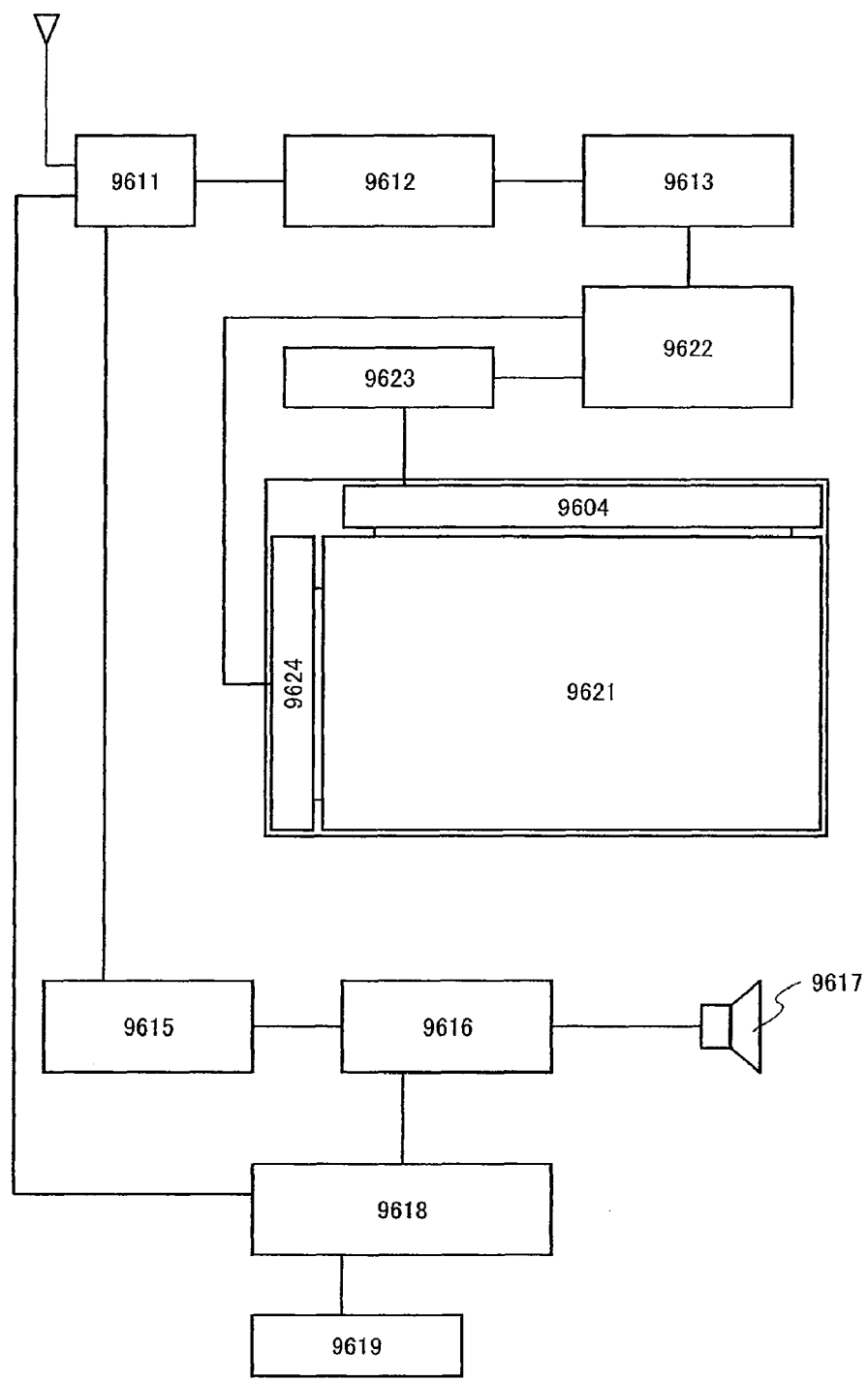
FIG. 56 illustrates an electronic device using a semiconductor device according to the present invention.

FIG. 56 is a block diagram of a main structure of a television receiver. A tuner 9611 receives a video signal and an audio signal. The video signals are processed by a video signal amplifier circuit 9612; a video signal processing circuit 9613 and a control circuit 9622. The video signal processing circuit 9613 converts a signal output from the video signal amplifier circuit 9612 into a color signal corresponding to each color of red, green and blue. The control circuit 9622 converts the video signal into the input specification of a driver circuit. The control circuit 9622 outputs a signal to each of a scan line driver circuit 9624 and a signal line driver circuit 9614. The scan line driver circuit 9624 and the signal line driver circuit 9614 drive a display panel 9621. When performing digital driving, a structure may be employed in which a signal dividing circuit 9623 is provided on the signal line side so that an input digital signal is divided into m signals (m is a positive integer) to be supplied.

Among the signals received by the tuner 9611, an audio signal is transmitted to an audio signal amplifier circuit 9615, and an output thereof is supplied to a speaker 9617 through an audio signal processing circuit 9616. A control circuit 9618 receives control information on receiving station (receiving frequency) and volume from an input portion 9619 and transmits signals to the tuner 9611 or the audio signal processing circuit 9616.

Figure 57A:
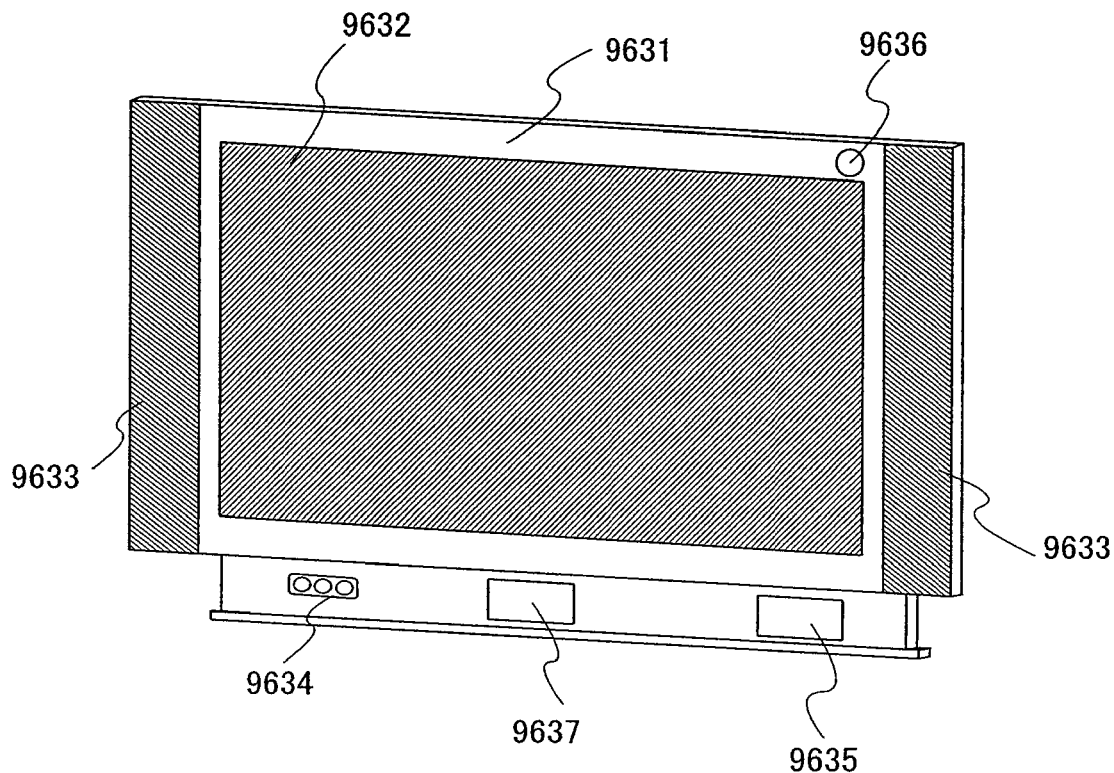
FIGS. 57A and 57B illustrate electronic devices using semiconductor devices according to the present invention.

FIG. 57A illustrates a television receiver incorporated with a display panel module, which is different from FIG. 56. In FIG. 57A, a display screen 9632 incorporated in a housing 9631 is formed using the display panel module. Note that speakers 9633, input means (an operation key 9634, a connection terminal 9635, a sensor 9636 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9637), and the like may be provided as appropriate.

Figure 57B:
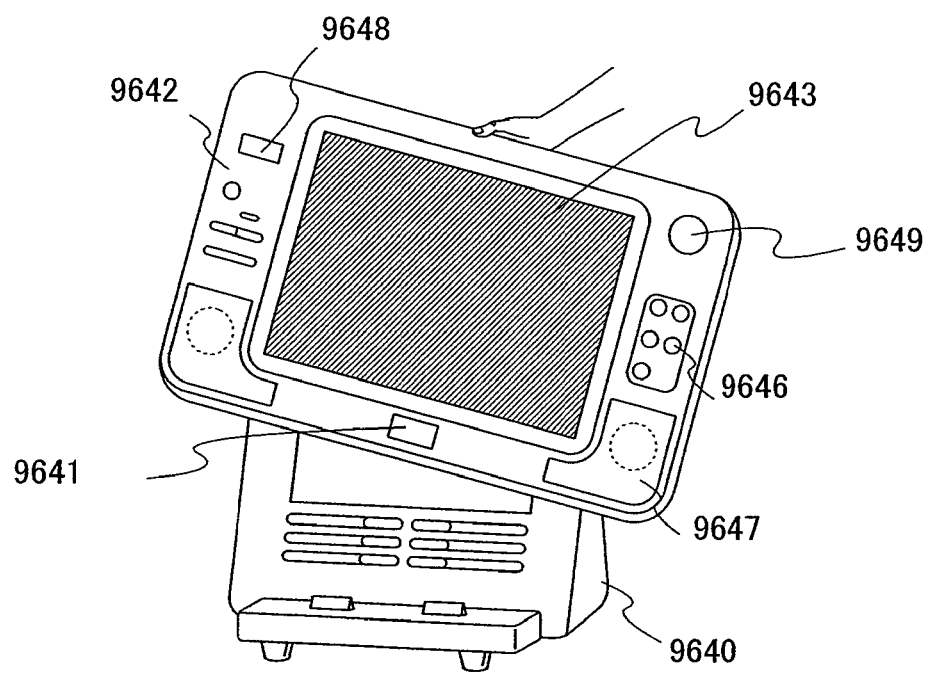

FIG. 57B illustrates a television receiver in which a display can be carried wirelessly. The television receiver is provided with a display portion 9643, a speaker portion 9647, input means (an operation key 9646, a connection terminal 9648, a sensor 9649 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9641), and the like as appropriate. A battery and a signal receiver are incorporated in a housing 9642. The battery drives the display portion 9643, the speaker portion 9647, the sensor 9649, and the microphone 9640. The battery can be repeatedly charged by a charger 9641. The charger 9640 can transmit and receive a video signal and transmit the video signal to the signal receiver of the display. The device in FIG. 57B is controlled by the operation key 9646. Alternatively, the device in FIG. 57B can transmit a signal to the charger 9640 by operating the operation key 9646. That is, the device may be a video-audio two-way communication device. Further alternatively, by operating the operation key 9646, the device in FIG. 57B may transmit a signal to the charger 9640 and another electronic device is made to receive a signal which can be transmitted from the charger 9640; thus, the device in FIG. 57B can control communication of another electronic device. That is, the device may be a general-purpose remote control device. Note that the contents (or part thereof) described in each drawing of this embodiment mode can be applied to the display portion 9643.

Next, a structure example of a mobile phone is described with reference to FIG. 58.

A display panel 9662 is detachably incorporated in a housing 9650. The shape and size of the housing 9650 can be changed as appropriate in accordance with the size of the display panel 9662. The housing 9650 which fixes the display panel 9662 is fitted in a printed wiring board 9651 to be assembled as a module.

The display panel 9662 is connected to the printed wiring board 9651 through an FPC 9663. The printed wiring board 9651 is provided with a speaker 9652, a microphone 9653, a transmitting/receiving circuit 9654, a signal processing circuit 9655 including a CPU, a controller, and the like, and a sensor 9661 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray). Such a module, an operation key 9656, a battery 9657, and an antenna 9660 are combined and stored in a housing 9659. A pixel portion of the display panel 9662 is provided to be viewed from an opening window formed in the housing 9659.

In the display panel 9662, the pixel portion and part of peripheral driver circuits (a driver circuit having a low operation frequency among a plurality of driver circuits) may be formed over the same substrate by using transistors, and another part of the peripheral driver circuits (a driver circuit having a high operation frequency among the plurality of driver circuits) may be formed over an IC chip. Then, the IC chip may be mounted on the display panel 9662 by COG (Chip On Glass). Alternatively, the IC chip may be connected to a glass substrate by using TAB (Tape Automated Bonding) or a printed wiring board. With such a structure, power consumption of a display device can be reduced and operation time of the mobile phone per charge can be extended. Further, reduction in cost of the mobile phone can be realized.

Figure 58:
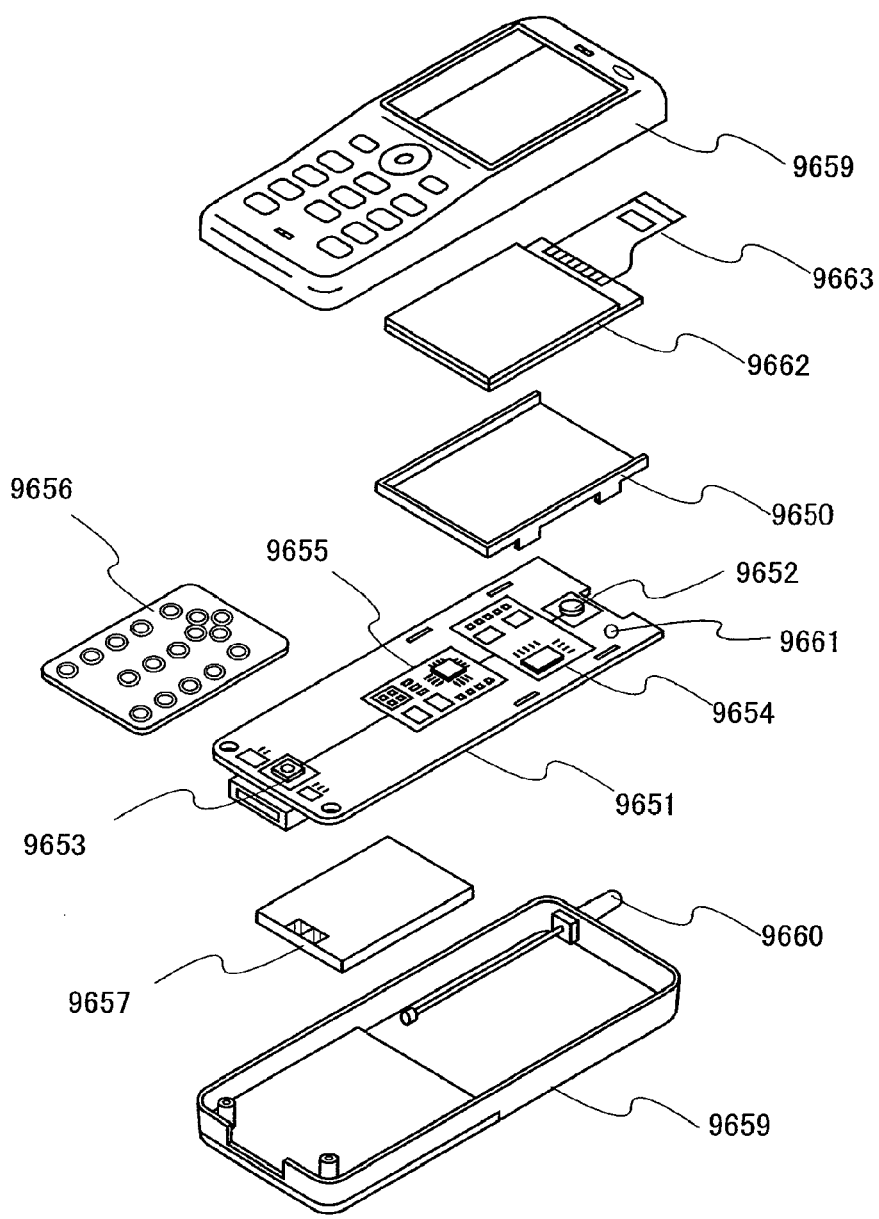
FIG. 58 illustrates an electronic device using a semiconductor device according to the present invention.

The mobile phone in FIG. 58 has various functions such as, but not limited to, a function to display various kinds of information (e.g., a still image, a moving image, and a text image); a function to display a calendar, a date, the time, and the like on a display portion; a function to operate or edit the information displaying on the display portion; a function to control processing by various kinds of software (programs); a function of wireless communication; a function to communicate with another mobile phone, a fixed phone, or an audio communication device by using the wireless communication function; a function to connect with various computer networks by using the wireless communication function; a function to transmit or receive various kinds of data by using the wireless communication function; a function to operate a vibrator in accordance with incoming call, reception of data, or an alarm; and a function to produce a sound in accordance with incoming call, reception of data, or an alarm.

Figure 59A:
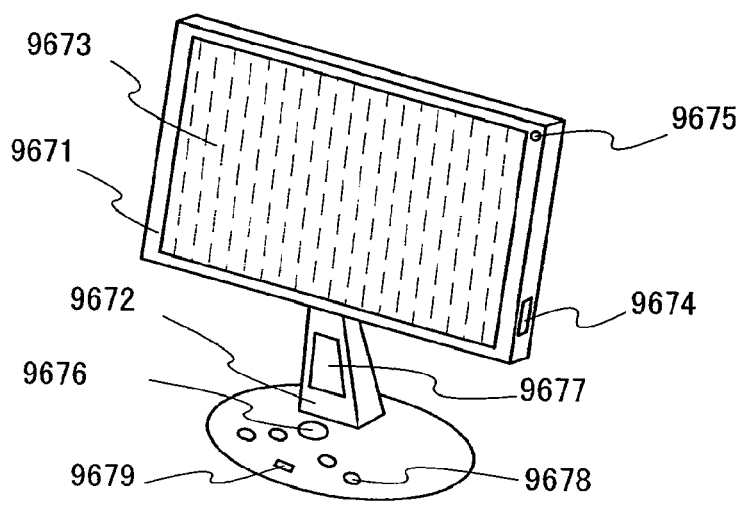
FIGS. 59A to 59C illustrate electronic devices using semiconductor devices according to the present invention.

FIG. 59A illustrates a display, which includes a housing 9671, a support base 9672, a display portion 9673, a speaker 9677, an LED lamp 9679, input means (a connection terminal 9674, a sensor 9675 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), a microphone 9676, and an operation key 9678), and the like. The display in FIG. 59A can have various functions such as, but not limited to, a function to display various kinds of information (e.g., a still image, a moving image, and a text image) on the display portion.

Figure 59B:
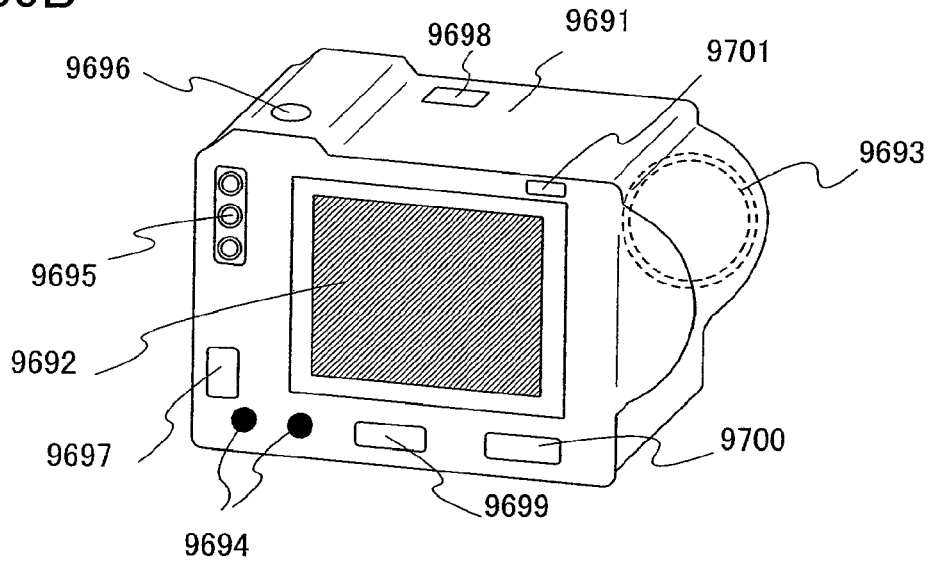

FIG. 59B illustrates a camera, which includes a main body 9691, a display portion 9692, a shutter button 9696, a speaker 9700, an LED lamp 9701, input means (an image receiving portion 9693, operation keys 9694, an external connection port 9695, a connection terminal 9697, a sensor 9698 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9699), and the like. The camera in FIG. 59B can have various functions such as, but not limited to, a function to photograph a still image or a moving image; a function to automatically adjust the photographed image (still image or moving image); a function to store the photographed image in a recording medium (provided externally or incorporated in the camera); and a function to display the photographed image on the display portion.

Figure 59C:
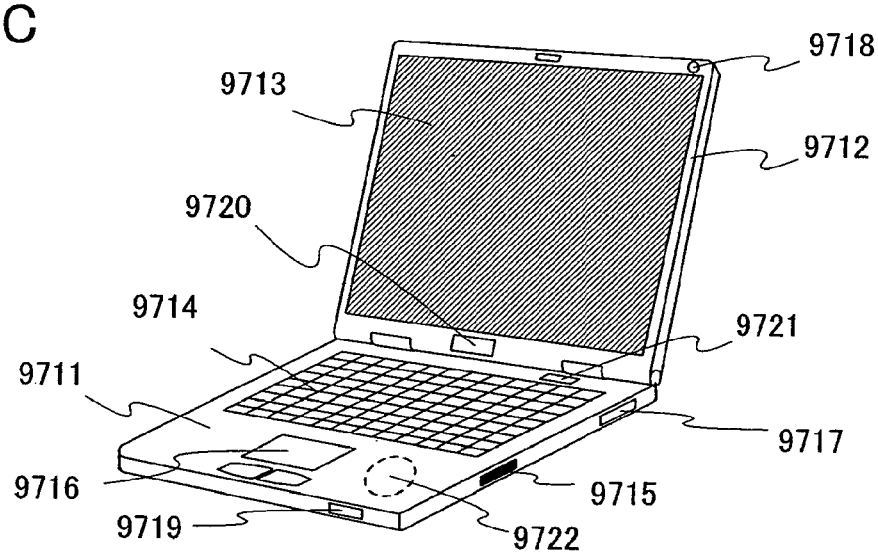

FIG. 59C illustrates a computer, which includes a main body 9711, a housing 9712, a display portion 9713, a speaker 9720, an LED lamp 9721, a reader/writer 9722, input means (a keyboard 9714, an external connection port 9715, a pointing device 9716, a connection terminal 9717, a sensor 9718 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9719), and the like. The computer in FIG. 59C can have various functions such as, but not limited to, a function to display various kinds of information (e.g., a still image, a moving image, and a text image) on the display portion; a function to control processing by various kinds of software (programs); a communication function such as wireless communication or wire communication; a function to connect with various computer networks by using the communication function; and a function to transmit or receive various kinds of data by using the communication function.

Figure 66A:
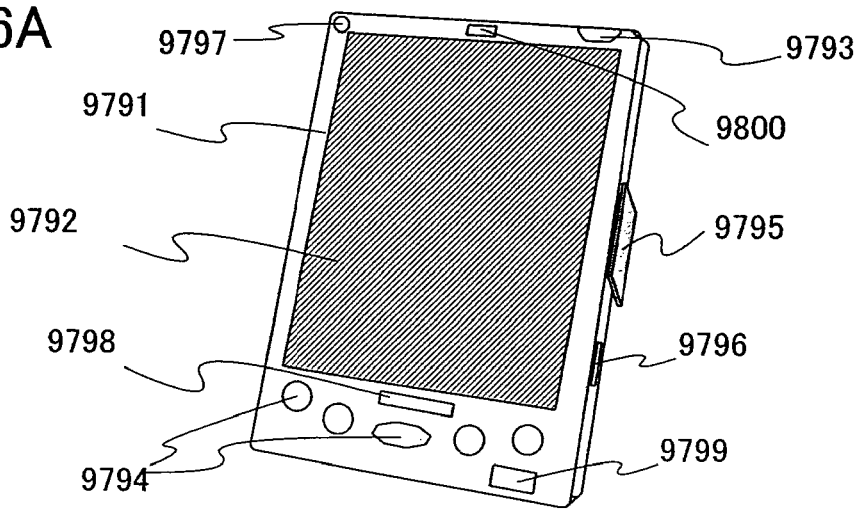
FIGS. 66A to 66C illustrate electronic devices using semiconductor devices according to the present invention.

FIG. 66A illustrates a mobile computer, which includes a main body 9791, a display portion 9792, a switch 9793, a speaker 9799, an LED lamp 9800, input means (operation keys 9794, an infrared port 9795, a connection terminal 9796, a sensor 9797 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9798), and the like. The mobile computer in FIG. 66A can have various functions such as, but not limited to, a function to display various kinds of information (e.g., a still image, a moving image, and a text image) on a display portion; a touch panel function provided on the display portion; a function to display a calendar, a date, the time, and the like on the display portion; a function to control processing by various kinds of software (programs); a function of wireless communication; a function to connect with various computer networks by using the wireless communication function; and a function to transmit or receive various kinds of data by using the wireless communication function.

Figure 66B:
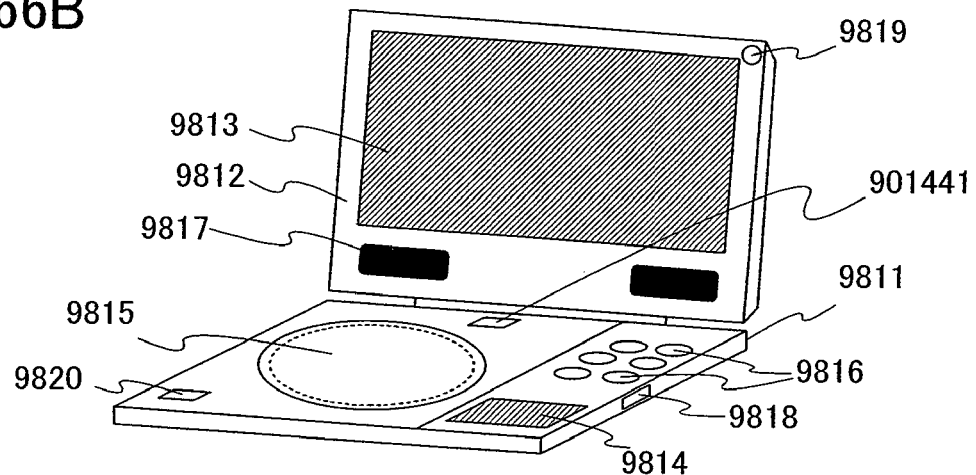

FIG. 66B illustrates a portable image reproducing device having a recording medium (e.g., a DVD player), which includes a main body 9811, a housing 9812, a display portion A 9813, a display portion B 9814, a speaker portion 9817, an LED lamp 901441, input means (a recording medium (e.g., DVD) reading portion 9815, operation keys 9816, a connection terminal 9818, a sensor 9819 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9820), and the like. The display portion A 9813 mainly displays image information and the display portion B 9814 mainly displays text information.

Figure 66C:
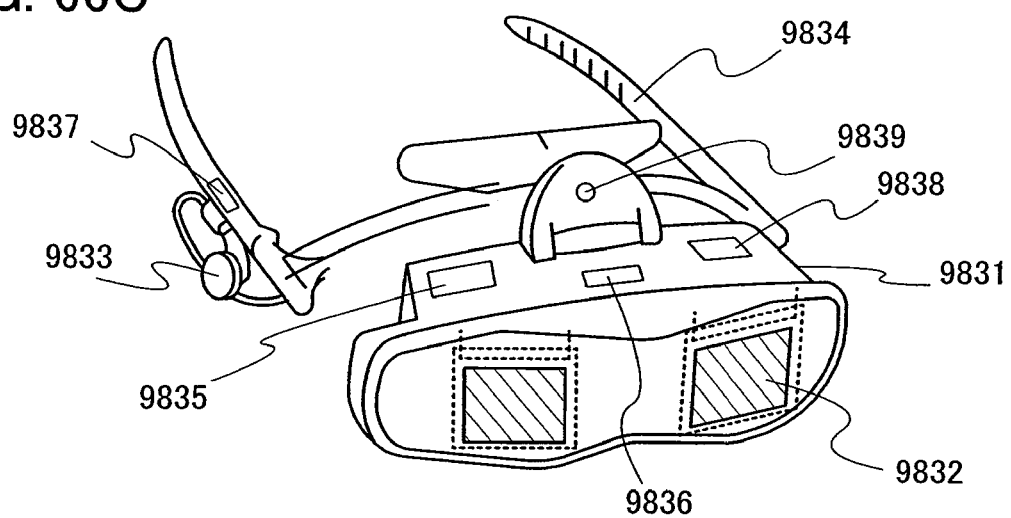

FIG. 66C illustrates a goggle-type display, which includes a main body 9031, a display portion 9032, an earphone 9033, a support portion 9034, an LED lamp 9039, a speaker 9038, input means (a connection terminal 9035, a sensor 9036 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9037), and the like. The goggle-type display in FIG. 66C can have various functions such as, but not limited to, a function to display an externally obtained image (e.g., a still image, a moving image, and a text image) on the display portion.

Figure 67A:
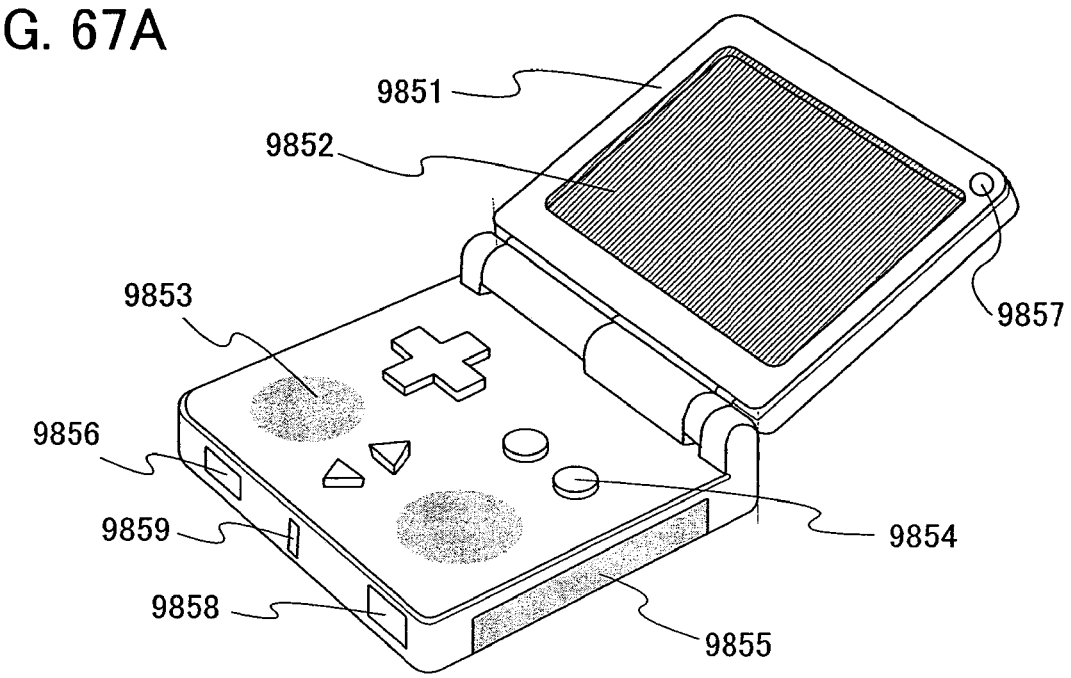
FIGS. 67A and 67B illustrate electronic devices using semiconductor devices according to the present invention.

FIG. 67A illustrates a portable game machine, which includes a housing 9851, a display portion 9852, a speaker portion 9853, a recording medium insert portion 9855, an LED lamp 9859, input means (an operation key 9854, a connection terminal 9856, a sensor 9857 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9858), and the like. The portable game machine in FIG. 67A can have various functions such as, but not limited to, a function to read a program or data stored in the recording medium to display on the display portion; and a function to share information with another portable game machine by wireless communication.

Figure 67B:
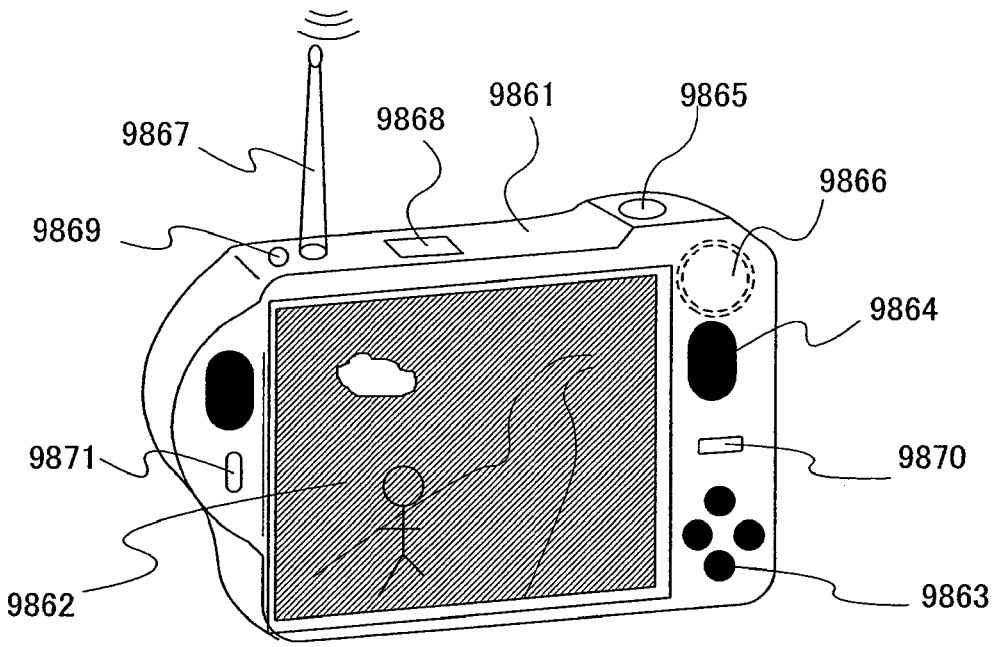

FIG. 67B illustrates a digital camera having a television reception function, which includes a body 9861, a display portion 9862, a speaker 9864, a shutter button 9865, an LED lamp 9871, input means (an operation key 9863, an image receiving portion 9866, an antenna 9867, a connection terminal 9868, a sensor 9869 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9870), and the like. The digital camera having a television reception function in FIG. 67B can have various functions such as, but not limited to, a function to photograph a still image or a moving image; a function to automatically adjust the photographed image; a function to obtain various kinds of information from the antenna; a function to store the photographed image or the information obtained from the antenna; and a function to display the photographed image or the information obtained from the antenna on the display portion.

Figure 68:
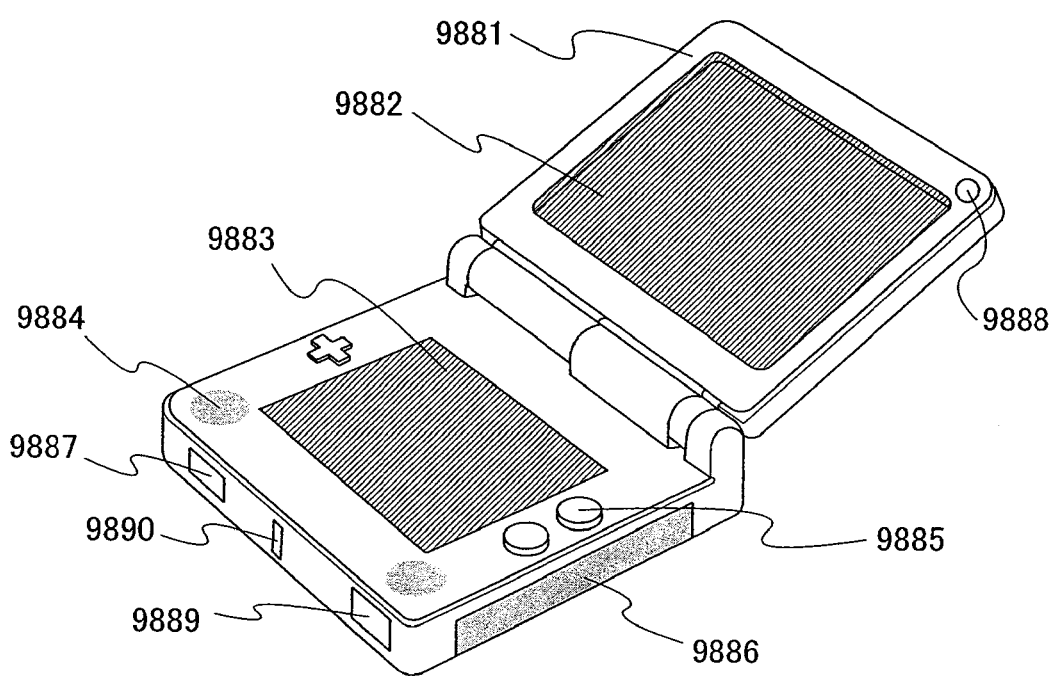
FIG. 68 illustrates an electronic device using a semiconductor device according to the present invention.

FIG. 68 illustrates a portable game machine, which includes a housing 9881, a first display portion 9882, a second display portion 9883, a speaker portion 9884, a recording medium insert portion 9886, an LED lamp 9890, input means (an operation key 9885, a connection terminal 9887, a sensor 9888 (having a function to measure power, displacement, position, speed, acceleration, angular velocity, the number of rotations, distance, light, liquid, magnetism, temperature, a chemical substance, sound, time, hardness, an electric field, current, voltage, electric power, radiation, a flow rate, humidity, gradient, oscillation, smell, or infrared ray), and a microphone 9889), and the like. The portable game machine in FIG. 68 can have various functions such as, but not limited to, a function to read a program or data stored in the recording medium to display on the display portion; and a function to share information with another portable game machine by wireless communication.

As shown in FIGS. 59A to 59C, 66A to 66C, 67A, 67B, and 68, the electronic devices include a display portion for displaying some kind of information, can display a moving image smoothly, suppress afterimages to human eyes, and display images without motion blur.

Next, application examples of a semiconductor device are described.

Figure 60:
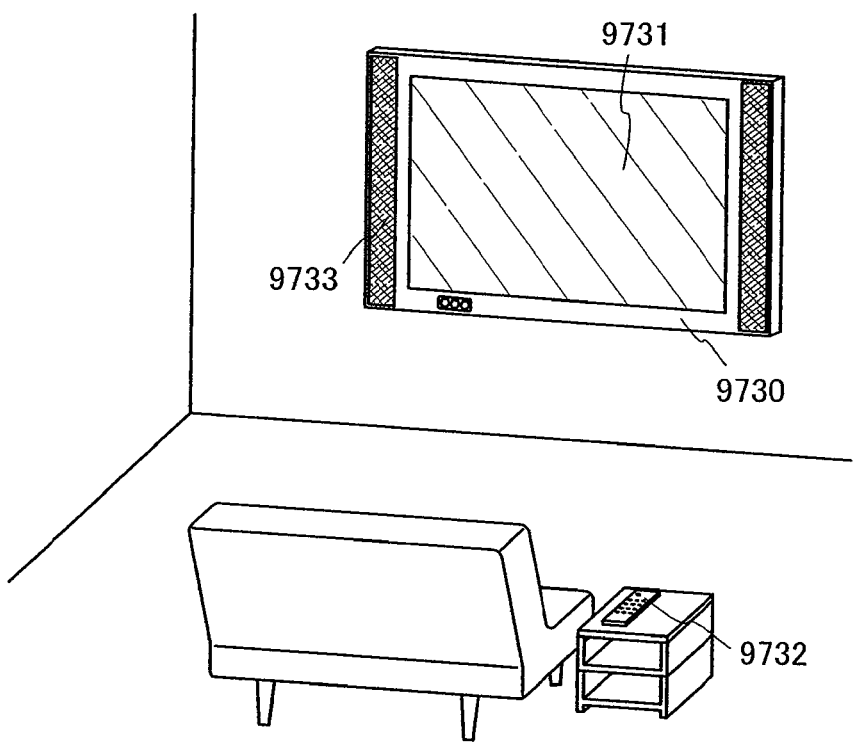
FIG. 60 illustrates an electronic device using a semiconductor device according to the present invention.

FIG. 60 illustrates an example where a semiconductor device is incorporated in a constructed object. FIG. 60 illustrates a housing 9730, a display portion 9731, a remote control device 9732 which is an operation portion, a speaker portion 9733, and the like. The semiconductor device is attached to or incorporated in the constructed object as a wall-hanging type and can be provided without requiring a large space.

Figure 61:
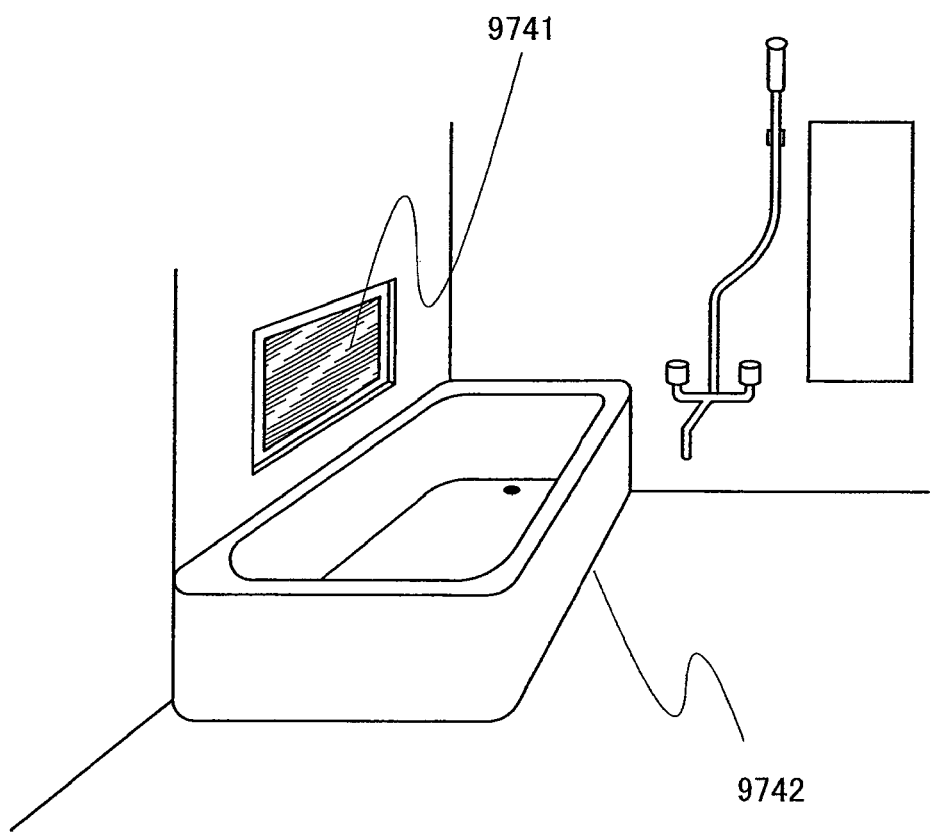
FIG. 61 illustrates an electronic device using a semiconductor device according to the present invention.

FIG. 61 illustrates another example where a semiconductor device is incorporated in a constructed object. A display panel 9741 is incorporated with a prefabricated bath 9742, and a person who takes a bath can view the display panel 9741. The display panel 9741 has a function to display information by an operation by a person who takes a bath; and a function to be used as an advertisement or an entertainment means.

The semiconductor device can be provided not only to a side wall of the prefabricated bath 9742 as shown in FIG. 61, but also to various places. For example, the semiconductor device can be attached to or unified with part of a mirror, a bathtub itself, or the like. At this time, a shape of the display panel 9741 may be changed in accordance with a shape of the mirror or the bathtub.

Figure 62:
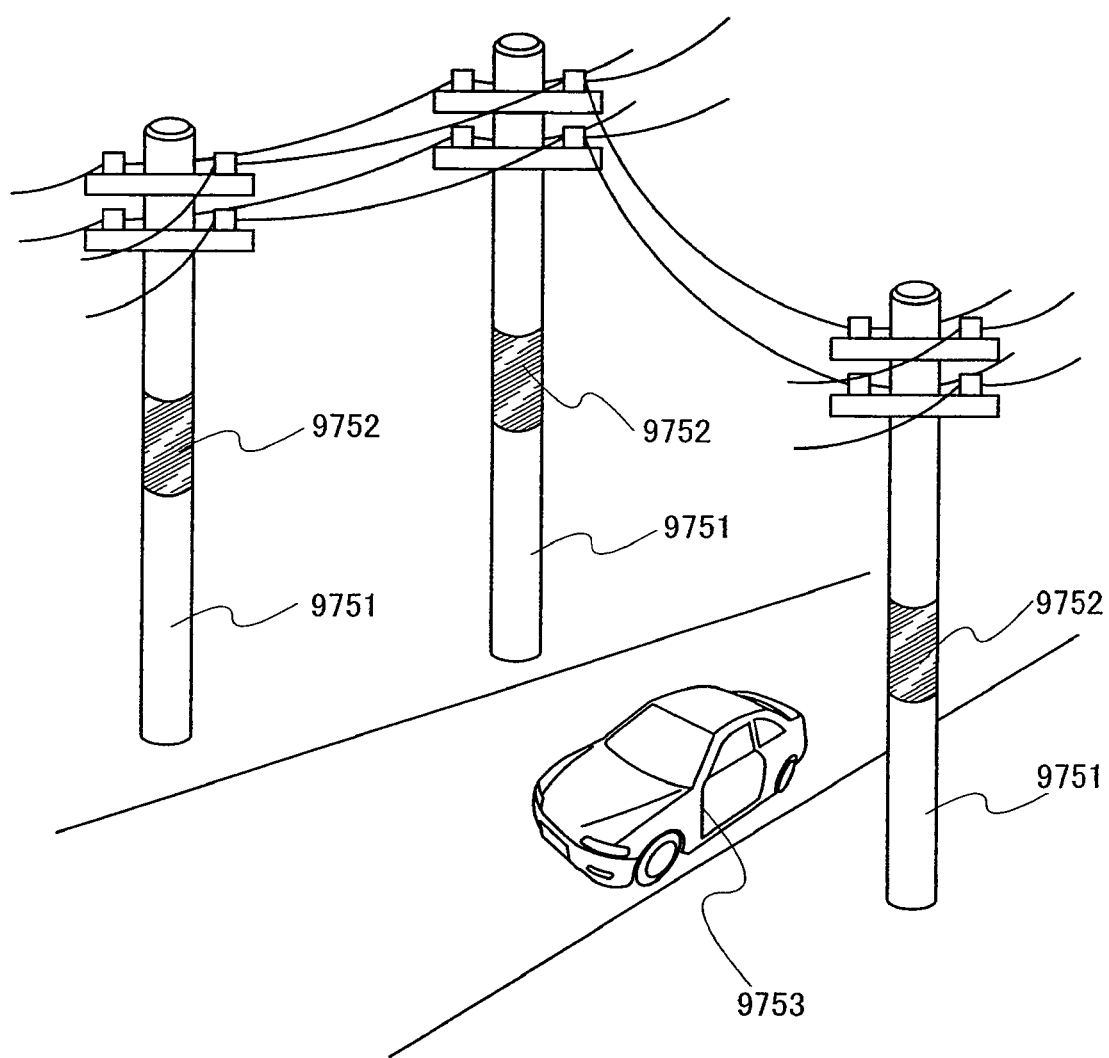
FIG. 62 illustrates an electronic device using a semiconductor device according to the present invention.

FIG. 62 illustrates another example where a semiconductor device is unified with a constructed object. A display panel 9752 is bent and attached to a curved surface of a column-shaped object 9751. Here, a utility pole is described as the column-shaped object 9751.

The display panel 9752 in FIG. 62 is provided at a position higher than a human viewpoint. When the same images are displayed on the display panels 9752 provided in constructed objects which stand together in large numbers outdoors, such as utility poles, advertisement can be performed to unspecified number of viewers. Since it is easy for the display panel 9752 to display the same images and instantly switch images by external control, highly effective information display and advertisement effect can be expected. When provided with self-luminous display elements, the display panel 9752 can be effectively used as a highly visible display medium even at night. When the display panel 9752 is provided in the utility pole, a power supply means for the display panel 9752 can be easily obtained. In an emergency such as disaster, the display panel 9752 can also rapidly transmit correct information to victims.

As the display panel 9752, a display panel in which a switching element such as an organic transistor is provided over a film-like substrate, and a display element is driven, so that an image can be displayed can be used, for example.

In this embodiment mode, a wall, a column-shaped object, and a prefabricated bath are shown as examples of a constructed object; however, this embodiment mode is not limited thereto, and various constructed objects can be provided with a semiconductor device.

Next, examples where a semiconductor device is incorporated with a moving object are described.

Figure 63:
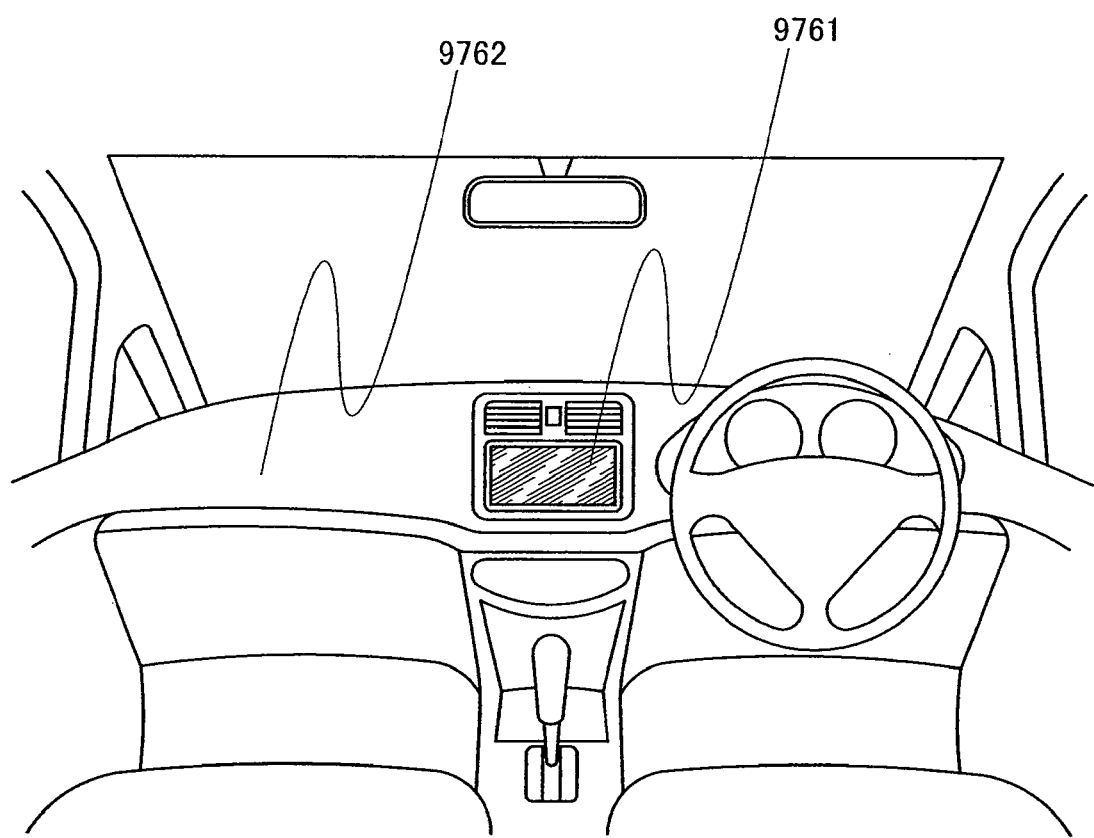
FIG. 63 illustrates an electronic device using a semiconductor device according to the present invention.

FIG. 63 illustrates an example where a semiconductor device is incorporated with a car. A display panel 9762 is incorporated with a car body 9761, and can display an operation of the car body or information input from inside or outside the car body on demand. Note that a navigation function may be provided.

The semiconductor device can be provided not only to the car body 9761 as shown in FIG. 63, but also to various places. For example, the semiconductor device can be incorporated with a glass window, a door, a steering wheel, a gear shift, a seat, a rear-view mirror, and the like. At this time, a shape of the display panel 9762 may be changed in accordance with a shape of an object provided with the semiconductor device.

Figure 64A:
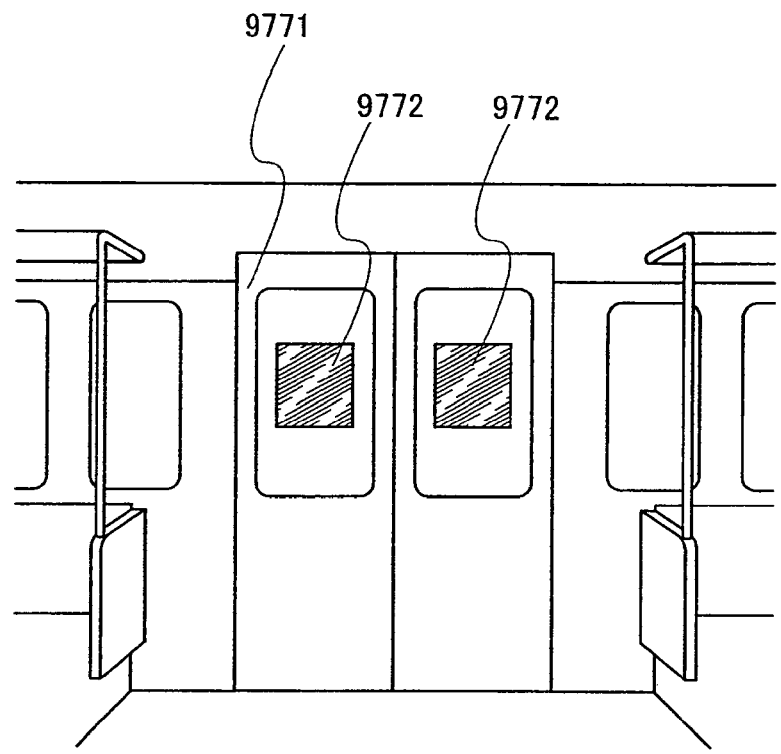
FIGS. 64A and 64B illustrate electronic devices using semiconductor devices according to the present invention.
Figure 64B:
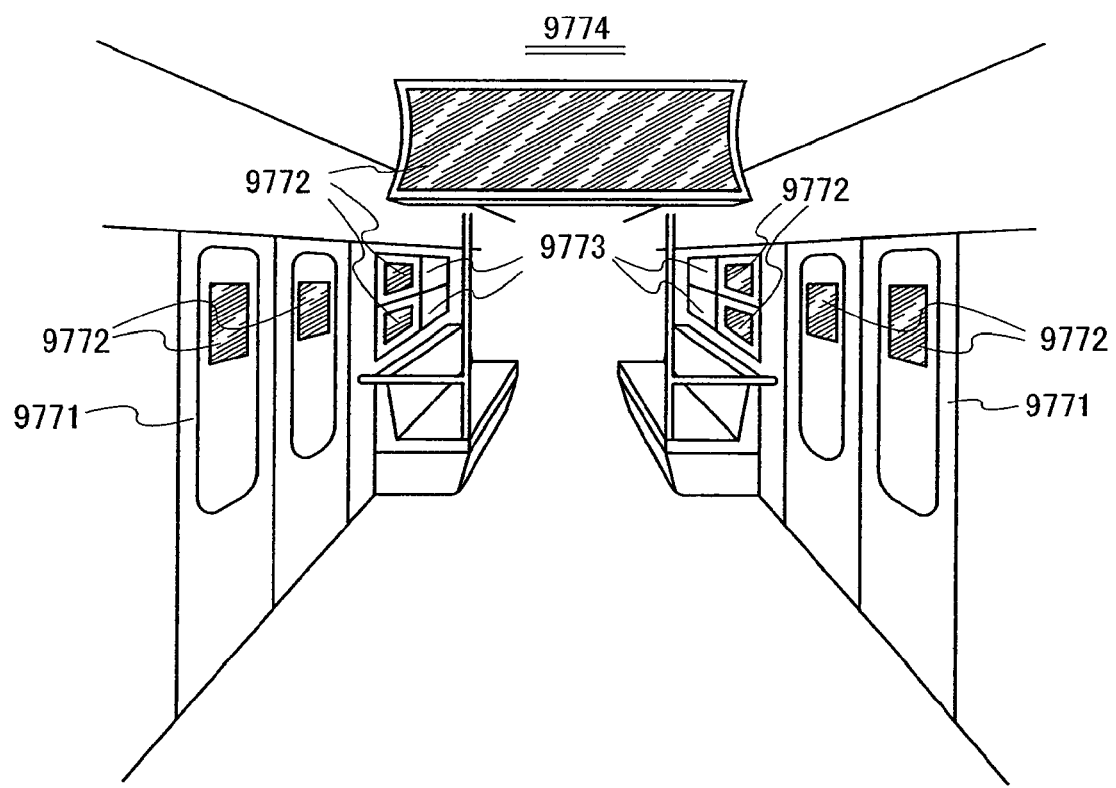

FIGS. 64A and 64B show examples where a semiconductor device is incorporated with a train car are described.

FIG. 64A illustrates an example where a display panel 9772 is provided in glass of a door 9771 in a train car, which has an advantage compared with a conventional advertisement using paper in that labor cost for changing an advertisement is not necessary. Since the display panel 9772 can instantly switch images displaying on a display portion by an external signal, images on the display panel can be switched every time period when types of passengers on the train are changed, for example; thus, more effective advertisement effect can be expected.

FIG. 64B illustrates an example where the display panels 9772 are provided to a glass window 9773 and a ceiling 9774 as well as the glass of the door 9771 in the train car. In this manner, the semiconductor device can be easily provided to a place where the semiconductor device has been difficult to be provided conventionally; thus, effective advertisement effect can be obtained. Further, the semiconductor device can instantly switch images displayed on a display portion by an external signal; thus, cost and time for changing an advertisement can be reduced, and more flexible advertisement management and information transmission can be realized.

The semiconductor device can be provided not only to the door 9771, the glass window 9773, and the ceiling 9774 as shown in FIG. 64, but also to various places. For example, the semiconductor device can be incorporated with a strap, a seat, a handrail, a floor, and the like. At this time, a shape of the display panel 9772 may be changed in accordance with a shape of an object provided with the semiconductor device.

Figure 65A:
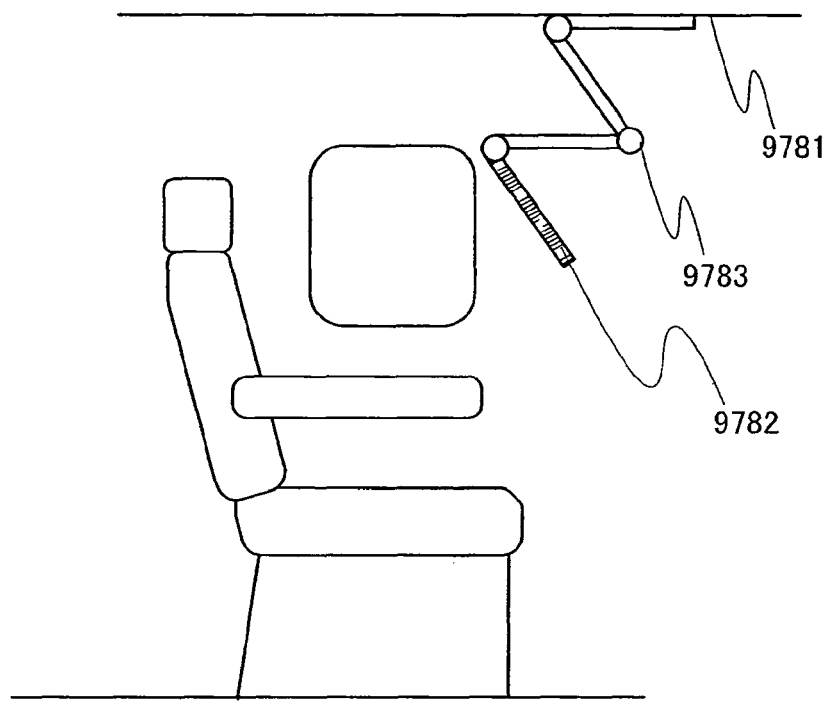
FIGS. 65A and 65B illustrate electronic devices using semiconductor devices according to the present invention.
Figure 65B:
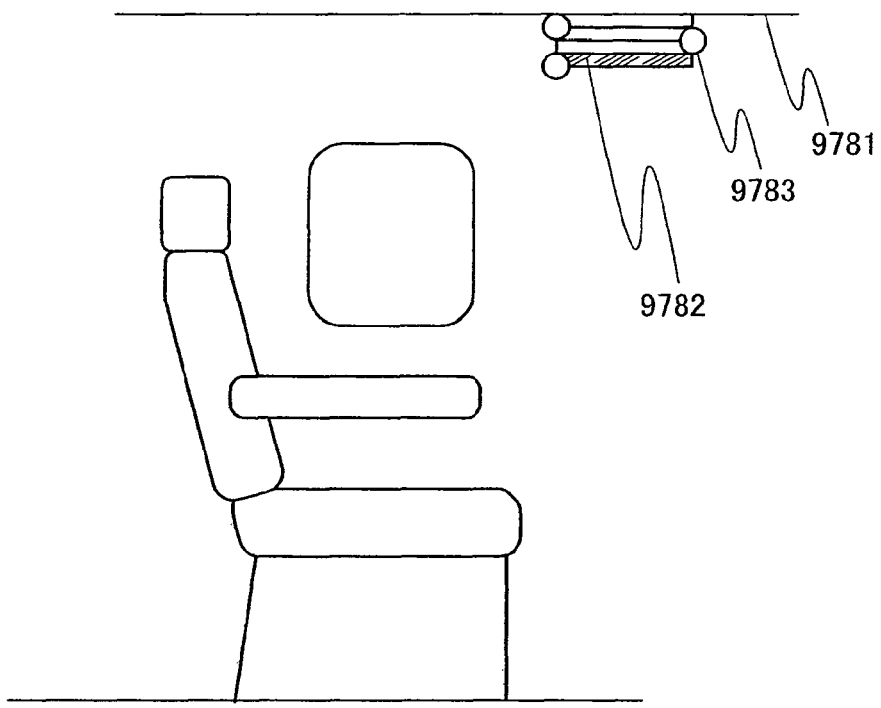

FIGS. 65A and 65B show an example where a semiconductor device is incorporated with a passenger airplane.

FIG. 65A illustrates a shape of a display panel 9782 attached to a ceiling 9781 above a seat of the passenger airplane when the display panel 9782 is used. The display panel 9782 is incorporated with the ceiling 9781 using a hinge portion 9783, and the passenger can view the display panel 9782 by stretching of the hinge portion 9783. The display panel 9782 has a function to display information by an operation by the passenger and a function to be used as an advertisement or an entertainment means. In addition, when the hinge portion is bent and put in the ceiling 9781 of the airplane as shown in FIG. 65B, safety in taking-off and landing can be assured. Note that when a display element in the display panel is lit in an emergency, the display panel can also be used as an information transmission means and an evacuation light.

The semiconductor device can be provided not only to the ceiling 9781 as shown in FIGS. 65A and 65B, but also to various places. For example, the semiconductor device can be incorporated with a seat, a table attached to a seat, an armrest, a window, and the like. A large display panel which a large number of people can view may be provided at a wall of an airframe. At this time, a shape of the display panel 9782 may be changed in accordance with a shape of an object provided with the semiconductor device.

Note that in this embodiment mode, bodies of a train car, a car, and an airplane are shown as a moving object; however, the present invention is not limited thereto, and a semiconductor device can be provided to various objects such as a motorcycle, an four-wheel drive car (including a car, a bus, and the like), a train (including a monorail, a railroad car, and the like), and a vessel. Since a semiconductor device can instantly switch images displayed on a display panel in a moving object by an external signal, an moving object is provided with the semiconductor device, so that the moving object can be used as an advertisement display board for an unspecified number of customers, an information display board in disaster, and the like.

Although this embodiment mode has been described with reference to various drawings, the contents (or part of the contents) described in each drawing can be freely applied to, combined with, or replaced with the contents (or part of the contents) described in another drawing. Further, much more drawings can be formed by combining each part in the above-described drawings with another part.

The contents (or part of the contents) described in each drawing in this embodiment mode can be freely applied to, combined with, or replaced with the contents (or part of the contents) described in a drawing in another embodiment mode. Further, much more drawings can be formed by combining each part in the drawings in this embodiment mode with part of another embodiment mode.

Note that this embodiment mode has described just examples of embodying, slightly transforming, modifying, improving, or detailed describing the contents (or part of the contents) described in other embodiment modes, an application example or an example of related part thereof, or the like. Therefore, the contents described in other embodiment modes can be freely applied to, combined with, or replaced with this embodiment mode.

This application is based on Japanese Patent Application serial no. 2006-251911 filed in Japan Patent Office on Sep. 15, 2006, the entire contents of which are hereby incorporated by reference.

What is claimed is:

1. A method of driving a liquid crystal display device having a display screen, comprising the steps of:
   forming a first image, a second image, and a third image sequentially from an external video signal supplied in an input frame rate;
   detecting a first luminance;
   forming a fourth image based on the first image and the second image;
   forming a fifth image based on the second image and the third image; and
   displaying the first image, the fourth image, the fifth image, and the third image sequentially on the display screen in a display frame rate;
   wherein:
   the first image comprises an image of an object;
   the second image comprises an image of the object;
   the third image comprises an image of the object;
   the fourth image comprises an image of the object;
   the fifth image comprises an image of the object;
   the first luminance is luminance of the image of the object in the first image;
   a second luminance is luminance of the image of the object in the fourth image;
   a third luminance is luminance of the image of the object in the fifth image;
   a first location of the image of the object in the first image and a third location of the image of the object in the third image are the same as each other;
   the second luminance and the third luminance are lower than the first luminance; and
   the display frame rate is 1.5 times as high as the input frame rate.

2. The method of driving the liquid crystal display device according to claim 1, wherein the image of the object in the second image is a black image.

3. A display device comprising:
   a display screen, the display screen sequentially displaying a first image, a fourth image, a fifth image, and a third image in a display frame rate; and
   a control circuit, the control circuit configured to:
      form the first image, a second image, and the third image from an external video signal supplied in an input frame rate;
      detect a first luminance;
      form the fourth image based on the first image and the second image; and
      form the fifth image based on the second image and the third image,
   wherein the first image comprises an image of an object,
   wherein the second image comprises an image of the object,
   wherein the third image comprises an image of the object,
   wherein the fourth image comprises an image of the object,
   wherein the fifth image comprises an image of the object,
   wherein the first luminance is luminance of the image of the object in the first image,
   wherein a second luminance is luminance of the image of the object in the fourth image,
   wherein a third luminance is luminance of the image of the object in the fifth image,
   wherein a first location of the image of the object in the first image and a third location of the image of the object in the third image are the same as each other,
   wherein the second luminance and the third luminance are lower than the first luminance, and
   wherein the display frame rate is 1.5 times as high as the input frame rate.

4. An electronic device comprising the display device according to claim 3.

5. The display device according to claim 3, wherein the image of the object in the second image is a black image.

6. A method of driving a liquid crystal display device, comprising the steps of:
   forming a first image, a second image, and a third image sequentially from an external video signal supplied in an input frame rate;
   detecting a first luminance;
   forming a fourth image based on the first image and the second image;

forming a fifth image based on the second image and the third image; and displaying the first image, the fourth image, the fifth image, and the third image sequentially in a display frame rate, wherein the first image comprises an image of an object, wherein the second image comprises an image of the object, wherein the third image comprises an image of the object, wherein the fourth image comprises an image of the object, wherein the fifth image comprises an image of the object, wherein the first luminance is luminance of the image of the object in the first image, wherein a second luminance is luminance of the image of the object in the fourth image, wherein a third luminance is luminance of the image of the object in the fifth image, wherein a first location of the image of the object in the first image and a third location of the image of the object in the third image are the same as each other, wherein the second luminance and the third luminance are lower than the first luminance; and the display frame rate is 1.5 times as high as the input frame rate.

7. The method of driving the liquid crystal display device according to claim 6, further comprising controlling luminance of a backlight to realize the second luminance while the second image is displayed.

8. A display device, wherein the display device is configured to sequentially display a first image, a fourth image, a fifth image, and a third image in a display frame rate, wherein the display device comprises a control circuit, the control circuit configured to:

form the first image, a second image, and the third image from an external video signal supplied in an input frame rate;

detect a first luminance;

form the fourth image based on the first image and the second image; and form the fifth image based on the second image and the third image, wherein the first image comprises an image of an object, wherein the second image comprises an image of the object, wherein the third image comprises an image of the object, wherein the fourth image comprises an image of the object, wherein the fifth image comprises an image of the object, wherein the first luminance is luminance of the image of the object in the first image, wherein a second luminance is luminance of the image of the object in the fourth image, wherein a third luminance is luminance of the image of the object in the fifth image, wherein a first location of the image of the object in the first image and a third location of the image of the object in the third image are the same as each other, wherein the second luminance and the third luminance are lower than the first luminance, and wherein the display frame rate is 1.5 times as high as the input frame rate.

9. The display device according to claim 8, wherein luminance of a backlight is controlled to realize the second luminance while the second image is displayed.

* * * * *